(12) United States Patent
Yamazaki et al.

(10) Patent No.: US 11,790,817 B2
(45) Date of Patent: Oct. 17, 2023

(54) METHOD FOR OPERATING DISPLAY DEVICE

(71) Applicant: SEMICONDUCTOR ENERGY LABORATORY CO., LTD., Atsugi (JP)

(72) Inventors: Shunpei Yamazaki, Tokyo (JP); Takayuki Ikeda, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 63 days.

(21) Appl. No.: 17/633,269

(22) PCT Filed: Jul. 28, 2020

(86) PCT No.: PCT/IB2020/057090
§ 371 (c)(1),
(2) Date: Feb. 7, 2022

(87) PCT Pub. No.: WO2021/028755
PCT Pub. Date: Feb. 18, 2021

(65) Prior Publication Data
US 2022/0383783 A1    Dec. 1, 2022

(30) Foreign Application Priority Data

Aug. 9, 2019   (JP) .................................. 2019-147373
Oct. 17, 2019  (JP) .................................. 2019-190103

(51) Int. Cl.
*G09G 3/00*    (2006.01)
(52) U.S. Cl.
CPC ....... *G09G 3/006* (2013.01); *G09G 2320/045* (2013.01); *G09G 2360/145* (2013.01); *G09G 2360/16* (2013.01)

(58) Field of Classification Search
CPC ............. G09G 3/006; G09G 2320/045; G09G 2360/145; G09G 2360/16; G09G 3/3648;
(Continued)

(56) References Cited

U.S. PATENT DOCUMENTS 5,285,150 A * 2/1994 Henley ............ G01R 31/31724
324/760.02
5,363,037 A   11/1994 Henley et al.
(Continued)

FOREIGN PATENT DOCUMENTS

CN    108281102 A    7/2018
JP    06-043415 A    2/1994
(Continued)

OTHER PUBLICATIONS

International Search Report (Application No. PCT/IB2020/057090) dated Nov. 2, 2020.
(Continued)

*Primary Examiner* — Antonio Xavier
(74) *Attorney, Agent, or Firm* — Fish & Richardson P.C.

(57) ABSTRACT

A display device in which a pixel defect is less likely to be perceived is provided. The display device includes a display portion where pixels are arranged in a matrix, and a sensor portion including a photoelectric conversion element. First, the display portion is divided into a first region and a second region. Next, first light is emitted from the pixel included in the first region, and the luminance of the first light is detected by the photoelectric conversion element. Moreover, second light is emitted from the pixel included in the second region, and the luminance of the second light is detected by the photoelectric conversion element. Then, the luminance of the first light is compared to the luminance of the second light, and on the basis of the comparison result, one of the first region and the second region is divided into a third (Continued)

region and a fourth region. By repeating these operations, a defective pixel is detected. Luminance represented by image data can be corrected on the basis of the detection result of the defective pixel.

12 Claims, 54 Drawing Sheets

(58) Field of Classification Search
CPC .... G09G 2330/10; G09G 3/3233; G09G 3/30; G09G 3/3208; G09G 3/3611; G09G 5/10; G09G 2360/142; H10K 59/13; H10K 59/122; H10K 59/123; H10K 59/65; H10K 50/80; H10K 59/60; G06F 3/147; G02F 1/1309; G02F 1/136259; H05B 33/02
See application file for complete search history.

(56) References Cited

U.S. PATENT DOCUMENTS

| | | | | |
|---|---|---|---|---|
| 9,552,753 | B1* | 1/2017 | Sivertsen | ............... G09G 3/006 |
| 2008/0315890 | A1 | 12/2008 | Kasai et al. | |
| 2015/0003720 | A1* | 1/2015 | Kwon | .................. G06T 7/0004 |
| | | | | 382/147 |
| 2016/0329016 | A1* | 11/2016 | Chaji | .................. G09G 3/3225 |
| 2018/0218211 | A1 | 8/2018 | Ishioka et al. | |
| 2019/0237013 | A1 | 8/2019 | Wang et al. | |
| 2019/0371226 | A1 | 12/2019 | Iwaki | |

FOREIGN PATENT DOCUMENTS

| | | |
|---|---|---|
| JP | 2001-041852 A | 2/2001 |
| JP | 2002-340739 A | 11/2002 |
| JP | 2006-200927 A | 8/2006 |
| JP | 2008-068284 A | 3/2008 |
| JP | 2009-003092 A | 1/2009 |
| JP | 2009-063298 A | 3/2009 |
| JP | 2018-136537 A | 8/2018 |
| JP | 2019-080354 A | 5/2019 |
| KR | 1992-0010309 A | 6/1992 |
| WO | WO-1992/009900 | 6/1992 |
| WO | WO-2018/150291 | 8/2018 |

OTHER PUBLICATIONS

Written Opinion (Application No. PCT/IB2020/057090) dated Nov. 2, 2020.

* cited by examiner

FIG. 2A1
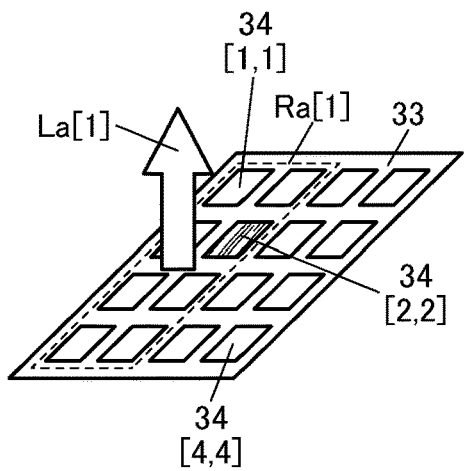
FIG. 2A2
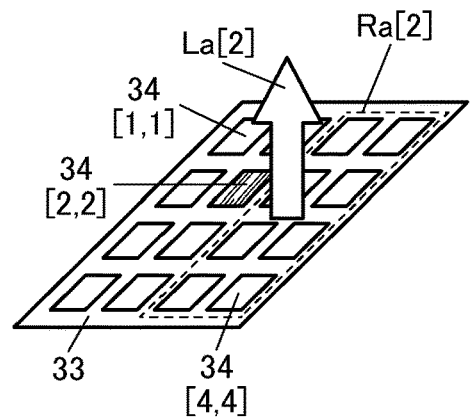
FIG. 2B1
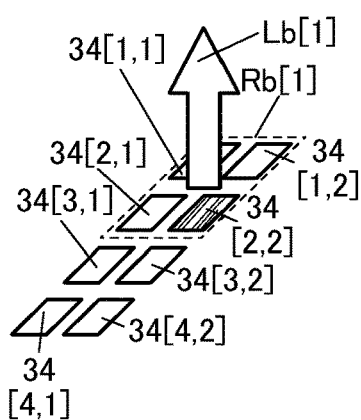
FIG. 2B2
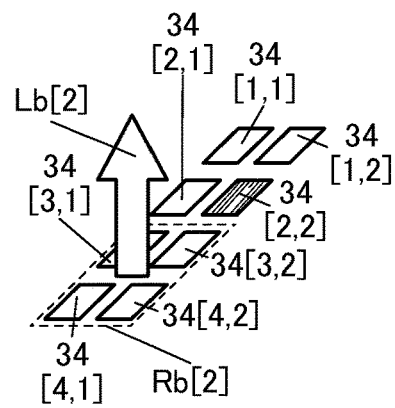
FIG. 2C1
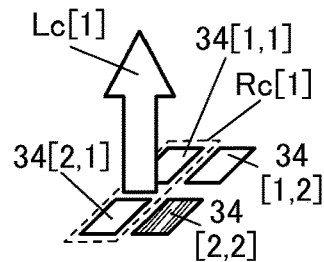
FIG. 2C2
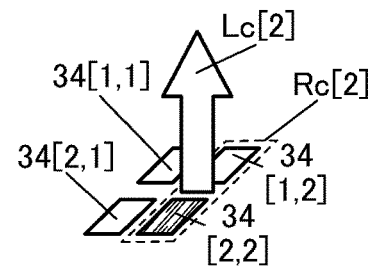
FIG. 2D1
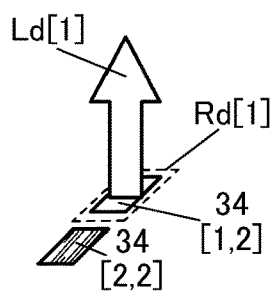
FIG. 2D2
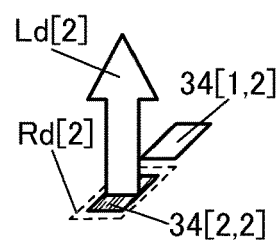

FIG. 12A

Judgment table 1

| Number of blinks (/min) | Judgment |
|---|---|
| 10 or more and less than 30 | A |
| 30 or more | B |
| 40 or more | C |
| less than 10 | D |
| less than 5 | E |

FIG. 12B

Judgment table 2

| Judgment | Alarm information |
|---|---|
| B | Eye fatigue has been accumulated. You need a rest. |
| C | Eye fatigue has been accumulated excessively. Display will stop in 5 minutes. |
| D | The number of blinks is decreasing. Be careful of dry eyes. |
| E | The number of blinks is decreasing excessively. Display will stop in 5 minutes. |

FIG. 12C

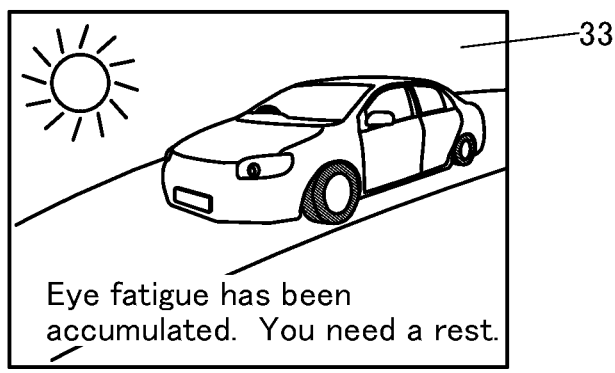

Eye fatigue has been accumulated. You need a rest.

Judgment table 3

| Blink multiplication | Judgment |
|---|---|
| 0.7 or more and less than 2.0 | A |
| 2.0 or more | B |
| 2.3 or more | C |
| less than 0.7 | D |
| less than 0.4 | E |

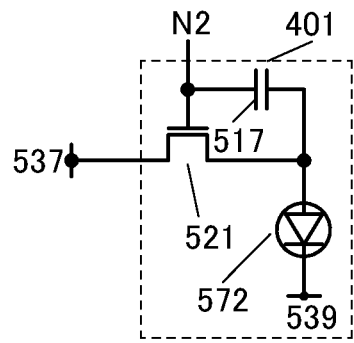
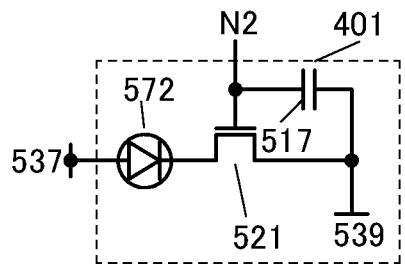
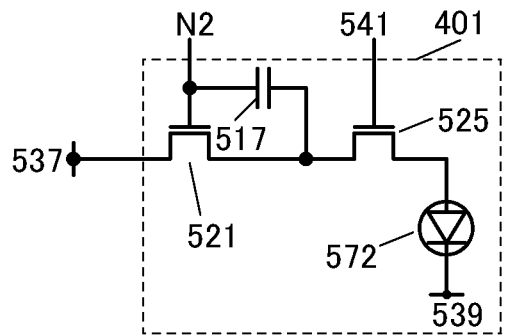
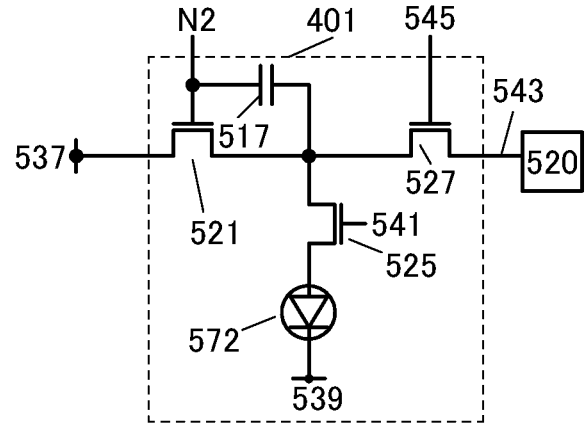
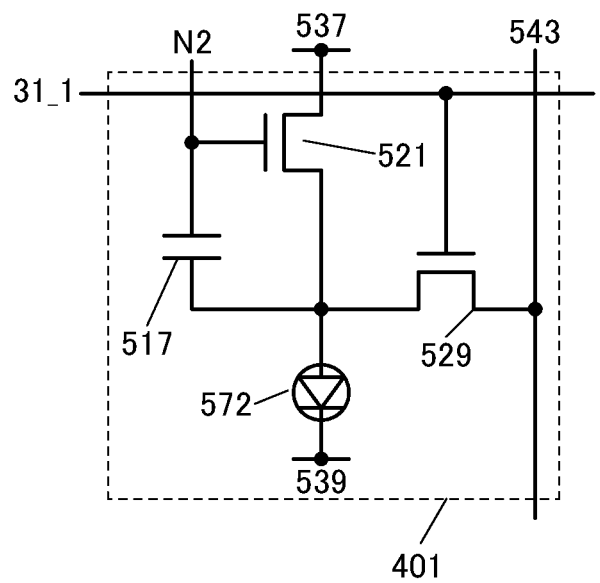

10

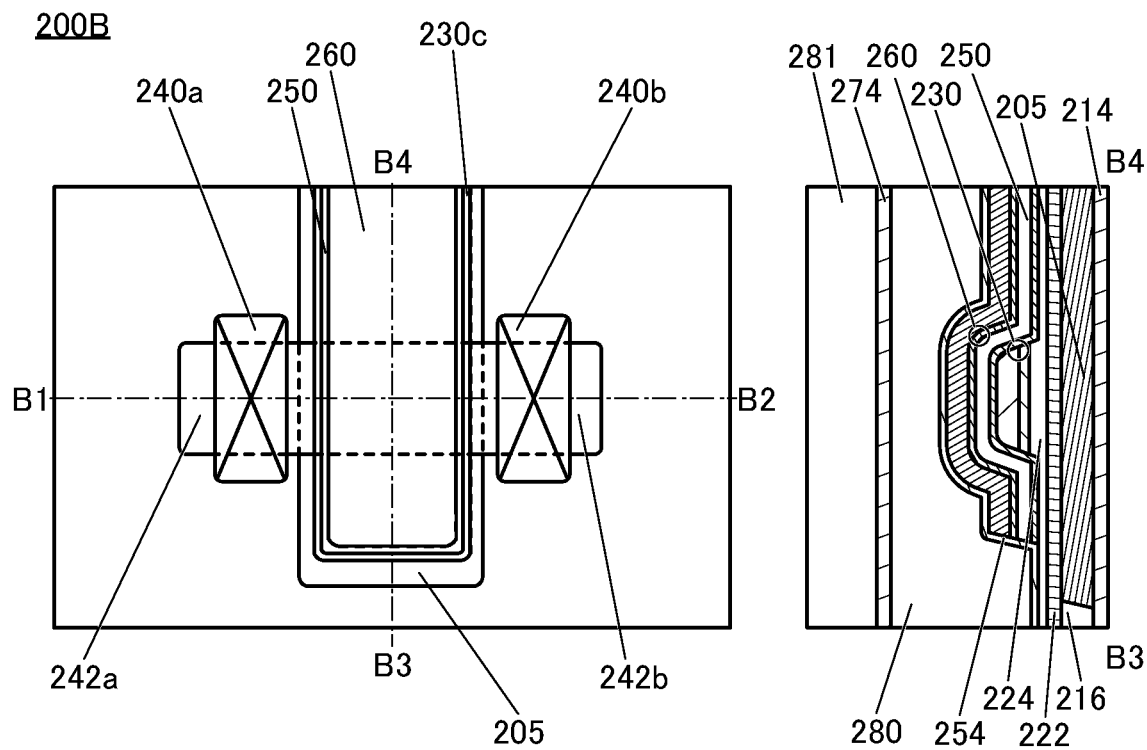
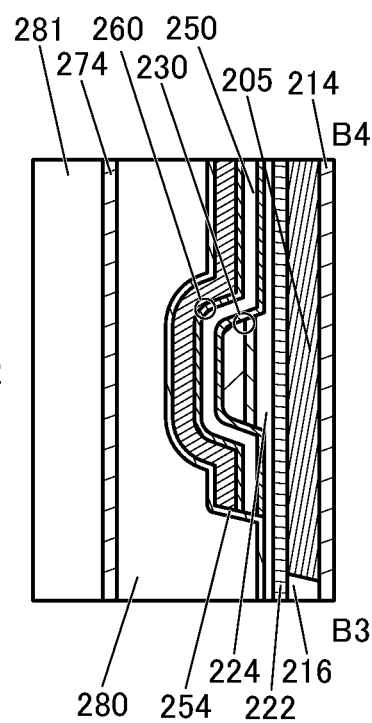
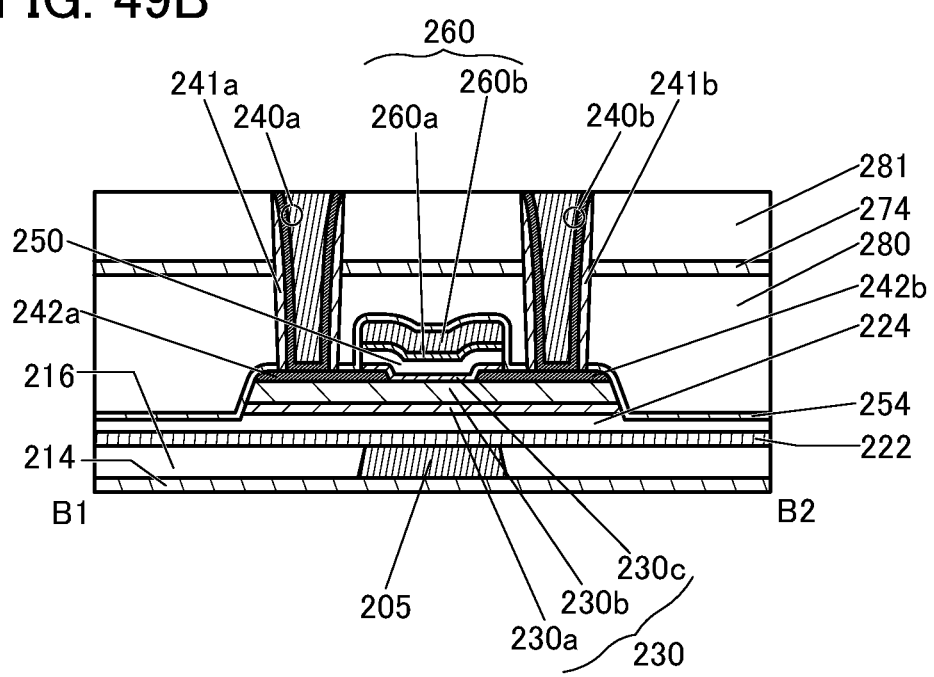
FIG. 49A
FIG. 49B
FIG. 49C

FIG. 51A
| Amorphous | Intermediate state<br>New crystalline phase<br>Crystalline | Crystal |
|---|---|---|
| • completely amorphous | • CAAC<br>• nc<br>• CAC<br>excluding single crystal and poly crystal | • single crystal<br>• poly crystal |
FIG. 51B
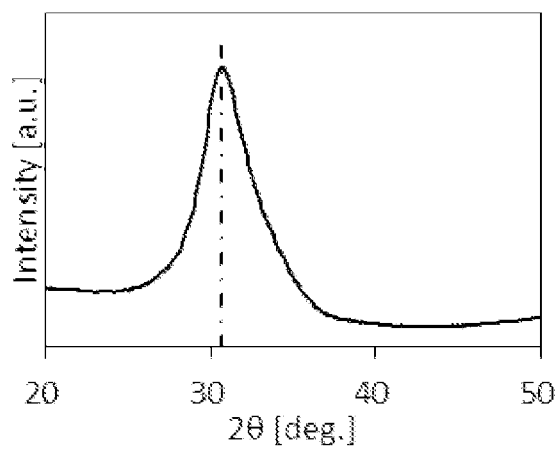
FIG. 51C
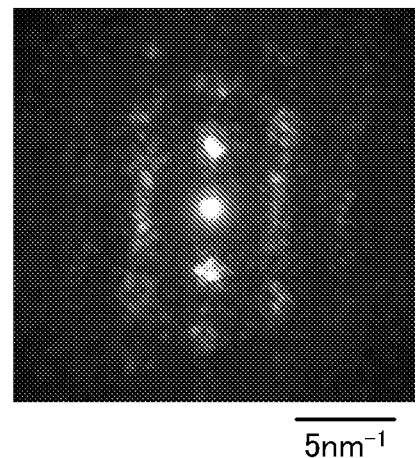

9100

9200

9101

9201

9102

9201

9201

METHOD FOR OPERATING DISPLAY DEVICE

CROSS REFERENCE TO RELATED APPLICATIONS

This application is a U.S. National Phase Application under 35 U.S.C. § 371 of International Application PCT/IB2020/057090, filed on Jul. 28, 2020, which is incorporated by reference and claims the benefit of foreign priority applications filed in Japan on Aug. 9, 2019, as Application No. 2019-147373 and on Oct. 17, 2019, as Application No. 2019-190103.

TECHNICAL FIELD

One embodiment of the present invention relates to a method for operating a display device. One embodiment of the present invention relates to a display device. One embodiment of the present invention relates to an electronic device.

Note that one embodiment of the present invention is not limited to the above technical field. Examples of the technical field of one embodiment of the present invention include a semiconductor device, a display device, a light-emitting device, a display system, an electronic device, a lighting device, an input device (e.g., a touch sensor), an input-output device (e.g., a touch panel), a driving method thereof, and a manufacturing method thereof.

Note that in this specification and the like, a semiconductor device generally means a device that can function by utilizing semiconductor characteristics. A display device (a liquid crystal display device, a light-emitting display device, and the like), a projection device, a lighting device, an electro-optical device, a power storage device, a memory device, a semiconductor circuit, an imaging device, an electronic device, and the like can sometimes be regarded as a semiconductor device. Alternatively, they can sometimes be regarded as including a semiconductor device.

BACKGROUND ART

As display devices for augmented reality (AR) or virtual reality (VR), wearable display devices and stationary display devices are becoming widespread. Examples of wearable display devices include a head-mounted display (HMD) and an eyeglass-type display device. Examples of stationary display devices include a head-up display (HUD). For example, Patent Document 1 discloses a head-mounted display that can easily take images of the user's eyes.

REFERENCE

Patent Document

[Patent Document 1] Japanese Published Patent Application No. 2019-80354

SUMMARY OF THE INVENTION

Problems to be Solved by the Invention

With a display device whose display portion is close to the user, such as an HMD, the user is likely to perceive pixels and strongly feels granularity, whereby the sense of immersion and realistic feeling of AR and VR might be diminished. Therefore, an HMD requires a display device that has so high a pixel density that pixels are not perceived by the user. For example, the pixel density is preferably higher than or equal to 1000 ppi, further preferably higher than or equal to 5000 ppi, still further preferably higher than or equal to 7000 ppi.

However, when the pixel density is high and a pixel defect such as a dot defect occurs, it is difficult to perform laser irradiation or the like on the defective pixel in order to repair the defect.

An object of one embodiment of the present invention is to provide a method for operating a display device in which a pixel defect is less likely to be perceived. Another object of one embodiment of the present invention is to provide a method for operating a display device that is capable of displaying high-quality images. Another object of one embodiment of the present invention is to provide a method for operating a display device with a high pixel density. Another object of one embodiment of the present invention is to provide a method for operating a display device that operates at high speed. Another object of one embodiment of the present invention is to provide a method for operating a display device with low power consumption. Another object of one embodiment of the present invention is to provide a novel method for operating a display device. Another object of one embodiment of the present invention is to provide a display device that operates according to the above-described operating method.

Note that the description of these objects does not preclude the existence of other objects. One embodiment of the present invention does not need to achieve all these objects. Other objects can be derived from the description of the specification, the drawings, and the claims.

Means for Solving the Problems

One embodiment of the present invention is a method for operating a display device including a display portion and a sensor portion, wherein the display portion includes a matrix of pixels in m rows by n columns (m and n are each an integer greater than or equal to 2), and the sensor portion includes a photoelectric conversion element. In the method for operating the display device, the display portion is divided into a first region and a second region; first light is emitted from the pixel included in the first region, and a luminance of the first light is detected by the photoelectric conversion element; second light is emitted from the pixel included in the second region, and a luminance of the second light is detected by the photoelectric conversion element; the luminance of the first light and the luminance of the second light are compared to each other; one of the first region and the second region is divided into a third region and a fourth region on the basis of a result of the comparison; third light is emitted from the pixel included in the third region, and a luminance of the third light is detected by the photoelectric conversion element; fourth light is emitted from the pixel included in the fourth region, and a luminance of the fourth light is detected by the photoelectric conversion element; the luminance of the third light and the luminance of the fourth light are compared to each other; and a defective pixel that is the pixel having a defect is detected.

In the above embodiment, image data may be generated, and fifth light that is light having a luminance obtained by correcting a luminance represented by the image data on the basis of a result of detecting the defective pixel may be emitted from the pixel.

Another embodiment of the present invention is a method for operating a display device including a display portion and a sensor portion, wherein the display portion includes a matrix of pixels in m rows by n columns (m and n are each an integer greater than or equal to 2), and the sensor portion includes a photoelectric conversion element. In the method for operating the display device, the display portion is divided into first to p-th regions (p is an integer greater than or equal to 2 and less than or equal to m×n/2); first to p-th light are emitted from the pixels included in the first to p-th regions, and luminances of the first to p-th light are detected by the photoelectric conversion element; the luminances of the first to p-th light are compared; a (p+1)th region including at least one of the first to p-th regions is divided into (p+2)th to q-th regions (q is an integer greater than or equal to p+3 and less than or equal to m×n+p+1) on the basis of results of the comparison; (p+1)th to (q−1)th light are emitted from the pixels included in the (p+2)th to q-th regions, and luminances of the (p+1)th to (q−1)th light are detected by the photoelectric conversion element; the luminances of the (p+1)th to (q−1)th light are compared; and a defective pixel that is the pixel having a defect is detected.

In the above embodiment, image data may be generated, and q-th light that is light having a luminance obtained by correcting a luminance represented by the image data on the basis of a result of detecting the defective pixel may be emitted from the pixel.

In the above embodiment, the correction may be performed using a neural network.

In the above embodiment, learning of the neural network is performed using learning-purpose image data and learning-purpose defective pixel coordinate data corresponding to the learning-purpose image data, as learning data.

In the above embodiment, a first layer and a second layer may be provided to be stacked in the display device. The first layer may include a gate driver circuit and a data driver circuit. The second layer may include the display portion and the sensor portion. The gate driver circuit and the data driver circuit may include a region overlapped by the pixel provided in the display portion. The gate driver circuit and the data driver circuit may include an overlap region.

In the above embodiment, the pixel may include a transistor containing a metal oxide in a channel formation region. The metal oxide may contain at least one of In and Zn.

Effect of the Invention

According to one embodiment of the present invention, a method for operating a display device in which a pixel defect is less likely to be perceived can be provided. According to one embodiment of the present invention, a method for operating a display device that is capable of displaying high-quality images can be provided. According to one embodiment of the present invention, a method for operating a display device with a high pixel density can be provided. According to one embodiment of the present invention, a method for operating a display device that operates at high speed can be provided. According to one embodiment of the present invention, a method for operating a display device with low power consumption can be provided. According to one embodiment of the present invention, a novel method for operating a display device can be provided. According to one embodiment of the present invention, a display device that operates according to the above-described operating method can be provided.

Note that the description of these effects does not preclude the existence of other effects. One embodiment of the present invention does not need to have all these effects. Other effects can be derived from the description of the specification, the drawings, and the claims.

BRIEF DESCRIPTION OF THE DRAWINGS

FIG. 2A1, FIG. 2A2, FIG. 2B1, FIG. 2B2, FIG. 2C1, FIG. 2C2, FIG. 2D1, and FIG. 2D2 are diagrams illustrating examples of operation of a display device.

FIG. 12A to FIG. 12C are diagrams illustrating Judgment table 1, Judgment table 2, and an example of alarm display, respectively.

FIG. 30A to FIG. 30E are circuit diagrams illustrating structure examples of a pixel.

FIG. 49A is a top view illustrating a structure example of a transistor. FIG. 49B and FIG. 49C are cross-sectional views illustrating the structure example of the transistor.

FIG. 51A is a diagram showing the classification of crystal structures of IGZO. FIG. 51B is a graph showing an XRD spectrum of a CAAC-IGZO film. FIG. 51C is an image showing a nanobeam electron diffraction pattern of a CAAC-IGZO film.

MODE FOR CARRYING OUT THE INVENTION

Figure 1A:
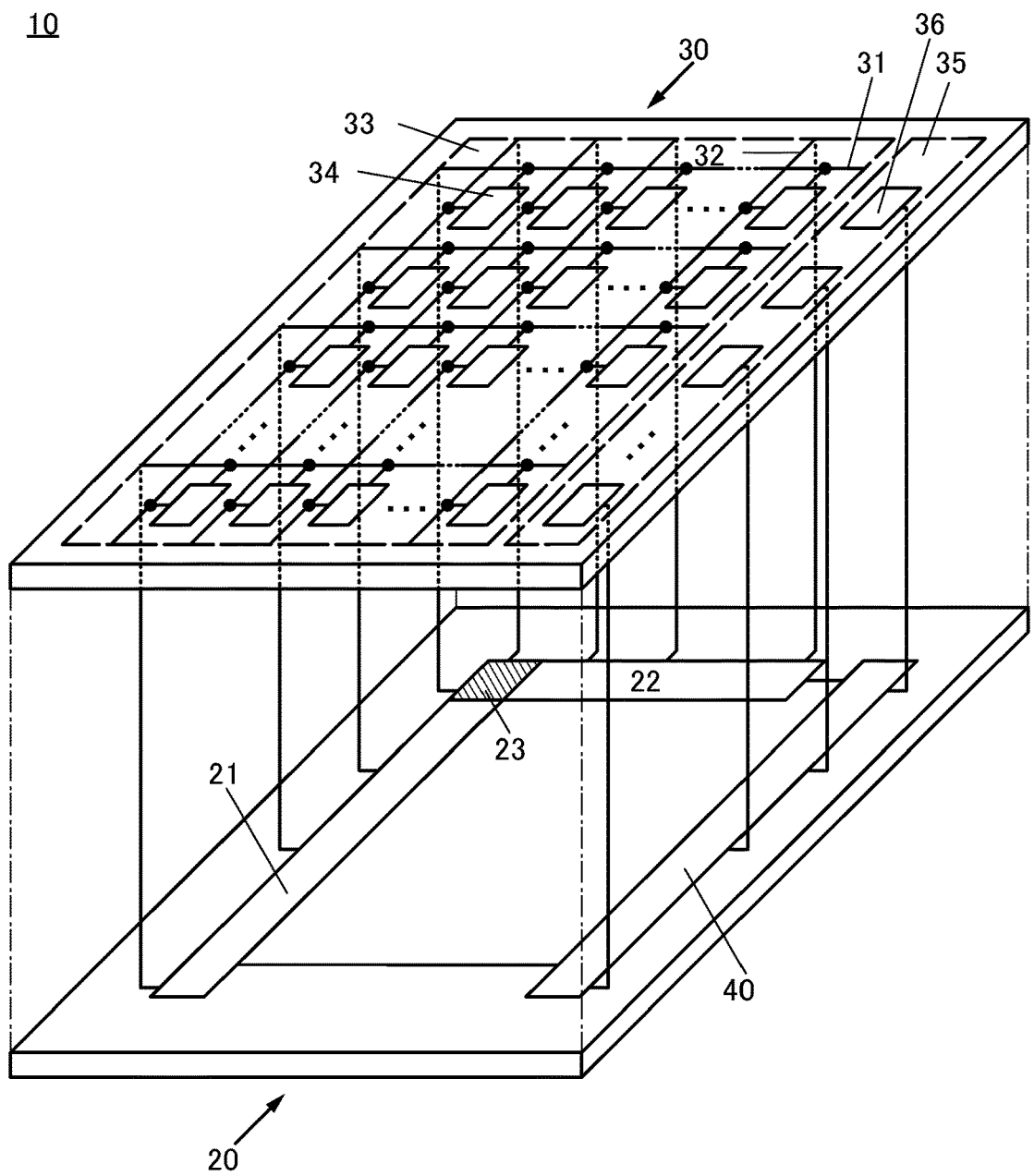
FIG. 1A is a block diagram illustrating a structure example of a display device.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

In this specification and the like, the terms "electrode," "wiring," and "terminal" do not functionally limit those components. For example, an "electrode" is used as part of a "wiring" in some cases, and vice versa. Furthermore, the term "electrode" or "wiring" can also mean the case where a plurality of "electrodes" or "wirings" are formed in an integrated manner, for example. For example, a "terminal" is used as part of a "wiring" or an "electrode" in some cases, and vice versa. Furthermore, the term "terminal" can also mean the case where a plurality of "electrodes," "wirings," "terminals," or the like are formed in an integrated manner, for example. Therefore, for example, an "electrode" can be part of a "wiring" or a "terminal", and a "terminal" can be part of a "wiring" or an "electrode". Moreover, the terms "electrode", "wiring", and "terminal" can sometimes be replaced with the term "region" depending on the case, for example.

In this specification and the like, the resistance value of a "resistor" is sometimes determined depending on the length of a wiring. Alternatively, the resistance value is sometimes determined by connection to a conductor with resistivity different from that of a conductor used for a wiring. Alternatively, the resistance value is sometimes determined by doping a semiconductor with an impurity.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection is made and a wiring just extends in an actual circuit. In addition, the expression "directly connected" includes the case where different conductors are connected to each other through a contact. Note that a wiring may be formed of conductors that contain one or more of the same elements or may be formed of conductors that contain different elements.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS FET can also be called a transistor including a metal oxide or an oxide semiconductor.

Furthermore, in this specification and the like, a metal oxide containing nitrogen is also collectively referred to as a metal oxide in some cases. A metal oxide containing nitrogen may be referred to as a metal oxynitride.

Embodiment 1

In this embodiment, a display device of one embodiment of the present invention and an operating method therefor will be described with reference to drawings.

One embodiment of the present invention relates to a method for detecting a defective pixel among pixels provided in a display portion included in a display device. One embodiment of the present invention also relates to a method for correcting an image to be displayed by the display device in accordance with the coordinates of the detected defective pixel.

In this specification, the term "defective pixel" refers to, among pixels provided with display elements, a pixel that is always in a display state or a non-display state or a pixel in a state unable to control a display element properly. A defective pixel is caused because of a short circuit between the two electrodes of a display element, a short circuit between wirings, a short circuit between an electrode of a display element and a wiring, or malfunction of a transistor connected to a display element, for example.

Here, a pixel that is in a "constant display" state indicates a pixel that constantly emit light. A pixel that is in a "constant display" state can be referred to as a "white defective pixel", for example. In addition, a pixel that is in a "constant non-display" state indicates a pixel that does not emit light even when an image is displayed on a display portion, i.e., even when pixels other than a defective pixel emit light. A pixel that is in a "constant non-display" state can be referred to as a "black defective pixel", for example.

Structure Example 1 of Display Device

FIG. 1A is a block diagram illustrating a structure example of a display device 10 that is the display device of one embodiment of the present invention. The display device 10 includes a layer 20 and a layer 30 stacked over the layer 20. The layer 20 includes a gate driver circuit 21, a data driver circuit 22, and a functional circuit 40. The layer 30 includes a display portion 33 in which pixels 34 are arranged in a matrix, and a sensor portion 35 in which pixels 36 are arranged. An interlayer insulator can be provided between the layer 20 and the layer 30.

Figure 1B:
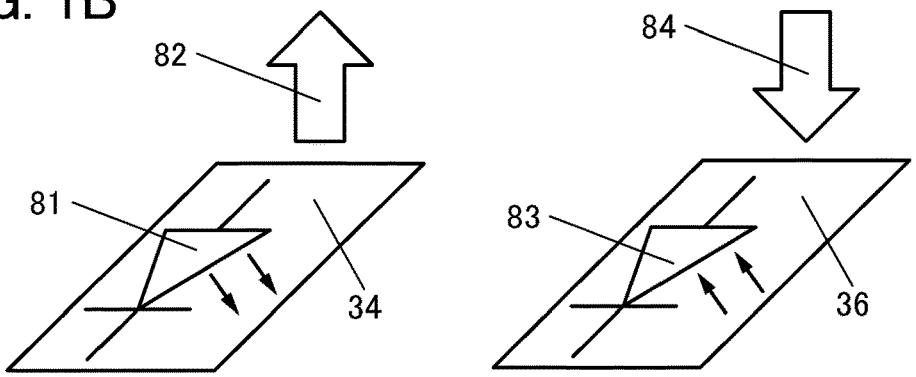
FIG. 1B is a diagram illustrating a structure example of pixels.

Here, as illustrated in FIG. 1B, the pixel 34 includes a display element 81, and light 82 is emitted from the display element 81. Accordingly, an image can be displayed on the display portion 33. The pixel 36 includes a photoelectric conversion element 83. The photoelectric conversion element 83 has a function of detecting luminance of light 84 incident on the photoelectric conversion element 83. Thus, providing the photoelectric conversion element 83 in the sensor portion 35 enables detection of luminance of light delivered to the sensor portion 35.

Any of a variety of elements can be used as the display element 81, and typically, a light-emitting element such as an organic light-emitting element or an LED element, a liquid crystal element, a MEMS (Micro Electro Mechanical Systems) element, or the like can be used.

The functional circuit 40 is electrically connected to the gate driver circuit 21, the data driver circuit 22, and the pixels 36.

The pixels 34 in the same row are electrically connected to the gate driver circuit 21 through a wiring 31, and the pixels 34 in the same column are electrically connected to the data driver circuit 22 through a wiring 32.

Although FIG. 1A illustrates the structure in which the pixels 34 in one row are electrically connected through one wiring 31 and the pixels 34 in one column are electrically connected through one wiring 32, one embodiment of the present invention is not limited thereto. For example, the pixels 34 in one row may be electrically connected through two or more wirings 31, or the pixels 34 in one column may be electrically connected through two or more wirings 32. Alternatively, for example, one wiring 31 may be electrically connected to the pixels 34 in two or more rows, or one wiring 32 may be electrically connected to the pixels 34 in two or more columns. That is, for example, one wiring 31 may be shared by the pixels 34 in two or more rows, or one wiring 32 may be shared by the pixels 34 in two or more columns.

The functional circuit 40 has a function of performing processing necessary for making the display device 10 achieve a desired function. For example, the functional circuit 40 has a function of generating image data that is data representing luminance of light emitted from each of the pixels 34 provided in the display portion 33. Moreover, the functional circuit 40 has a function of correcting the generated image data by a method of one embodiment of the present invention. For example, the functional circuit 40 has a function of correcting image data on the basis of luminance of light delivered to the sensor portion 35.

The functional circuit 40 has a function of performing processing using machine learning described below. For example, the functional circuit 40 has a function of performing processing using a neural network. The functional circuit 40 has a function of correcting image data on the basis of inference results obtained by machine learning, for example.

The functional circuit 40 has a function of controlling the operation of the circuits included in the display device 10. For example, the functional circuit 40 has a function of generating a start pulse signal, a clock signal, and the like. Thus, the functional circuit 40 can be regarded as including a control circuit. The control circuit can be configured to include a CPU (Central Processing Unit), a GPU (Graphics Processing Unit), or the like.

Furthermore, the functional circuit 40 has a function of storing a program or the like for controlling the operation of the display device 10. The functional circuit 40 may have a function of storing image data generated by the functional circuit 40. Thus, the functional circuit 40 can be regarded as including a memory circuit. The memory circuit includes at least one of a volatile memory and a nonvolatile memory. For example, the memory circuit may include a volatile memory such as a DRAM or an SRAM. For example, the memory circuit may include a nonvolatile memory such as an ReRAM (Resistive Random Access Memory), a PRAM (Phase change Random Access Memory), an FeRAM (Ferroelectric Random Access Memory), an MRAM (Magnetoresistive Random Access Memory), or a flash memory (including a NAND flash memory and a NOR flash memory).

The gate driver circuit 21 has a function of generating a signal for controlling the operation of the pixel 34 and supplying the signal to the pixel 34 through the wiring 31. Here, the gate driver circuit 21 has a function of supplying the signal to the pixels 34 sequentially from the first row, for example. Thus, the wiring 31 can be regarded as having a function of a scan line.

The data driver circuit 22 has a function of supplying image data output from the functional circuit 40 to the pixel 34. Accordingly, the wiring 32 can be regarded as having a function of a data line. Specifically, the data driver circuit 22 has a function of converting digital image data output from the functional circuit 40 into analog image data and supplying the analog image data to the pixel 34. Thus, light whose luminance corresponds to the image data is emitted from the pixels 34, whereby an image can be displayed on the display portion 33.

In the display device 10, the gate driver circuit 21 and the data driver circuit 22, which are provided in the layer 20, each have a region overlapped by the display portion 33. For example, the gate driver circuit 21 and the data driver circuit 22 each have a region overlapped by some of the pixels 34. Stacking the gate driver circuit 21 and the data driver circuit 22 with the display portion 33 to have an overlap region allows the display device 10 to have a narrower frame and a smaller size.

The gate driver circuit 21 and the data driver circuit 22 have a region where they are not strictly separated from each other and overlap each other. The region is referred to as a region 23. With the region 23 included in the gate driver circuit 21 and the data driver circuit 22, the area occupied by the gate driver circuit 21 and the data driver circuit 22 can be reduced. Thus, even when the area of the display portion 33 is small, the gate driver circuit 21 and the data driver circuit 22 can be provided without extending beyond the display portion 33. Alternatively, the area of the region where the gate driver circuit 21 and the data driver circuit 22 are not overlapped by the display portion 33 can be reduced. In the above manner, the frame and size of the display device 10 can be further reduced, compared to the structure without the region 23.

The functional circuit 40 can be provided so as not to be overlapped by the display portion 33. Note that the functional circuit 40 may be provided to have a region overlapped by the display portion 33. Moreover, the functional circuit 40 can be provided to have a region overlapped by the sensor portion 35.

As illustrated in FIG. 1A, in the display device 10, the sensor portion 35 is provided around the display portion 33. Thus, a defect, such as a dot defect, of the pixel 34 included in the display portion 33 can be detected using the sensor portion 35. That is, a defective pixel can be detected among the pixels 34 included in the display portion 33.

Information on a detected defective pixel, specifically, information on the coordinates representing the position of the defective pixel, for instance, can be held in the memory circuit included in the functional circuit 40, for example.

Example 1 of Method for Detecting Defective Pixel

An example of a method for detecting a defective pixel will be described with reference to FIG. 2A1, FIG. 2A2, FIG. 2B1, FIG. 2B2, FIG. 2C1, FIG. 2C2, FIG. 2D1, and FIG. 2D2.

Given that the display portion 33 includes pixels 34 in four rows by four columns and the pixel 34 in the second row and the second column is a black defective pixel, an example of a method for detecting the black defective pixel will be described below.

In this specification and the like, when a plurality of components are denoted by the same reference numerals and in particular need to be distinguished from each other, an identification sign such as "[m,n]", "[n]", "_1", or "_2" is sometimes added to the reference numerals. For example, the pixel 34 in the first row and the first column is referred to as a pixel 34[1,1], the pixel 34 in the second row and the second column is referred to as a pixel 34[2,2], and the pixel 34 in the fourth row and the fourth column is referred to as a pixel 34[4,4]. For example, [1,1] in the term "pixel 34[1,1]" can be regarded as the coordinates.

In FIG. 2A1 to FIG. 2D2, the pixel 34[2,2] is hatched to indicate that the pixel 34[2,2] is a defective pixel.

First, as illustrated in FIG. 2A1 and FIG. 2A2, the display portion 33 is divided into a region Ra[1] and a region Ra[2]. In FIG. 2A1, the pixels 34 in the first column and the pixels 34 in the second column are included in the region Ra[1]. In FIG. 2A2, the pixels 34 in the third column and the pixels 34 in the fourth column are included in the region Ra[2].

Next, light La[1] is emitted from the pixels 34 included in the region Ra[1], and the luminance of the light La[1] is detected. Specifically, for example, white light is emitted as the light La[1], and the luminance of the white light is detected. Note that other light illustrated in FIG. 2A1 to FIG. 2D2 can be white light like the light La[1]. The light illustrated in FIG. 2A1 to FIG. 2D2 can be detected using the sensor portion 35 illustrated in FIG. TA and the like.

In the case where light emitted from the pixels 34 is detected using the sensor portion 35, the display portion 33 and the sensor portion 35 are preferably covered with a substance having a high degree of diffuse reflection of light. For example, the display portion 33 and the sensor portion 35 are preferably covered with paper. In that case, even when the directionality of light emitted from the pixels 34 is high, the light can be efficiently incident on the sensor portion 35. Furthermore, light other than the light emitted from the pixels 34 can be inhibited from entering the sensor portion 35. Accordingly, the luminance of the light emitted from the pixels 34 can be detected with high accuracy by using the sensor portion 35.

Then, light La[2] is emitted from the pixels 34 included in the region Ra[2], and the luminance of the light La[2] is detected.

Next, the luminance of the light La[1] and the luminance of the light La[2] are compared to each other. In the case shown in FIG. 2A1 and FIG. 2A2, all the pixels 34 included in the region Ra[2] can emit white light. Meanwhile, among the pixels 34 included in the region Ra[1], the pixel 34[2,2] cannot emit white light or can only emit light whose luminance is lower than that of light emitted from the other pixels 34. Thus, the luminance of the light La[1] is lower than the luminance of the light La[2].

Accordingly, the display device 10 performs the operations shown in FIG. 2A1 and FIG. 2A2, thereby sensing that a black defective pixel is included in the region Ra[1].

Next, as illustrated in FIG. 2B1 and FIG. 2B2, the region Ra[1] is divided into a region Rb[1] and a region Rb[2]. In FIG. 2B1, the pixel 34[1,1], the pixel 34[1,2], the pixel 34[2,1], and the pixel 34[2,2] are included in the region Rb[1]. In FIG. 2B2, the pixel 34[3,1], the pixel 34[3,2], the pixel 34[4,1], and the pixel 34[4,2] are included in the region Rb[2].

Subsequently, light Lb[1] is emitted from the pixels 34 included in the region Rb[1], and the luminance of the light Lb[1] is detected. Then, light Lb[2] is emitted from the pixels 34 included in the region Rb[2], and the luminance of the light Lb[2] is detected.

Next, the luminance of the light Lb[1] and the luminance of the light Lb[2] are compared to each other. In the case shown in FIG. 2B1 and FIG. 2B2, all the pixels 34 included in the region Rb[2] can emit white light. Meanwhile, among the pixels 34 included in the region Rb[1], the pixel 34[2,2] cannot emit white light or can only emit light whose luminance is lower than that of light emitted from the other pixels 34. Thus, the luminance of the light Lb[1] is lower than the luminance of the light Lb[2].

Accordingly, the display device 10 performs the operations shown in FIG. 2B1 and FIG. 2B2, thereby sensing that a black defective pixel is included in the region Rb[1].

Next, as illustrated in FIG. 2C1 and FIG. 2C2, the region Rb[1] is divided into a region Rc[1] and a region Rc[2]. In FIG. 2C1, the pixel 34[1,1] and the pixel 34[2,1] are included in the region Rc[1]. In FIG. 2C2, the pixel 34[1,2] and the pixel 34[2,2] are included in the region Rc[2].

Subsequently, light Lc[1] is emitted from the pixels 34 included in the region Rc[1], and the luminance of the light Lc[1] is detected. Then, light Lc[2] is emitted from the pixels 34 included in the region Rc[2], and the luminance of the light Lc[2] is detected.

Next, the luminance of the light Lc[1] and the luminance of the light Lc[2] are compared to each other. In the case shown in FIG. 2C1 and FIG. 2C2, all the pixels 34 included in the region Rc[1] can emit white light. Meanwhile, among the pixels 34 included in the region Rc[2], the pixel 34[2,2] cannot emit white light or can only emit light whose luminance is lower than that of light emitted from the other pixels 34. Thus, the luminance of the light Lc[2] is lower than the luminance of the light Lc[1].

Accordingly, the display device 10 performs the operations shown in FIG. 2C1 and FIG. 2C2, thereby sensing that a black defective pixel is included in the region Rc[2].

Next, as illustrated in FIG. 2D1 and FIG. 2D2, the region Rc[2] is divided into a region Rd[1] and a region Rd[2]. In FIG. 2D1, the pixel 34[1,2] is included in the region Rd[1]. In FIG. 2D2, the pixel 34[2,2] is included in the region Rd[2].

Subsequently, light Ld[1] is emitted from the pixel 34 included in the region Rd[1], and the luminance of the light Ld[1] is detected. Then, light Ld[2] is emitted from the pixel 34 included in the region Rd[2], and the luminance of the light Ld[2] is detected.

Next, the luminance of the light Ld[1] and the luminance of the light Ld[2] are compared to each other. In the case shown in FIG. 2D1 and FIG. 2D2, the pixel 34[1,2] included in the region Rd[1] can emit white light. Meanwhile, the pixel 34[2,2] included in the region Rd[2] cannot emit white light or can only emit light whose luminance is lower than that of light emitted from the pixel 34[1,2]. Thus, the luminance of the light Ld[2] is lower than the luminance of the light Ld[1].

Accordingly, the display device 10 performs the operations shown in FIG. 2D1 and FIG. 2D2, thereby sensing that a black defective pixel is included in the region Rd[2].

By performing the above operations shown in FIG. 2A1 to FIG. 2D2, it can be sensed that the pixel 34[2,2] is a black defective pixel. Note that the above-described method for detecting a defective pixel can also be used to detect a white defective pixel. For example, when the light shown in FIG. 2A1 to FIG. 2D2 is set to black or light with a color close to black, it is possible to sense that a white defective pixel is included in a region that emits light with a higher luminance. Note that "light is set to black" means that light is not emitted, for example.

For example, in the case where the display portion 33 has the structure illustrated in FIG. 2A1 and FIG. 2A2, all the operations in FIG. 2A1 to FIG. 2D2 do not always need to be performed. For example, the operations shown in FIG. 2D1 and FIG. 2D2 are not necessarily performed. In that case, the display device 10 can detect a defective pixel at high speed. Note that in the case where the operations shown in FIGS. 2D1 and 2D2 are not performed, both the pixel 34[1,2] and the pixel 34[2,2] included in the region Rc[2] illustrated in FIG. 2C2, for example, are detected as defective pixels.

In the case where the number of pixels 34 provided in the display portion 33 is large, it takes a long time to perform the operation of detecting a defective pixel when whether the pixel 34 is a defective pixel is judged accurately, i.e., when detection of the pixel 34 that is not a defective pixel as a defective pixel is not tolerated at all. Meanwhile, when the pixel density is high, for example, when the pixel density is higher than or equal to 1000 ppi, higher than or equal to 5000 ppi, or higher than or equal to 7000 ppi, the area per pixel becomes small. Thus, the luminance per pixel of light emitted from defectless pixels 34 is decreased. Moreover, even when a defectless pixel 34 positioned around a defective pixel is detected as a defective pixel, the appearance of an image displayed on the display portion 33 is not largely affected. Accordingly, particularly when the number of pixels 34 provided in the display portion 33 is large and the pixel density is high, it is preferred that detection of the pixel 34 that is not a defective pixel as a defective pixel be tolerated to a certain degree. Consequently, even when the number of pixels 34 provided in the display portion 33 is large, the display device 10 can detect a defective pixel at high speed.

For example, in the case where one of the pixels 34 included in the region Ra[1] illustrated in FIG. 2A1 and one of the pixels 34 included in the region Ra[2] illustrated in FIG. 2A2 are defective pixels, the luminance of the light La[1] illustrated in FIG. 2A1 and the luminance of the light La[2] illustrated in FIG. 2A2 are equal to each other. In this case, first, the operations shown in FIG. 2B1 to FIG. 2D2 are performed. Thus, the defective pixel included in the region Ra[1] can be detected. Next, the operations shown in FIG. 2A1 and FIG. 2A2 are performed again. At this time, the luminance of the light La[1] and the luminance of the light La[2] are compared to each other in consideration of the detected defective pixel. For example, eight sevenths of the luminance of the light La[1] and the luminance of the light La[2] are compared to each other. Since the luminance of the light La[2] is lower than eight sevenths of the luminance of the light La[1], operations similar to the operations shown in FIG. 2B1 to FIG. 2D2 are performed on the region Ra[2] illustrated in FIG. 2A2. Thus, the defective pixel included in the region Ra[2] can be detected.

As described above, even when two or more defective pixels are included in the display portion 33, the defective pixels can be detected according to the method shown in FIG. 2A1 to FIG. 2D2.

In each of FIG. 2A1 to FIG. 2D2, the display portion 33 is divided into two regions; however, one embodiment of the present invention is not limited thereto. For example, the display portion 33 may be divided into three regions or four or more regions. For example, in the case where the display portion 33 includes a matrix of pixels 34 in m rows by n columns, the display portion 33 may be divided into p regions (p is an integer greater than or equal to 2 and less than or equal to m×n/2).

For example, in the case where the display portion 33 is divided into p regions (first to p-th regions), firstly, first light is emitted from the pixels 34 included in the first region, and the luminance of the first light is detected. Then, second light is emitted from the pixels 34 included in the second region, and the luminance of the second light is detected. In this manner, luminances up to the luminance of p-th light emitted from the pixels 34 included in the p-th region are sequentially detected.

Next, the luminances of the first to p-th light are compared, and a region including at least one of the first to p-th regions is denoted as a (p+1)th region on the basis of the comparison results. For example, a region that is determined to include a defective pixel is denoted as the (p+1)th region. After that, the (p+1)th region is divided into two or more regions. For example, the (p+1)th region is divided into (p+2)th to q-th regions (q is an integer greater than or equal to p+3 and less than or equal to m×n+p+1).

After that, (p+1)th light is emitted from the pixels 34 included in the (p+2)th region, and the luminance of the (p+1)th light is detected. Next, (p+2)th light is emitted from the pixels 34 included in the (p+3)th region, and the luminance of the (p+2)th light is detected. Then, in the case where the (p+1)th region is divided into the (p+2)th to q-th regions, for example, luminances up to the luminance of (q−1)th light emitted from the pixels 34 included in the q-th region are sequentially detected.

Subsequently, the luminances of the (p+1)th to (q−1)th light are compared, and a region including at least one of the (p+2)th to q-th regions is denoted as a (q+1)th region on the basis of the comparison results. For example, a region that is determined to include a defective pixel is denoted as the (q+1)th region.

A defective pixel can be detected by repeating the above-described operations.

Note that each region illustrated in FIG. 2A1 to FIG. 2D2 is rectangular; however, one embodiment of the present invention is not limited thereto. The region may have a checkered pattern, for instance. For example, in FIG. 2A1, a region including the pixel 34[1,1], the pixel 34[2,2], the pixel 34[1,3], the pixel 34[2,4], the pixel 34[3,1], the pixel 34[4,2], the pixel 34[3,3], and the pixel 34[4,4] may be the region Ra[1]. In FIG. 2A2, a region including the pixel 34[2,1], the pixel 34[1,2], the pixel 34[2,3], the pixel 34[1,4], the pixel 34[4,1], the pixel 34[3,2], the pixel 34[4,3], and the pixel 34[3,4] may be the region Ra[2].

The shapes of the regions illustrated in FIG. 2A1 to FIG. 2D2, i.e., the pixels 34 included in the regions illustrated in FIG. 2A1 to FIG. 2D2 may be determined using machine learning. In the case where the shapes of the regions illustrated in FIG. 2A1 to FIG. 2D2 are determined by machine learning, data indicating the coordinates of defective pixels caused in display devices manufactured in the same process as the display device 10 can be used as learning data.

The shapes of the regions illustrated in FIG. 2A1 to FIG. 2D2 may be determined by reinforcement learning using a neural network. In the case where the shapes are determined by reinforcement learning, a reward can be higher as the time taken for detection of a defective pixel is shorter, for example.

When the shapes of the regions illustrated in FIG. 2A1 to FIG. 2D2 are determined using machine learning, the shapes can be optimized. For example, in the case where the manufacturing process or the like of the display device 10 causes an imbalance of regions where a defective pixel is likely to occur, the shapes of the regions can be determined so that the region where a defective pixel is likely to occur can be intensively subjected to examination (e.g., comparison between luminances of light emitted from the pixels 34). Thus, a defective pixel can be detected at high speed and with high accuracy.

Example of Method for Correcting Image

An example of a method for correcting an image displayed on the display portion 33 on the basis of detection results of a defective pixel will be described with reference to FIG. 3A to FIG. 3C. Specifically, the description will be made on an example of a method for correcting image data generated by the functional circuit 40 illustrated in FIG. 1A and the like on the basis of the coordinates of a detected defective pixel. The pixels 34 emit light with luminance represented by the corrected image data, whereby a corrected image can be displayed on the display portion 33.

An image to be displayed on the display portion 33 can be corrected using machine learning, for example, using a neural network. Correcting an image to be displayed on the display portion 33 with the use of a neural network is preferable, in which case high-accuracy correction can be performed to de-emphasize a defect of the pixel 34 without creating a specific algorithm for correction, and thus a high-quality image can be displayed on the display portion 33. FIG. 3A to FIG. 3C illustrate an example of a method for correcting an image displayed on the display portion 33 with the use of machine learning.

[Learning]

Figure 3A:
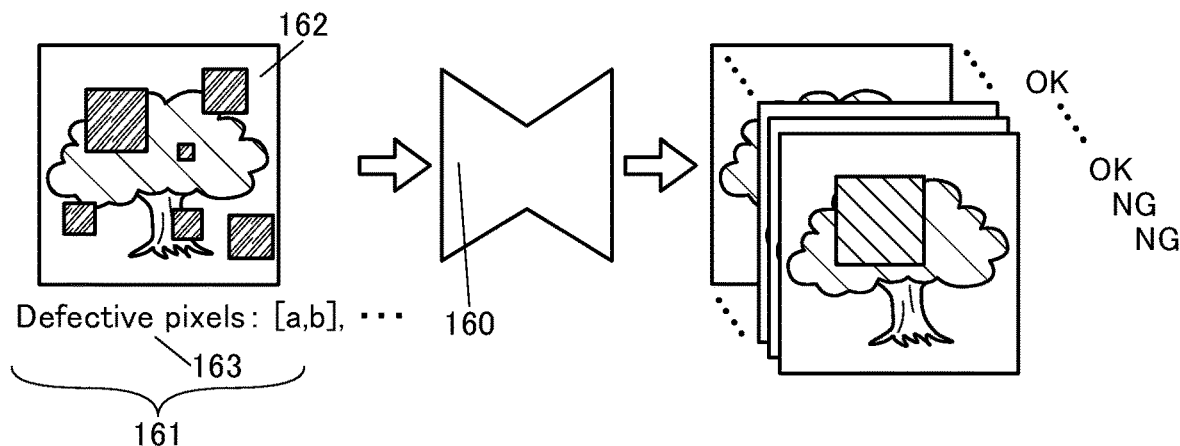
FIG. 3A to FIG. 3C are diagrams illustrating examples of operation of a display device.
Figure 3B:
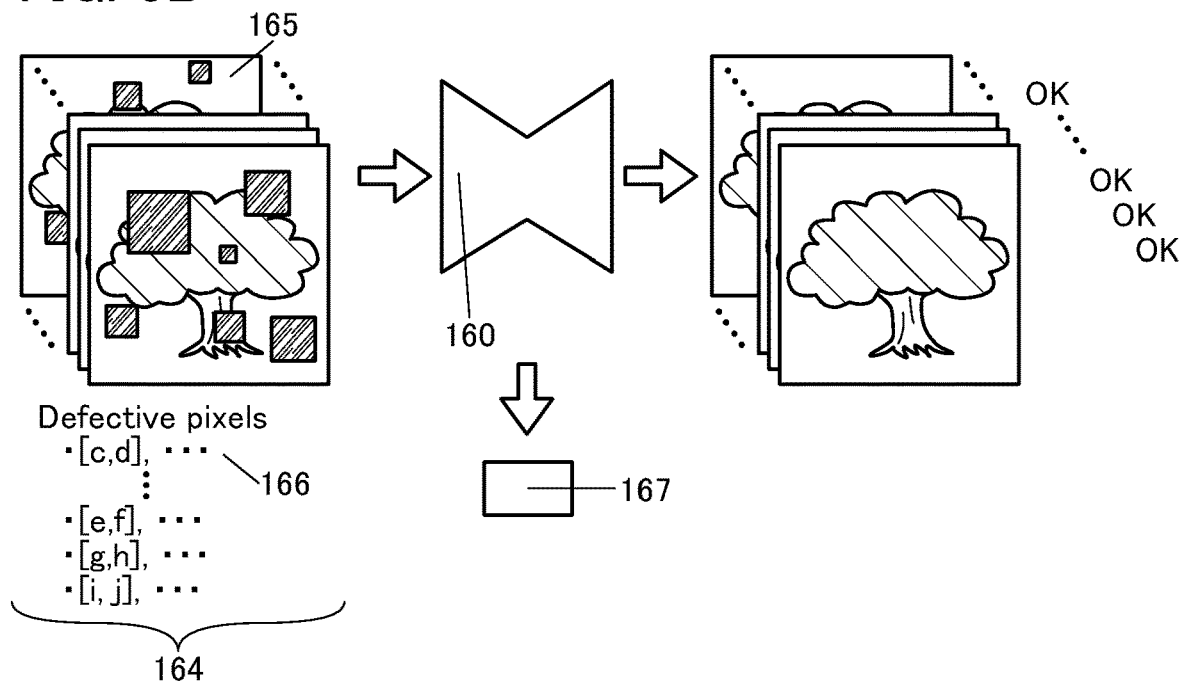

FIG. 3A and FIG. 3B are diagrams illustrating an example of a learning method. The learning can be performed using learning data 161 and a generator 160.

The generator 160 can be a program using a neural network and can generate an image corresponding to input data. Examples of the generator 160 include an Autoencoder (AE) and a Convolutional Autoencoder (CAE). Alternatively, as the generator 160, a model utilizing GAN (Generative Adversarial Networks), such as DCGAN (Deep Convolutional Generative Adversarial Networks), may be used.

The learning data 161 includes learning-purpose image data 162 representing images including defects and learning-purpose defective pixel coordinate data 163 representing the coordinates of the position of the defects. As illustrated in FIG. 3A, when the learning data 161 is input to the generator 160, images in which defects have been corrected are output. For example, a plurality of images with different correction patterns can be output. Then, each of the output images is judged whether correction has been performed accurately. For example, whether correction has been performed so that a defect is inconspicuous is judged. The judgment can be performed visually, for example. In FIG. 3A and FIG. 3B, "OK" indicates a judgment that correction has been performed accurately, and "NG" indicates a judgment that correction has not been performed accurately. Here, when the learning-purpose defective pixel coordinate data 163 is included in the learning data 161, the luminance of light emitted from pixels around a defective pixel can be corrected with priority. Thus, high-accuracy correction can be performed to de-emphasize a defect, and a high-quality image can be displayed on the display portion 33.

By repeating the operations shown in FIG. 3A, the generator 160 becomes able to accurately correct image data input to the generator 160. The learning-purpose image data 162 and the learning-purpose defective pixel coordinate data 163 included in the learning data 161 are each one kind in FIG. 3A, but may each be two or more kinds.

Next, a test is performed to judge whether the learning has been performed sufficiently. As illustrated in FIG. 3B, when test data 164 including test-purpose image data 165 and test-purpose defective pixel coordinate data 166 is input to the generator 160, images that have been corrected based on the learning results are output. Then, each of the output images is judged whether correction has been performed accurately. When the proportion of images that have been corrected accurately is higher than or equal to a certain value, the learning is judged to have been performed sufficiently and ends, and a learning result 167 is retained. The learning result 167 can be retained in the memory circuit included in the functional circuit 40, for example. On the other hand, when the proportion of images that have been corrected accurately is lower than the certain value, the learning is judged to have been insufficient, and the learning shown in FIG. 3A is performed again. The above is one example of a learning method. Note that when the generator 160 is a program using a neural network, the learning result 167 can be a weight coefficient.

[Inference]

Figure 3C:
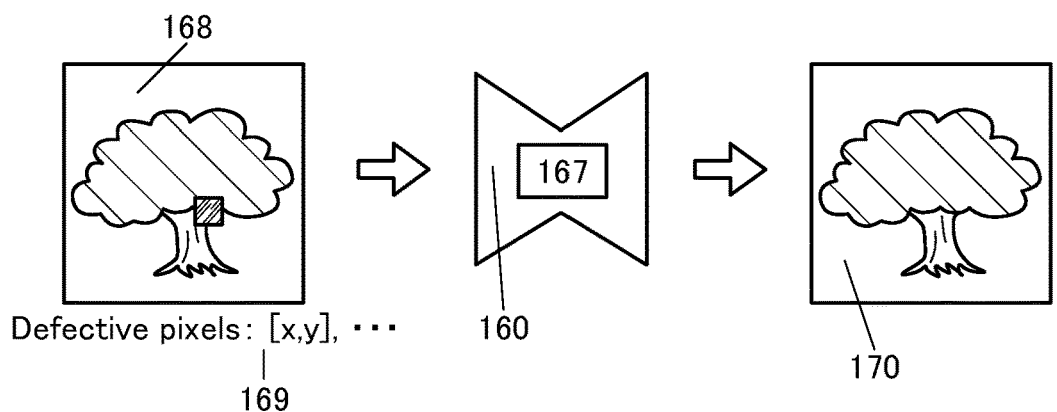

FIG. 3C is a diagram illustrating an example of an inference method, specifically, a method for correcting image data generated by the functional circuit 40 so that a defect is inconspicuous when an image is displayed on the display portion 33, for instance.

As illustrated in FIG. 3C, image data 168 and defective pixel coordinate data 169 representing the coordinates of the position of the detected defective pixel are input to the learned generator 160. Thus, image data 170 representing the corrected image is output from the generator 160. The generator 160 is in a state where the learning result 167 obtained by the prior learning has been loaded. The generator 160 in which the learning result 167 has been loaded can correct the image data 168 such that a defect can be inconspicuous, for example.

The above is an example of a method for correcting image data generated by the functional circuit 40.

Examples of Position where Sensor Portion is Placed

Figure 4A:
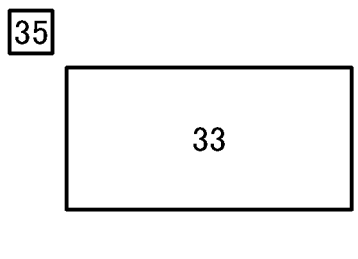
FIG. 4A to FIG. 4H are block diagrams illustrating structure examples of a display device.
Figure 4B:
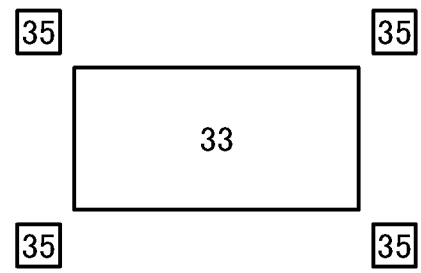
Figure 4C:
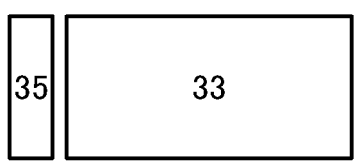
Figure 4D:
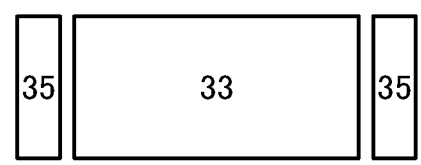
Figure 4E:
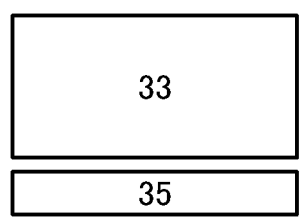
Figure 4F:
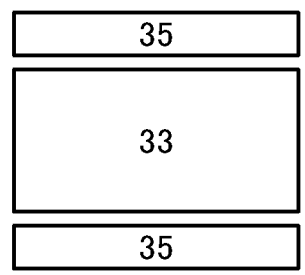
Figure 4G:
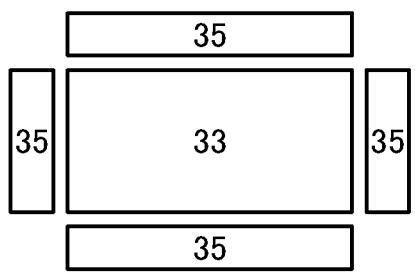
Figure 4H:
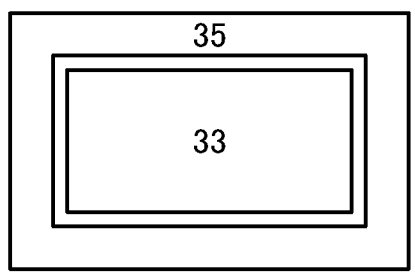

FIG. 4A to FIG. 4H are diagrams illustrating examples of the position where the sensor portion 35 is placed. As illustrated in FIG. 4A, the sensor portion 35 may be placed on the upper left of the display portion 33. Alternatively, the sensor portion 35 may be placed on the lower left, upper right, or lower right of the display portion 33. As illustrated in FIG. 4B, the sensor portion 35 may be placed on all the upper left, lower left, upper right, and lower right of the display portion 33. As illustrated in FIG. 4C, the sensor portion 35 may be placed on the left side of the display portion 33. Alternatively, the sensor portion 35 may be placed on the right side of the display portion 33. As illustrated in FIG. 4D, the sensor portion 35 may be placed on the left and right of the display portion 33. As illustrated in FIG. 4E, the sensor portion 35 may be placed on the bottom side of the display portion 33. Alternatively, the sensor portion 35 may be placed on the top side of the display portion 33. As illustrated in FIG. 4F, the sensor portion 35 may be placed on the top and bottom of the display portion 33. As illustrated in FIG. 4G, the sensor portion 35 may be placed on the top, bottom, left, and right of the display portion 33. As illustrated in FIG. 4H, the sensor portion 35 may be placed so as to surround the display portion 33.

Example 2 of Method for Detecting Defective Pixel

In the case where the display device 10 includes a plurality of sensor portions 35, the luminance of light emitted from the pixel 34 at the time of detecting a defective pixel included in the display portion 33 is preferably detected by a different sensor portion 35 depending on the position of a region including the pixel 34. FIG. 5A, FIG. 5B, FIG. 6A, FIG. 6B, FIG. 7A, FIG. 7B, FIG. 8A, and FIG. 8B are diagrams illustrating an example of a method for detecting a defective pixel included in the display portion 33 in the case where the sensor portion 35 is provided on the top, bottom, left, and right of the display portion 33 as illustrated in FIG. 4G. In FIG. 5A to FIG. 8B, the sensor portion 35 provided on the top side of the display portion 33 is referred to as a sensor portion 35T; the sensor portion 35 provided on the bottom side of the display portion 33 is referred to as a sensor portion 35B; the sensor portion 35 provided on the left side of the display portion 33 is referred to as a sensor portion 35L; and the sensor portion 35 provided on the right side of the display portion 33 is referred to as a sensor portion 35R.

As in the case shown in FIG. 2A1 to FIG. 2D2, FIG. 5A to FIG. 8B show the case where the display portion 33 includes the pixel 34[1,1] to the pixel 34[4,4] and the pixel 34[2,2] is a defective pixel. Here, the pixel 34[2,2] is hatched to indicate that the pixel 34[2,2] is a defective pixel.

Figure 5A:
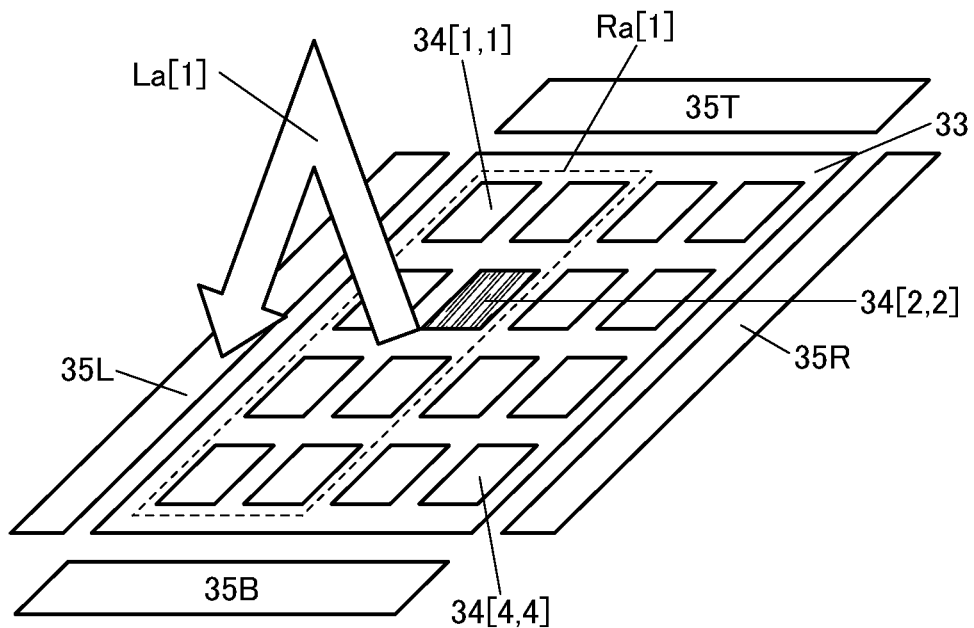
FIG. 5A and FIG. 5B are diagrams illustrating examples of operation of a display device.
Figure 6A:
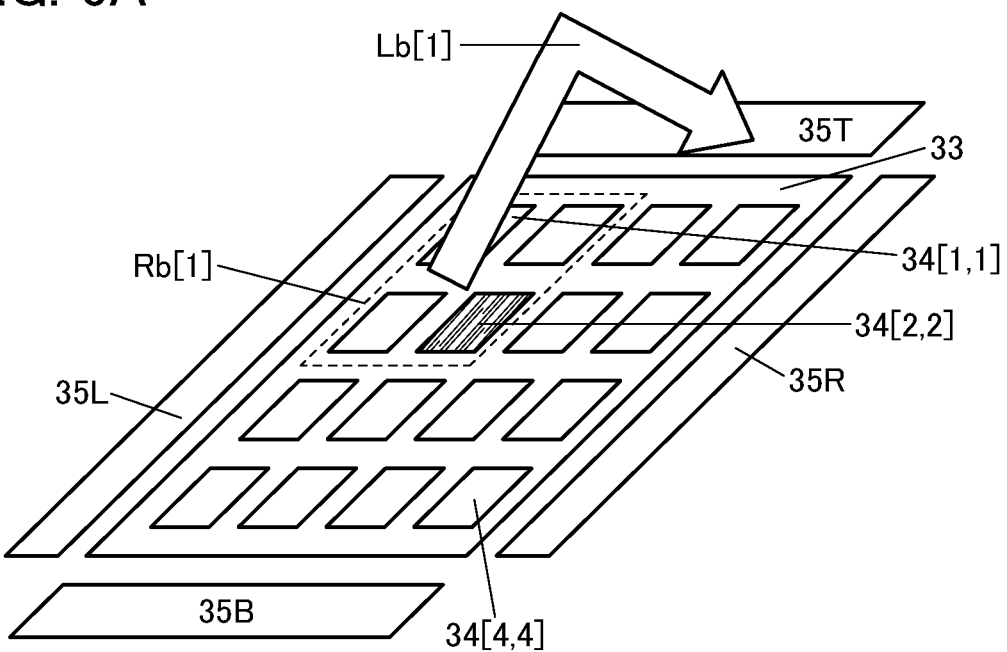
FIG. 6A and FIG. 6B are diagrams illustrating examples of operation of a display device.
Figure 6B:
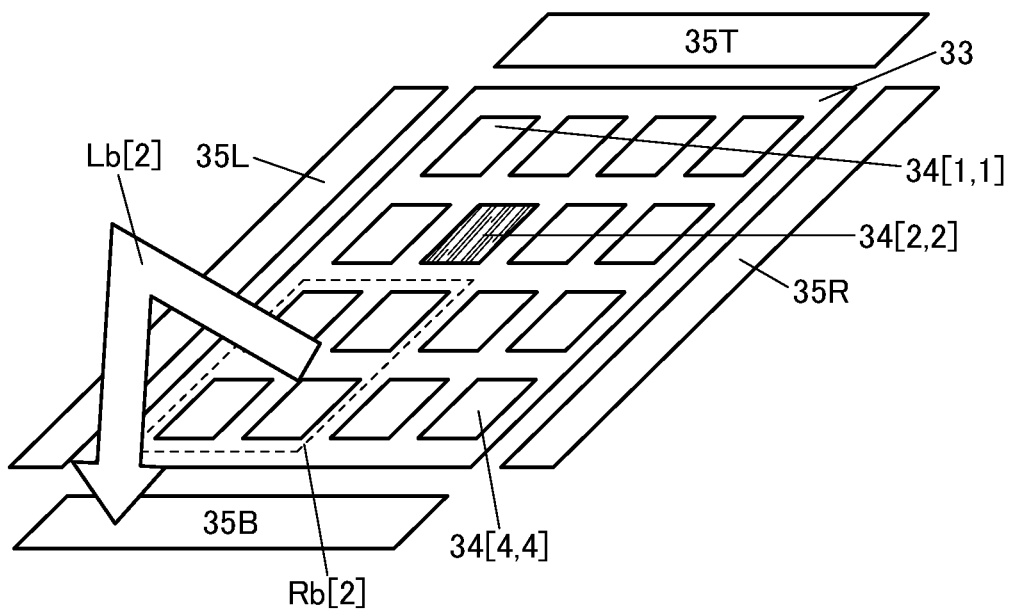
Figure 7A:
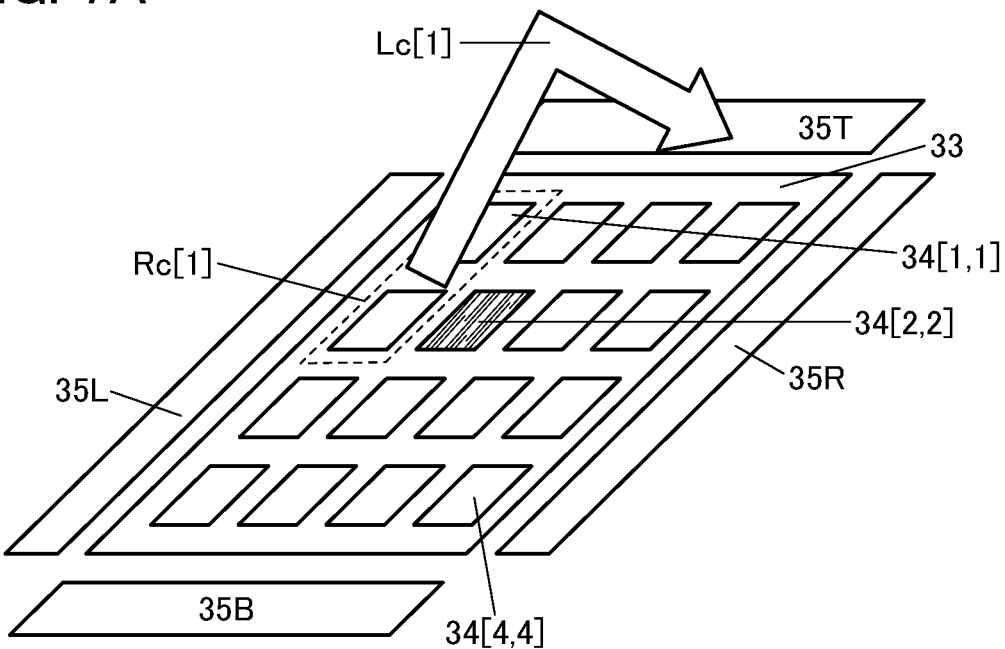
FIG. 7A and FIG. 7B are diagrams illustrating examples of operation of a display device.
Figure 7B:
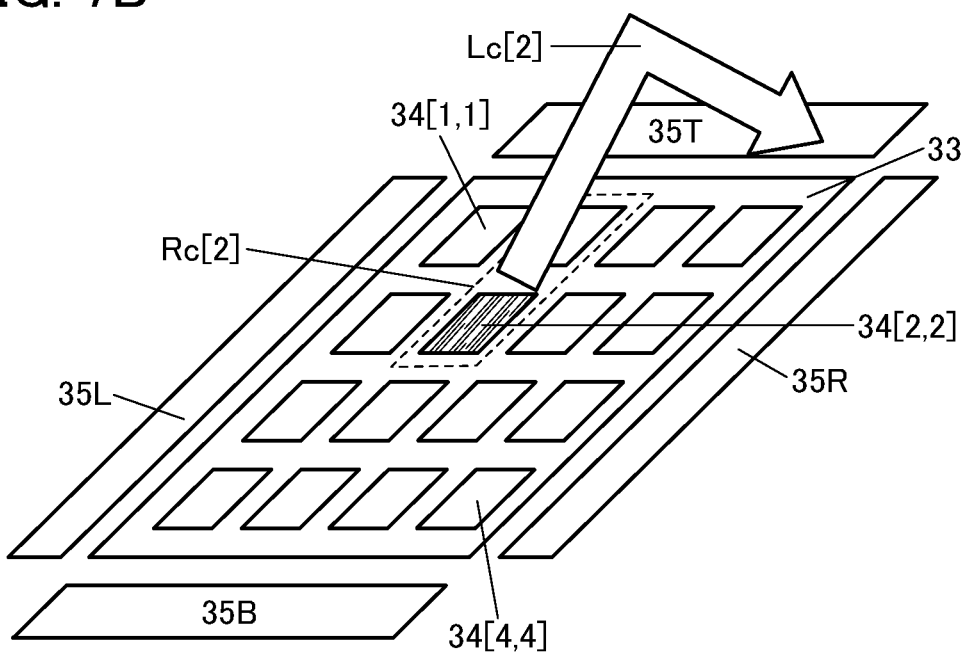
Figure 8A:
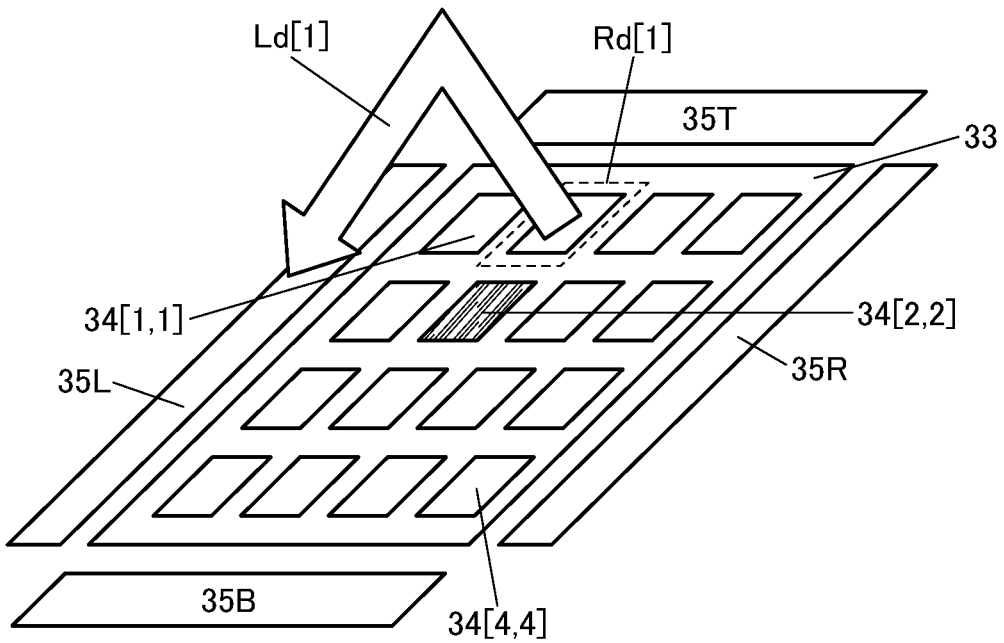
FIG. 8A and FIG. 8B are diagrams illustrating examples of operation of a display device.
Figure 8B:
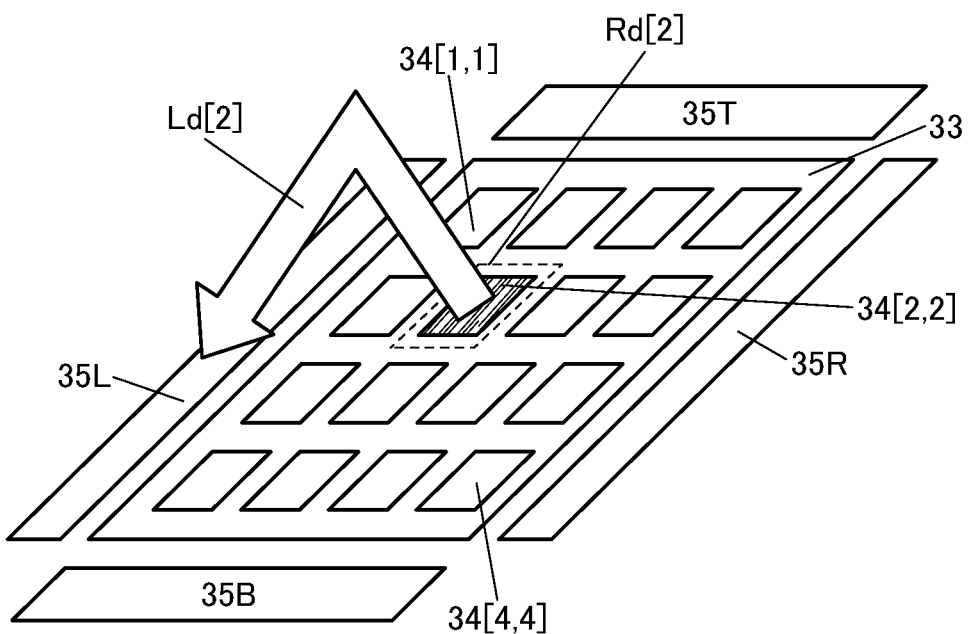

The methods illustrated in FIG. 5A to FIG. 8B can be similar to the methods illustrated in FIG. 2A1 to FIG. 2D2. Specifically, FIG. 5A and FIG. 2A1 show similar methods; FIG. 5B and FIG. 2A2 show similar methods; FIG. 6A and FIG. 2B1 show similar methods; FIG. 6B and FIG. 2B2 show similar methods; FIG. 7A and FIG. 2C1 show similar methods; FIG. 7B and FIG. 2C2 show similar methods; FIG. 8A and FIG. 2D1 show similar methods; and FIG. 8B and FIG. 2D2 show similar methods.

Figure 5B:
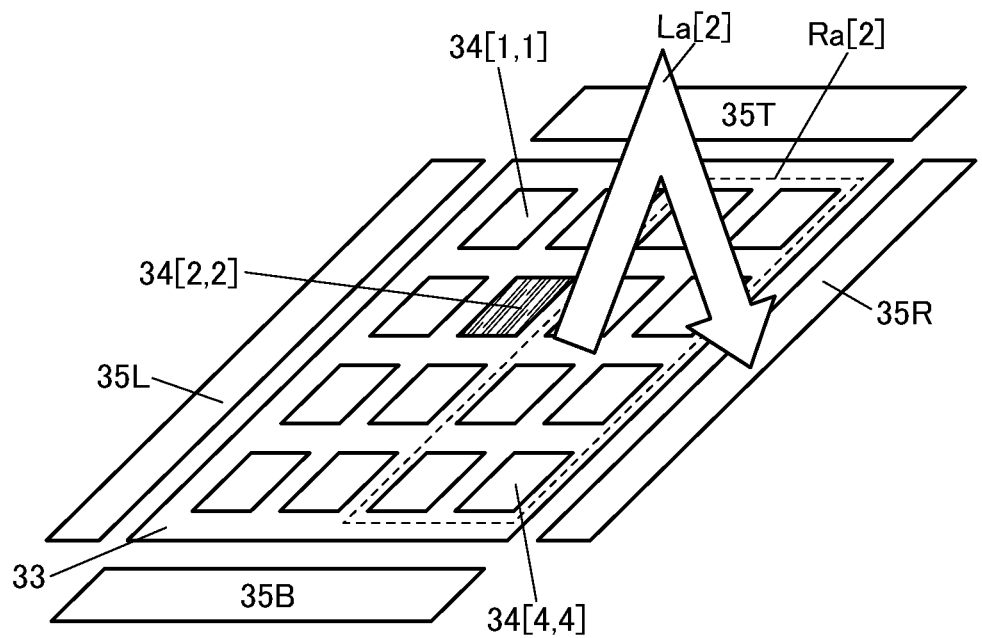

As illustrated in FIG. 5A, the luminance of the light La[1] emitted from the pixel 34 included in the region Ra[1] is preferably detected using the sensor portion 35L. As illustrated in FIG. 5B, the luminance of the light La[2] emitted from the pixel 34 included in the region Ra[2] is preferably detected using the sensor portion 35R. In that case, the distance between the pixel 34 that emits light and the sensor portion 35 that detects the light can be made close. Moreover, a difference between the distance from the sensor portion 35 that detects the luminance of the light La[1] to the region Ra[1] and the distance from the sensor portion 35 that detects the luminance of the light La[2] to the region Ra[2] can be made small. Thus, the luminance of the light La[1] and the luminance of the light La[2] can be compared with high accuracy, so that a defective pixel can be detected with high accuracy.

As illustrated in FIG. 6A, the luminance of the light Lb[1] emitted from the pixel 34 included in the region Rb[1] is preferably detected using the sensor portion 35T. As illustrated in FIG. 6B, the luminance of the light Lb[2] emitted from the pixel 34 included in the region Rb[2] is preferably detected using the sensor portion 35B. In that case, the distance between the pixel 34 that emits light and the sensor portion 35 that detects the light can be made close. Moreover, a difference between the distance from the sensor portion 35 that detects the luminance of the light Lb[1] to the region Rb[1] and the distance from the sensor portion 35 that detects the luminance of the light Lb[2] to the region Rb[2] can be made small. Thus, the luminance of the light Lb[1] and the luminance of the light Lb[2] can be compared with high accuracy, so that a defective pixel can be detected with high accuracy.

As illustrated in FIG. 7A, the luminance of the light Lc[1] emitted from the pixel 34 included in the region Rc[1] is preferably detected using the sensor portion 35T. As illustrated in FIG. 7B, the luminance of the light Lc[2] emitted from the pixel 34 included in the region Rc[2] is also preferably detected using the sensor portion 35T, as in the case of the light Lc[1]. Thus, the distance between the pixel 34 that emits light and the sensor portion 35 that detects the light can be made closer than in the case where the luminances of the light Lc[1] and the light Lc[2] are detected using the sensor portion 35B. Furthermore, a difference between the distance from the sensor portion 35 that detects the luminance of the light Lc[1] to the region Rc[1] and the distance from the sensor portion 35 that detects the luminance of the light Lc[2] to the region Rc[2] can be made smaller than in the case where the luminances of the light Lc[1] and the light Lc[2] are detected using the sensor portion 35L or the sensor portion 35R. Consequently, the luminance of the light Lc[1] and the luminance of the light Lc[2] can be compared with high accuracy, so that a defective pixel can be detected with high accuracy.

As illustrated in FIG. 8A, the luminance of the light Ld[1] emitted from the pixel 34 included in the region Rd[1] is preferably detected using the sensor portion 35L. As illustrated in FIG. 8B, the luminance of the light Ld[2] emitted from the pixel 34 included in the region Rd[2] is also preferably detected using the sensor portion 35L, as in the case of the light Ld[1]. Thus, the distance between the pixel 34 that emits light and the sensor portion 35 that detects the light can be made closer than in the case where the luminances of the light Ld[1] and the light Ld[2] are detected using the sensor portion 35B or the sensor portion 35R. Furthermore, a difference between the distance from the sensor portion 35 that detects the luminance of the light Ld[1] to the region Rd[1] and the distance from the sensor portion 35 that detects the luminance of the light Ld[2] to the region Rd[2] can be made smaller than in the case where the luminances of the light Ld[1] and the light Ld[2] are detected using the sensor portion 35T. Consequently, the luminance of the light Ld[1] and the luminance of the light Ld[2] can be compared with high accuracy, so that a defective pixel can be detected with high accuracy.

As described above, the luminance of light emitted from the pixel 34 is preferably detected using the sensor portion 35 that is close to the pixel 34. For example, the case where the luminance of first light emitted from the pixel 34 included in a first region is compared to the luminance of second light emitted from the pixel 34 included in a second region is considered. In this case, it is preferred that the distance from the sensor portion 35 that detects the luminance of the first light to the first region be as nearly equal as possible to the distance from the sensor portion 35 that detects the luminance of the second light to the second region. To achieve this, the sensor portion 35 that detects the luminance of the first light and the sensor portion 35 that detects the luminance of the second light are preferably selected. Accordingly, the luminances of light can be compared with high accuracy, whereby a defective pixel can be detected with high accuracy.

Example of Electronic Device

Figure 9A:
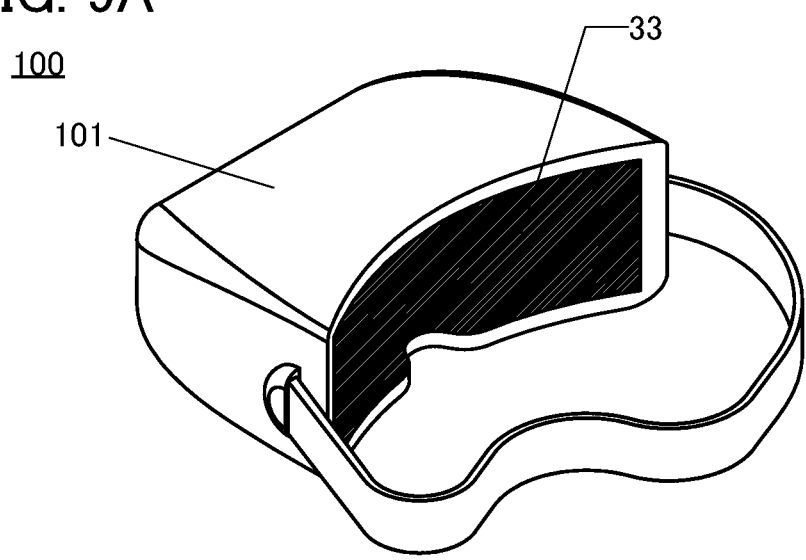
FIG. 9A is a perspective view illustrating a structure example of an electronic device.

FIG. 9A is a perspective view illustrating an example of the appearance of an electronic device 100 that is an electronic device to which the display device 10 is applicable. As illustrated in FIG. 9A, the electronic device 100 can be an HMD. FIG. 9A illustrates a housing 101 and the display portion 33 among the components of the electronic device 100.

Because of a small distance between a display portion of an HMD and the user, the user is likely to perceive pixels and strongly feels granularity, whereby the sense of immersion and realistic feeling of AR and VR might be diminished. Therefore, in an HMD, the pixel density is preferably increased so that the user does not perceive pixels. For example, the pixel density is preferably higher than or equal to 1000 ppi, further preferably higher than or equal to 5000 ppi, still further preferably higher than or equal to 7000 ppi.

As described above, the method for detecting a defective pixel described in this embodiment can be preferably employed even when the pixel density of the display device 10 is high. In addition, a small distance between a display portion of an HMD and the user makes it more likely for the user to perceive a defective pixel. As described above, the display device 10 can correct image data so that a defective pixel is not easily perceived by the user. Accordingly, the display device 10 can be favorably applied to an HMD and the like.

When the electronic device 100 is an HMD, for example, the user is likely to have eye fatigue. Thus, the electronic device 100 preferably has a function of measuring the user's eye fatigue and notifying the user of information based on the measurement result.

Figure 9B:
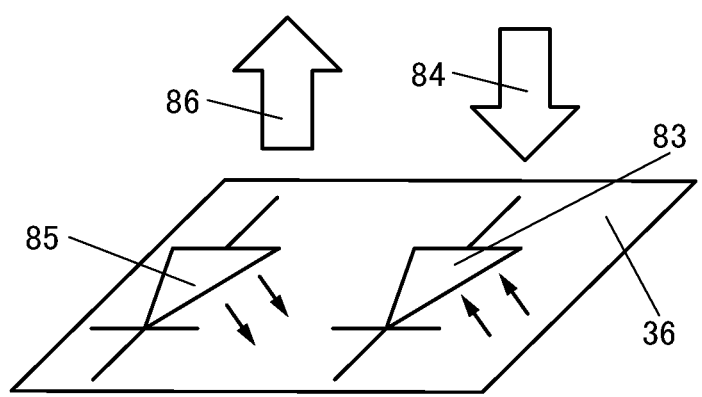
FIG. 9B is a diagram illustrating a structure example of a pixel.

FIG. 9B is a diagram illustrating a structure example of the pixel 36 provided in the sensor portion 35 in the case where the electronic device 100 including the display device 10 has a function of measuring the user's eye fatigue. In the case where the electronic device 100 has a function of measuring the user's eye fatigue, the pixel 36 can include a light-emitting element 85 in addition to the photoelectric conversion element 83. The light-emitting element 85 has a function of emitting light 86. As the light-emitting element 85, an organic light-emitting element, an LED element, or the like can be used. Note that in this specification and the like, the light 86 is referred to as detection light.

The light-emitting element 85 preferably has a function of emitting infrared light. Infrared light cannot be seen with the human eye. Thus, using infrared light as light emitted from the light-emitting element 85 can prevent the user of the electronic device 100 from perceiving the light emitted from the light-emitting element 85; hence, a decrease in the sense of immersion and realistic feeling of AR and VR can be suppressed.

Figure 10A:
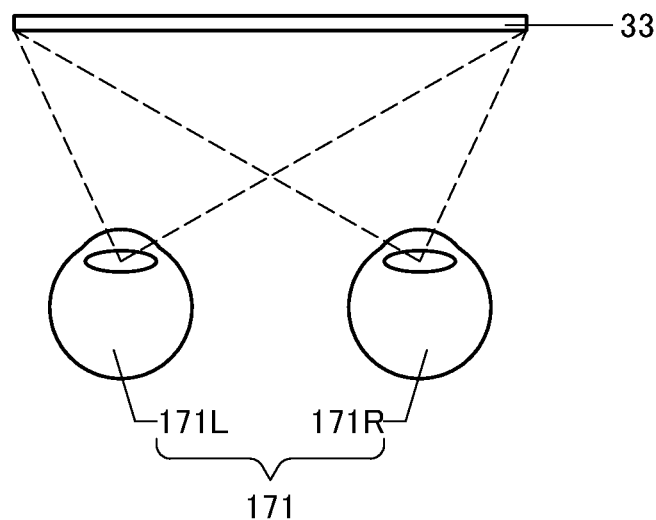
FIG. 10A and FIG. 10B are diagrams illustrating a positional relation between a display device and a user.

FIG. 10A is a diagram illustrating a positional relation between eyeballs 171 (an eyeball 171R and an eyeball 171L) of the user of the electronic device 100 and the display portion 33. An image displayed on the display portion 33 is perceived by the eyeball 171R and the eyeball 171L.

Figure 10B:
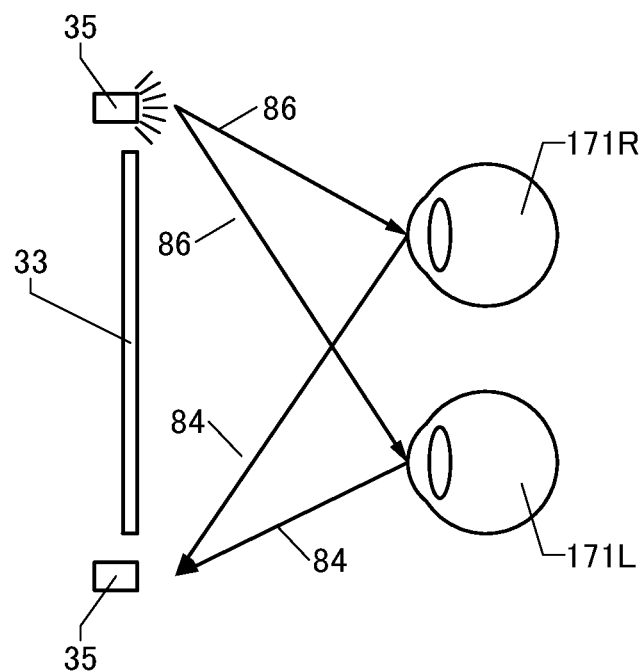

FIG. 10B is a diagram illustrating a positional relation between the eyeballs 171 of the user of the electronic device 100 and each of the display portion 33 and the sensor portion 35.

Part of the light 86, which is detection light from the sensor portion 35, is reflected by the eyeballs 171 and/or the eyelids (not illustrated) of the user of the electronic device 100 and enters the sensor portion 35 as the light 84. Specifically, part of the light 86, which is detection light emitted from the light-emitting element 85 included in the sensor portion 35, is reflected by the eyeballs 171 and/or the eyelids of the user of the electronic device 100 and enters the photoelectric conversion element 83 included in the sensor portion 35 as the light 84. When the user of the electronic device 100 blinks, the luminance of the light 84 entering the sensor portion 35 changes. Thus, whether the user blinks can be detected from a change in the luminance of the light 84, which is detected by the photoelectric conversion element 83 included in the sensor portion 35.

As described above, the display device 10 can detect a defective pixel by using the photoelectric conversion element 83 provided in the sensor portion 35. Thus, in the display device 10, a photoelectric conversion element used for detecting a defective pixel can double as a photoelectric conversion element used for detecting eye fatigue of the user of the electronic device 100 including the display device 10.

Example of Method for Measuring Eye Fatigue

An example of a method for measuring eye fatigue using the electronic device 100 will be described with reference to drawings. Measurement of eye fatigue with the number of blinks may be always performed while images are displayed, or may be performed at given intervals. Performing the measurement at given intervals can reduce power consumption of the electronic device 100. In this embodiment, an example of measuring eye fatigue at given intervals will be described.

The measurement of eye fatigue can be performed in Mode 1 or Mode 2. In addition, Mode 1 and Mode 2 can be used in combination.

[Mode 1]

Figure 11:
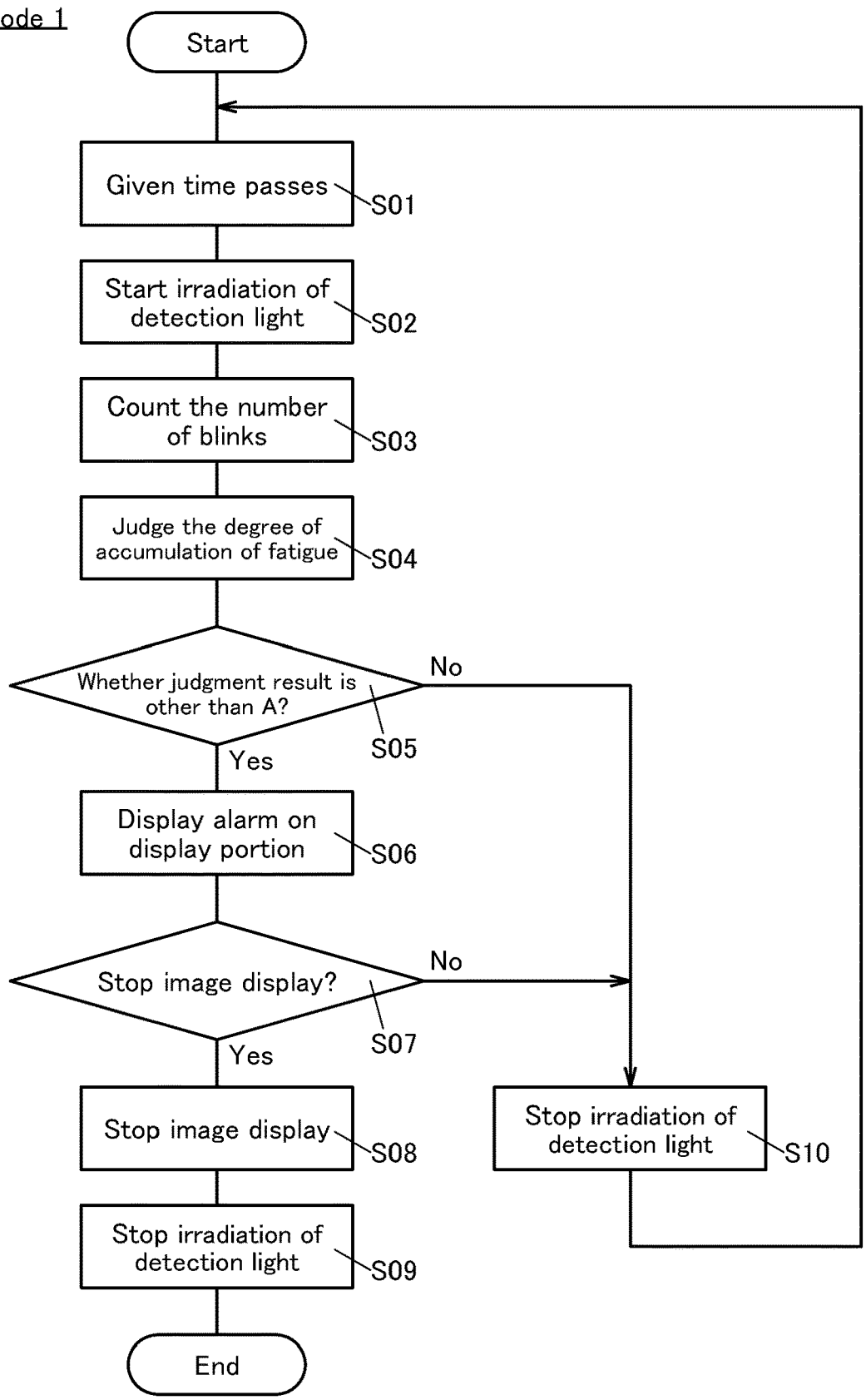
FIG. 11 is a flow chart illustrating an example of operation of a display device.

First, a measurement procedure of Mode 1 is described. FIG. 11 is a flow chart showing the operation in Mode 1.

After a period T passes (Step S01) after image display starts, irradiation of detection light of the sensor portion 35 is performed (Step S02). A given time can be set as the period T. However, if the interval between measurements of eye fatigue is too long, detection of eye fatigue may be delayed, and as a result, the effect of reducing fatigue might be reduced. The period T is preferably longer than or equal to 15 minutes and shorter than or equal to 2 hours, further preferably longer than or equal to 10 minutes and shorter than or equal 1 hour, still further preferably longer than or equal to 5 minutes and shorter than or equal to 30 minutes.

Next, the number of blinks per minute is counted (Step S03). As for the number of blinks per minute, for example, the number of blinks obtained by measurement for 30 seconds may be converted into the number of blinks per minute, or the number of blinks obtained by measurement for three minutes may be converted into the number of blinks per minute. A longer measurement time results in higher measurement accuracy. The measurement time is preferably longer than or equal to 15 seconds and shorter than the period T.

The number of blinks may be counted for one of the left and right eyes or for both eyes. In the case of counting the number of blinks of both eyes, the larger of the two numbers for the left and right eyes is adopted.

Then, the degree of accumulation of eye fatigue is judged (Step S04). The degree of accumulation is judged by comparing the number of blinks per minute to Judgment table 1 shown in FIG. 12A. The case where the number of blinks per minute (hereinafter also simply referred to as "the number of blinks") is greater than or equal to 10 and less than 30 is determined that there is no or a small amount of accumulated fatigue, and is judged as A. The case where the number of blinks is greater than or equal to 30 is determined that fatigue is accumulated, and is judged as B. The case where the number of blinks is greater than or equal to 40 is determined that fatigue is accumulated excessively, and is judged as C. The case where the number of blinks is less than 10 brings a concern about dry eyes and the like, and is judged as D. The case where the number of blinks is less than 5 probably means that the user does not watch or recognize video, and is judged as E.

Next, whether the judgment result is other than A is determined (Step S05). When the judgment result is A, irradiation of the detection light is stopped (Step S10). After that, the operation returns to Step S01.

When the judgment result is other than A, the judgment result is compared to Judgment table 2 shown in FIG. 12B, and alarm information corresponding to the judgment result is displayed on the display portion 33 (Step S06, see FIG. 12C).

Next, whether image display is stopped or not is determined (Step S07). When stopping image display is selected, image display is stopped (Step S08), and irradiation of the detection light is stopped (Step S09). When image display is not stopped, irradiation of the detection light is stopped (Step S10), and after that, the operation returns to Step S01.

[Mode 2]

Figure 13:
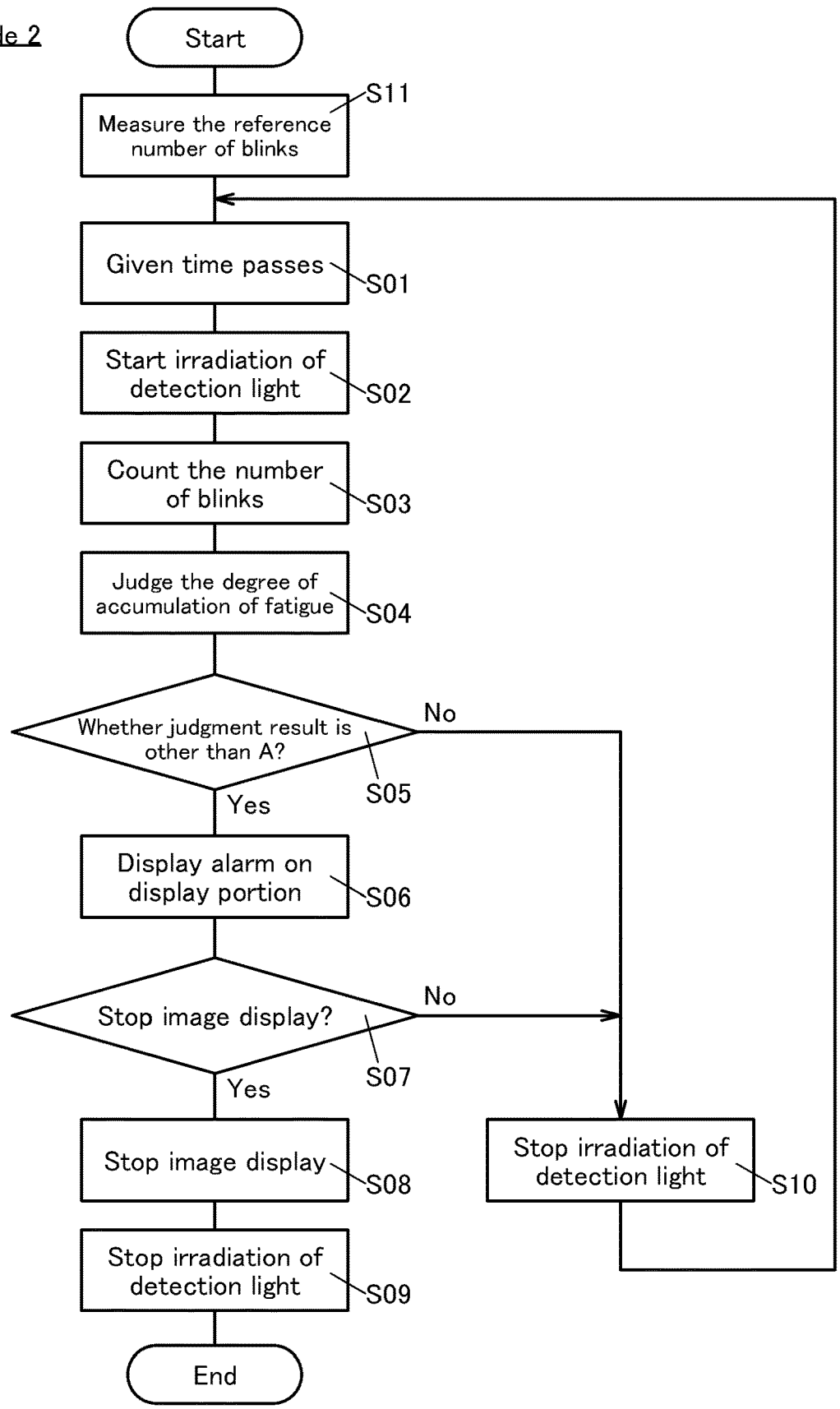
FIG. 13 is a flow chart illustrating an example of operation of a display device.

Next, a measurement procedure of Mode 2 is described. FIG. 13 is a flow chart showing the operation in Mode 2. Mode 2 includes steps similar to those in Mode 1. To reduce repetition of description, the description of a step similar to that in Mode 1 is omitted in some cases.

The number of blinks of a person is said to be 15 to 20 at normal times. However, the number of blinks at normal times varies with individuals. In Mode 2, the number of blinks of the user of the electronic device 100 serving as a reference (also referred to as "the reference number of blinks") is measured before measurement of eye fatigue. After that, the degree of accumulation of fatigue of the user of the electronic device 100 is judged by comparing the number of blinks that is newly measured to the reference number of blinks. For example, the degree of accumulation of fatigue of the user of the electronic device 100 is judged by calculating how many times the newly measured number of blinks is to the reference number of blinks (also referred to as "a blink multiplication factor").

First, after image display is started, the reference number of blinks is measured (Step S11). In Step S11, for example, irradiation of the detection light of the sensor portion 35 is performed, and the number of blinks is measured as in Step S03.

After Step S11 ends, Step S01, Step S02, Step S03, and Step S04 are sequentially performed. In Mode 2, judgment of the degree of accumulation of fatigue (Step S04) is performed by comparing a blink multiplication factor and Judgment table 3 shown in FIG. 14A.

In Mode 2, the case where the blink multiplication factor is greater than or equal to 0.7 and less than 2.0 is determined that there is no or a small amount of accumulated fatigue, and is judged as A. The case where the blink multiplication factor is greater than or equal to 2.0 is determined that fatigue is accumulated, and is judged as B. The case where the blink multiplication factor is greater than or equal to 2.3 is determined that fatigue is accumulated excessively, and is judged as C. The case where the blink multiplication factor is less than 0.7 brings a concern about dry eyes and the like, and is judged as D. The case where the blink multiplication factor is less than 0.4 probably means that the user does not watch or recognize video, and is judged as E.

Figures 14A, 14B:
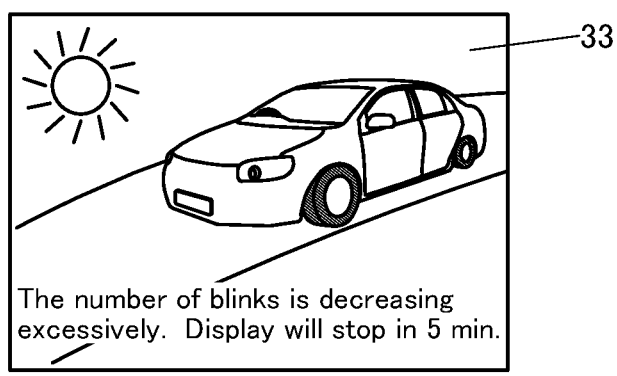
FIG. 14A and FIG. 14B are diagrams illustrating Judgment table 3 and an example of alarm display, respectively.

Next, Step S05 is performed, and when the judgment result is other than A, the judgment result is compared to Judgment table 2 shown in FIG. 12B, and alarm information corresponding to the judgment result is displayed on the display portion 33 (Step S06, see FIG. 14B).

Note that Mode 1 and Mode 2 may be appropriately used in combination. Alternatively, Mode 1 and Mode 2 may be switched as appropriate. For example, in the case where the reference number of blinks is greater than or equal to 30 during the operation in Mode 2, the operation may be temporarily switched to Mode 1 so that alarm information may be displayed on the display portion 33.

This embodiment has shown the example in which alarm information based on the degree of accumulation of eye fatigue or the like is displayed in accordance with the number of blinks. However, one embodiment of the present invention is not limited thereto. For example, a function of emitting an alarm sound in accordance with the degree of accumulation of eye fatigue or the like may be provided. Moreover, a function of adjusting luminance of light from the display portion 33 in accordance with the degree of accumulation of eye fatigue or the like may be provided.

The electronic device 100 may be provided with various types of sensors such as a temperature sensor, a pressure sensor, a pulse sensor, and an $SpO_2$ (blood oxygen saturation) sensor. Biological information of the user of the electronic device 100 may be obtained by using various types of sensors and used to judge the degree of accumulation of fatigue of the user of the electronic device 100.

Structure Example 2 of Display Device

Figure 15:
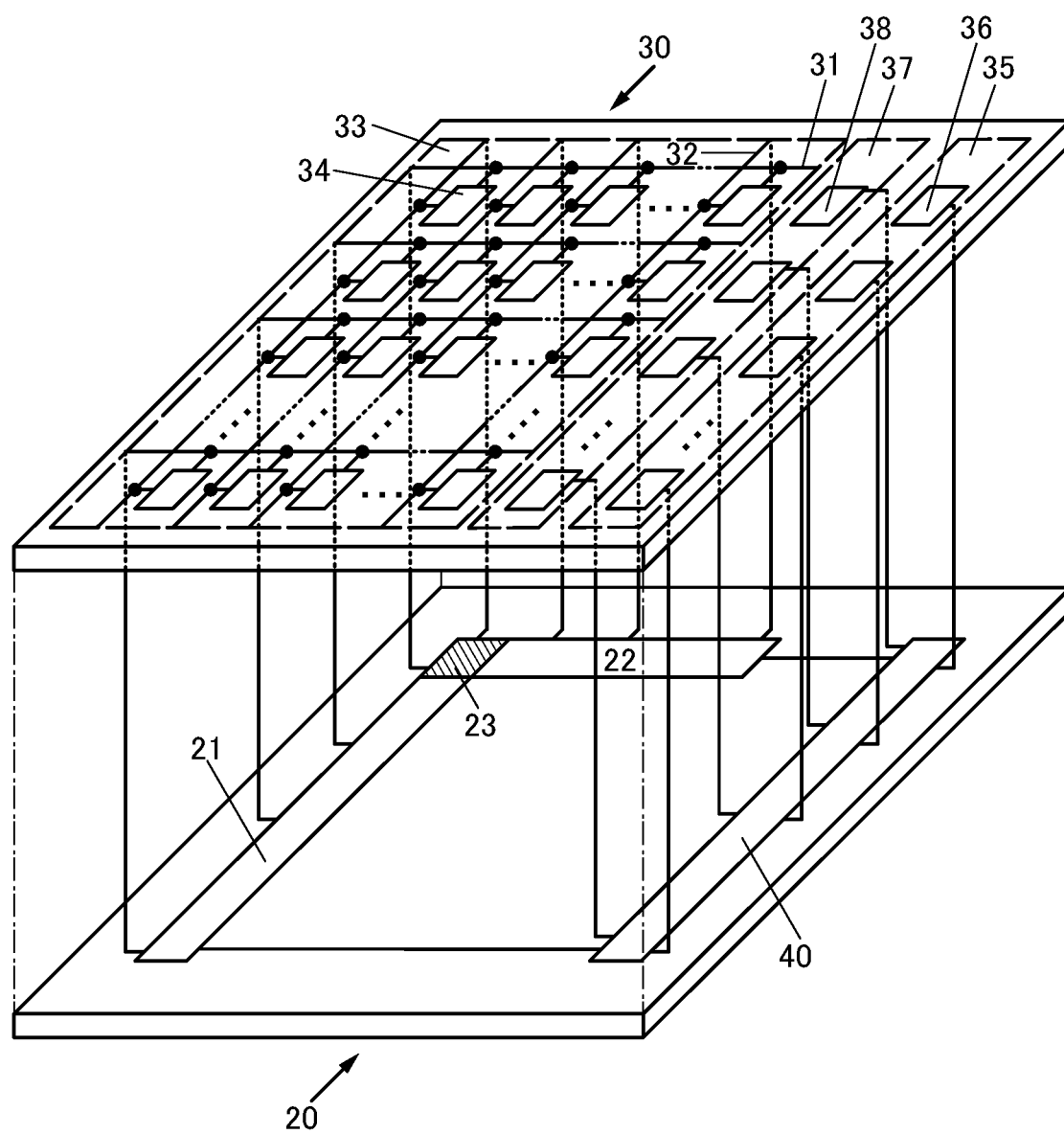
FIG. 15 is a block diagram illustrating a structure example of a display device.

FIG. 15 is a block diagram illustrating a structure example of the display device 10, and shows a variation example of the display device 10 illustrated in FIG. 1A. The display device 10 illustrated in FIG. 15 is different from the display device 10 having the structure illustrated in FIG. 1A in that a memory portion 37 is provided in the layer 30.

Cells 38 are arranged in the memory portion 37. The cell 38 has a function of retaining data. In the memory portion 37, a volatile memory such as a DRAM or an SRAM can be provided. Moreover, a nonvolatile memory such as a ReRAM, a PRAM, an FeRAM, an MRAM, or a flash memory may be provided.

The cell 38 may include a transistor containing a metal oxide in a channel formation region (hereinafter also referred to as an OS transistor). The band gap of the metal oxide can be 2 eV or more, or 2.5 eV or more. Thus, an OS transistor exhibits an extremely low leakage current (off-state current) in an off state. Accordingly, providing an OS transistor in the cell 38 simplifies the configuration of the cell 38 and enables a memory provided in the memory portion 37 to be a nonvolatile memory. For example, 1-bit data can be retained for a long time in a cell that consists of one OS transistor and one capacitor.

For example, as the metal oxide, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, indium oxide, zinc oxide, an In—Ga oxide, an In—Zn oxide, a Ga—Zn oxide, or gallium oxide may be used as the metal oxide.

In the display device 10 having the structure illustrated in FIG. 15, for example, when the display device 10 operates in Mode 2 shown in FIG. 13, data representing the reference number of blinks measured in Step S11 can be retained in the memory portion 37. This can decrease the frequency of performing the operation in Step S11. For example, after the operation in Step S10 is performed, the operation in Step S01 can be performed without performing the operation in Step S11. Thus, the power consumption of the display device 10 can be reduced.

Structure Example 3 of Display Device

Figure 16:
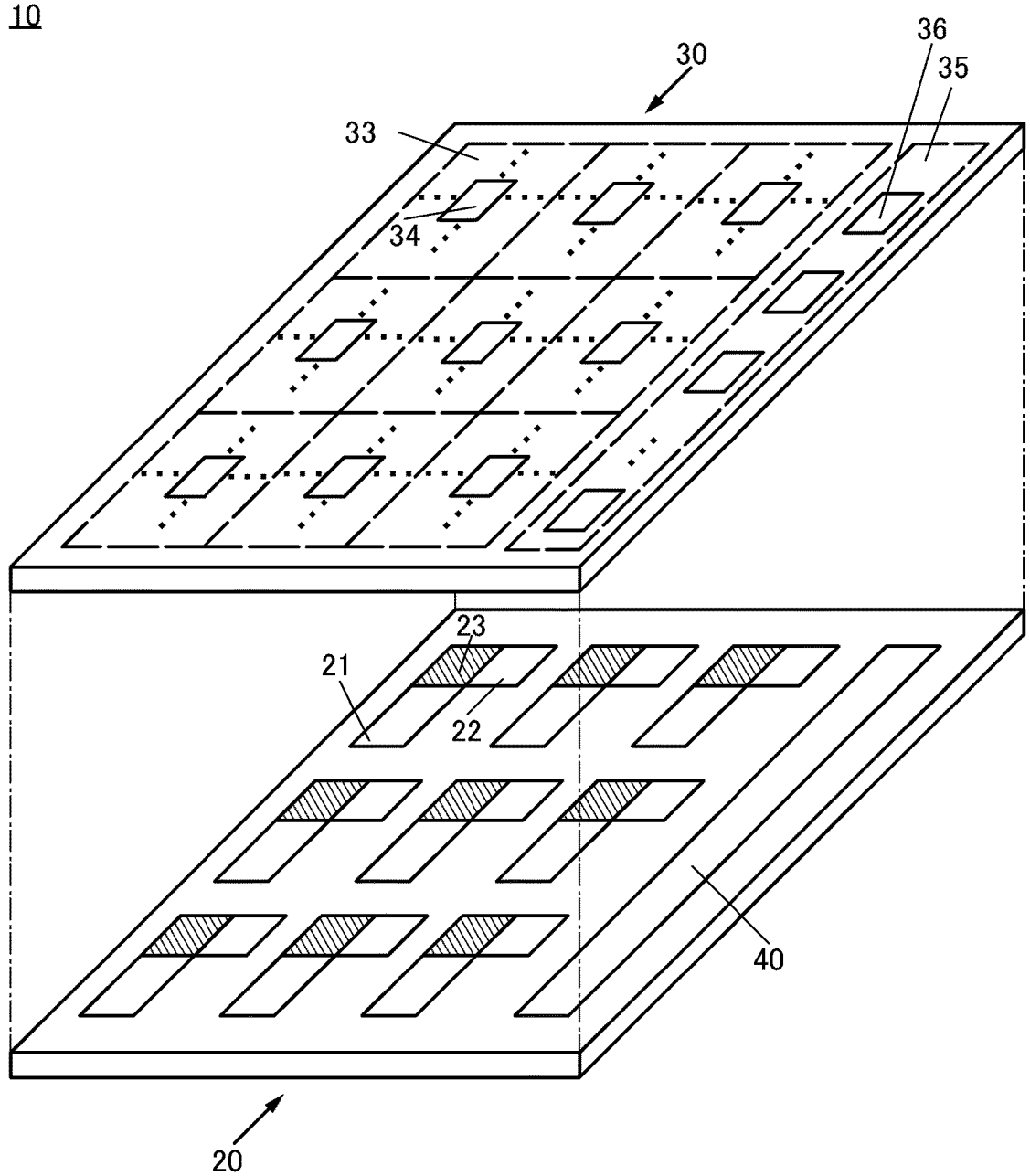
FIG. 16 is a block diagram illustrating a structure example of a display device.

Although FIG. 1A illustrates a structure example in which one gate driver circuit 21 and one data driver circuit 22 are provided in the layer 20 and one display portion 33 is provided in the layer 30, a plurality of display portions 33 may be provided in the layer 30. That is, the display portion provided in the layer 30 may be divided. FIG. 16 illustrates a variation example of the structure in FIG. 1A, and shows a structure example of the display device 10 in which display portions 33 of three rows by three columns are provided in the layer 30. Note that the layer 30 may include the display portions 33 of two rows by two columns, or the display portions 33 of four or more rows by four or more columns. The number of rows and the number of columns of the display portions 33 provided in the layer 30 may be different from each other. In the display device 10 with the structure illustrated in FIG. 16, one image can be displayed using all the display portions 33, for example.

Although the wiring 31 and the wiring 32 are omitted for simplicity in FIG. 16, the wiring 31 and the wiring 32 are actually provided in the display device 10 having the structure illustrated in FIG. 16. In addition, although the electrical connection relation of the functional circuit 40 is not shown, the functional circuit 40 is actually electrically connected to the gate driver circuit 21, the data driver circuit 22, the pixels 36 provided in the sensor portion 35, and the like. Note that as in FIG. 16, some components and the like may be omitted in other diagrams.

The layer 20 can be provided with the same number of gate driver circuits 21 as the display portions 33 and the same number of data driver circuits 22 as the display portions 33. In this case, each of the gate driver circuits 21 can be provided to be overlapped by the display portion 33 including the pixel 34 to which the gate driver circuit 21 supplies a signal. Moreover, each of the data driver circuits 22 can be provided to be overlapped by the display portion 33 including the pixel 34 to which the data driver circuit 22 supplies image data.

When a plurality of display portions 33 are provided and a plurality of gate driver circuits 21 and data driver circuits 22 are provided accordingly, the number of pixels 34 provided in one display portion 33 can be reduced. The plurality of gate driver circuits 21 can be operated in parallel and the plurality of data driver circuits 22 can be operated in parallel; thus, the time required for writing image data corresponding to a one-frame image to the pixels 34 can be shortened, for example. Hence, the length of one frame period can be shortened, and the display device 10 can operate at higher speed. Therefore, the number of pixels 34 included in the display device 10 can be increased, resulting in a higher pixel density of the display device 10. In addition, the definition of an image that can be displayed by the display device of one embodiment of the present invention can be higher than the definition of an image that can be displayed by a display device in which gate driver circuits and data driver circuits are not overlapped by display portions. Furthermore, the clock frequency can be lowered, so that the power consumption of the display device 10 can be reduced.

Here, in the case of a structure in which the gate driver circuits and the data driver circuits are not overlapped by the display portions, the gate driver circuits and the data driver circuits are provided in a portion around the display portions, for example. In this case, it is difficult to provide display portions of more than two rows by more than two columns in terms of the positions where data driver circuits would be provided, for example. In contrast, in the display device 10, the gate driver circuit and the data driver circuit can be provided in a layer different from the layer including the display portion, thereby having a region overlapped by the display portion; hence, display portions of more than two rows and more than two columns can be provided as illustrated in FIG. 16. In other words, five or more gate driver circuits and five or more data driver circuits can be provided in the display device 10.

As described above, the display device 10 can operate at higher speed, for example, than a display device in which gate driver circuits and data driver circuits are not overlapped by display portions. Thus, the pixel density of the display device 10 can be higher than that of the display device in which the gate driver circuits and the data driver circuits are not overlapped by the display portions. For example, the pixel density of the display device 10 can be 1000 ppi or higher, 5000 ppi or higher, or 7000 ppi or higher. Consequently, the display device 10 can display high-quality images with little graininess and highly realistic images.

The resolution of an image that can be displayed by the display device 10 can be higher than the resolution of an image that can be displayed by the display device in which the gate driver circuit and the data driver circuit are not overlapped by the display portion. For example, the display device 10 can display images with a resolution of 4K2K, 8K4K, or higher. Moreover, the size of the display device 10 can be reduced. For example, the size of a display region of the display device 10 can be 8 inches or less.

Note that even in the structure in which a plurality of data driver circuits 22 and the like are provided in the layer 20 and a plurality of display portions 33 are provided in the layer 30, the number of functional circuits 40 provided in the display device 10 can be one as in the structure illustrated FIG. TA. Thus, as illustrated in FIG. 16, the functional circuit 40 can be provided not to be overlapped by any of the display portions 33. Note that the functional circuit 40 may be provided to have a region overlapped by any of the display portions 33.

Figure 17:
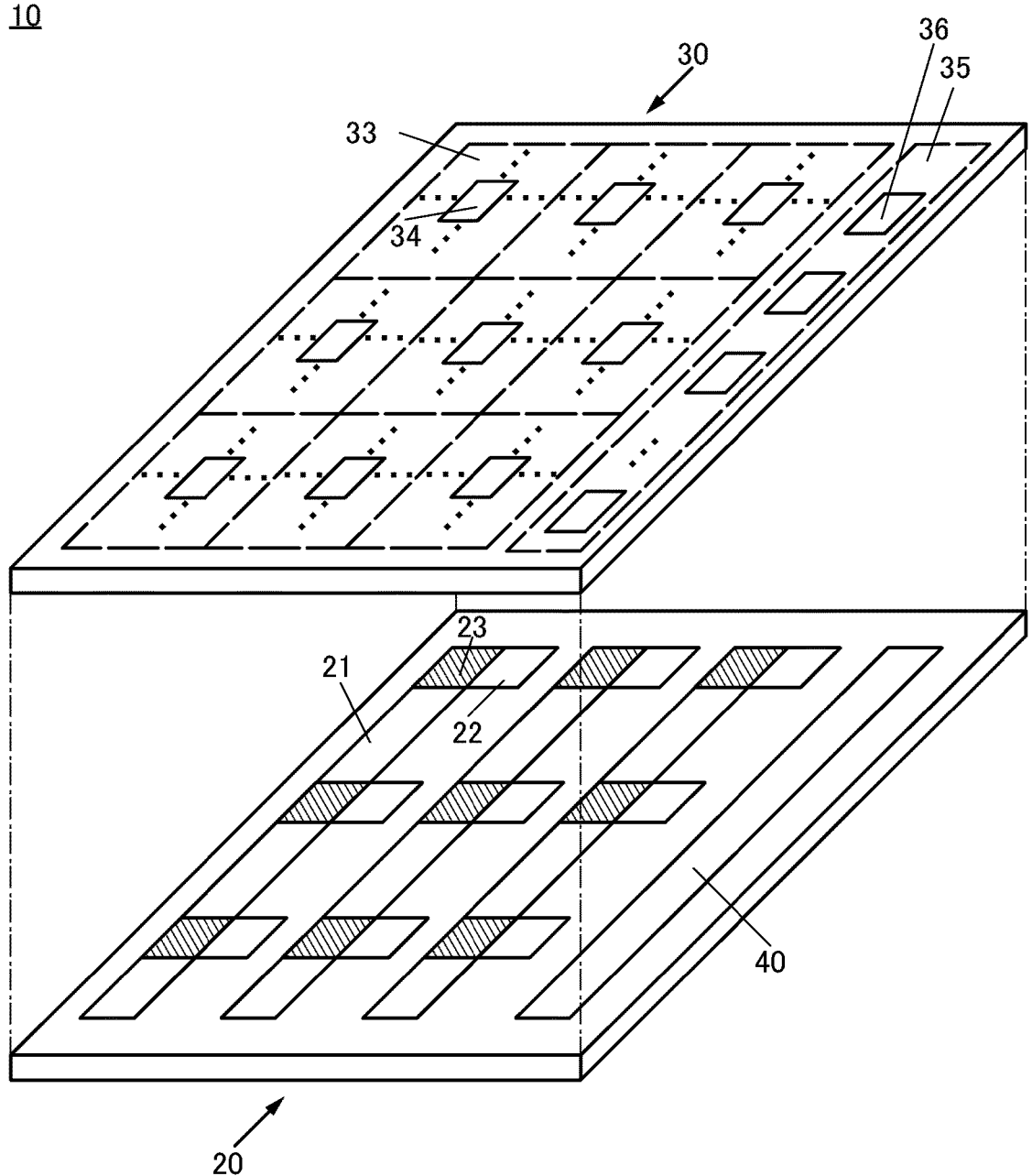
FIG. 17 is a block diagram illustrating a structure example of a display device.

Although FIG. 16 illustrates the structure example in which the number of gate driver circuits 21 is the same as the number of display portions 33, one embodiment of the present invention is not limited thereto. FIG. 17 illustrates a variation example of the structure illustrated in FIG. 16 and illustrates a structure example of the display device 10 in which the number of gate driver circuits 21 is the same as the number of columns of the display portions 33. In the display device 10 with the structure illustrated in FIG. 17, the display portions 33 of three columns are provided, and three gate driver circuits 21 are provided accordingly. In addition, the display portions 33 of three rows are provided, and the display portions 33 of three rows and one column share one gate driver circuit 21.

Figure 18:
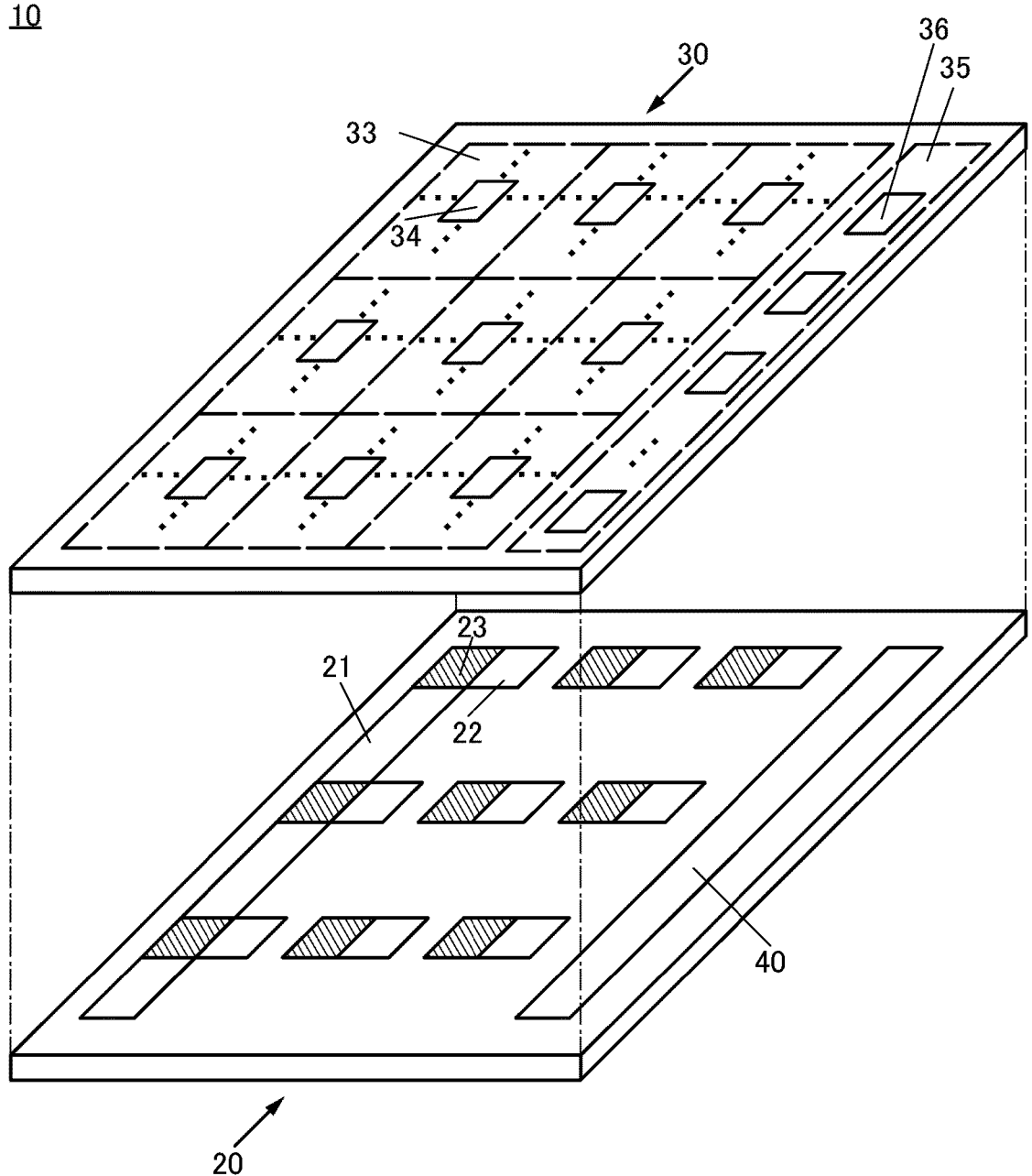
FIG. 18 is a block diagram illustrating a structure example of a display device.

FIG. 18 illustrates a variation example of the structure illustrated in FIG. 16 and illustrates a structure example of the display device 10 in which a plurality of display portions 33 and one gate driver circuit 21 are provided. In the display device 10 with the structure illustrated in FIG. 18, the display portions 33 of three rows and three columns share one gate driver circuit 21. Note that in the display device 10 with the structure illustrated in FIG. 18, the gate driver circuit 21 can be provided not to be overlapped by the display portion 33.

Although not illustrated, the number of data driver circuits 22 is not necessarily the same as the number of display portions 33. The number of data driver circuits 22 in the display device 10 may be larger than or smaller than the number of display portions 33 in the display device 10.

Figure 19:
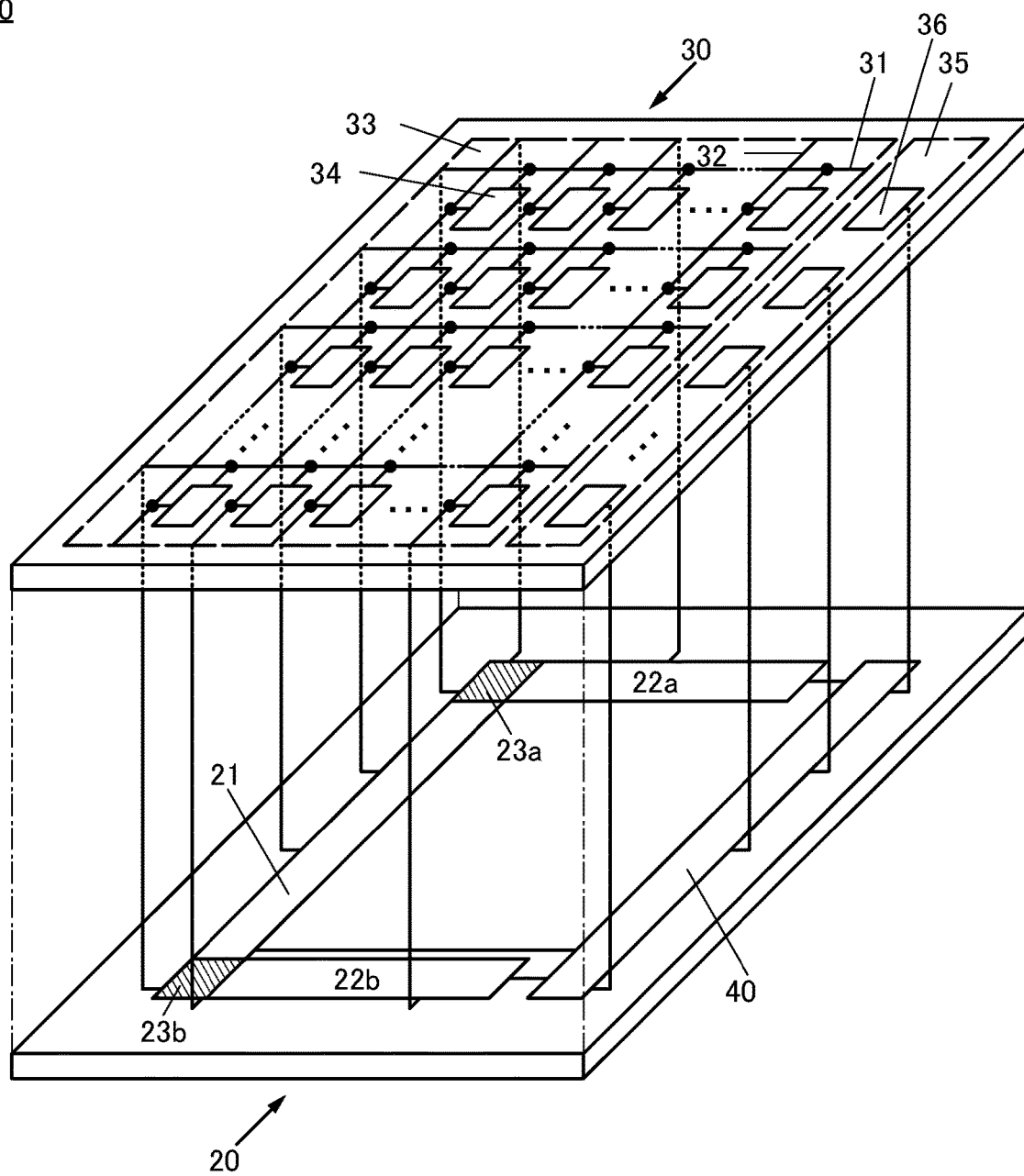
FIG. 19 is a block diagram illustrating a structure example of a display device.

Although FIG. TA illustrates the structure example in which one display portion 33 and one data driver circuit are provided, the number of data driver circuits 22 may be larger than that of the display portions 33. FIG. 19 illustrates a variation example of the structure illustrated in FIG. TA and illustrates a structure example of the display device 10 in which two data driver circuits (a data driver circuit 22a and a data driver circuit 22b) are provided for one display portion 33.

Like the data driver circuit 22, the data driver circuit 22a and the data driver circuit 22b include a region overlapped by the display portion 33. For example, the data driver circuit 22a and the data driver circuit 22b include a region overlapped by some of the pixels 34, like the data driver circuit 22. The data driver circuit 22a includes a region 23a where the data driver circuit 22a overlaps the gate driver circuit 21 without being strictly separated from the gate driver circuit 21. The data driver circuit 22b includes a region 23b where the data driver circuit 22b overlaps the gate driver circuit 21 without being strictly separated from the gate driver circuit 21.

As illustrated in FIG. 19, providing a larger number of data driver circuits than the display portion 33 allows the density of transistors constituting the data driver circuits to be reduced. Accordingly, the layout flexibility of the display device 10 can be increased.

Figure 20:
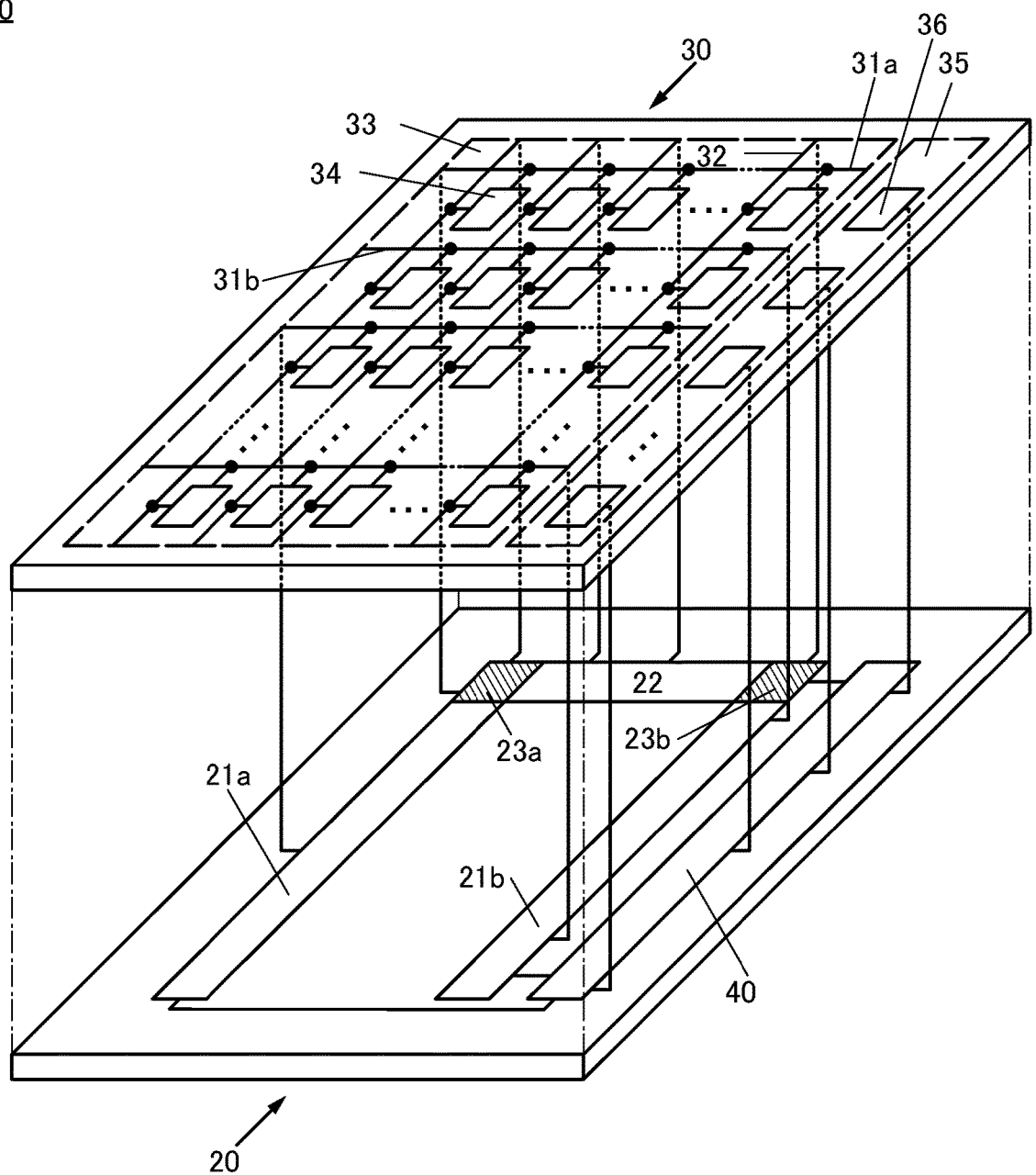
FIG. 20 is a block diagram illustrating a structure example of a display device.

Although FIG. 1A illustrates the structure example including one display portion 33 and one gate driver circuit, the number of gate driver circuits may be larger than that of display portions 33. FIG. 20 illustrates a variation example of the structure illustrated in FIG. TA, and shows a structure example of the display device 10 in which two gate driver circuits (a gate driver circuit 21a and a gate driver circuit 21b) are provided for one display portion 33.

In the display device 10 with the structure illustrated in FIG. 20, the pixels 34 in an odd-numbered row are electrically connected to the gate driver circuit 21a through a wiring 31a, and the pixels 34 in an even-numbered row are electrically connected to the gate driver circuit 21b through a wiring 31b. The wiring 31a and the wiring 31b have a function of a scan line like the wiring 31.

The gate driver circuit 21a has a function of generating a signal for controlling the operation of the pixels 34 in the odd-numbered row and supplying the signal to the pixels 34 through the wiring 31a. The gate driver circuit 21b has a function of generating a signal for controlling the operation of the pixels 34 in the even-numbered row and supplying the signal to the pixels 34 through the wiring 31b.

Like the gate driver circuit 21, the gate driver circuit 21a and the gate driver circuit 21b include a region overlapped by the display portion 33. For example, the gate driver circuit 21a and the gate driver circuit 21b include a region overlapped by some of the pixels 34, like the gate driver circuit 21. The gate driver circuit 21a includes the region 23a where the gate driver circuit 21a overlaps the data driver circuit 22 without being strictly separated from the data driver circuit 22. The gate driver circuit 21b includes the region 23b where the gate driver circuit 21b overlaps the data driver circuit 22 without being strictly separated from the data driver circuit 22.

In the display device 10 with the structure illustrated in FIG. 20, the gate driver circuit 21a can operate to write image data to all the pixels 34 in the odd-numbered rows, and then the gate driver circuit 21b can operate to write image data to all the pixels 34 in the even-numbered rows. That is, the display device 10 having the structure illustrated in FIG. 20 can operate by an interlace method. With an interlace method, the operating speed of the display device 10 can be increased and the frame frequency can be increased. In addition, the number of pixels 34 to which image data is written in one frame period can be half that when the display device 10 operates by a progressive method. Thus, in the display device 10, the clock frequency can be lower in interlace driving than in progressive driving; hence, the power consumption of the display device 10 can be reduced.

Figure 21:
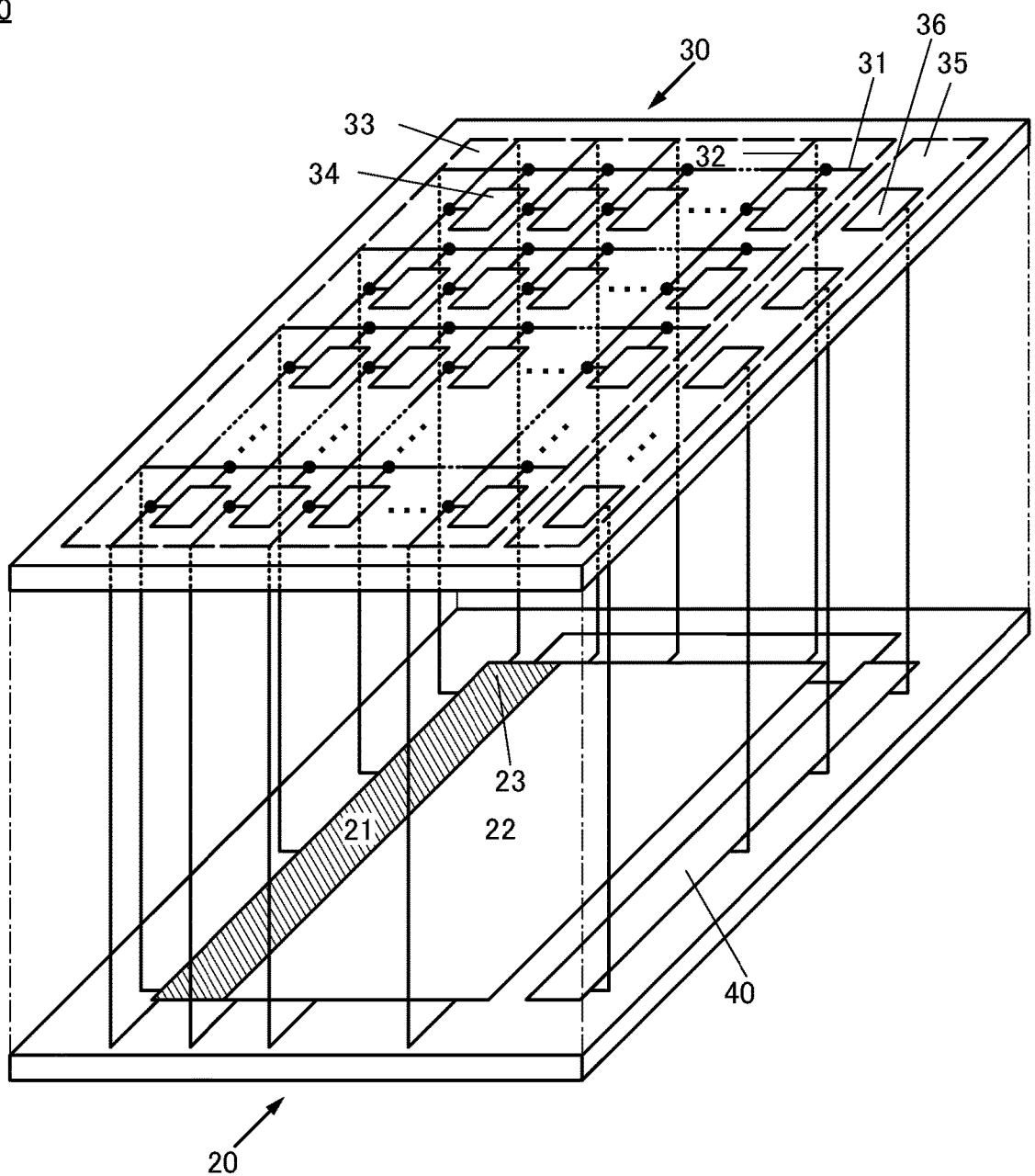
FIG. 21 is a block diagram illustrating a structure example of a display device.

Although FIG. 1A illustrates the structure example in which only one end of the wiring 32 is connected to the data driver circuit 22, a plurality of portions of the wiring 32 may be connected to the data driver circuit 22. FIG. 21 illustrates a structure example of the display device 10 in which the data driver circuit 22 is connected to both ends of the wiring 32. When a plurality of portions of the wiring 32 are connected to the data driver circuit 22, signal delay due to wiring resistance, parasitic capacitance, and the like can be inhibited, for example. This increases the operating speed of the display device 10.

Note that not only the one end and the other end of the wirings 32 but also another portion of the wiring 32 may be connected to the data driver circuit 22. For example, a center portion of the wiring 32 may be connected to the data driver circuit 22. By increasing the number of portions where the wiring 32 and the data driver circuit 22 are connected, signal delay and the like can be further inhibited and the operating speed of the display device 10 can be further increased. For example, a structure may be employed in which one end of the wiring 32 and a center portion of the wiring 32 are connected to the data driver circuit 22 and the other end of the wiring 32 is not connected to the data driver circuit 22.

When one data driver circuit 22 is connected to a plurality of portions of the wiring 32, the area occupied by the data driver circuit 22 increases as illustrated in FIG. 21. Even in that case, the data driver circuit 22 is stacked to have a region overlapped by the display portion 33, which can inhibit an increase in size of the display device 10. FIG. 21 shows that the entire gate driver circuit 21 overlaps the data driver circuit 22 without being strictly separated from the data driver circuit 22; however, even when one data driver circuit 22 is connected to a plurality of portions of the wiring 32, only part of the gate driver circuit 21 may overlap the data driver circuit 22.

Note that a plurality of portions of the wiring 31 may be connected to one gate driver circuit 21. Thus, signal delay and the like can be inhibited, and the operating speed of the display device 10 can be increased. Such a structure increases the area occupied by the gate driver circuit 21 as in the case of employing the data driver circuit 22 in FIG. 21; however, the gate driver circuit 21 is stacked to have a region overlapped by the display portion 33, which can inhibit an increase in size of the display device 10.

The structures of the display device 10 that are illustrated in FIG. TA to FIG. 21 can be combined as appropriate. For example, the structure in FIG. 16 can be combined with the structure in FIG. 20. In this case, the display device 10 can include, for example, a plurality of display portions 33, gate driver circuits twice as many as the display portions 33, and data driver circuits 22 as many as the display portions 33.

Structure Example of Gate Driver Circuit 21

Figure 22:
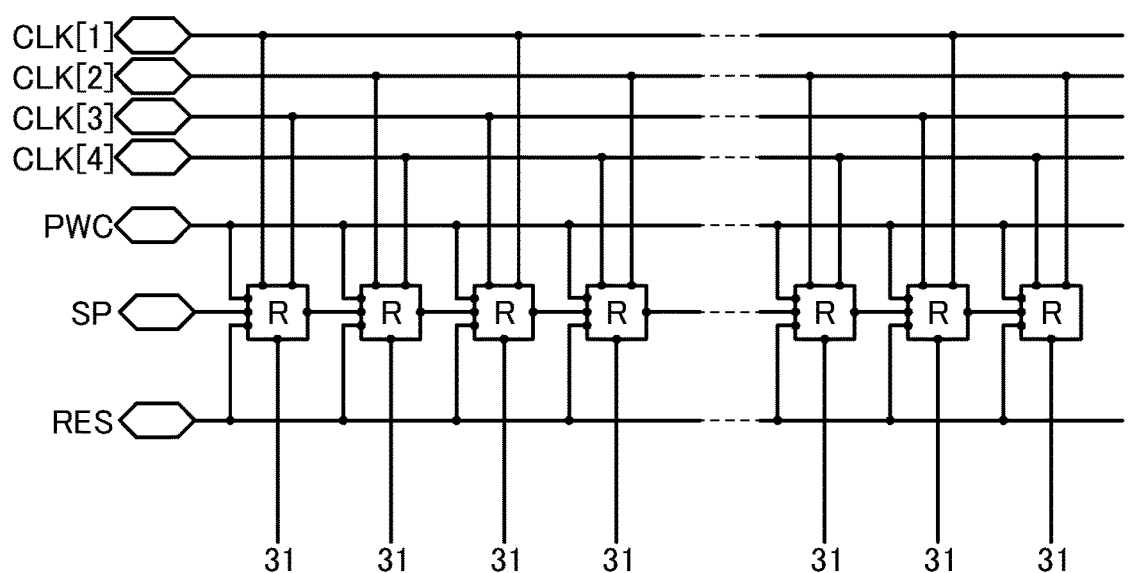
FIG. 22 is a block diagram illustrating a structure example of a gate driver circuit.

FIG. 22 is a block diagram illustrating a structure example of the gate driver circuit 21. The gate driver circuit 21 includes register circuits R composed of a plurality of set-reset flip-flops. The register circuit R is electrically connected to the wiring 31 having a function of a scan line, and has a function of outputting a signal to the wiring 31.

A signal RES is a reset signal; when the signal RES is set to a high potential, for example, all the outputs of the register circuits R can be a low potential. A signal SP is a start pulse signal; when the signal SP is input to the gate driver circuit 21, the shift operation of the register circuits R can be started. A signal PWC is a pulse width control signal and has a function of controlling the pulse width of a signal output from the register circuit R to the wiring 31. A signal CLK[1], a signal CLK[2], a signal CLK[3], and a signal CLK[4] are clock signals; for example, two of the signal CLK[1] to the signal CLK[4] can be input to one register circuit R.

Note that the structure illustrated in FIG. 22 can be applied to a register circuit or the like included in the data driver circuit 22 when the wiring 31 electrically connected to the register circuit R is replaced with another wiring, for example.

Figure 23A:
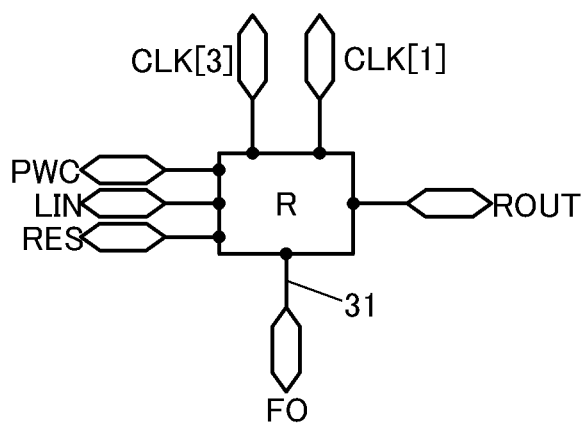
FIG. 23A is a block diagram illustrating a structure example of a register circuit.

FIG. 23A illustrates signals input to the register circuit R and signals output from the register circuit R. Here, FIG. 23A illustrates the case where the signal CLK[1] and the signal CLK[3] are input as the clock signals.

A signal FO is an output signal and is output to the wiring 31, for example. A signal ROUT is a shift signal and can be used as a signal LIN that is input to the next-stage register circuit R. Among the signals illustrated in FIG. 23A, the signal RES, the signal PWC, the signal CLK[1], the signal CLK[3], and the signal LIN are input to the register circuit R; the signal FO and the signal ROUT are output from the register circuit R.

Figure 23B:
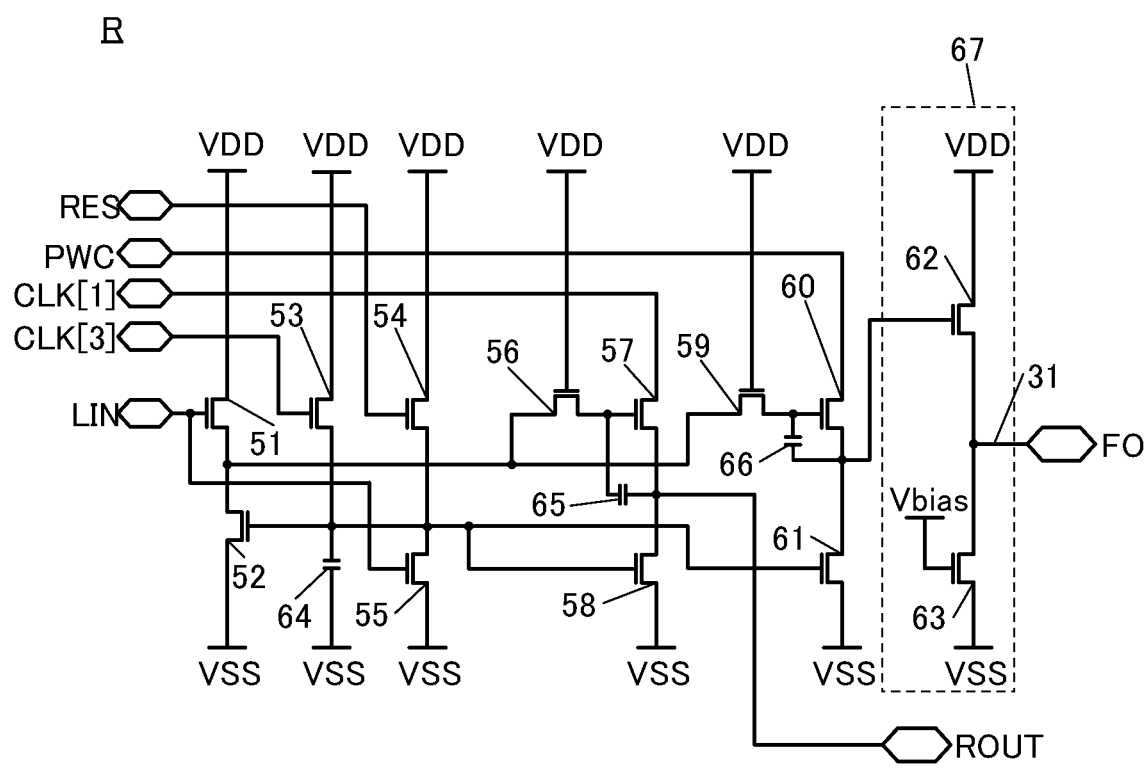
FIG. 23B is a circuit diagram illustrating a structure example of a register circuit.

FIG. 23B is a circuit diagram illustrating a structure example of the register circuit R that inputs and outputs the signals illustrated in FIG. 23A. The register circuit R includes a transistor 51 to a transistor 63 and a capacitor 64 to a capacitor 66.

One of a source and a drain of the transistor 51 is electrically connected to one of a source and a drain of the transistor 52, one of a source and a drain of the transistor 56, and one of a source and a drain of the transistor 59. A gate of the transistor 52 is electrically connected to one of a source and a drain of the transistor 53, one of a source and a drain of the transistor 54, one of a source and a drain of the transistor 55, a gate of the transistor 58, a gate of the transistor 61, and one electrode of the capacitor 64. The other of the source and the drain of the transistor 56 is electrically connected to a gate of the transistor 57 and one electrode of the capacitor 65. The other of the source and the drain of the transistor 59 is electrically connected to a gate of the transistor 60 and one electrode of the capacitor 66. One of a source and a drain of the transistor 60 is electrically connected to one of a source and a drain of the transistor 61, a gate of the transistor 62, and the other electrode of the capacitor 66.

The signal LIN is input to a gate of the transistor 51 and a gate of the transistor 55. The signal CLK[3] is input to a gate of the transistor 53. The signal RES is input to a gate of the transistor 54. The signal CLK[1] is input to one of a source and a drain of the transistor 57. The signal PWC is input to the other of the source and the drain of the transistor 60.

One of a source and a drain of the transistor 62 and one of a source and a drain of the transistor 63 are electrically connected to the wiring 31, and the signal FO is output from the wiring 31 as described above. The signal ROUT is output from the other of the source and the drain of the transistor 57, one of a source and a drain of the transistor 58, and the other electrode of the capacitor 65.

A potential VDD is supplied to the other of the source and the drain of the transistor 51, the other of the source and the drain of the transistor 53, the other of the source and the drain of the transistor 54, a gate of the transistor 56, a gate of the transistor 59, and the other of the source and drain of the transistor 62. A potential VSS is supplied to the other of the source and the drain of the transistor 52, the other of the source and the drain of the transistor 55, the other of the source and the drain of the transistor 58, the other of the source and the drain of the transistor 61, the other of the source and the drain of the transistor 63, and the other electrode of the capacitor 64.

A bias potential Vbias is supplied to a gate of the transistor 63. The bias potential Vbias is a potential with which the transistor 63 operates in a saturation region. With the bias potential Vbias, the transistor 63 can function as a constant current source.

The transistor 62 and the transistor 63 form a source follower circuit 67. Even if signal decay or the like due to wiring resistance, parasitic capacitance, or the like occurs inside the register circuit R, the source follower circuit 67 provided in the register circuit R can inhibit a decrease in the potential of the signal FO due to the signal decay or the like. This increases the operating speed of the display device 10. Note that the source follower circuit 67 may be replaced with another circuit as long as the circuit has a function of a buffer.

Structure Example of Region 23

Figure 24:
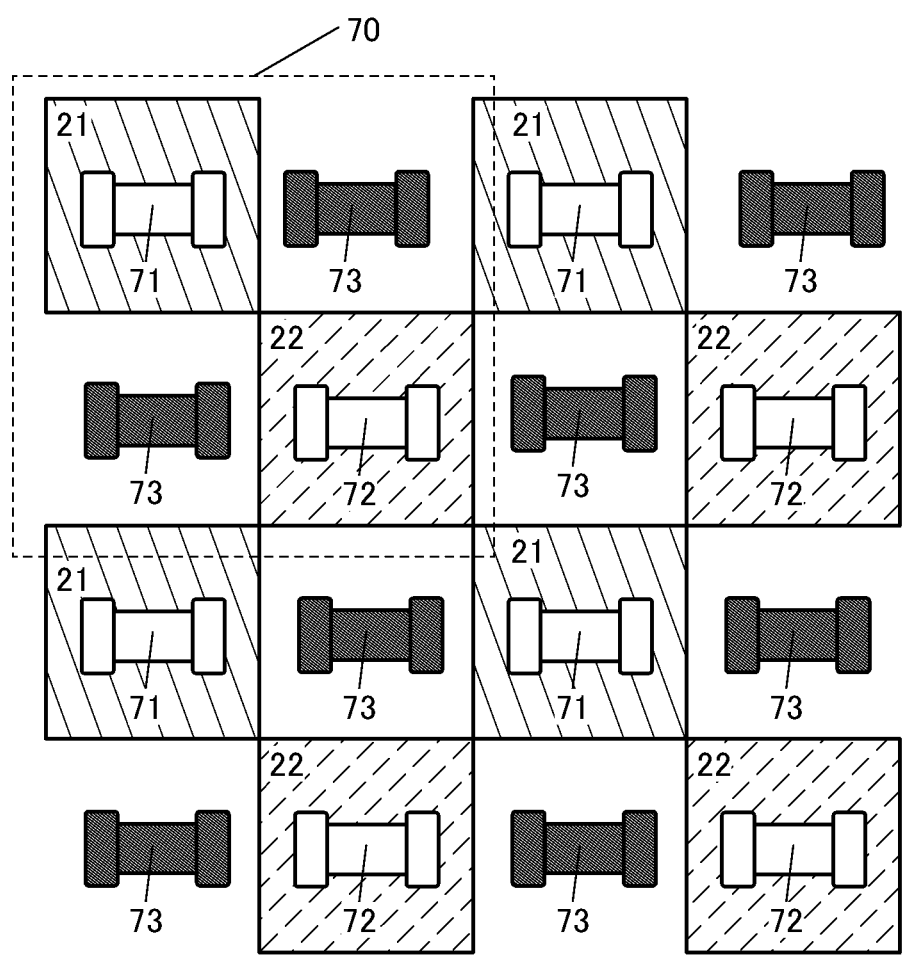
FIG. 24 is a schematic diagram illustrating an example of arrangement of a gate driver circuit and a data driver circuit.

FIG. 24 illustrates a structure example of the region 23 where the gate driver circuit 21 and the data driver circuit 22 overlap each other. As illustrated in FIG. 24, regions including a component of the gate driver circuit 21 and regions including a component of the data driver circuit 22 are arranged in a certain regular pattern in the region 23. FIG. 24 illustrates a transistor 71 as a component of the gate driver circuit 21 and a transistor 72 as a component of the data driver circuit 22.

FIG. 24 illustrates the case where the regions including the component of the gate driver circuit 21 are provided in the first row and the third row, and the regions including the component of the data driver circuit 22 are provided in the second row and the fourth row. In the region 23, a dummy element is provided between the regions including the component of the gate driver circuit 21. A dummy element is also provided between the regions including the component of the data driver circuit 22. FIG. 24 illustrates a structure example of the region 23 in which four dummy transistors 73 as dummy elements are provided around the transistor 71 and around the transistor 72.

When the dummy elements such as the dummy transistors 73 are provided in the region 23, the dummy elements can absorb impurities and inhibit diffusion of impurities into the transistor 71, the transistor 72, and the like. Thus, the reliability of the transistor 71, the transistor 72, and the like can be increased, leading to higher reliability of the display device 10. Although the transistors 71, the transistors 72, and the dummy transistors 73 are arranged in a matrix in FIG. 24, they are not necessarily arranged in a matrix.

Figure 25:
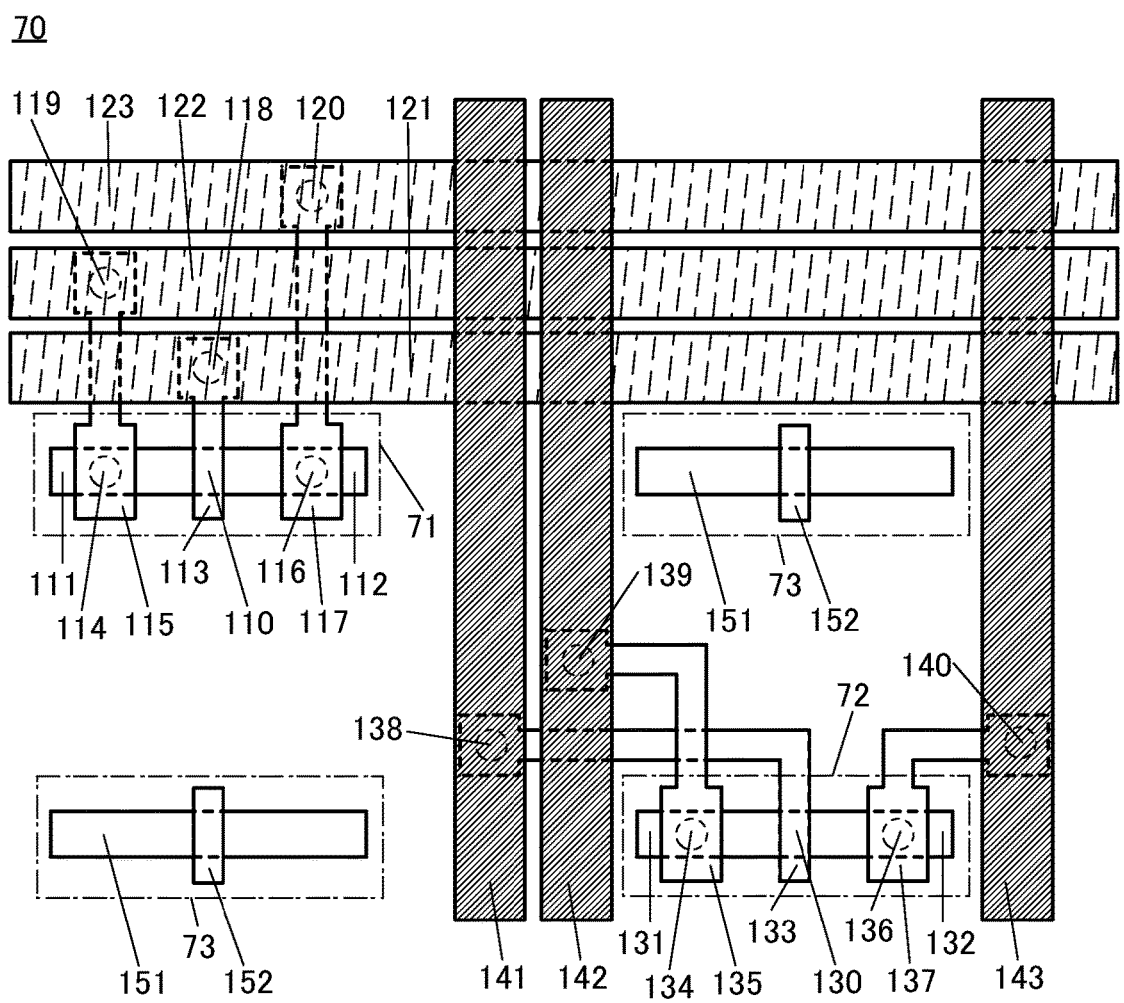
FIG. 25 is a top view illustrating a structure example of a gate driver circuit and a data driver circuit.

FIG. 25 is a top view illustrating a structure example of a region 70 that is part of the region 23. As illustrated in FIG. 24 and FIG. 25, one transistor 71, one transistor 72, and two dummy transistors 73 are provided in the region 70. As illustrated in FIG. 25, the transistor 71 includes a channel formation region 110, a source region 111, and a drain region 112. The transistor 71 also includes a gate electrode 113 that has a region overlapping the channel formation region 110.

Note that components such as a gate insulator are not illustrated in FIG. 25. The channel formation region, the source region, and the drain region are not illustrated as clearly separated regions in FIG. 25.

An opening portion 114 is provided in the source region 111, and the source region 111 is electrically connected to a wiring 115 through the opening portion 114. An opening portion 116 is provided in the drain region 112, and the drain region 112 is electrically connected to a wiring 117 through the opening portion 116.

An opening portion 118 is provided in the gate electrode 113, and the gate electrode 113 is electrically connected to a wiring 121 through the opening portion 118. An opening portion 119 is provided in the wiring 115, and the wiring 115 is electrically connected to a wiring 122 through the opening portion 119. An opening portion 120 is provided in the wiring 117, and the wiring 117 is electrically connected to a wiring 123 through the opening portion 120. In other words, the source region 111 is electrically connected to the wiring 122 through the wiring 115, and the drain region 112 is electrically connected to the wiring 123 through the wiring 117.

The transistor 72 includes a channel formation region 130, a source region 131, and a drain region 132. The transistor 72 also includes a gate electrode 133 that has a region overlapping the channel formation region 130.

An opening portion 134 is provided in the source region 131, and the source region 131 is electrically connected to a wiring 135 through the opening portion 134. An opening portion 136 is provided in the drain region 132, and the drain region 132 is electrically connected to a wiring 137 through the opening portion 136.

An opening portion 138 is provided in the gate electrode 133, and the gate electrode 133 is electrically connected to a wiring 141 through the opening portion 138. An opening portion 139 is provided in the wiring 135, and the wiring 135 is electrically connected to a wiring 142 through the opening portion 139. An opening portion 140 is provided in the wiring 137, and the wiring 137 is electrically connected to a wiring 143 through the opening portion 140. In other words, the source region 131 is electrically connected to the wiring 142 through the wiring 135, and the drain region 132 is electrically connected to the wiring 143 through the wiring 137.

Note that the channel formation region 110 can be provided in the same layer as the channel formation region 130. The source region 111 and the drain region 112 can be provided in the same layer as the source region 131 and the drain region 132. The gate electrode 113 can be provided in the same layer as the gate electrode 133. The wiring 115 and the wiring 117 can be provided in the same layer as the wiring 135 and the wiring 137. In other words, the transistor 71 and the transistor 72 can be provided in one layer. Consequently, the manufacturing process of the display device 10 can be simpler than the case where the transistor 71 and the transistor 72 are provided in different layers, making the display device 10 inexpensive.

The wiring 121 to the wiring 123 electrically connected to the transistor 71 included in the gate driver circuit 21 are provided in one layer. The wiring 141 to the wiring 143 electrically connected to the transistor 72 included in the data driver circuit 22 are provided in one layer. The wiring 121 to the wiring 123 are provided in a layer different from the layer where the wiring 141 to the wiring 143 are provided. In the above manner, an electrical short circuit between the transistor 71, which is the component of the gate driver circuit 21, and the transistor 72, which is the component of the data driver circuit 22, can be inhibited. Accordingly, a malfunction of the gate driver circuit 21 and the data driver circuit 22 can be inhibited even when the gate driver circuit 21 and the data driver circuit 22 have a region where they are not strictly separated from each other and overlap each other. As a result, the reliability of the display device 10 can be increased.

In this specification and the like, the expression "the same layer as A" means a layer that is formed in the same step as A and contains the same material as A, for example.

Although FIG. 25 illustrates the structure in which the wiring 141 to the wiring 143 are provided above the wiring 121 to the wiring 123, the wiring 141 to the wiring 143 may be provided below the wiring 121 to the wiring 123.

Although FIG. 25 illustrates the structure in which the wiring 121 to the wiring 123 extend in the horizontal direction and the wiring 141 to the wiring 143 extend in the perpendicular direction, one embodiment of the present invention is not limited thereto. For example, the wiring 121 to the wiring 123 may extend in the perpendicular direction, and the wiring 141 to the wiring 143 may extend in the horizontal direction. Alternatively, the wiring 121 to the wiring 123 and the wiring 141 to the wiring 143 may all extend in the horizontal direction or in the perpendicular direction.

The dummy transistor 73 includes a semiconductor 151 and a conductor 152. The conductor 152 includes a region overlapped by the semiconductor 151. The semiconductor 151 can be formed in the same layer as the channel formation regions of the transistor 71 and the transistor 72. The conductor 152 can be formed in the same layer as the gate electrodes of the transistor 71 and the transistor 72. Note that one of the semiconductor 151 and the conductor 152 may be omitted in the dummy transistor 73.

The semiconductor 151 and the conductor 152 can be electrically isolated from other wirings or the like. A constant potential may be supplied to the semiconductor 151 and/or the conductor 152. For example, a ground potential may be supplied.

Structure Examples of Pixel 34

Figure 26A:
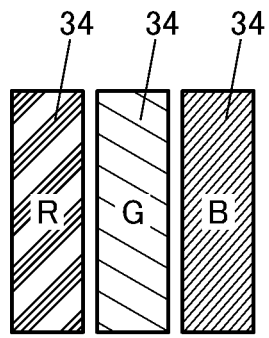
FIG. 26A to FIG. 26G are diagrams illustrating structure examples of pixels.
Figure 26B:
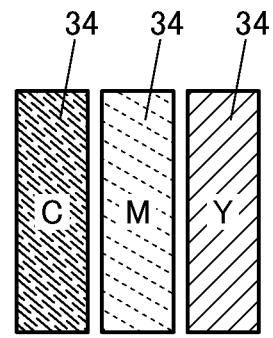

FIG. 26A to FIG. 26E are diagrams for describing colors exhibited by the pixels 34 provided in the display device 10. As illustrated in FIG. 26A, the display device 10 can include the pixel 34 having a function of emitting red light (R), the pixel 34 having a function of emitting green light (G), and the pixel 34 having a function of emitting blue light (B). Alternatively, as illustrated in FIG. 26B, the display device 10 may include the pixel 34 having a function of emitting cyan (C) light, the pixel 34 having a function of emitting magenta (M) light, and the pixel 34 having a function of emitting yellow (Y) light.

Figure 26C:
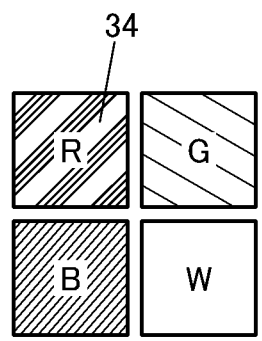
Figure 26D:
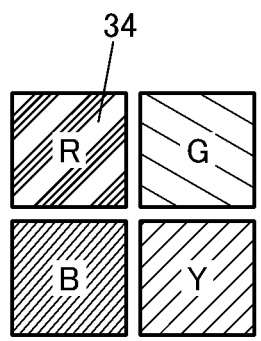

Alternatively, as illustrated in FIG. 26C, the display device 10 may include the pixel 34 having a function of emitting red light (R), the pixel 34 having a function of emitting green light (G), the pixel 34 having a function of emitting blue light (B), and the pixel 34 having a function of emitting white light (W). Alternatively, as illustrated in FIG. 26D, the display device 10 may include the pixel 34 having a function of emitting red light (R), the pixel 34 having a function of emitting green light (G), the pixel 34 having a function of emitting blue light (B), and the pixel 34 having a function of emitting yellow (Y) light. Alternatively, as illustrated in FIG. 26E, the display device 10 may include the pixel 34 having a function of emitting cyan (C) light, the pixel 34 having a function of emitting magenta (M) light, the pixel 34 having a function of emitting yellow (Y) light, and the pixel 34 having a function of emitting white light (W).

Figure 26E:
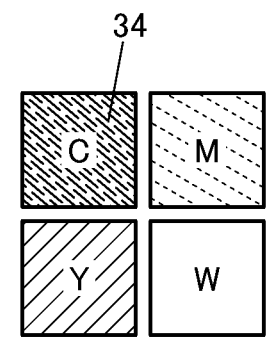

Providing the pixel 34 having a function of emitting white light (W) in the display device 10 as illustrated in FIG. 26C and FIG. 26E can increase the luminance of a displayed image. Furthermore, increasing the number of colors exhibited by the pixels 34 as illustrated in FIG. 26D and the like can increase the reproducibility of intermediate colors and thus can improve the display quality.

Figure 26F:
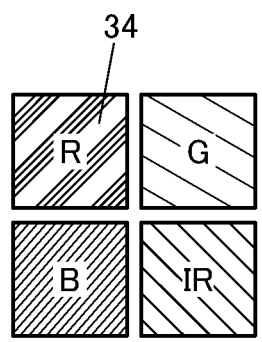
Figure 26G:
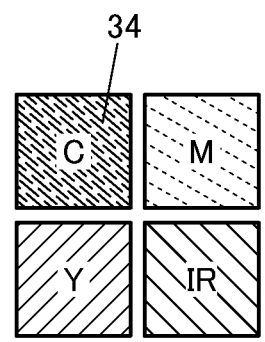

As illustrated in FIG. 26F, the display device 10 may include the pixel 34 having a function of emitting infrared light (IR) in addition to the pixel 34 having a function of emitting red light (R), the pixel 34 having a function of emitting green light (G), and the pixel 34 having a function of emitting blue light (B). Alternatively, as illustrated in FIG. 26G, the display device 10 may include the pixel 34 having a function of emitting infrared light (IR) in addition to the pixel 34 having a function of emitting cyan (C) light, the pixel 34 having a function of emitting magenta (M) light, and the pixel 34 having a function of emitting yellow (Y) light. Alternatively, the display device 10 may include the pixel 34 having a function of emitting white light (W) in addition to the pixels 34 illustrated in FIG. 26F and FIG. 26G.

Figure 27A:
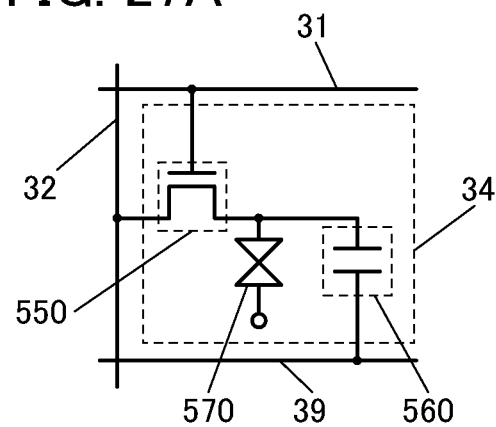
FIG. 27A to FIG. 27C are circuit diagrams illustrating structure examples of a pixel.
Figure 27B:
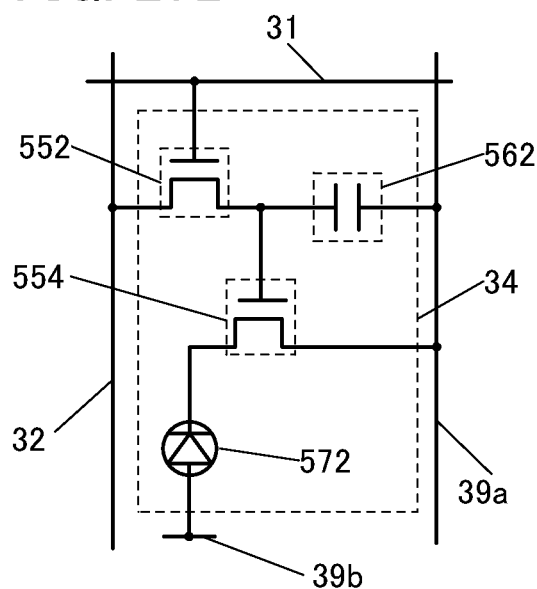
Figure 27C:
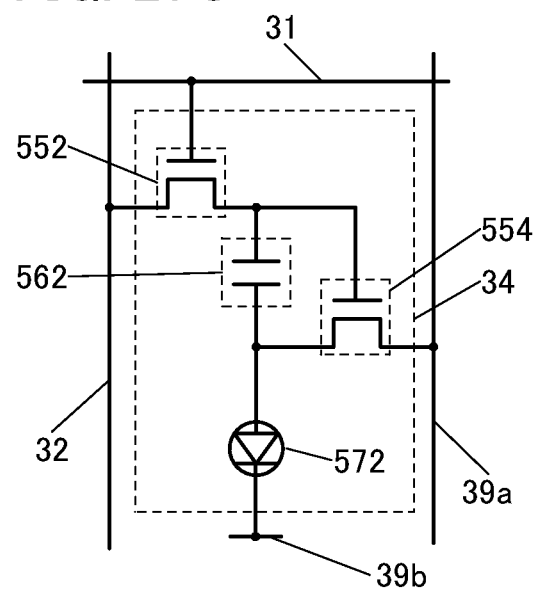

FIG. 27A to FIG. 27C are circuit diagrams each illustrating a configuration example of the pixel 34. The pixel 34 having the configuration illustrated in FIG. 27A includes a liquid crystal element 570, a transistor 550, and a capacitor 560. Here, the liquid crystal element 570 is an element corresponding to the display element 81 illustrated in FIG. 1B. In addition to the wiring 31 and the wiring 32, a wiring 39 and the like are electrically connected to the pixel 34.

The potential of one electrode of the liquid crystal element 570 is set as appropriate in accordance with the specifications of the pixel 34. The alignment state of the liquid crystal element 570 is set depending on image data written to the pixel 34. Note that a common potential may be supplied to the one electrode of the liquid crystal element 570 included in each of a plurality of pixels 34. Alternatively, a potential supplied to the one electrode of the liquid crystal element 570 in the pixel 34 may differ between rows.

The pixel 34 having the configuration illustrated in FIG. 27B includes a transistor 552, a transistor 554, a capacitor 562, and a light-emitting element 572. Here, the light-emitting element 572 is an element corresponding to the display element 81 illustrated in FIG. 1B. As the light-emitting element 572, an EL element utilizing electroluminescence can be used, for example. The EL element includes a layer containing a light-emitting compound (hereinafter also referred to as an EL layer) between a pair of electrodes. By generating a potential difference between the pair of electrodes that is greater than the threshold voltage of the EL element, holes are injected into the EL layer from the anode side and electrons are injected into the EL layer from the cathode side. The injected electrons and holes are recombined in the EL layer and a light-emitting substance contained in the EL layer emits light.

EL elements are classified according to whether a light-emitting material is an organic compound or an inorganic compound; in general, the former is referred to as an organic EL element, and the latter is referred to as an inorganic EL element.

In an organic EL element, by voltage application, electrons from one electrode and holes from the other electrode are injected into the EL layer. Then, these carriers (electrons and holes) are recombined, which makes a light-emitting organic compound form an excited state and emit light when it returns from the excited state to a ground state. On the basis of such a mechanism, this light-emitting element is referred to as a current-excitation light-emitting element.

The EL layer may further contain a substance with a high hole-injection property, a substance with a high hole-transport property, a hole-blocking material, a substance with a high electron-transport property, a substance with a high electron-injection property, a substance with a bipolar property (a substance with a high electron- and hole-transport properties), or the like in addition to the light-emitting compound.

The EL layer can be formed by an evaporation method (including a vacuum evaporation method), a transfer method, a printing method, an inkjet method, a coating method, or the like.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is positioned between dielectric layers, which are further positioned between electrodes, and its light emission mechanism is localized type light emission that utilizes inner-shell electron transition of metal ions.

In order that light emitted from the light-emitting element can be extracted, at least one of the pair of electrodes is transparent. A transistor and a light-emitting element are formed over a substrate; the light-emitting element can have any of a top emission structure in which emitted light is extracted from the surface on the side opposite to the substrate, a bottom emission structure in which emitted light is extracted from the surface on the substrate side, or a dual emission structure in which emitted light is extracted from both surfaces.

Note that an element similar to the light-emitting element 572 can be used as light-emitting elements other than the light-emitting element 572.

One of a source and a drain of a transistor 552 is electrically connected to the wiring 32. The other of the source and the drain of the transistor 552 is electrically connected to one electrode of the capacitor 562 and a gate of the transistor 554. The other electrode of the capacitor 562 is electrically connected to a wiring 39a. A gate of the transistor 552 is electrically connected to the wiring 31. One of a source and a drain of the transistor 554 is electrically connected to the wiring 39a. The other of the source and the drain of the transistor 554 is electrically connected to one electrode of the light-emitting element 572. The other electrode of the light-emitting element 572 is electrically connected to a wiring 39b. The potential VSS is supplied to the wiring 39a, and the potential VDD is supplied to the wiring 39b. The wiring 39a and the wiring 39b have a function of a power supply line.

In the pixel 34 having the configuration illustrated in FIG. 27B, a current flowing through the light-emitting element 572 is controlled in accordance with a potential supplied to the gate of the transistor 554, whereby the luminance of light emitted from the light-emitting element 572 is controlled.

FIG. 27C illustrates a configuration different from that of the pixel 34 in FIG. 27B. In the pixel 34 having the configuration illustrated in FIG. 27C, one of the source and the drain of the transistor 552 is electrically connected to the wiring 32. The other of the source and the drain of the transistor 552 is electrically connected to one electrode of the capacitor 562 and the gate of the transistor 554. The gate of the transistor 552 is electrically connected to the wiring 31. One of the source and the drain of the transistor 554 is electrically connected to the wiring 39a. The other of the source and the drain of the transistor 554 is electrically connected to the other electrode of the capacitor 562 and one electrode of the light-emitting element 572. The other electrode of the light-emitting element 572 is electrically connected to the wiring 39b. The potential VDD is supplied to the wiring 39a, and the potential VSS is supplied to the wiring 39b.

Figure 28A:
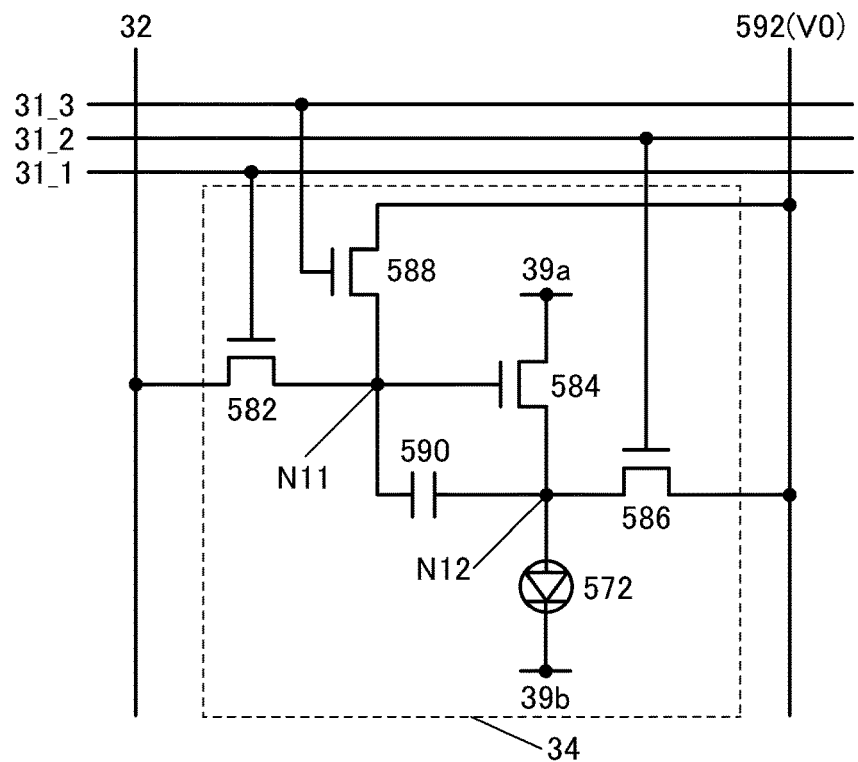
FIG. 28A is a circuit diagram illustrating a structure example of a pixel.

FIG. 28A is a circuit diagram illustrating a configuration example of the pixel 34. The pixel 34 having the configuration illustrated in FIG. 28A includes the light-emitting element 572, a transistor 582, a transistor 584, a transistor 586, a transistor 588, and a capacitor 590. As the wiring 31 having a function of a scan line, a wiring 31_1, a wiring 312, and a wiring 31_3 are electrically connected to the pixel 34 with the configuration illustrated in FIG. 28A.

One of a source and a drain of the transistor 582 is electrically connected to the wiring 32. The other of the source and the drain of the transistor 582 is electrically connected to a gate of the transistor 584. The gate of the transistor 584 is electrically connected to one of a source and a drain of the transistor 588. The one of the source and the drain of the transistor 588 is electrically connected to one electrode of the capacitor 590. One of a source and a drain of the transistor 584 is electrically connected to the wiring 39a. The other of the source and the drain of the transistor 584 is electrically connected to one electrode of the light-emitting element 572. The one electrode of the light-emitting element 572 is electrically connected to one of a source and a drain of the transistor 586. The one of the source and the drain of the transistor 586 is electrically connected to the other electrode of the capacitor 590. The other of the source and the drain of the transistor 586 and the other of the source and the drain of the transistor 588 are electrically connected to a wiring 592. The other electrode of the light-emitting element 572 is electrically connected to the wiring 39b.

Here, a node where the other of the source and the drain of the transistor 582, the gate of the transistor 584, the one of the source and the drain of the transistor 588, and the one electrode of the capacitor 590 are electrically connected to each other is referred to as anode N11. Anode where the one electrode of the light-emitting element 572, the other of the source and the drain of the transistor 584, one electrode of the transistor 586, and the other electrode of the capacitor 590 are electrically connected to each other is referred to as a node N12.

The wiring 592 has a function of a power supply line. The potential of the wiring 592 is referred to as a potential V0.

Example 1 of Method for Operating Pixel 34

Figure 28B:
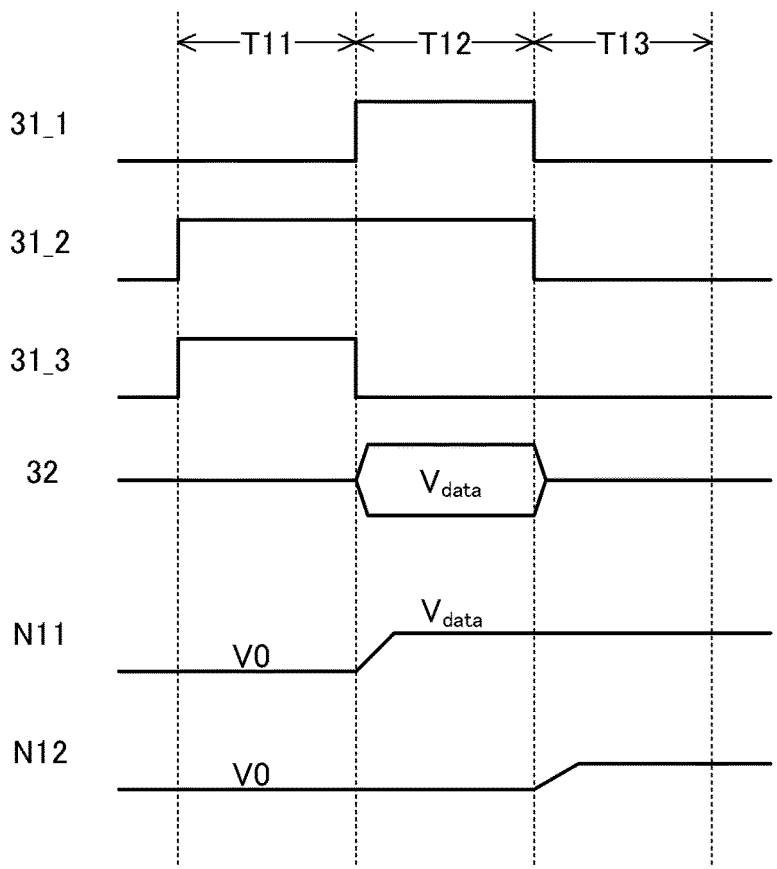
FIG. 28B is a timing chart illustrating an example of a method for operating a pixel.

Next, an example of a method for operating the pixel 34 having the configuration illustrated in FIG. 28A will be described. FIG. 28B is a timing chart illustrating an example of a method for operating the pixel 34 having the configuration illustrated in FIG. 28A. Note that for simplification of description, the influence of various kinds of resistance such as wiring resistance, parasitic capacitance of a transistor, a wiring, or the like, the threshold voltage of a transistor, and the like is not taken into account here.

In the operation shown in FIG. 28B, one frame period is divided into a period T11, a period T12, and a period T13. The description will be made below on an example of a method for operating the pixel 34 having the configuration in FIG. 28A in the period T11 to the period T13.

In the period T11, a potential for turning off the transistor 582 is supplied to the wiring 31_1. In addition, a potential for turning on the transistor 586 is supplied to the wiring 312. Furthermore, a potential for turning on the transistor 588 is supplied to the wiring 31_3. Thus, the potential of the node N11 and the potential of the node N12 become the potential V0, which is the potential of the wiring 592.

In the period T11, both the potential of the node N11, which is electrically connected to the gate of the transistor 584, and the potential of the node N12, which is electrically connected to the other of the source and the drain of the transistor 584, are set to the potential V0. Thus, given that the other of the source and the drain of the transistor 584 is the source of the transistor 584, a difference between the potential of the gate of the transistor 584 and the potential of the source of the transistor 584 can be 0 V. Accordingly, current can be inhibited from flowing between the drain and source of the transistor 584 particularly when the threshold voltage of the transistor 584 is higher than 0 V; hence, current can be inhibited from flowing through the light-emitting element 572. From the above, the period T11 can be referred to as a period during which an image is not displayed on the display device 10.

In the period T12, a potential for turning on the transistor 582 is supplied the wiring 31_1. A potential for turning on the transistor 586 is supplied to the wiring 31_2. A potential for turning off the transistor 588 is supplied to the wiring 31_3. Furthermore, a potential $V_{data}$ corresponding to image data is supplied to the wiring 32. Thus, the potential of the node N11 becomes the potential $V_{data}$. Consequently, image data is written to the pixel 34.

In the period T13, a potential for turning off the transistor 582 is supplied to the wiring 31_1. A potential for turning off the transistor 586 is supplied to the wiring 31_2. A potential for turning off the transistor 588 is supplied to the wiring 31_3. When the transistor 586 is turned off, the current flowing between the drain and source of the transistor 584 flows through the light-emitting element 572. Thus, the light-emitting element 572 emits light with a luminance corresponding to the potential $V_{data}$ written to the node N11. In the above manner, an image can be displayed using the pixel 34.

As described above, in the method shown in FIG. 28B, an image is displayed after a period during which an image is not displayed on the display device 10 is provided. Thus, an image can be displayed with edge enhancement particularly when moving images are displayed on the display device 10. That is, a sharp image can be displayed on the display device 10.

Figure 29A:
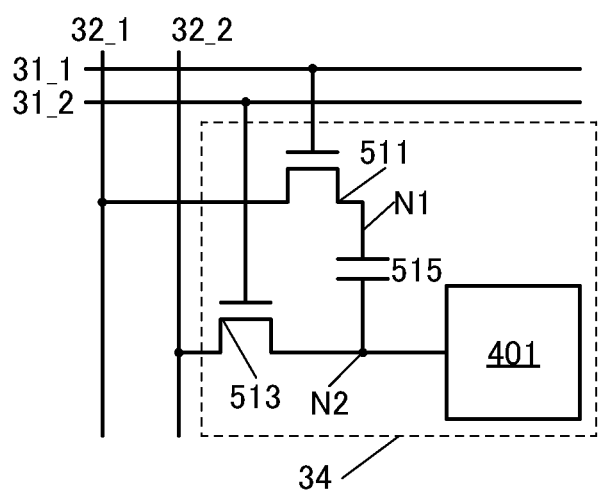
FIG. 29A, FIG. 29C, and FIG. 29D are circuit diagrams illustrating structure examples of a pixel.

FIG. 29A illustrates a configuration example of the pixel 34 that is different from the pixels 34 having the configurations in FIG. 27A to FIG. 27C in including a memory. The pixel 34 having the configuration illustrated in FIG. 29A includes a transistor 511, a transistor 513, a capacitor 515, and a circuit 401. To the pixel 34, the wiring 31_1 and the wiring 31_2 are electrically connected as the wiring 31 having a function of a scan line, and a wiring 32_1 and a wiring 32_2 are electrically connected as the wiring 32 having a function of a data line.

One of a source and a drain of the transistor 511 is electrically connected to the wiring 32_1. The other of the source and the drain of the transistor 511 is electrically connected to one electrode of the capacitor 515. A gate of the transistor 511 is electrically connected to the wiring 31_1. One of a source and a drain of the transistor 513 is electrically connected to the wiring 32_2. The other of the source and the drain of the transistor 513 is electrically connected to the other electrode of the capacitor 515 and the circuit 401. A gate of the transistor 513 is electrically connected to the wiring 31_2.

The circuit 401 is a circuit including at least one display element. Any of a variety of elements can be used as the display element, and typically, a light-emitting element such as an organic light-emitting element or an LED element, a liquid crystal element, a MEMS (Micro Electro Mechanical Systems) element, or the like can be used.

In this specification and the like, a voltage supplied to a display element such as a light-emitting element or a liquid crystal element refers to a difference between a potential applied to one electrode of the display element and a potential applied to the other electrode of the display element.

A node where the transistor 511 and the capacitor 515 are electrically connected to each other is referred to as a node N1, and a node where the transistor 513, the capacitor 515, and the circuit 401 are electrically connected to each other is referred to as a node N2.

In the pixel 34, the potential of the node N1 can be retained when the transistor 511 is turned off. The potential of the node N2 can be retained when the transistor 513 is turned off. When a predetermined potential is written to the node N1 through the transistor 511 with the transistor 513 being in an off state, the potential of the node N2 can be changed in accordance with a change in the potential of the node N1 owing to capacitive coupling through the capacitor 515.

Here, OS transistors can be used as the transistor 511 and the transistor 513. As described above, an OS transistor exhibits an extremely low leakage current (off-state current) in an off state. Accordingly, the use of OS transistors as the transistor 511 and the transistor 513 enables the potentials of the node N1 and the node N2 to be held for a long time.

Note that a transistor containing silicon in its channel formation region (hereinafter also referred to as a Si transistor) may be used as each of the transistor 511 and the transistor 513. Examples of silicon include single crystal silicon, polycrystalline silicon, and amorphous silicon. It is particularly preferable to use a transistor containing low-temperature polysilicon (LTPS) in its semiconductor layer (hereinafter also referred to as an LTPS transistor). An LTPS transistor has high field-effect mobility and can operate at high speed. Thus, when LTPS transistors are used as the transistor 511 and the transistor 513, the pixel 34 can operate at high speed.

Example 2 of Method for Operating Pixel 34

Figure 29B:
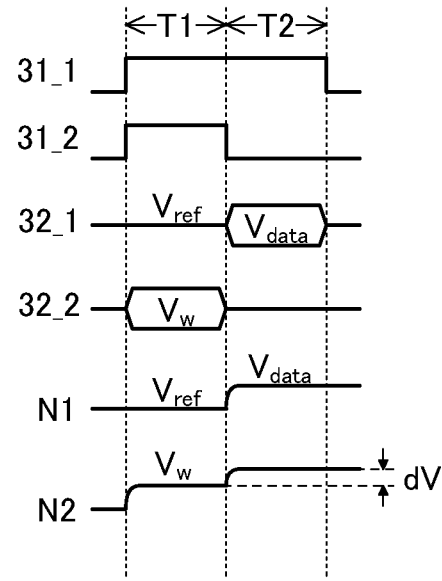
FIG. 29B is a timing chart illustrating an example of a method for operating a pixel.

Next, an example of a method for operating the pixel 34 having the configuration in FIG. 29A is described with reference to FIG. 29B. FIG. 29B is a timing chart of the operation of the pixel 34 having the configuration in FIG. 29A. Note that for simplification of description, the influence of various kinds of resistance such as wiring resistance, parasitic capacitance of a transistor, a wiring, or the like, the threshold voltage of a transistor, and the like is not taken into account here.

In the operation shown in FIG. 29B, one frame period is divided into a period T1 and a period T2. The period T1 is a period in which a potential is written to the node N2, and the period T2 is a period in which a potential is written to the node N1.

In the period T1, a potential for turning on the transistor is supplied to both the wiring 31_1 and the wiring 31_2. In addition, a potential $V_{ref}$ that is a fixed potential is supplied to the wiring 321, and a potential V, is supplied to the wiring 32_2.

The potential $V_{ref}$ is supplied from the wiring 32_1 to the node N1 through the transistor 511. The potential V, is supplied from the wiring 32_2 to the node N2 through the transistor 513. Accordingly, a potential difference $V_w-V_{ref}$ is retained in the capacitor 515.

Next, in the period T2, a potential for turning on the transistor 511 is supplied to the wiring 311, and a potential for turning off the transistor 513 is supplied to the wiring 31_2. The potential $V_{data}$ is supplied to the wiring 32_1, and a predetermined constant potential is supplied to the wiring 32_2. Note that the potential of the wiring 32_2 may be floating.

The potential $V_{data}$ is supplied to the node N1 through the transistor 511. At this time, capacitive coupling due to the capacitor 515 changes the potential of the node N2 in accordance with the potential $V_{data}$ by a potential dV. That is, a potential that is the sum of the potential V, and the potential dV is input to the circuit 401. Note that although dV is shown as a positive value in FIG. 29B, dV may be a negative value. That is, the potential $V_{data}$ may be lower than the potential $V_{ref}$.

Here, the potential dV is roughly determined by the capacitance of the capacitor 515 and the capacitance of the circuit 401. When the capacitance of the capacitor 515 is sufficiently larger than the capacitance of the circuit 401, the potential dV becomes a potential close to a potential difference $V_{data}-V_{ref}$.

As described above, the pixel 34 can generate a potential supplied to the circuit 401 including the display element in combination with two kinds of data; thus, an image displayed on the display portion 33 can be corrected inside the pixel 34. Here, one of the two kinds of data can be the aforementioned image data, and the other can be correction data, for example. For example, when the potential V, corresponding to correction data is supplied to the node N2 in the period T1 and then the potential $V_{data}$ corresponding to image data is supplied to the node N1 in the period T2, an image based on the image data corrected by the correction data can be displayed on the display portion 33. Note that not only image data but also correction data and the like can be generated by the data driver circuit 22 included in the display device 10.

The pixel 34 can also generate a potential exceeding the maximum potential that can be supplied to the wiring 32_1 and the wiring 32_2. For example, in the case of using a light-emitting element, high-dynamic range (HDR) display or the like can be performed. In the case of using a liquid crystal element, overdriving or the like can be performed.

Configuration Examples of Circuit 401

Figure 29C:
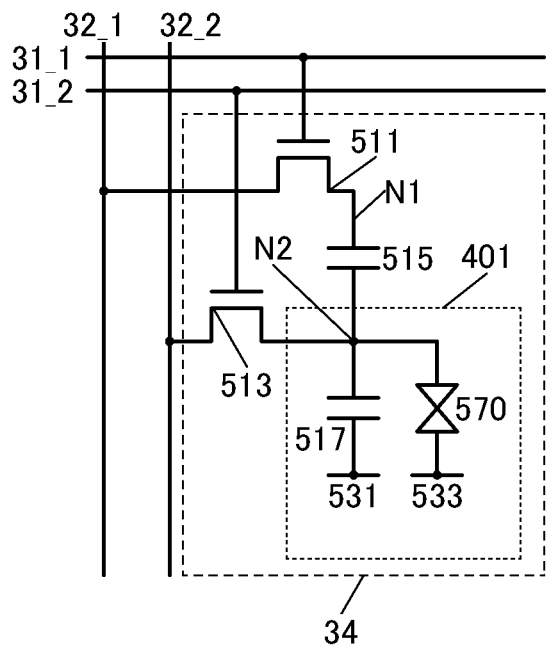
Figure 29D:
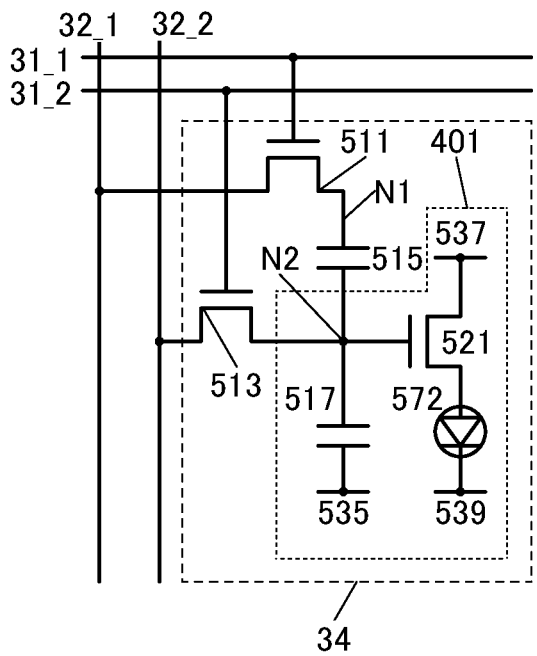

FIG. 29C and FIG. 29D each illustrate a configuration example of the pixel 34 including a specific configuration example of the circuit 401. The circuit 401 that is provided in the pixel 34 having the configuration illustrated in FIG. 29C includes the liquid crystal element 570 and a capacitor 517.

One electrode of the liquid crystal element 570 is electrically connected to the node N2. The other electrode of the liquid crystal element 570 is electrically connected to a wiring 533. One electrode of the capacitor 517 is electrically connected to the node N2. The other electrode of the capacitor 517 is electrically connected to a wiring 531. The wiring 531 and the wiring 533 can be shared by all the pixels 34 provided in the display device 10, for example. In that case, a potential supplied to the wiring 531 and the wiring 533 is a common potential.

The capacitor 517 has a function of a storage capacitor. The capacitor 517 may be omitted.

In the pixel 34 having the configuration illustrated in FIG. 29C, a potential higher than or equal to a potential that can be generated by the data driver circuit 22 and the like can be supplied to the one electrode of the liquid crystal element 570. Thus, a high voltage can be supplied to the liquid crystal element 570 without the data driver circuit 22 having a high withstand voltage, and thus the display device 10 can be inexpensive. Alternatively, for example, it is possible to achieve high-speed display by overdriving and use a liquid crystal material having a high driving voltage while suppressing an increase in power consumption of the display device 10. Image data can be corrected in accordance with the operating temperature, the deterioration state of the liquid crystal element 570, or the like by supply of correction data to the wiring 32_1 or the wiring 322.

The circuit 401 provided in the pixel 34 having the configuration illustrated in FIG. 29D includes the light-emitting element 572, a transistor 521, and the capacitor 517.

One of a source and a drain of the transistor 521 is electrically connected to a wiring 537. The other of the source and the drain of the transistor 521 is electrically connected to one electrode of the light-emitting element 572. A gate of the transistor 521 is electrically connected to the node N2. One electrode of the capacitor 517 is electrically connected to the node N2. The other electrode of the capacitor 517 is electrically connected to a wiring 535. The other electrode of the light-emitting element 572 is electrically connected to a wiring 539.

The wiring 535 can be shared by all the pixels 34 provided in the display device 10, for example. In that case, a potential supplied to the wiring 535 is a common potential. A constant potential can be supplied to the wiring 537 and the wiring 539. For example, a high potential can be supplied to the wiring 537, and a low potential can be supplied to the wiring 539.

The transistor 521 has a function of controlling current to be supplied to the light-emitting element 572. The capacitor 517 has a function of a storage capacitor. The capacitor 517 may be omitted.

Note that FIG. 29D illustrates a configuration in which the anode of the light-emitting element 572 is electrically connected to the transistor 521; alternatively, the transistor 521 may be electrically connected to the cathode. In that case, the value of the potential of the wiring 537 and the value of the potential of the wiring 539 can be changed as appropriate.

In the pixel 34 having the configuration illustrated in FIG. 29D, a potential higher than or equal to a potential that can be generated by the data driver circuit 22 and the like can be supplied to the one electrode of the light-emitting element 572. Thus, a high voltage can be supplied to the gate of the transistor 521 without the data driver circuit 22 having a high withstand voltage, and thus the display device 10 can be inexpensive. Supplying a high potential to the gate of the transistor 521 can make a large current flow through the light-emitting element 572; hence, for example, HDR display or the like can be achieved with the pixel 34 having the configuration illustrated in FIG. 29D. Variations in electrical characteristics of the transistor 521 and the light-emitting element 572 can also be corrected by supply of correction data to the wiring 32_1 or the wiring 32_2.

Moreover, supplying a high potential to the gate of the transistor 521 can supply a high voltage to the light-emitting element 572. Specifically, the potential of the wiring 537 can be set higher, for example. Accordingly, when the light-emitting element 572 is an organic EL element, the light-emitting element can employ a tandem structure described later. This increases the current efficiency and external quantum efficiency of the light-emitting element 572. Thus, the display device 10 can display high-luminance images. In addition, the power consumption of the display device 10 can be reduced.

Note that the configuration is not limited to the circuits shown in FIG. 29C and FIG. 29D, and a configuration to which a transistor, a capacitor, or the like is further added may be employed. For example, when one transistor and one capacitor are added to the configuration in FIG. 29C and FIG. 29D, three nodes capable of holding a potential can be provided. That is, the pixel 34 can have another node capable of holding a potential, in addition to the node N1 and the node N2. Thus, the potential of the node N2 can be further increased. Therefore, in the case where the pixel 34 has the configuration illustrated in FIG. 29C, a higher voltage can be supplied to the liquid crystal element 570. Furthermore, in the case where the pixel 34 has the configuration illustrated in FIG. 29D, a larger amount of current can flow to the light-emitting element 572.

FIG. 30A to FIG. 30E are diagrams illustrating configuration examples of the circuit 401 when the light-emitting element 572 is used as a display element. Like the circuit 401 having the configuration illustrated in FIG. 29D, the circuit 401 having the configuration illustrated in FIG. 30A includes the capacitor 517, the transistor 521, and the light-emitting element 572.

In the circuit 401 having the configuration illustrated in FIG. 30A, the gate of the transistor 521 and one electrode of the capacitor 517 are electrically connected to the node N2. One of the source and the drain of the transistor 521 is electrically connected to the wiring 537. The other of the source and the drain of the transistor 521 is electrically connected to the other electrode of the capacitor 517. The other electrode of the capacitor 517 is electrically connected to one electrode of the light-emitting element 572. The other electrode of the light-emitting element 572 is electrically connected to the wiring 539.

Like the circuit 401 having the configuration illustrated in FIG. 29D, the circuit 401 having the configuration illustrated in FIG. 30B includes the capacitor 517, the transistor 521, and the light-emitting element 572.

In the circuit 401 having the configuration illustrated in FIG. 30B, the gate of the transistor 521 and one electrode of the capacitor 517 are electrically connected to the node N2. One electrode of the light-emitting element 572 is electrically connected to the wiring 537. The other electrode of the light-emitting element 572 is electrically connected to one of the source and the drain of the transistor 521. The other of the source and the drain of the transistor 521 is electrically connected to the other electrode of the capacitor 517. The other electrode of the capacitor 517 is electrically connected to the wiring 539.

FIG. 30C illustrates a configuration example of the circuit 401 in which a transistor 525 is added to the circuit 401 in FIG. 30A. One of a source and a drain of the transistor 525 is electrically connected to the other of the source and the drain of the transistor 521 and the other electrode of the capacitor 517. The other of the source and the drain of the transistor 525 is electrically connected to one electrode of the light-emitting element 572. A gate of the transistor 525 is electrically connected to a wiring 541. The wiring 541 has a function of a scan line that controls the conduction of the transistor 525.

In the pixel 34 including the circuit 401 having the configuration illustrated in FIG. 30C, even when the potential of the node N2 becomes higher than or equal to the threshold voltage of the transistor 521, a current does not flow through the light-emitting element 572 unless the transistor 525 is turned on. Thus, a malfunction of the display device 10 can be inhibited.

FIG. 30D illustrates a configuration example of the circuit 401 in which a transistor 527 is added to the circuit 401 in FIG. 30C. One of a source and a drain of the transistor 527 is electrically connected to the other of the source and the drain of the transistor 521, one of the source and the drain of the transistor 525, and the other electrode of the capacitor 517. The other of the source and the drain of the transistor 527 is electrically connected to a wiring 543. A gate of the transistor 527 is electrically connected to a wiring 545. The wiring 545 has a function of a scan line that controls the conduction of the transistor 527.

The wiring 543 can be electrically connected to a supply source for a certain potential such as a reference potential. That is, the wiring 543 has a function of a power supply line. The certain potential is supplied from the wiring 543 to the other of the source and the drain of the transistor 521, whereby write of the image data to the pixel 34 can be stable.

The wiring 543 can be electrically connected to a circuit 520. The circuit 520 can have one or more of the supply source for the certain potential, a function of obtaining electrical characteristics of the transistor 521, and a function of generating correction data.

The circuit 401 having the configuration illustrated in FIG. 30E includes the capacitor 517, the transistor 521, a transistor 529, and the light-emitting element 572.

In the circuit 401 having the configuration illustrated in FIG. 30E, the gate of the transistor 521 and one electrode of the capacitor 517 are electrically connected to the node N2. One of the source and the drain of the transistor 521 is electrically connected to the wiring 537. One of a source and a drain of the transistor 529 is electrically connected to the wiring 543.

The other electrode of the capacitor 517 is electrically connected to the other of the source and the drain of the transistor 521. The other of the source and the drain of the transistor 521 is electrically connected to the other of the source and the drain of the transistor 529. The other of the source and the drain of the transistor 529 is electrically connected to one electrode of the light-emitting element 572.

A gate of the transistor 529 is electrically connected to the wiring 31_1. The other electrode of the light-emitting element 572 is electrically connected to the wiring 539.

Structure Example 3 of Display Device

Figure 31:
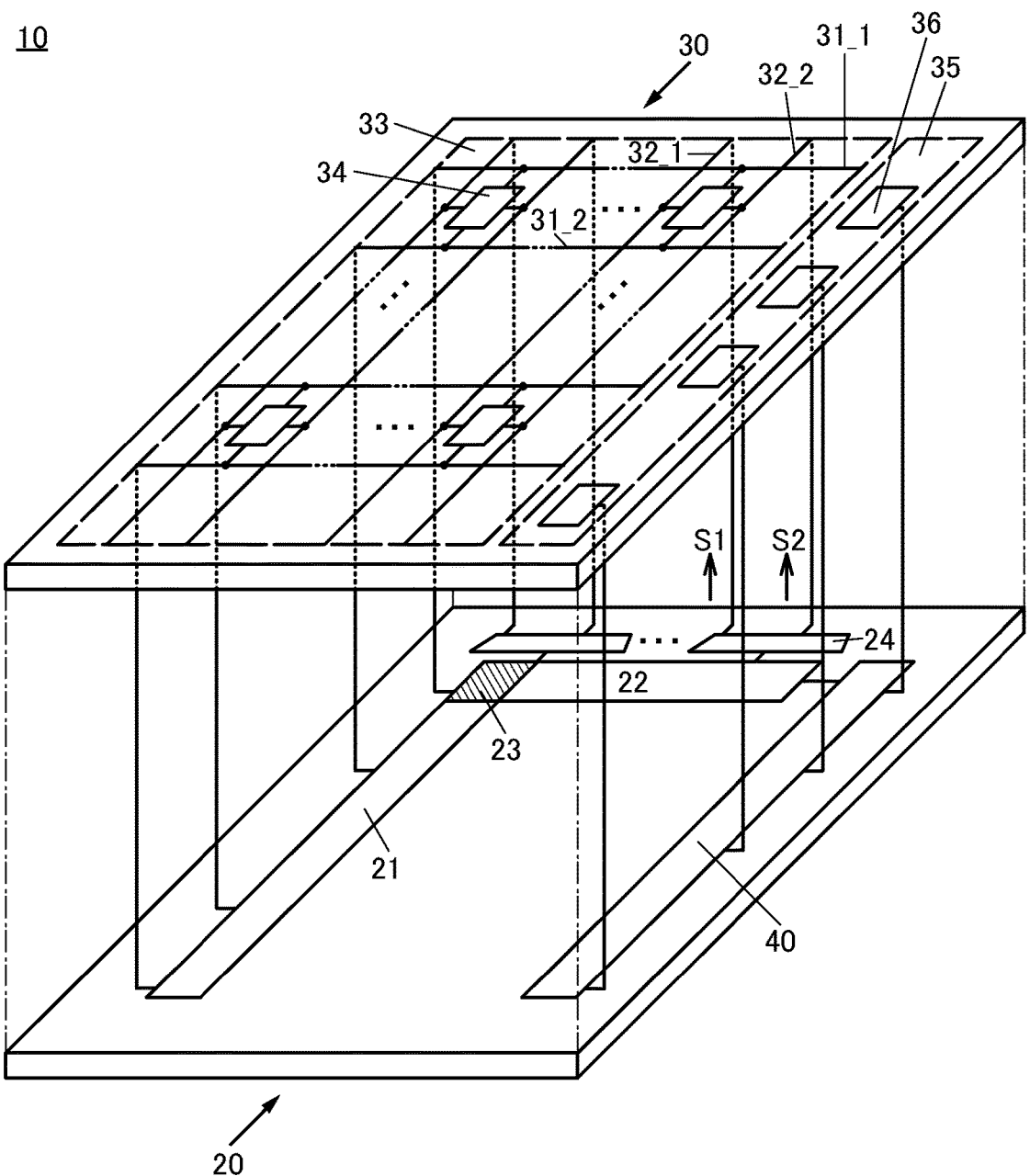
FIG. 31 is a block diagram illustrating a structure example of a display device.

FIG. 31 is a block diagram illustrating a structure example of the display device 10 in which the pixels 34 have the configuration illustrated in FIG. 29A, FIG. 29C, or FIG. 29D. In the display device 10 having the structure illustrated in FIG. 31, a demultiplexer circuit 24 is provided in addition to the components of the display device 10 illustrated in FIG. TA. The demultiplexer circuit 24 can be provided in the layer 20 as illustrated in FIG. 31, for example. Note that the number of demultiplexer circuits 24 can be equal to the number of columns of the pixels 34 provided in the display portion 33, for example.

The gate driver circuit 21 is electrically connected to the pixel 34 through the wiring 31_1. The gate driver circuit 21 is electrically connected to the pixel 34 through the wiring 31_2. The wiring 31_1 and the wiring 31_2 each have a function of a scan line.

The data driver circuit 22 is electrically connected to an input terminal of the demultiplexer circuit 24. A first output terminal of the demultiplexer circuit 24 is electrically connected to the pixel 34 through the wiring 32_1. A second output terminal of the demultiplexer circuit 24 is electrically connected to the pixel 34 through the wiring 32_2. The wiring 32_1 and the wiring 32_2 each have a function of a data line.

Note that the data driver circuit 22 and the demultiplexer circuits 24 may be collectively referred to as a data driver circuit. In other words, the demultiplexer circuits 24 may be included in the data driver circuit 22.

In the display device 10 having the structure in FIG. 31, the data driver circuit 22 has a function of generating image data S1 and image data S2. The demultiplexer circuit 24 has a function of supplying the image data S1 to the pixel 34 through the wiring 321, and a function of supplying the image data S2 to the pixel 34 through the wiring 32_2. Here, when the display device 10 having the structure in FIG. 31 operates with the method illustrated in FIG. 29B, the potential $V_{data}$ can be a potential corresponding to the image data S1 and the potential V, can be a potential corresponding to the image data S2.

When the potential V, is supplied to the node N2 and then the potential $V_{data}$ is supplied to the node N1 as shown in FIG. 29B, the potential of the node N2 becomes "$V_w$+dV". Here, the potential dV corresponds to the potential $V_{data}$ as described above. As a result, the image data S1 can be added to the image data S2. That is, the image data S1 can be superimposed on the image data S2.

The level of the potential $V_{data}$ corresponding to the image data S1 and the level of the potential V, corresponding to the image data S2 are limited by the withstand voltage of the data driver circuit 22, for example. In view of this, superimposing the image data S1 and the image data S2 enables an image corresponding to image data having a potential higher than a potential that the data driver circuit 22 can output, to be displayed on the display portion 33. Thus, a large amount of current can flow through the light-emitting element 572; hence, a high-luminance image can be displayed on the display portion 33. Moreover, the dynamic range, which is the range of luminance of images that the display portion 33 can display, can be enlarged.

An image corresponding to the image data S1 and an image corresponding to the image data S2 may be the same or different from each other. When an image corresponding to the image data S1 and an image corresponding to the image data S2 are the same, the display portion 33 can display an image with higher luminance than the luminance of the image corresponding to the image data S1 or the luminance of the image corresponding to the image data S2.

Figure 32:
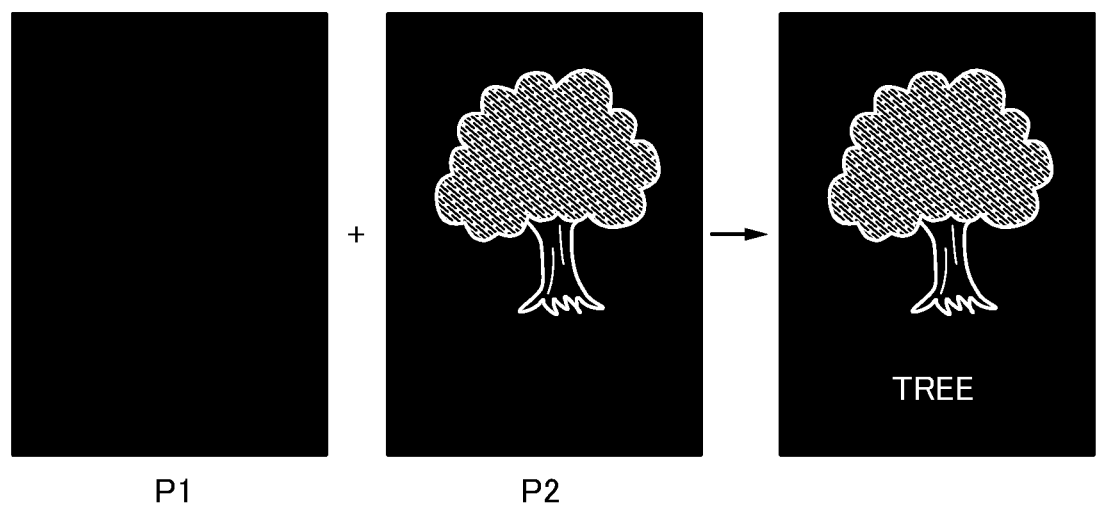
FIG. 32 is a diagram illustrating an operation example of a display device.

FIG. 32 shows the case where an image P1 corresponding to the image data S1 includes only letters, and an image P2 corresponding to the image data S2 includes a picture and letters. In this case, when the image P1 and the image P2 are superimposed on each other, the luminance of the letters can be increased, whereby the letters can be emphasized, for example. As illustrated in FIG. 29B, the potential of the node N2 is changed in accordance with the potential $V_{data}$ after the potential V, is written to the node N2; hence, to rewrite the potential V, corresponding to the image data S2, the potential $V_{data}$ of the image data S1 needs to be written again. Meanwhile, to rewrite the potential $V_{data}$, the potential V, does not need to be rewritten as long as the charge written to the node N2 at the time T1 shown in FIG. 29B is retained without being leaked through the transistor 513 or the like. Consequently, in the case illustrated in FIG. 32, the luminance of the letters can be controlled by adjusting the level of the potential $V_{data}$.

Here, to rewrite the potential V, corresponding to the image data S2, the potential $V_{data}$ corresponding to the image data S1 needs to be written again as described above. On the other hand, to rewrite the potential $V_{data}$, the potential V, does not need to be rewritten. Therefore, the image P2 is preferably an image that needs to be rewritten less frequently than the image PT. Note that the image P1 is not limited to an image including only letters, and the image P2 is not limited to an image including a picture and letters.

Cross-Sectional Structure Example of Display Device

Figure 33:
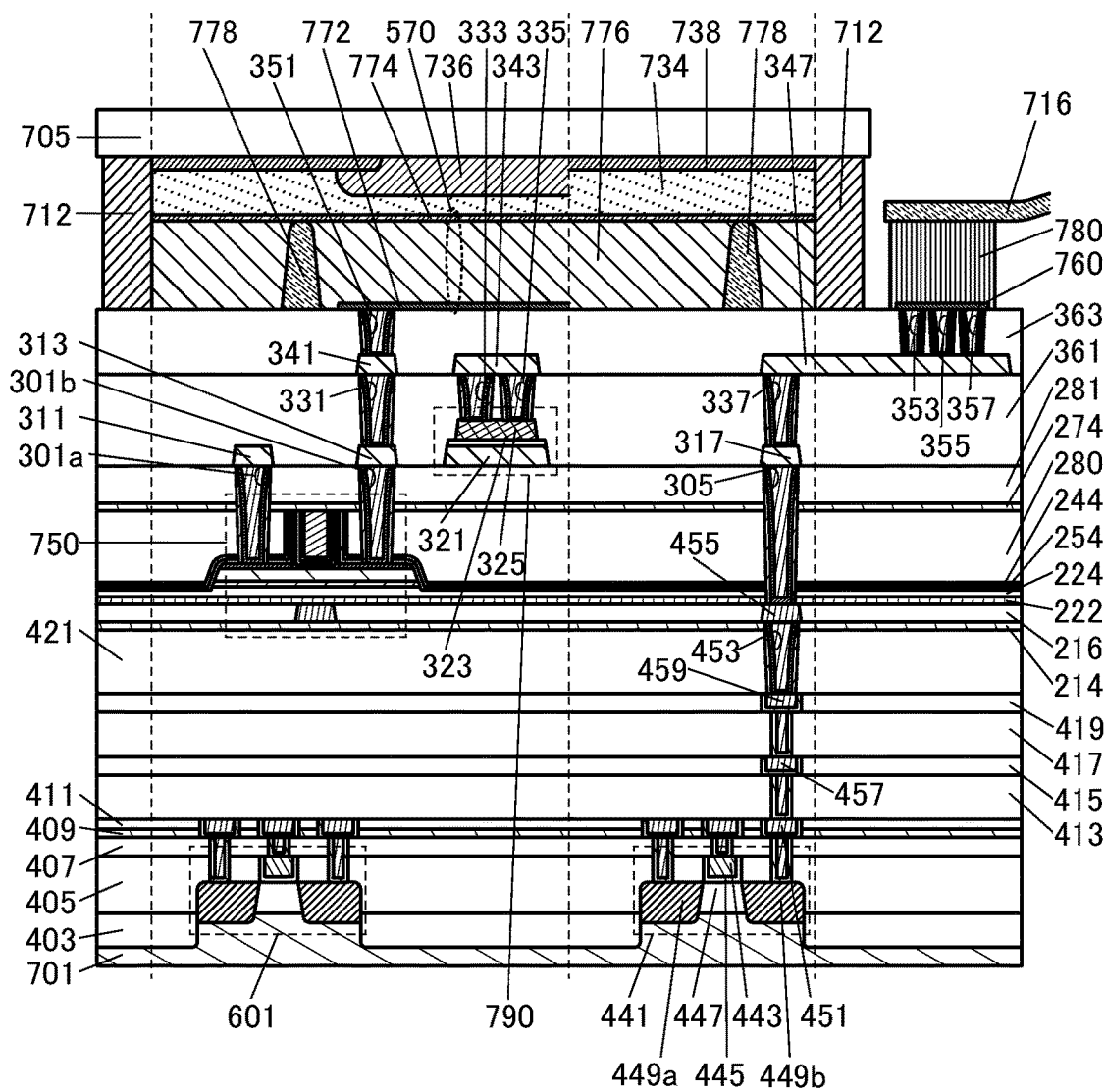
FIG. 33 is a cross-sectional view illustrating a structure example of a display device.

FIG. 33 is a cross-sectional view illustrating a structure example of the display device 10. The display device 10 includes a substrate 701 and a substrate 705, and the substrate 701 and the substrate 705 are attached to each other with a sealant 712.

As the substrate 701, a single crystal semiconductor substrate such as a single crystal silicon substrate can be used. Note that a semiconductor substrate other than a single crystal semiconductor substrate may be used as the substrate 701.

A transistor 441 and a transistor 601 are provided on the substrate 701. The transistor 441 can be a transistor provided in the functional circuit 40. The transistor 601 can be a transistor provided in the gate driver circuit 21 or a transistor provided in the data driver circuit 22. That is, the transistor 441 and the transistor 601 can be provided in the layer 20 illustrated in FIG. TA and the like.

The transistor 441 is formed of a conductor 443 having a function of a gate electrode, an insulator 445 having a function of a gate insulator, and part of the substrate 701 and includes a semiconductor region 447 including a channel formation region, a low-resistance region 449a having a function of one of a source region and a drain region, and a low-resistance region 449b having a function of the other of the source region and the drain region. The transistor 441 can be a p-channel transistor or an n-channel transistor.

The transistor 441 is electrically isolated from other transistors by an element isolation layer 403. FIG. 33 illustrates the case where the transistor 441 and the transistor 601 are electrically isolated from each other by the element isolation layer 403. The element isolation layer 403 can be formed by a LOCOS (LOCal Oxidation of Silicon) method, an STI (Shallow Trench Isolation) method, or the like.

Here, in the transistor 441 illustrated in FIG. 33, the semiconductor region 447 has a projecting shape. Moreover, the conductor 443 is provided to cover a side surface and a top surface of the semiconductor region 447 with the insulator 445 therebetween. Note that FIG. 33 does not illustrate the state where the conductor 443 covers the side surface of the semiconductor region 447. A material adjusting the work function can be used for the conductor 443.

A transistor having a projecting semiconductor region, like the transistor 441, can be referred to as a fin-type transistor because a projecting portion of a semiconductor substrate is used. An insulator functioning as a mask for forming a projecting portion may be provided in contact with an upper portion of the projecting portion. Although FIG. 33 illustrates the structure in which the projecting portion is formed by processing part of the substrate 701, a semiconductor having a projecting shape may be formed by processing an SOI substrate.

Note that the structure of the transistor 441 illustrated in FIG. 33 is only an example; the structure of the transistor 441 is not limited thereto and can be changed as appropriate in accordance with the circuit configuration, an operation method for the circuit, or the like. For example, the transistor 441 may be a planar transistor.

The transistor 601 can have a structure similar to that of the transistor 441.

An insulator 405, an insulator 407, an insulator 409, and an insulator 411 are provided over the substrate 701, in addition to the element isolation layer 403, the transistor 441, and the transistor 601. A conductor 451 is embedded in the insulator 405, the insulator 407, the insulator 409, and the insulator 411. Here, the top surface of the conductor 451 and the top surface of the insulator 411 can be substantially level with each other.

An insulator 413 and an insulator 415 are provided over the conductor 451 and the insulator 411. A conductor 457 is embedded in the insulator 413 and the insulator 415. The conductor 457 can be provided in the same layer as the wiring 121 to the wiring 123 illustrated in FIG. 25, for example. Here, the top surface of the conductor 457 and the top surface of the insulator 415 can be substantially level with each other.

An insulator 417 and an insulator 419 are provided over the conductor 457 and the insulator 415. A conductor 459 is embedded in the insulator 417 and the insulator 419. The conductor 459 can be provided in the same layer as the wiring 141 to the wiring 143 illustrated in FIG. 25, for example. Here, the top surface of the conductor 459 and the top surface of the insulator 419 can be substantially level with each other.

An insulator 421 and an insulator 214 are provided over the conductor 459 and the insulator 419. A conductor 453 is embedded in the insulator 421 and the insulator 214. Here, the top surface of the conductor 453 and the top surface of the insulator 214 can be substantially level with each other.

An insulator 216 is provided over the conductor 453 and the insulator 214. A conductor 455 is embedded in the insulator 216. Here, the top surface of the conductor 455 and the top surface of the insulator 216 can be substantially level with each other.

An insulator 222, an insulator 224, an insulator 254, an insulator 244, an insulator 280, an insulator 274, and an insulator 281 are provided over the conductor 455 and the insulator 216. A conductor 305 is embedded in the insulator 222, the insulator 224, the insulator 254, the insulator 244, the insulator 280, the insulator 274, and the insulator 281. Here, the top surface of the conductor 305 and the top surface of the insulator 281 can be substantially level with each other.

An insulator 361 is provided over the conductor 305 and the insulator 281. A conductor 317 and a conductor 337 are embedded in the insulator 361. Here, the top surface of the conductor 337 and the top surface of the insulator 361 can be substantially level with each other.

An insulator 363 is provided over the conductor 337 and the insulator 361. A conductor 347, a conductor 353, a conductor 355, and a conductor 357 are embedded in the insulator 363. Here, the top surfaces of the conductor 353, the conductor 355, and the conductor 357 and the top surface of the insulator 363 can be substantially level with each other.

A connection electrode 760 is provided over the conductor 353, the conductor 355, the conductor 357, and the insulator 363. An anisotropic conductor 780 is provided to be electrically connected to the connection electrode 760, and an FPC (Flexible Printed Circuit) 716 is provided to be electrically connected to the anisotropic conductor 780. A variety of signals and the like are supplied to the display device 10 from outside of the display device 10 through the FPC 716.

As illustrated in FIG. 33, the low-resistance region 449b having a function of the other of the source region and the drain region of the transistor 441 is electrically connected to the FPC 716 through the conductor 451, the conductor 457, the conductor 459, the conductor 453, the conductor 455, the conductor 305, the conductor 317, the conductor 337, the conductor 347, the conductor 353, the conductor 355, the conductor 357, the connection electrode 760, and the anisotropic conductor 780. Although FIG. 33 illustrates three conductors, which are the conductor 353, the conductor 355, and the conductor 357, as conductors that electrically connect the connection electrode 760 and the conductor 347, one embodiment of the present invention is not limited thereto. The number of conductors having a function of electrically connecting the connection electrode 760 and the conductor 347 may be one, two, or four or more. Providing a plurality of conductors having a function of electrically connecting the connection electrode 760 and the conductor 347 can reduce the contact resistance.

A transistor 750 is provided over the insulator 214. The transistor 750 can be a transistor provided in the pixel 34. That is, the transistor 750 can be provided in the layer 30 illustrated in FIG. 1A and the like. As the transistor 750, an OS transistor can be used, for example. As described above, an OS transistor is characterized by an extremely low off-state current. Thus, image data or the like can be held for a longer time, so that the refresh operation can be less frequent. Thus, power consumption of the display device 10 can be reduced.

Note that a Si transistor may be used as the transistor 750. In particular, an LTPS transistor is preferably used. As described above, an LTPS transistor has high field-effect mobility and can operate at high speed. Thus, when an LTPS transistor is used as the transistor 750, the display device 10 can operate at high speed.

A conductor 301a and a conductor 301b are embedded in the insulator 254, the insulator 244, the insulator 280, the insulator 274, and the insulator 281. The conductor 301a is electrically connected to one of a source and a drain of the transistor 750, and the conductor 301b is electrically connected to the other of the source and the drain of the transistor 750. Here, the top surfaces of the conductor 301a and the conductor 301b and the top surface of the insulator 281 can be substantially level with each other.

A conductor 311, a conductor 313, a conductor 331, a capacitor 790, a conductor 333, and a conductor 335 are embedded in the insulator 361. The conductor 311 and the conductor 313 are electrically connected to the transistor 750 and have a function of a wiring. The conductor 333 and the conductor 335 are electrically connected to the capacitor 790. Here, the top surfaces of the conductor 331, the conductor 333, and the conductor 335 and the top surface of the insulator 361 can be substantially level with each other.

A conductor 341, a conductor 343, and a conductor 351 are embedded in the insulator 363. Here, the top surface of the conductor 351 and the top surface of the insulator 363 can be substantially level with each other.

The insulator 405, the insulator 407, the insulator 409, the insulator 411, the insulator 413, the insulator 415, the insulator 417, the insulator 419, the insulator 421, the insulator 214, the insulator 280, the insulator 274, the insulator 281, the insulator 361, and the insulator 363 have a function of an interlayer film and may also have a function of a planarization film that covers unevenness thereunder. For example, the top surface of the insulator 363 may be planarized by planarization treatment using a chemical mechanical polishing (CMP) method or the like to have the increased evenness.

As illustrated in FIG. 33, the capacitor 790 includes a lower electrode 321 and an upper electrode 325. An insulator 323 is provided between the lower electrode 321 and the upper electrode 325. That is, the capacitor 790 has a stacked-layer structure in which the insulator 323 functioning as a dielectric is positioned between the pair of electrodes. Although FIG. 33 illustrates an example in which the capacitor 790 is provided over the insulator 281, the capacitor 790 may be provided over an insulator different from the insulator 281.

In the example in FIG. 33, the conductor 301a, the conductor 301b, and the conductor 305 are formed in one layer. The conductor 311, the conductor 313, the conductor 317, and the lower electrode 321 are formed in one layer. The conductor 331, the conductor 333, the conductor 335, and the conductor 337 are formed in one layer. The conductor 341, the conductor 343, and the conductor 347 are formed in one layer. The conductor 351, the conductor 353, the conductor 355, and the conductor 357 are formed in one layer. Forming a plurality of conductors in the same layer in this manner simplifies the process of manufacturing the display device 10 and thus makes the display device 10 inexpensive. Note that these conductors may be formed in different layers or may contain different types of materials.

The display device 10 illustrated in FIG. 33 includes the liquid crystal element 570. The liquid crystal element 570 includes a conductor 772, a conductor 774, and a liquid crystal layer 776 therebetween. The conductor 774 is provided on the substrate 705 side and has a function of a common electrode. The conductor 772 is electrically connected to the other of the source and the drain of the transistor 750 through the conductor 351, the conductor 341, the conductor 331, the conductor 313, and the conductor 301b. The conductor 772 is formed over the insulator 363 and has a function of a pixel electrode.

A material that transmits visible light or a material that reflects visible light can be used for the conductor 772. As a light-transmitting material, for example, an oxide material containing indium, zinc, tin, or the like is preferably used. As a reflective material, for example, a material containing aluminum, silver, or the like is preferably used.

When a reflective material is used for the conductor 772, the display device 10 is a reflective liquid crystal display device. By contrast, when a light-transmitting material is used for the conductor 772 and a light-transmitting material is also used for the substrate 701 and the like, the display device 10 is a transmissive liquid crystal display device. In the case where the display device 10 is a reflective liquid crystal display device, a polarizing plate is provided on the viewer side. On the other hand, in the case where the display device 10 is a transmissive liquid crystal display device, a pair of polarizing plates are provided such that the liquid crystal element is sandwiched therebetween.

In addition, although not illustrated in FIG. 33, an alignment film in contact with the liquid crystal layer 776 may be provided. Furthermore, an optical member (an optical substrate) such as a polarizing member, a retardation member, or an anti-reflection member and a light source such as a backlight or a side light can be provided as appropriate.

A component 778 is provided between the insulator 363 and the conductor 774. The component 778 is a columnar spacer and has a function of controlling the distance (the cell gap) between the substrate 701 and the substrate 705. Note that a spherical spacer may also be used as the component 778.

On the substrate 705 side, a light-blocking layer 738, a coloring layer 736, and an insulator 734 that is in contact with them are provided. The light-blocking layer 738 has a function of blocking light emitted from adjacent regions. Alternatively, the light-blocking layer 738 has a function of preventing external light from reaching the transistor 750 or the like. Note that coloring layer 736 is provided to have a region overlapping the liquid crystal element 570.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

As the mode of the liquid crystal element, a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like can be employed.

In addition, a scattering liquid crystal employing a polymer dispersed liquid crystal, a polymer network liquid crystal, or the like can be used for the liquid crystal layer 776. In this case, monochrome image display may be performed without providing the coloring layer 736, or color display may be performed using the coloring layer 736.

As a driving method of the liquid crystal element, a time-division display method (also referred to as a field-sequential driving method) by which color display is performed by a successive additive color mixing method may be used. In that case, a structure in which the coloring layer 736 is not provided can be employed. In the case where the time-division display method is employed, advantages such as an increase in the aperture ratio of pixels and an increase in definition can be obtained because it is not necessary to provide subpixels that exhibit R (red), G (green), and B (blue), for example.

Figure 34:
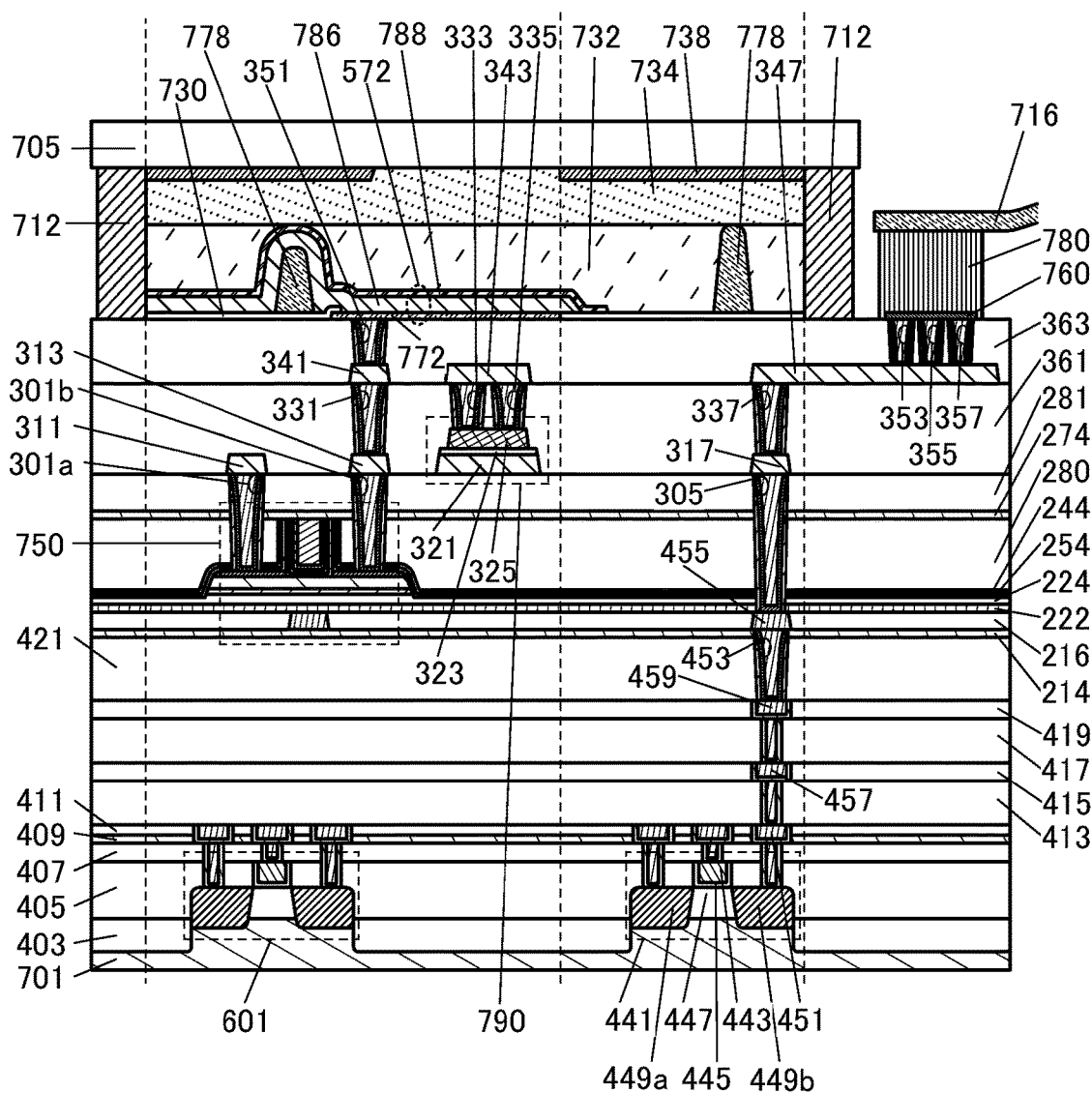
FIG. 34 is a cross-sectional view illustrating a structure example of a display device.

In the display device 10 with the structure illustrated in FIG. 33, a liquid crystal element is used as the display element; however, one embodiment of the present invention is not limited thereto. FIG. 34 illustrates a variation example of the display device 10 illustrated in FIG. 33, which is different from the display device 10 illustrated in FIG. 33 in that a light-emitting element is used as the display element.

The display device 10 illustrated in FIG. 34 includes the light-emitting element 572. The light-emitting element 572 includes the conductor 772, an EL layer 786, and a conductor 788. The conductor 788 is provided on the substrate 705 side and has a function of a common electrode. The conductor 772 is electrically connected to the other of the source and the drain of the transistor 750 through the conductor 351, the conductor 341, the conductor 331, the conductor 313, and the conductor 301b. The conductor 772 is formed over the insulator 363 and has a function of a pixel electrode. The EL layer 786 contains an organic compound or an inorganic compound such as quantum dots.

Examples of materials that can be used as an organic compound include a fluorescent material and a phosphorescent material. Examples of materials that can be used as quantum dots include a colloidal quantum dot material, an alloyed quantum dot material, a core-shell quantum dot material, and a core quantum dot material.

In the display device 10 illustrated in FIG. 34, an insulator 730 is provided over the insulator 363. Here, the insulator 730 can cover part of the conductor 772. The light-emitting element 572 includes the conductor 788 with a light-transmitting property, and thus can be a top-emission light-emitting element. Note that the light-emitting element 572 may have a bottom-emission structure in which light is emitted to the conductor 772 side or a dual-emission structure in which light is emitted to both the conductor 772 and the conductor 788.

The light-emitting element 572 can have a microcavity structure, which will be described later in detail. Thus, light of predetermined colors (e.g., RGB) can be extracted without a coloring layer, and the display device 10 can perform color display. The structure without a coloring layer can prevent light absorption by the coloring layer. As a result, the display device 10 can display high-luminance images, and the power consumption of the display device 10 can be reduced. Note that a structure in which a coloring layer is not provided can be employed even when the EL layer 786 is formed into an island shape for each pixel or into a stripe shape for each pixel column, i.e., the EL layers 786 are formed by separate coloring.

The light-blocking layer 738 is provided to include a region overlapping the insulator 730. The light-blocking layer 738 is covered with the insulator 734. A space between the light-emitting element 572 and the insulator 734 is filled with a sealing layer 732.

A component 778 is provided between the insulator 730 and the EL layer 786. Another component 778 is provided between the insulator 730 and the insulator 734. The component 778 is a columnar spacer and has a function of controlling the distance (the cell gap) between the substrate 701 and the substrate 705. Note that a spherical spacer may also be used as the component 778.

On the substrate 705 side, the light-blocking layer 738 and the insulator 734 in contact with the light-blocking layer 738 are provided. The light-blocking layer 738 has a function of blocking light emitted from adjacent regions. Alternatively, the light-blocking layer 738 has a function of preventing external light from reaching the transistor 750 or the like.

Figure 35:
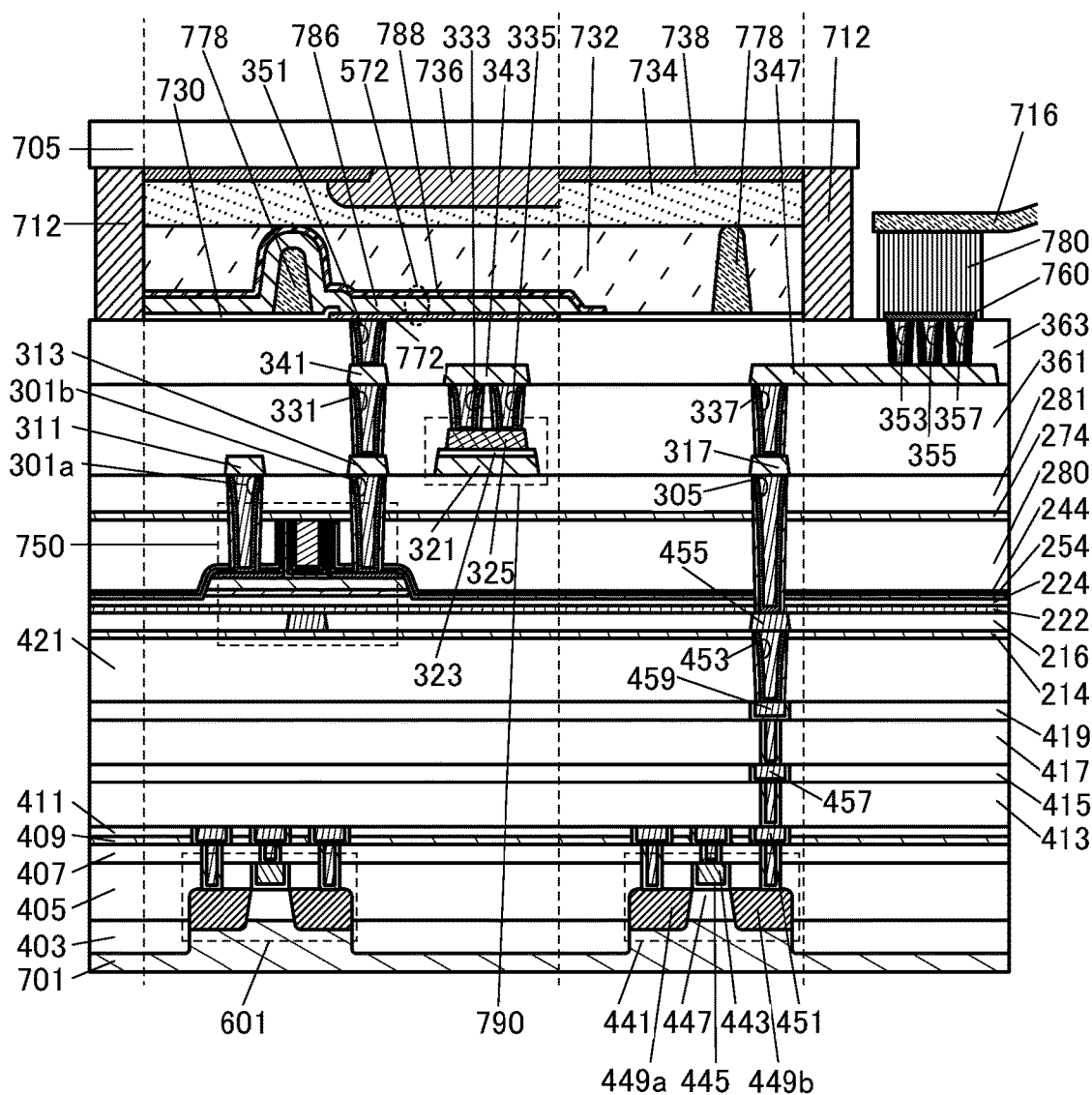
FIG. 35 is a cross-sectional view illustrating a structure example of a display device.

FIG. 35 illustrates a variation example of the display device 10 illustrated in FIG. 34 and differs from the display device 10 illustrated in FIG. 34 in that the coloring layer 736 is provided. Providing the coloring layer 736 can improve the color purity of light extracted from the light-emitting element 572. Thus, the display device 10 can display high-quality images. Furthermore, all the light-emitting elements 572, for example, in the display device 10 can be light-emitting elements that emit white light; hence, the EL layers 786 are not necessarily formed by separate coloring, leading to higher definition of the display device 10.

Figure 36:
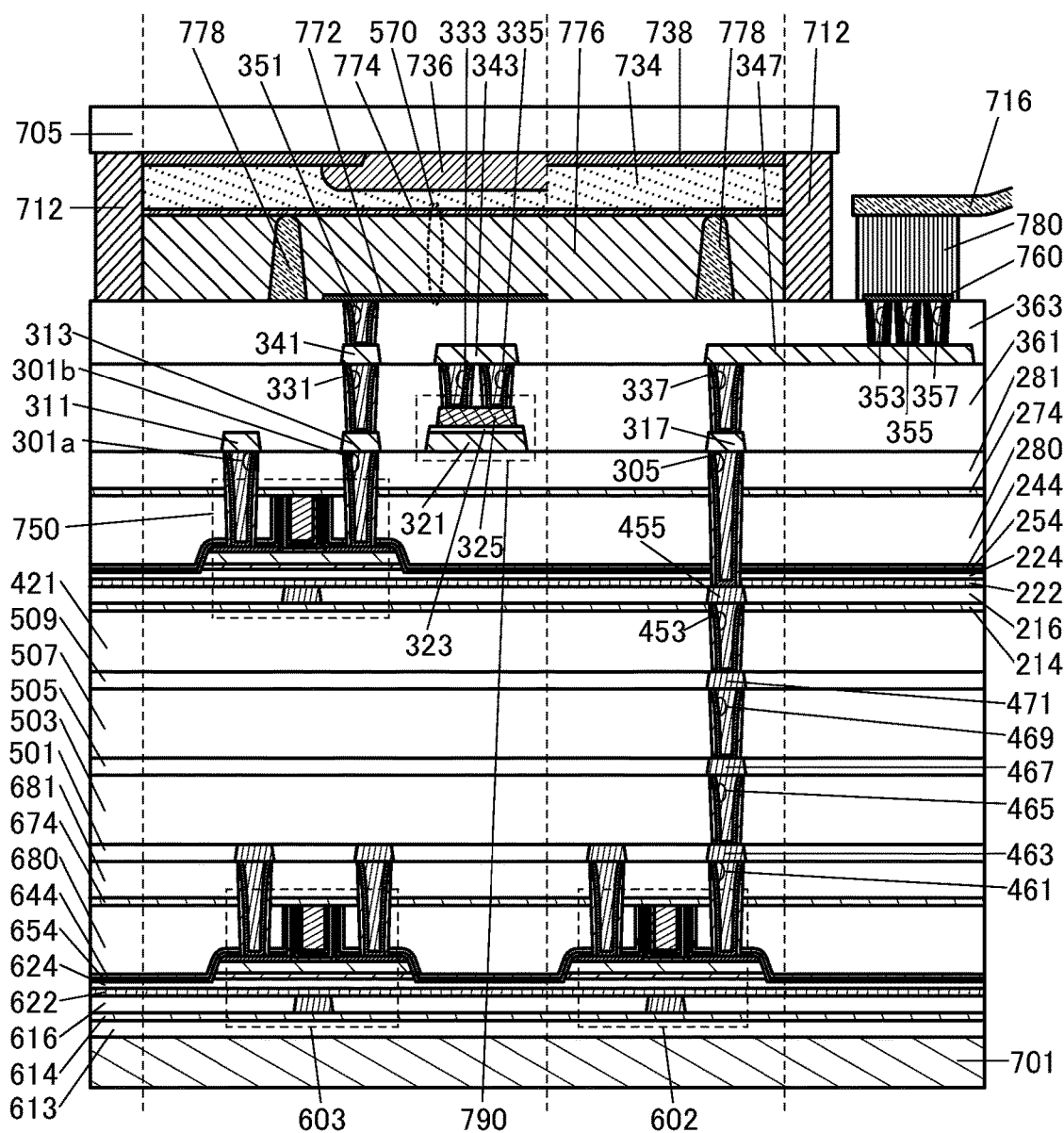
FIG. 36 is a cross-sectional view illustrating a structure example of a display device.
Figure 37:
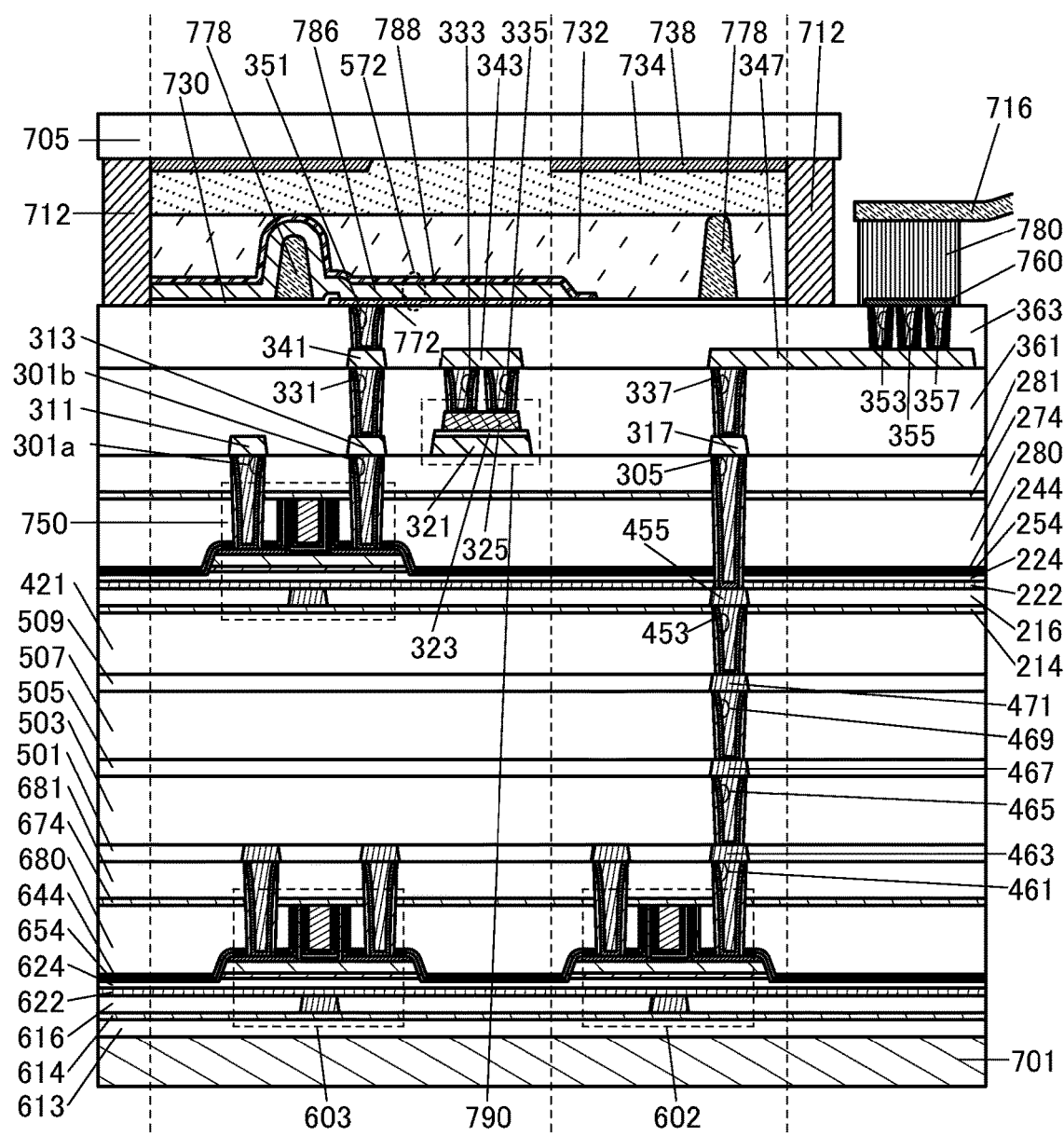
FIG. 37 is a cross-sectional view illustrating a structure example of a display device.
Figure 38:
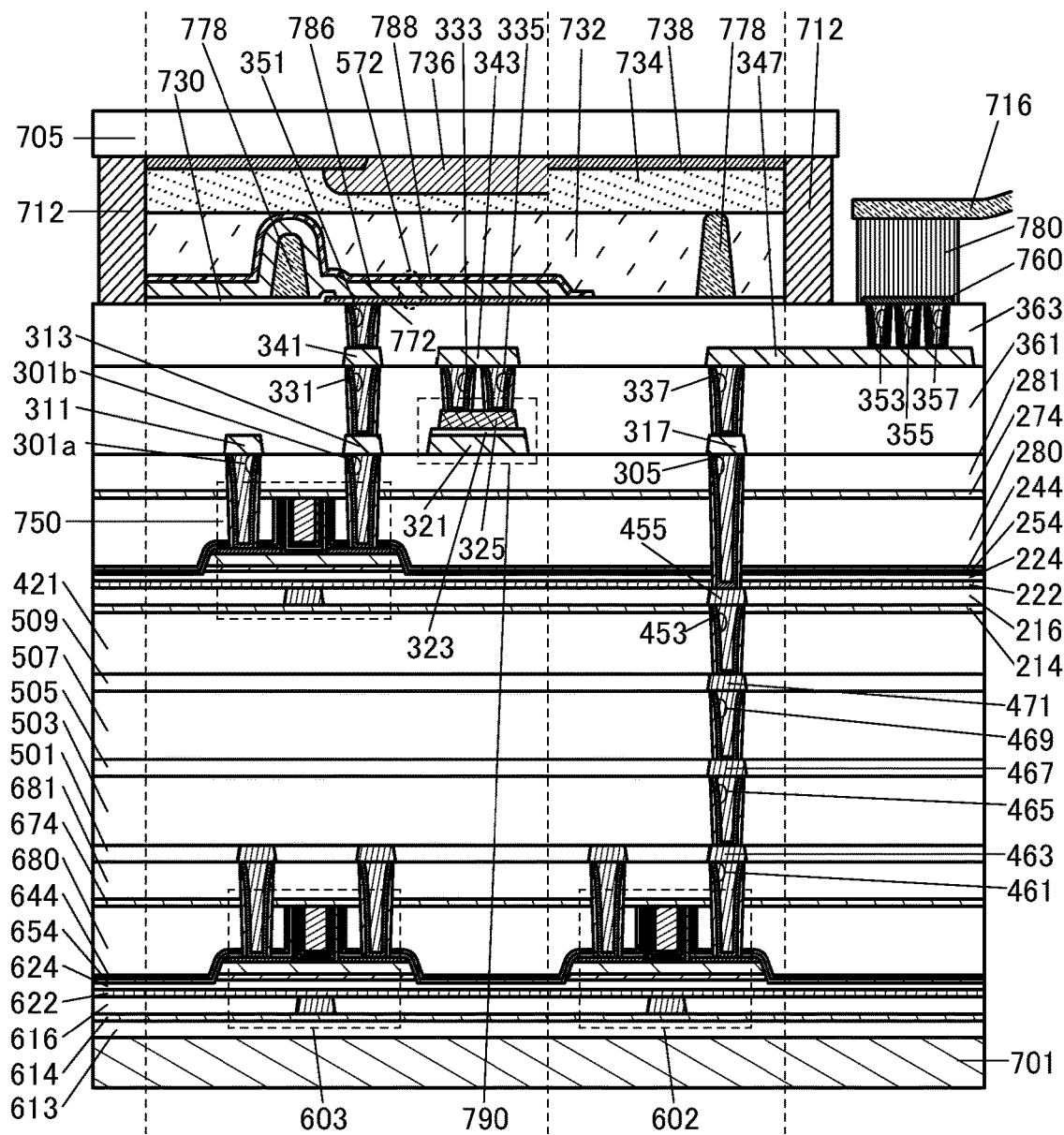
FIG. 38 is a cross-sectional view illustrating a structure example of a display device.

Although FIG. 33 to FIG. 35 show that the transistor 441 and the transistor 601 have a structure different from that of the transistor 750, one embodiment of the present invention is not limited thereto. FIG. 36 shows a variation example of FIG. 33, FIG. 37 shows a variation example of FIG. 34, and FIG. 38 shows a variation example of FIG. 35. The display devices 10 with the structures illustrated in FIG. 36 to FIG. 38 differ from those with the structures illustrated in FIG. 33 to FIG. 35 in that the transistor 750 is provided to be stacked over the transistor 602 and the transistor 603 that have a structure similar to that of the transistor 750.

An insulator 613 and an insulator 614 are provided over the substrate 701, and the transistor 602 and the transistor 603 are provided over the insulator 614. Note that a transistor or the like may be provided between the substrate 701 and the insulator 613. For example, a transistor having a structure similar to that of the transistor 441 and the transistor 601 illustrated in FIG. 33 to FIG. 35 may be provided between the substrate 701 and the insulator 613.

The transistor 602 can be a transistor provided in the functional circuit 40. The transistor 603 can be a transistor provided in the gate driver circuit 21 or a transistor provided in the data driver circuit 22. That is, the transistor 602 and the transistor 603 can be provided in the layer 20 illustrated in FIG. 1A and the like.

An insulator 616, an insulator 622, an insulator 624, an insulator 654, an insulator 644, an insulator 680, an insulator 674, and an insulator 681 are provided over the insulator 614, in addition to the transistor 602 and the transistor 603. A conductor 461 is embedded in the insulator 654, the insulator 644, the insulator 680, the insulator 674, and the insulator 681. Here, the top surface of the conductor 461 and the top surface of the insulator 681 can be substantially level with each other.

An insulator 501 is provided over the conductor 461 and the insulator 681. A conductor 463 is embedded in the insulator 501. Here, the top surface of the conductor 463 and the top surface of the insulator 501 can be substantially level with each other.

An insulator 503 is provided over the conductor 463 and the insulator 501. A conductor 465 is embedded in the insulator 503. Here, the top surface of the conductor 465 and the top surface of the insulator 503 can be substantially level with each other.

An insulator 505 is provided over the conductor 465 and the insulator 503. A conductor 467 is embedded in the insulator 505. The conductor 467 can be provided in the same layer as the wiring 121 to the wiring 123 illustrated in FIG. 25, for example. Here, the top surface of the conductor 467 and the top surface of the insulator 505 can be substantially level with each other.

An insulator 507 is provided over the conductor 467 and the insulator 505. A conductor 469 is embedded in the insulator 507. Here, the top surface of the conductor 469 and the top surface of the insulator 507 can be substantially level with each other.

An insulator 509 is provided over the conductor 469 and the insulator 507. A conductor 471 is embedded in the insulator 509. The conductor 471 can be provided in the same layer as the wiring 141 to the wiring 143 illustrated in FIG. 25, for example. Here, the top surface of the conductor 471 and the top surface of the insulator 509 can be substantially level with each other.

The insulator 421 and the insulator 214 are provided over the conductor 471 and the insulator 509. The conductor 453 is embedded in the insulator 421 and the insulator 214. Here, the top surface of the conductor 453 and the top surface of the insulator 214 can be substantially level with each other.

As illustrated in FIG. 36 to FIG. 38, one of a source and a drain of the transistor 602 is electrically connected to the FPC 716 through the conductor 461, the conductor 463, the conductor 465, the conductor 467, the conductor 469, the conductor 471, the conductor 453, the conductor 455, the conductor 305, the conductor 317, the conductor 337, the conductor 347, the conductor 353, the conductor 355, the conductor 357, the connection electrode 760, and the anisotropic conductor 780.

The insulator 613, the insulator 614, the insulator 680, the insulator 674, the insulator 681, the insulator 501, the insulator 503, the insulator 505, the insulator 507, and the insulator 509 have a function of an interlayer film and may also have a function of a planarization film that covers unevenness thereunder.

When the display device 10 has the structure illustrated in any of FIG. 36 to FIG. 38, all the transistors in the display device 10 can be transistors having the same structure while the frame and size of the display device 10 are reduced. Accordingly, the transistors provided in the layer 20 and the transistors provided in the layer 30 can be manufactured using the same apparatus, for example. Consequently, the manufacturing cost of the display device 10 can be reduced, making the display device 10 inexpensive.

Structure Example 4 of Display Device

Figure 39A:
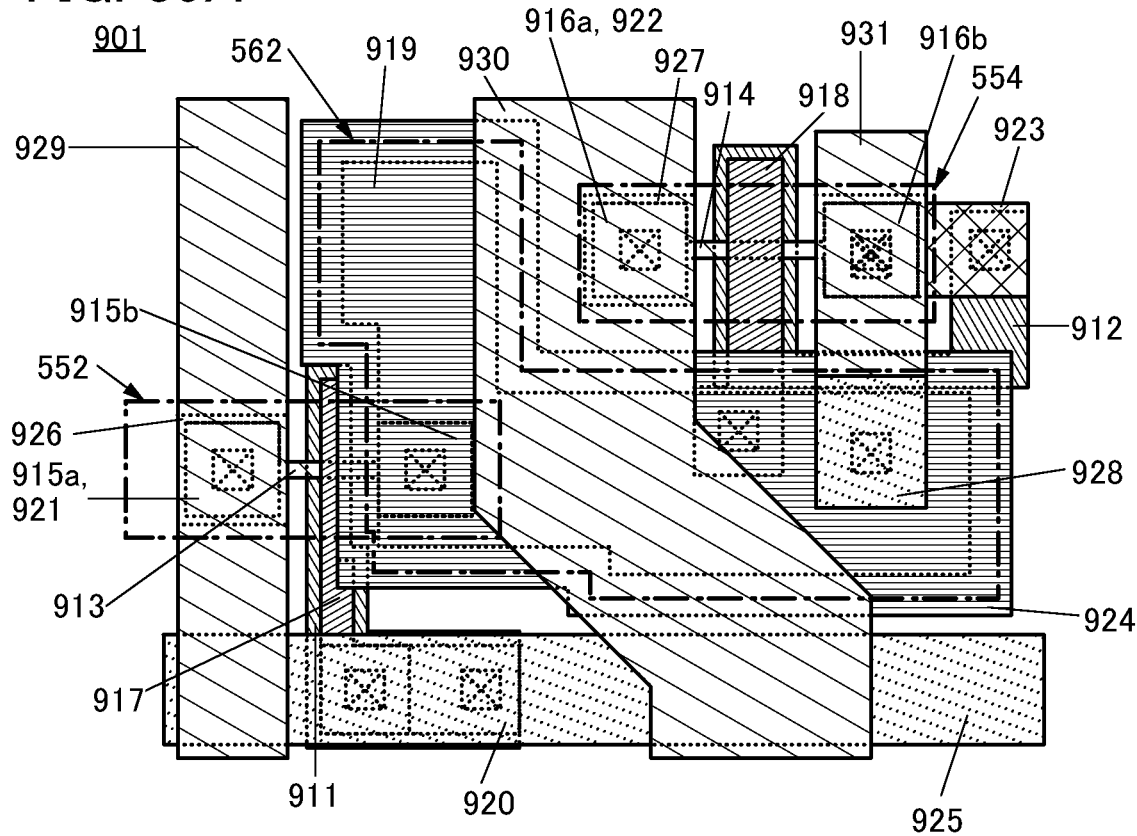
FIG. 39A and FIG. 39B are top views illustrating structure examples of a pixel.
Figure 39B:
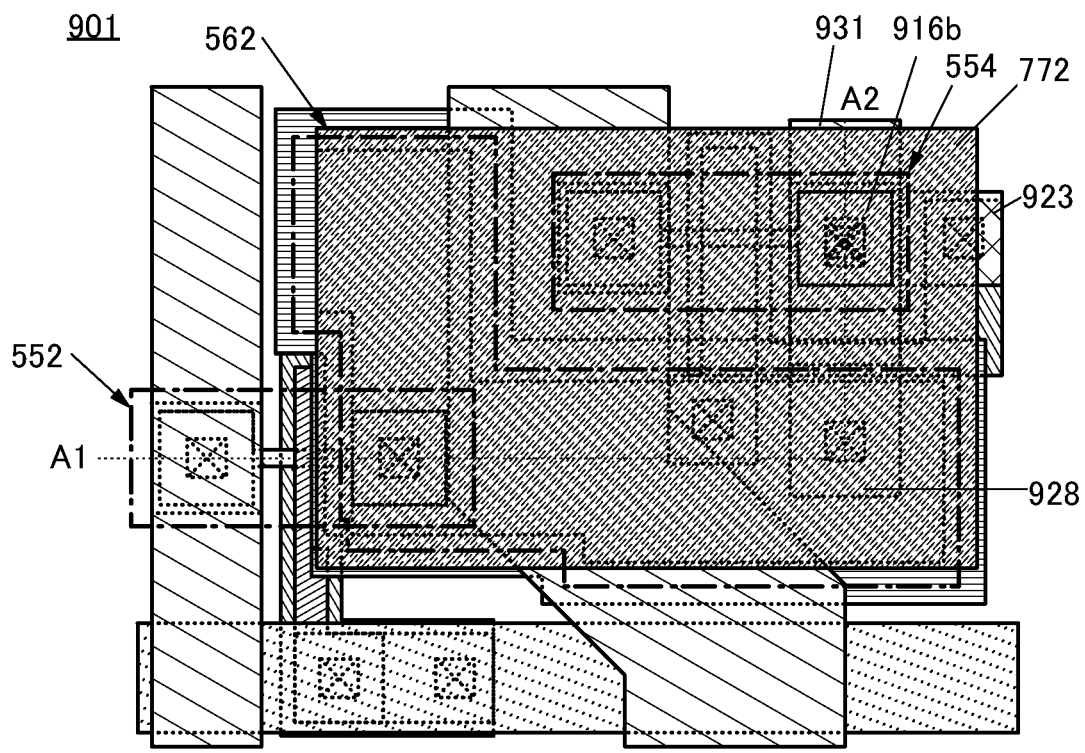

FIG. 39A and FIG. 39B are top views illustrating structure examples of a subpixel 901 that can be used in the display device of one embodiment of the present invention. The subpixel 901 can have the circuit configuration illustrated in FIG. 27C. Here, the transistor 552 includes a back gate in addition to a gate, and the back gate is electrically connected to the wiring 31. The transistor 554 includes a back gate in addition to a gate, and the back gate is electrically connected to the other of the source and the drain of the transistor 554, the other electrode of the capacitor 562, and one electrode of the light-emitting element 572.

FIG. 39A illustrates conductors and semiconductors that constitute the transistors, the capacitor, the wirings, and the like included in the subpixel 901. FIG. 39B illustrates the conductor 772 functioning as one electrode of the light-emitting element 572, in addition to the components illustrated in FIG. 39A. Note that the conductor functioning as the other electrode of the light-emitting element 572, or the like is omitted in both FIG. 39A and FIG. 39B. Here, the one electrode of the light-emitting element 572 has a function of a pixel electrode, and the other electrode of the light-emitting element 572 has a function of a common electrode.

As illustrated in FIG. 39A and FIG. 39B, the subpixel 901 includes a conductor 911, a conductor 912, a semiconductor 913, a semiconductor 914, a conductor 915a, a conductor 915b, a conductor 916a, a conductor 916b, a conductor 917, a conductor 918, a conductor 919, a conductor 920, a conductor 921, a conductor 922, a conductor 923, a conductor 924 conductor 925, a conductor 926, a conductor 927, a conductor 928, a conductor 929, a conductor 930, a conductor 931, and the conductor 772.

The conductor 911 and the conductor 912 can be formed in the same step. The semiconductor 913 and the semiconductor 914 are formed in the same step and can be formed in a step after the formation of the conductor 911 and the conductor 912. The conductor 915a, the conductor 915b, the conductor 916a, and the conductor 916b are formed in the same step and can be formed in a step after the formation of the conductor 911 and the conductor 912. The conductor 917 and the conductor 918 are formed in the same step and can be formed in a step after the formation of the semiconductor 913, the semiconductor 914, the conductor 915a, the conductor 915b, the conductor 916a, and the conductor 916b.

The conductor 919 to the conductor 923 are formed in the same step and can be formed in a step after the formation of the conductor 917 and the conductor 918. The conductor 924 can be formed in a step after the formation of the conductor 919 to the conductor 923. The conductor 925 to the conductor 928 are formed in the same step and can be formed in a step after the formation of the conductor 924. The conductor 929 to the conductor 931 are formed in the same step and can be formed in a step after the formation of the conductor 925 to the conductor 928. The conductor 772 can be formed in a step after the formation of the conductor 929 to the conductor 931.

In this specification and the like, it can be said that components formed in the same step are provided in the same layer. For example, since the conductor 911 and the conductor 912 can be formed in the same step, it can be said that the conductor 911 and the conductor 912 are provided in the same layer. In addition, it can be said that components formed in a later step are provided above components formed in a step prior to the later step. For example, since the conductor 929 to the conductor 931 can be formed in a step after the formation of the conductor 925 to the conductor 928, it can be said that the conductor 929 to the conductor 931 are provided above the conductor 925 to the conductor 928.

The conductor 911 has a function of the back gate electrode of the transistor 552. The semiconductor 913 includes a channel formation region of the transistor 552. The conductor 915a has a function of one of a source electrode and a drain electrode of the transistor 552. The conductor 915b has a function of the other of the source electrode and the drain electrode of the transistor 552. The conductor 917 has a function of the gate electrode of the transistor 552.

The conductor 912 has a function of the back gate electrode of the transistor 554. The semiconductor 914 includes a channel formation region of the transistor 554. The conductor 916a has a function of one of a source electrode and a drain electrode of the transistor 554. The conductor 916b has a function of the other of the source electrode and the drain electrode of the transistor 554. The conductor 918 has a function of the gate electrode of the transistor 554.

The conductor 919 has a function of one electrode of the capacitor 562. The conductor 924 has a function of the other electrode of the capacitor 562. The conductor 925 corresponds to the wiring 31 having a function of a scan line. The conductor 929 corresponds to the wiring 32 having a function of a data line. The conductor 930 corresponds to the wiring 39a having a function of a power supply line. The conductor 772 has a function of the one electrode of the light-emitting element 572 as described above.

The conductor 911 is electrically connected to the conductor 920. The conductor 912 is electrically connected to the conductor 923. The conductor 915a is electrically connected to the conductor 921. The conductor 915b is electrically connected to the conductor 919. The conductor 916a is electrically connected to the conductor 922.

The conductor 916b is electrically connected to the conductor 923. In other words, the conductor 912 having a function of the back gate electrode of the transistor 554 and the conductor 916b having a function of the other of the source electrode and the drain electrode of the transistor 554 are electrically connected to each other through the conductor 923.

The conductor 917 is electrically connected to the conductor 920. In other words, the conductor 911 having a function of the back gate electrode of the transistor 552 and the conductor 917 having a function of the gate electrode of the transistor 552 are electrically connected to each other through the conductor 920.

The conductor 920 is electrically connected to the conductor 925. In other words, the conductor 917 having a function of the gate electrode of the transistor 552 and the conductor 925 having a function of a scan line are electrically connected to each other through the conductor 920.

The conductor 918 is electrically connected to the conductor 919. The conductor 921 is electrically connected to the conductor 926. The conductor 922 is electrically connected to the conductor 927. The conductor 923 is electrically connected to the conductor 928. The conductor 924 is electrically connected to the conductor 928.

The conductor 926 is electrically connected to the conductor 929. In other words, the conductor 915a having a function of the one of the source electrode and the drain electrode of the transistor 552 and the conductor 929 having a function of a data line are electrically connected to each other through the conductor 921 and the conductor 926.

The conductor 927 is electrically connected to the conductor 930. In other words, the conductor 916a having a function of the one of the source electrode and the drain electrode of the transistor 554 and the conductor 930 having a function of a power supply line are electrically connected to each other through the conductor 922 and the conductor 927.

The conductor 928 is electrically connected to the conductor 931. The conductor 931 is electrically connected to the conductor 772.

The semiconductor 913 and the semiconductor 914 can contain a metal oxide, for example. Thus, the transistor 552 and the transistor 554 can be OS transistors. Alternatively, the semiconductor 913 and the semiconductor 914 can contain low-temperature polysilicon, for example. Thus, the transistor 552 and the transistor 554 can be LTPS transistors.

Figure 40:
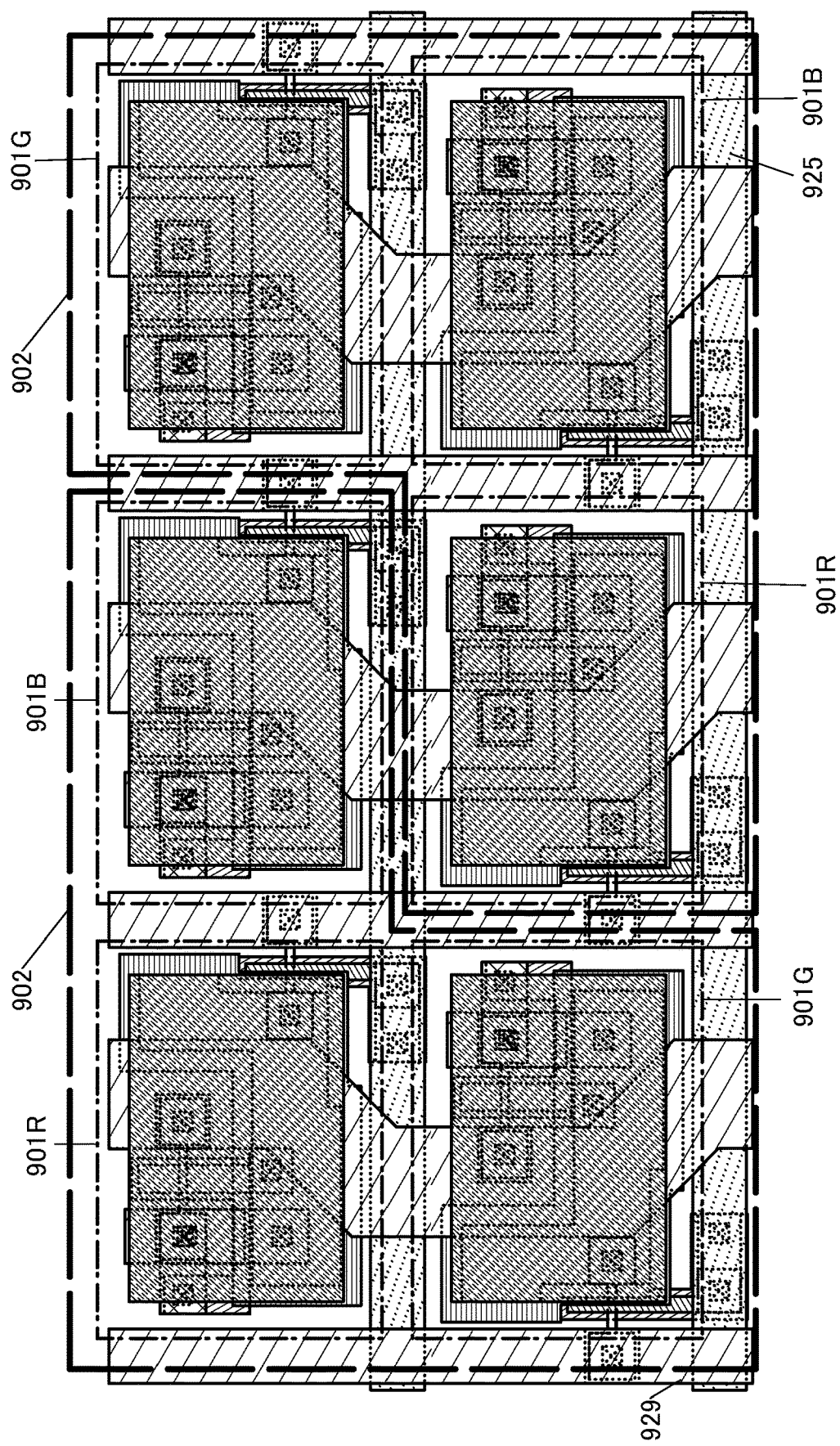
FIG. 40 is a top view illustrating a structure example of pixels.

FIG. 40 is a top view illustrating a structure example of a pixel 902 composed of subpixels 901 with the structure illustrated in FIG. 39B. In FIG. 40, a subpixel 901R indicates the subpixel 901 having a function of emitting red light, a subpixel 901G indicates the subpixel 901 having a function of emitting green light, and a subpixel 901B indicates the subpixel 901 having a function of emitting blue light. As illustrated in FIG. 40, the pixel 902 is composed of the subpixel 901R, the subpixel 901G, and the subpixel 901B. Specifically, one pixel 902 is composed of the subpixel 901R and the subpixel 901B that are placed on the upper side, and the subpixel 901G placed on the lower side. Another pixel 902 is composed of the subpixel 901G placed on the upper side, and the subpixel 901R and the subpixel 901B that are placed on the lower side.

In the structure illustrated in FIG. 40, the subpixel 901R, the subpixel 901G, and the subpixel 901B placed on the upper side are laterally inverted with respect to the subpixel 901R, the subpixel 901G, and the subpixel 901B placed on the lower side. With this structure, the subpixels 901 of the same color can be alternately arranged in the direction where the conductor 925 having a function of a scan line extends. Thus, the subpixels 901 having a function of emitting light of the same color can be electrically connected to one data line. In other words, two or more types of subpixels 901 selected from the subpixel 901R, the subpixel 901G, and the subpixel 901B can be prevented from being electrically connected to one data line.

Figure 41:
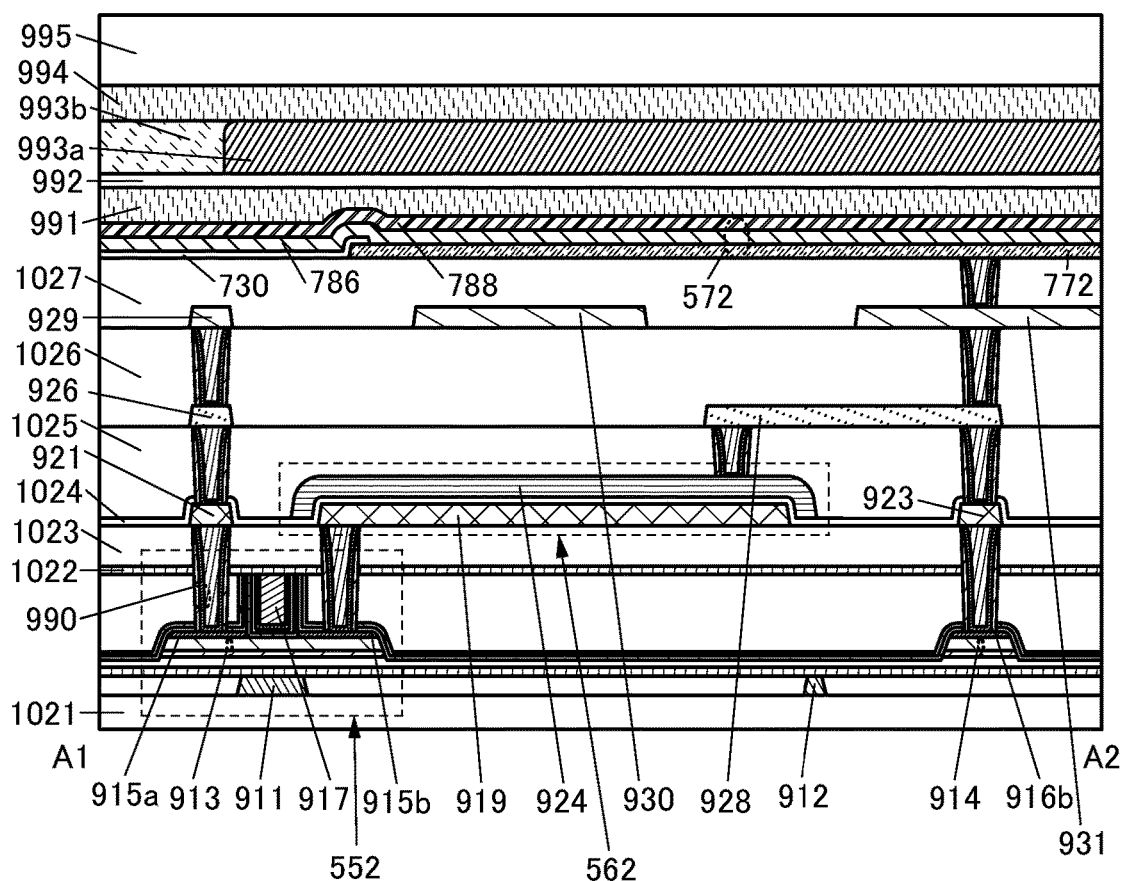
FIG. 41 is a cross-sectional view illustrating a structure example of a pixel.

FIG. 41 is a cross-sectional view of a portion indicated by the dashed-dotted line A1-A2 in FIG. 39B. The transistor 552 and the transistor 554 are provided over an insulator 1021. An insulator 1022 is provided over the transistor 552 and the transistor 554, and an insulator 1023 is provided over the insulator 1022. Note that a substrate is provided below the insulator 1021. The components in the layer 20 illustrated in FIG. 1A and the like (e.g., the gate driver circuit 21, the data driver circuit 22, and the functional circuit 40) can be provided between the substrate and the insulator 1021.

As illustrated in FIG. 41, the conductors provided in different layers are electrically connected to each other through the conductor 990 having a function of a plug. For example, the conductor 915a and the conductor 921 provided above the conductor 915a are electrically connected to each other through the conductor 990. The conductor 990 can have a structure similar to those of the conductor 453, the conductor 305, the conductor 337, the conductor 353, the conductor 355, the conductor 357, the conductor 301a, the conductor 301b, the conductor 331, the conductor 351, the conductor 333, and the conductor 335 illustrated in FIG. 34 and the like.

An insulator 1024 is provided over the conductor 919 to the conductor 923 and the insulator 1023. The conductor 924 is provided over the insulator 1024. The conductor 919, the insulator 1024, and the conductor 924 form the capacitor 562.

An insulator 1025 is provided over the conductor 924 and the insulator 1024. An insulator 1026 is provided over the conductor 925 to the conductor 928 and the insulator 1025. An insulator 1027 is provided over the conductor 929 to the conductor 931 and the insulator 1026.

The conductor 772 and the insulator 730 are provided over the insulator 1027. Here, the insulator 730 can cover part of the conductor 772. The conductor 772, the EL layer 786, and the conductor 788 form the light-emitting element 572.

A bonding layer 991 is provided over the conductor 788, and an insulator 992 is provided over the bonding layer 991. The insulator 992 over the bonding layer 991 can be formed in the following manner. First, the insulator 992 is formed over a substrate different from the substrate where the light-emitting element 572 and the like are formed. Next, the conductor 788 and the insulator 992 are bonded to each other with the bonding layer 991. After that, the substrate where the insulator 992 is formed is separated. Through the above steps, the insulator 992 can be formed over the conductor 788.

A coloring layer 993 is provided over the insulator 992. FIG. 41 illustrates a coloring layer 993a and a coloring layer 993b as the coloring layer 993. A substrate 995 is attached onto the coloring layer 993 with a bonding layer 994.

The coloring layer 993b has a function of transmitting light of a color that is different from the color of light that the coloring layer 993a transmits. For example, when the pixel 902 includes the subpixel 901R with a function of emitting red light, the subpixel 901G with a function of emitting green light, and the subpixel 901B with a function of transmitting blue light and the coloring layer 993a has a function of transmitting red light, the coloring layer 993b has a function of transmitting green light or blue light.

Forming the coloring layer 993 over the insulator 992 facilitates alignment between the coloring layer 993 and the light-emitting element 572. Thus, the pixel density of the display device of one embodiment of the present invention can be increased.

Structure Example 5 of Display Device

Figure 42A:
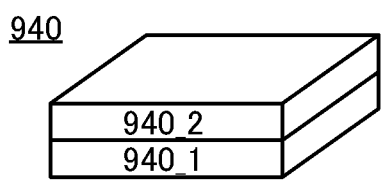
FIG. 42A is a schematic diagram illustrating a structure example of a pixel.

FIG. 42A is a schematic view illustrating a structure example of a subpixel 940 that can be used in the display device of one embodiment of the present invention. The subpixel 940 can have a stacked-layer structure of a subpixel 940_1 and a subpixel 940_2. The subpixel 940 can have the circuit configuration illustrated in FIG. 30E. Here, the transistor 511 and the transistor 529 each include a back gate in addition to a gate, and the back gates are electrically connected to the wiring 31_1. The transistor 513 includes a back gate, and the back gate is electrically connected to the wiring 31_2. The transistor 521 includes a back gate, and the back gate is electrically connected to the other electrode of the capacitor 517 and one electrode of the light-emitting element 572.

Figure 42B:
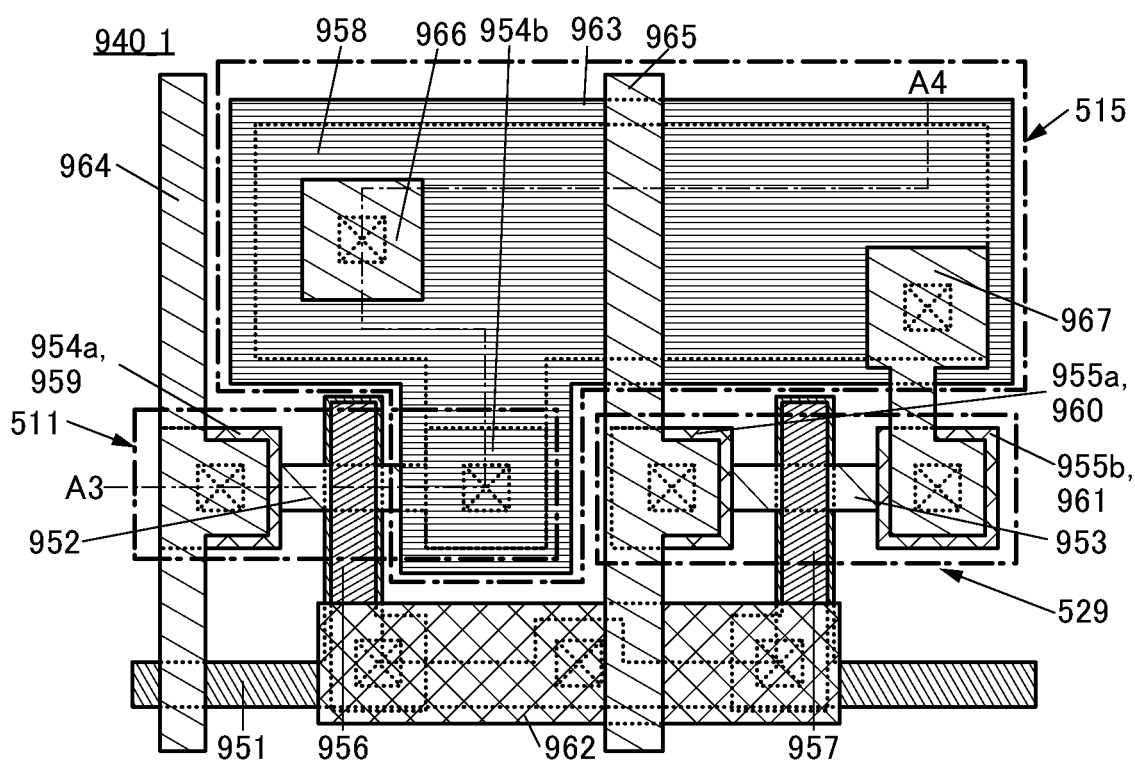
FIG. 42B is a top view illustrating a structure example of a pixel.

FIG. 42B is a top view illustrating a structure example of the subpixel 940_1. FIG. 42B illustrates conductors and semiconductors that constitute the transistors, the capacitor, the wirings, and the like included in the subpixel 940_1.

As illustrated in FIG. 42B, the subpixel 9401 includes a conductor 951, a semiconductor 952, a semiconductor 953, a conductor 954a, a conductor 954b, a conductor 955a, a conductor 955b, a conductor 956, a conductor 957, a conductor 958, a conductor 959, a conductor 960, a conductor 961, a conductor 962, a conductor 963, a conductor 964, a conductor 965, a conductor 966, and a conductor 967.

The semiconductor 952 and the semiconductor 953 are formed in the same step and can be formed in a step after the formation of the conductor 951. The conductor 954a, the conductor 954b, the conductor 955a, and the conductor 955b are formed in the same step and can be formed in a step after the formation of the conductor 951. The conductor 956 and the conductor 957 are formed in the same step and can be formed in a step after the formation of the semiconductor 952, the semiconductor 953, the conductor 954a, the conductor 954b, the conductor 955a, and the conductor 955b.

The conductor 958 to the conductor 962 are formed in the same step and can be formed in a step after the formation of the conductor 956 and the conductor 957. The conductor 963 can be formed in a step after the formation of the conductor 958 to the conductor 962. The conductor 964 to the conductor 967 are formed in the same step and can be formed in a step after the formation of the conductor 963.

The conductor 951 has a function of the back gate electrodes of the transistor 511 and the transistor 529. Moreover, the conductor 951 corresponds to the wiring 31_1 having a function of a scan line.

The semiconductor 952 includes a channel formation region of the transistor 511. The conductor 954a has a function of one of a source electrode and a drain electrode of the transistor 511. The conductor 954b has a function of the other of the source and the drain of the transistor 511. The conductor 956 has a function of the gate electrode of the transistor 511.

The semiconductor 953 includes a channel formation region of the transistor 529. The conductor 955a has a function of one of a source electrode and a drain electrode of the transistor 529. The conductor 955b has a function of the other of the source and the drain of the transistor 529. The conductor 957 has a function of the gate electrode of the transistor 529.

The conductor 958 has a function of one electrode of the capacitor 515. The conductor 963 has a function of the other electrode of the capacitor 515. The conductor 964 corresponds to the wiring 32_1 having a function of a data line. The conductor 965 corresponds to the wiring 543 having a function of a power supply line.

The conductor 951 is electrically connected to the conductor 962. The conductor 954a is electrically connected to the conductor 959. The conductor 954b is electrically connected to the conductor 958. The conductor 955a is electrically connected to the conductor 960. The conductor 955b is electrically connected to the conductor 961.

The conductor 956 and the conductor 957 are electrically connected to the conductor 962. That is, the conductor 951, which has a function of the back gate electrodes of the transistor 511 and the transistor 529 and corresponds to the wiring 31_1 having a function of a scan line, is electrically connected to the conductor 956 having a function of the gate electrode of the transistor 511 and the conductor 957 having a function of the gate electrode of the transistor 529 through the conductor 962.

The conductor 959 is electrically connected to the conductor 964. In other words, the conductor 954a having a function of the one of the source and the drain of the transistor 511 and the conductor 964 having a function of a data line are electrically connected to each other through the conductor 959.

The conductor 960 is electrically connected to the conductor 965. In other words, the conductor 955a having a function of the one of the source and the drain of the transistor 529 and the conductor 965 having a function of a power supply line are electrically connected to each other through the conductor 960.

The conductor 961 is electrically connected to the conductor 967. The conductor 963 is electrically connected to the conductor 966.

The semiconductor 952 and the semiconductor 953 can contain a metal oxide, for example. Thus, the transistor 511 and the transistor 529 can be OS transistors. Alternatively, the semiconductor 952 and the semiconductor 953 can contain low-temperature polysilicon, for example. Thus, the transistor 511 and the transistor 529 can be LTPS transistors.

Figure 43A:
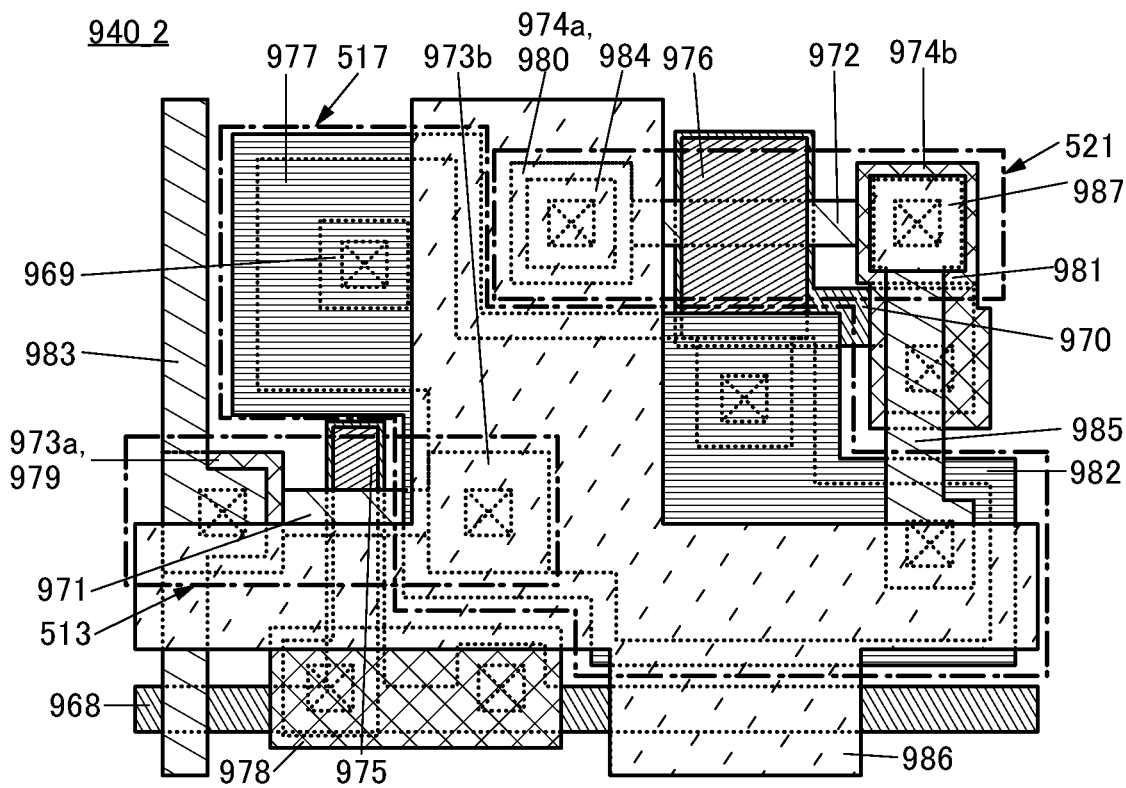
FIG. 43A and FIG. 43B are top views illustrating structure examples of a pixel.
Figure 43B:
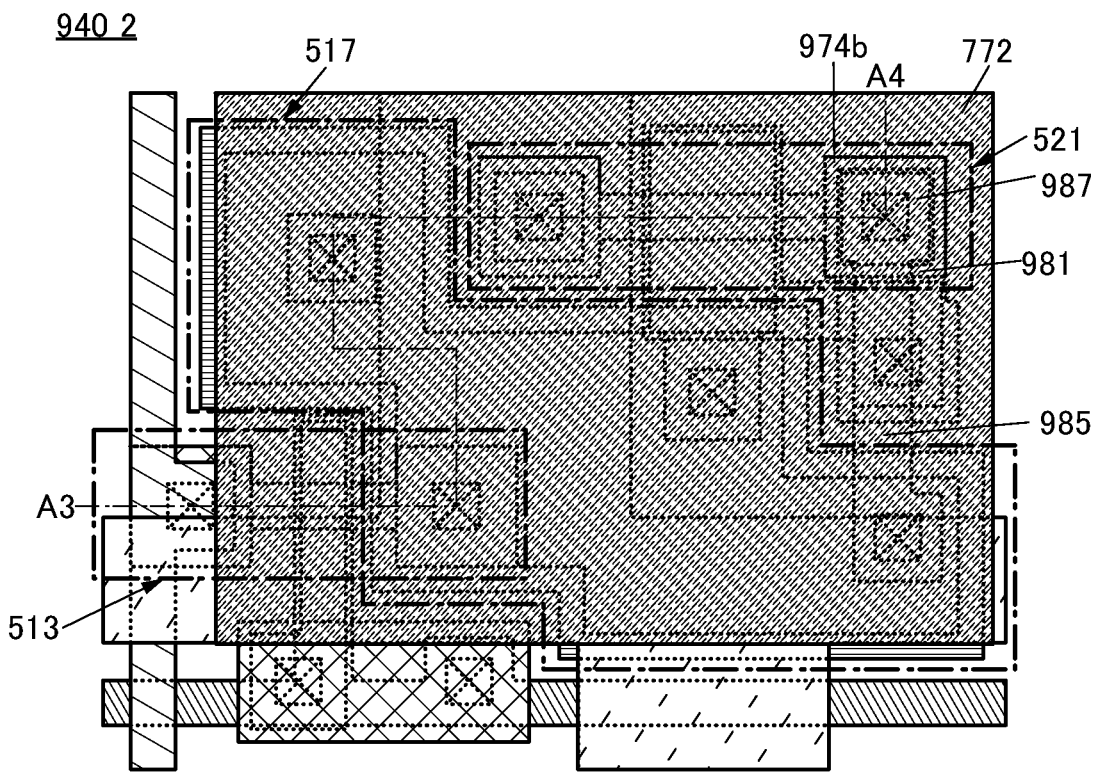

FIG. 43A illustrates conductors and semiconductors that constitute the transistors, the capacitor, the wirings, and the like included in the subpixel 940_2. FIG. 43B illustrates the conductor 772 having a function of one electrode of the light-emitting element 572, in addition to the components illustrated in FIG. 43A. Note that the conductor having a function of the other electrode of the light-emitting element 572, or the like is omitted in both FIG. 43A and FIG. 43B.

As illustrated in FIG. 43A and FIG. 43B, the subpixel 9402 includes a conductor 968, a conductor 969, a conductor 970, a semiconductor 971, a semiconductor 972, a conductor 973a, a conductor 973b, a conductor 974a, a conductor 974b, a conductor 975, a conductor 976, a conductor 977, a conductor 978, a conductor 979, a conductor 980, a conductor 981, a conductor 982, a conductor 983, a conductor 984, a conductor 985, a conductor 986, a conductor 987, and the conductor 772.

The conductor 968 to the conductor 970 can be formed in the same step. The semiconductor 971 and the semiconductor 972 are formed in the same step and can be formed in a step after the formation of the conductor 968 to the conductor 970. The conductor 973a, the conductor 973b, the conductor 974a, and the conductor 974b are formed in the same step and can be formed in a step after the formation of the conductor 968 to the conductor 970. The conductor 975 and the conductor 976 are formed in the same step and can be formed in a step after the formation of the semiconductor 971, the semiconductor 972, the conductor 973a, the conductor 973b, the conductor 974a, and the conductor 974b.

The conductor 977 to the conductor 981 are formed in the same step and can be formed in a step after the formation of the conductor 975 and the conductor 976. The conductor 982 can be formed in a step after the formation of the conductor 977 to the conductor 981. The conductor 983 to the conductor 985 are formed in the same step and can be formed in a step after the formation of the conductor 982. The conductor 986 and the conductor 987 are formed in the same step and can be formed in a step after the formation of the conductor 983 to the conductor 985. The conductor 772 can be formed in a step after the formation of the conductor 986 and the conductor 987.

The conductor 968 has a function of the back gate electrode of the transistor 513 and corresponds to the wiring 31_2 having a function of a scan line. The semiconductor 971 includes a channel formation region of the transistor 513. The conductor 973a has a function of one of a source electrode and a drain electrode of the transistor 513. The conductor 973b has a function of the other of the source electrode and the drain electrode of the transistor 513. The conductor 975 has a function of the gate electrode of the transistor 513.

The conductor 970 has a function of the back gate electrode of the transistor 521. The semiconductor 972 includes a channel formation region of the transistor 521. The conductor 974a has a function of one of a source electrode and a drain electrode of the transistor 521. The conductor 974b has a function of the other of the source electrode and the drain electrode of the transistor 521. The conductor 976 has a function of the gate electrode of the transistor 521.

The conductor 977 has a function of one electrode of the capacitor 517. The conductor 982 has a function of the other electrode of the capacitor 517. The conductor 983 corresponds to the wiring 32_2 having a function of a data line. The conductor 986 corresponds to the wiring 537 having a function of a power supply line. The conductor 772 has a function of the one electrode of the light-emitting element 572 as described above.

The conductor 968 is electrically connected to the conductor 978. The conductor 969 is electrically connected to the conductor 977. The conductor 970 is electrically connected to the conductor 981. The conductor 973a is electrically connected to the conductor 979. The conductor 973b is electrically connected to the conductor 977. The conductor 974a is electrically connected to the conductor 980.

The conductor 974b is electrically connected to the conductor 981. In other words, the conductor 970 having a function of the back gate electrode of the transistor 521 and the conductor 974b having a function of the other of the source electrode and the drain electrode of the transistor 521 are electrically connected to each other through the conductor 981.

The conductor 975 is electrically connected to the conductor 978. In other words, the conductor 968 having a function of the back gate electrode of the transistor 513 and the conductor 975 having a function of the gate electrode of the transistor 513 are electrically connected to each other through the conductor 978. The conductor 976 is electrically connected to the conductor 977.

The conductor 979 is electrically connected to the conductor 983. In other words, the conductor 973a having a function of the one of the source and the drain of the transistor 513 and the conductor 983 having a function of a data line are electrically connected to each other through the conductor 979.

The conductor 980 is electrically connected to the conductor 984. The conductor 981 is electrically connected to the conductor 985. The conductor 982 is electrically connected to the conductor 985.

The conductor 984 is electrically connected to the conductor 986. In other words, the conductor 974a having a function of the one of the source electrode and the drain electrode of the transistor 521 and the conductor 986 having a function of a power supply line are electrically connected to each other through the conductor 980 and the conductor 984.

The conductor 985 is electrically connected to the conductor 987. The conductor 987 is electrically connected to the conductor 772.

The semiconductor 971 and the semiconductor 972 can contain a metal oxide, for example. Thus, the transistor 513 and the transistor 521 can be OS transistors. Alternatively, the semiconductor 971 and the semiconductor 972 can contain low-temperature polysilicon, for example. Thus, the transistor 513 and the transistor 521 can be LTPS transistors.

Figure 44:
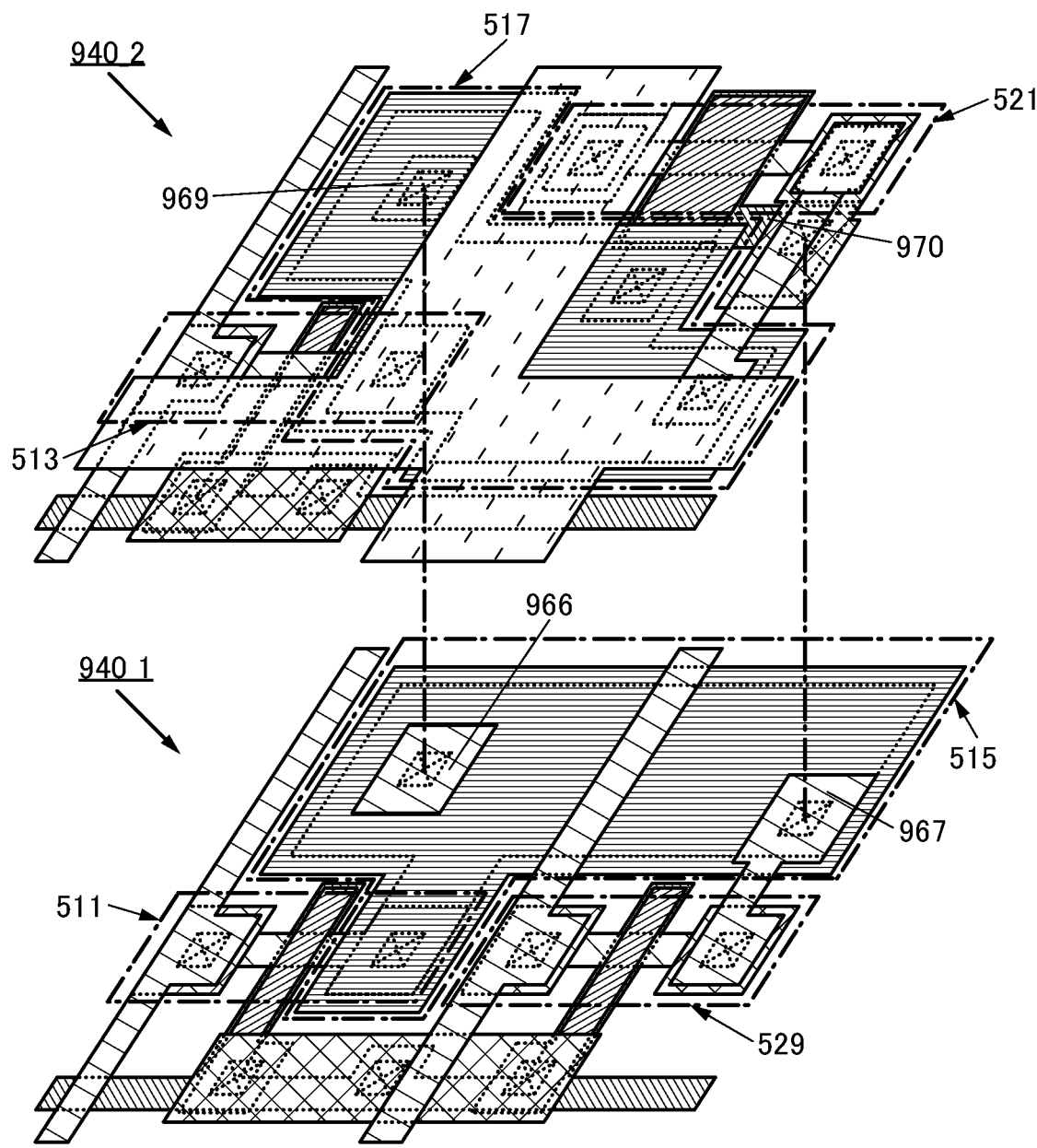
FIG. 44 is a top view illustrating a structure example of pixels.

FIG. 44 is a top view illustrating a stacked-layer structure of the subpixel 940_1 and the 30 subpixel 940_2, and shows the electrical connection relation between the subpixel 940_1 and the subpixel 940_2. For simplification of the diagram, the conductor 772 that has a function of a pixel electrode and is provided in the subpixel 940_2 is not illustrated.

As illustrated in FIG. 44, the conductor 966 provided in the subpixel 940_1 and the conductor 969 provided in the subpixel 940_2 are electrically connected to each other. Thus, the other electrode of the capacitor 515 provided in the subpixel 940_1 can be electrically connected to the other of the source and the drain of the transistor 513, the gate of the transistor 521, and the one electrode of the capacitor 517 that are provided in the subpixel 940_2. Moreover, the conductor 967 provided in the subpixel 940_1 and the conductor 970 provided in the subpixel 940_2 are electrically connected to each other. Thus, the other of the source and the drain of the transistor 529 provided in the subpixel 940_1 can be electrically connected to the other electrode of the capacitor 517, the other of the source and the drain of the transistor 521, and the one electrode of the light-emitting element 572 that are provided in the subpixel 940_2.

Figure 45:
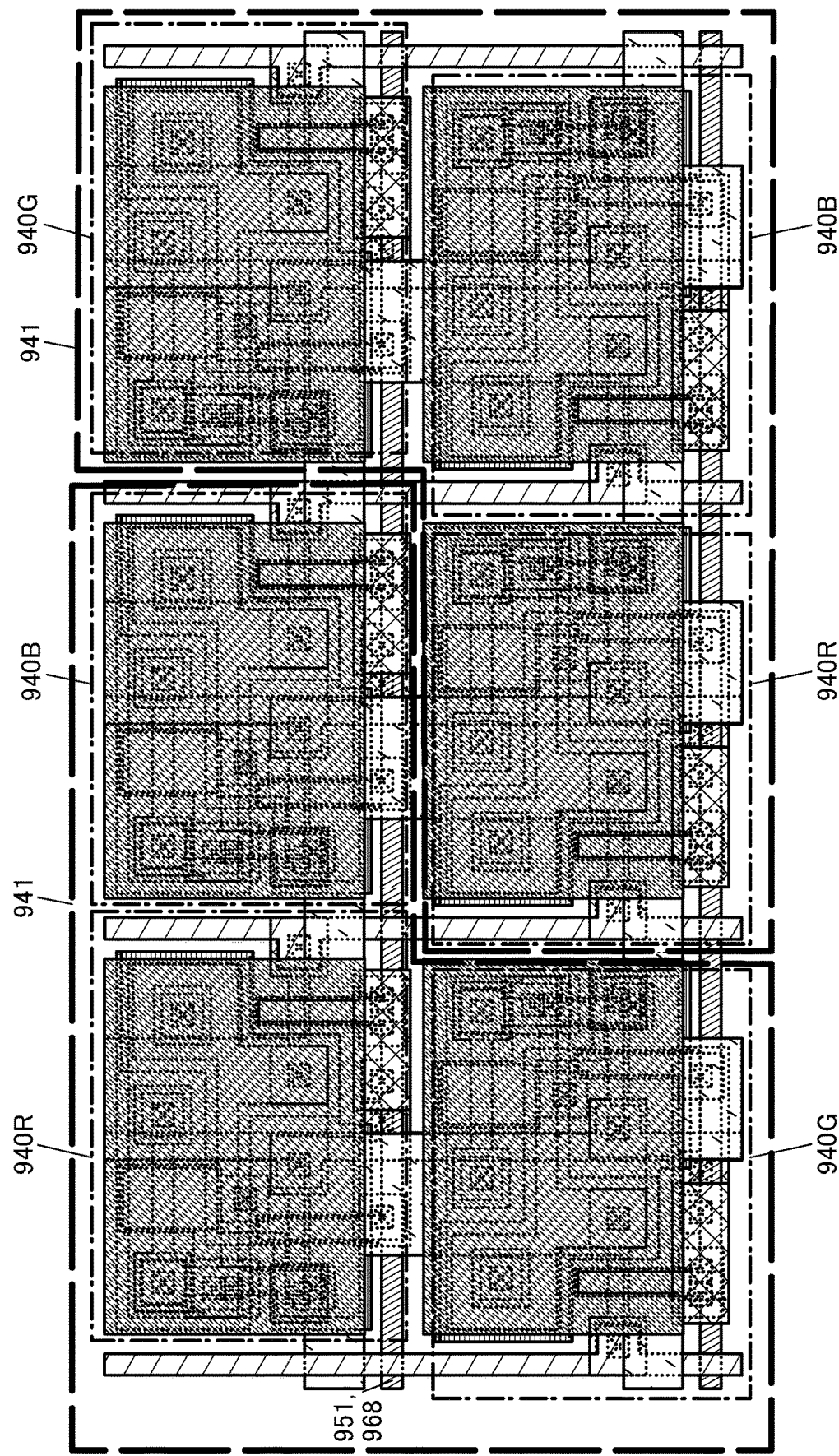
FIG. 45 is a top view illustrating a structure example of pixels.

FIG. 45 is a top view illustrating a structure example of a pixel 941 composed of subpixels 940 with the structure illustrated in FIG. 42B or FIG. 43B. In FIG. 45, a subpixel 940R indicates the subpixel 940 having a function of emitting red light, a subpixel 940G indicates the subpixel 940 having a function of emitting green light, and a subpixel 940B indicates the subpixel 940 having a function of emitting blue light. As illustrated in FIG. 45, the pixel 941 is composed of the subpixel 940R, the subpixel 940G, and the subpixel 940B. Specifically, one pixel 941 is composed of the subpixel 940R and the subpixel 940B that are placed on the upper side, and the subpixel 940G placed on the lower side. Another pixel 941 is composed of the subpixel 940G placed on the upper side, and the subpixel 940R and the subpixel 940B that are placed on the lower side.

In FIG. 45, the subpixel 940R, the subpixel 940G, and the subpixel 940B placed on the upper side are laterally inverted with respect to the subpixel 940R, the subpixel 940G, and the subpixel 940B placed on the lower side. With this structure, the subpixels 940 of the same color can be alternately arranged in the direction where the conductor 951 and the conductor 968 having a function of a scan line extend. Thus, the subpixels 940 having a function of emitting light of the same color can be electrically connected to one data line. In other words, two or more types of subpixels 940 selected from the subpixel 940R, the subpixel 940G, and the subpixel 940B can be prevented from being electrically connected to one data line.

Figure 46:
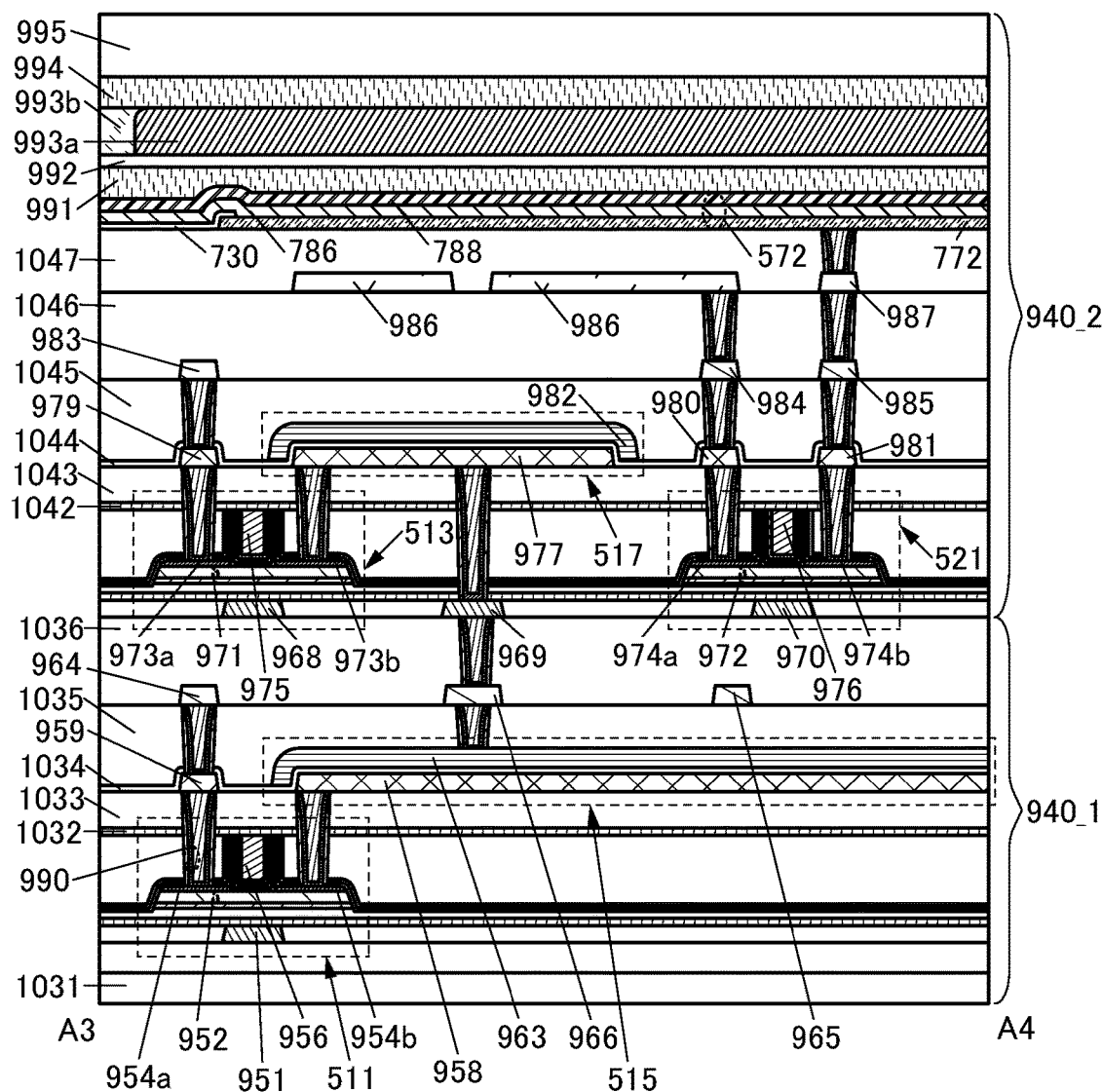
FIG. 46 is a cross-sectional view illustrating a structure example of pixels.

FIG. 46 is a cross-sectional view of a portion indicated by the dashed-dotted line A3-A4 in FIG. 42B and FIG. 43B. The transistor 511 and the transistor 529, which are the transistors provided in the subpixel 940_1, are provided over an insulator 1031. An insulator 1032 is provided over the transistor 511 and the transistor 529, and an insulator 1033 is provided over the insulator 1032. Note that a substrate is provided below the insulator 1031. The components in the layer 20 illustrated in FIG. 1A and the like (e.g., the gate driver circuit 21, the data driver circuit 22, and the functional circuit 40) can be provided between the substrate and the insulator 1031.

As illustrated in FIG. 46, the conductors provided in different layers are electrically connected to each other through the conductor 990 having a function of a plug.

An insulator 1034 is provided over the conductor 958 to the conductor 962 and the insulator 1033. The conductor 963 is provided over the insulator 1034. The conductor 958, the insulator 1034, and the conductor 963 form the capacitor 515.

An insulator 1035 is provided over the conductor 963 and the insulator 1034. An insulator 1036 is provided over the conductor 964 to the conductor 967.

The transistor 513 and the transistor 521, which are the transistors provided in the subpixel 940_2, are provided over the insulator 1036. An insulator 1042 is provided over the transistor 513 and the transistor 521, and an insulator 1043 is provided over the insulator 1042.

An insulator 1044 is provided over the conductor 977 to the conductor 981 and the insulator 1043. The conductor 982 is provided over the insulator 1044. The conductor 977, the insulator 1044, and the conductor 982 form the capacitor 517.

An insulator 1045 is provided over the conductor 982 and the insulator 1044. An insulator 1046 is provided over the conductor 983 to the conductor 985 and the insulator 1045. An insulator 1047 is provided over the conductor 986, the conductor 987, and the insulator 1046.

The conductor 772 and the insulator 730 are provided over the insulator 1047. Here, the insulator 730 can cover part of the conductor 772, as in the case shown in FIG. 41. The conductor 772, the EL layer 786, and the conductor 788 form the light-emitting element 572.

As in the case shown in FIG. 41, the bonding layer 991 is provided over the conductor 788, and the insulator 992 is provided over the bonding layer 991. The coloring layer 993 is provided over the insulator 992, and the substrate 995 is attached onto the coloring layer 993 with the bonding layer 994.

Structure Examples of Light-Emitting Element

Figure 47A:
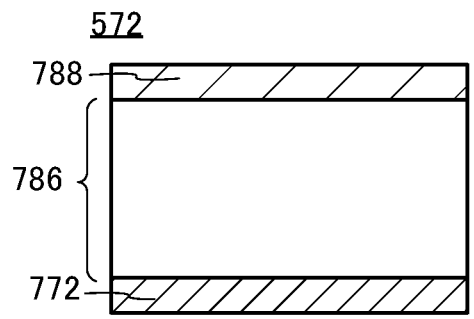
FIG. 47A to FIG. 47E are diagrams illustrating structure examples of a light-emitting element.

FIG. 47A to FIG. 47E are diagrams illustrating structure examples of the light-emitting element 572. FIG. 47A illustrates a structure in which the EL layer 786 is positioned between the conductor 772 and the conductor 788 (a single structure). As described above, the EL layer 786 contains a light-emitting material, for example, a light-emitting material of an organic compound.

Figure 47B:
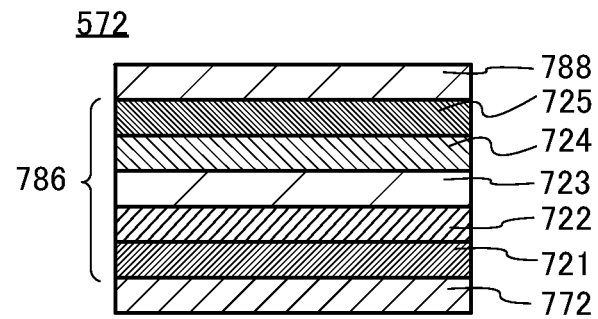

FIG. 47B illustrates a stacked-layer structure of the EL layer 786. In the light-emitting element 572 with the structure illustrated in FIG. 47B, the conductor 772 has a function of an anode and the conductor 788 has a function of a cathode.

The EL layer 786 has a structure in which a hole-injection layer 721, a hole-transport layer 722, a light-emitting layer 723, an electron-transport layer 724, and an electron-injection layer 725 are stacked in this order over the conductor 772. Note that the order of the stacked layers is reversed when the conductor 772 has a function of a cathode and the conductor 788 has a function of an anode.

The light-emitting layer 723 contains a light-emitting material and a plurality of materials in appropriate combination, so that fluorescence or phosphorescence of a desired emission color can be obtained. The light-emitting layer 723 may have a stacked-layer structure having different emission colors. In that case, light-emitting substances and other substances can be different between the stacked light-emitting layers.

For example, when the light-emitting element 572 has a micro optical resonator (microcavity) structure with the conductor 772 and the conductor 788 illustrated in FIG. 47B serving as a reflective electrode and a transflective electrode, respectively, light emitted from the light-emitting layer 723 included in the EL layer 786 can be resonated between the electrodes and thus the light emitted through the conductor 788 can be intensified.

Note that when the conductor 772 of the light-emitting element 572 is a reflective electrode having a stacked-layer structure of a reflective conductive material and a light-transmitting conductive material (a transparent conductive film), optical adjustment can be performed by controlling the thickness of the transparent conductive film. Specifically, when the wavelength of light from the light-emitting layer 723 is λ, the interelectrode distance between the conductor 772 and the conductor 788 is preferably adjusted to around mλ/2 (m is a natural number).

To amplify desired light (wavelength: λ) obtained from the light-emitting layer 723, the optical path length from the conductor 772 to a region where desired light is obtained in the light-emitting layer 723 (a light-emitting region) and the optical path length from the conductor 788 to the region where desired light is obtained in the light-emitting layer 723 (the light-emitting region) are preferably adjusted to around (2m'+1)λ/4 (m' is a natural number). Here, the light-emitting region means a region where holes and electrons are recombined in the light-emitting layer 723.

By such optical adjustment, the spectrum of specific monochromatic light from the light-emitting layer 723 can be narrowed and light emission with high color purity can be obtained.

In the above case, the optical path length between the conductor 772 and the conductor 788 can be, to be exact, the total thickness between a reflective region in the conductor 772 and a reflective region in the conductor 788. However, it is difficult to precisely determine the reflection region in the conductor 772 and the conductor 788; hence, it is assumed that the above effect is sufficiently obtained with given positions in the conductor 772 and the conductor 788 being supposed to be reflective regions. Furthermore, the optical path length between the conductor 772 and the light-emitting layer where desired light is obtained can be, to be exact, the optical path length between the reflective region in the conductor 772 and the light-emitting region where desired light is obtained in the light-emitting layer. However, it is difficult to precisely determine the reflective region in the conductor 772 and the light-emitting region where desired light is obtained in the light-emitting layer; thus, it is assumed that the above effect can be sufficiently obtained with a given position in the conductor 772 being supposed to be the reflective region and a given position in the light-emitting layer where desired light is obtained being supposed to be the light-emitting region.

The light-emitting element 572 illustrated in FIG. 47B has a microcavity structure, so that light (monochromatic light) with different wavelengths can be extracted from different light-emitting elements including the same EL layer. Thus, separate formation for obtaining different emission colors (e.g., RGB) is not necessary. Therefore, high resolution can be easily achieved. In addition, a combination with coloring layers is also possible. Furthermore, the emission intensity of light with a specific wavelength in the front direction can be increased, whereby power consumption can be reduced.

Note that the light-emitting element 572 illustrated in FIG. 47B does not necessarily have a microcavity structure. In that case, light of predetermined colors (e.g., RGB) can be extracted when the light-emitting layer 723 has a structure for emitting white light and coloring layers are provided. When the EL layers 786 are formed separately for obtaining different emission colors, light of predetermined colors can be extracted without providing coloring layers.

At least one of the conductor 772 and the conductor 788 can be a light-transmitting electrode (e.g., a transparent electrode or a transflective electrode). In the case where the light-transmitting electrode is a transparent electrode, the visible light transmittance of the transparent electrode is higher than or equal to 40%. In the case where the light-transmitting electrode is a transflective electrode, the visible light reflectance of the transflective electrode is higher than or equal to 20% and lower than or equal to 80%, preferably higher than or equal to 40% and lower than or equal to 70%. These electrodes preferably have a resistivity less than or equal to $1\times10^{-2}$ Ωcm.

When the conductor 772 or the conductor 788 is an electrode having reflectivity (a reflective electrode), the visible light reflectance of the reflective electrode is higher than or equal to 40% and lower than or equal to 100%, preferably higher than or equal to 70% and lower than or equal to 100%. This electrode preferably has a resistivity lower than or equal to $1\times10^{-2}$ Ωcm.

Figure 47C:
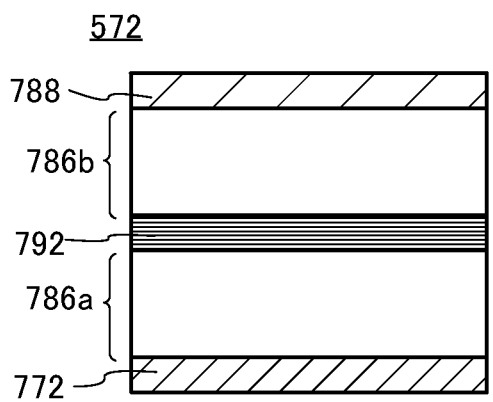

The light-emitting element 572 may have a structure illustrated in FIG. 47C. FIG. 47C illustrates the light-emitting element 572 having a stacked-layer structure (a tandem structure) in which two EL layers (an EL layer 786a and an EL layer 786b) are provided between the conductor 772 and the conductor 788, and a charge generation layer 792 is provided between the EL layer 786a and the EL layer 786b. When the light-emitting element 572 has the tandem structure, the current efficiency and external quantum efficiency of the light-emitting element 572 can be increased. Thus, the display device 10 can display high-luminance images. In addition, the power consumption of the display device 10 can be reduced. Here, the EL layer 786a and the EL layer 786b can have a structure similar to that of the EL layer 786 illustrated in FIG. 47B.

The charge generation layer 792 has a function of injecting electrons into one of the EL layer 786a and the EL layer 786b and injecting holes to the other of the EL layer 786a and the EL layer 786b when a voltage is supplied between the conductor 772 and the conductor 788. Accordingly, when a voltage is supplied such that the potential of the conductor 772 becomes higher than the potential of the conductor 788, electrons are injected into the EL layer 786a from the charge generation layer 792 and holes are injected into the EL layer 786b from the charge generation layer 792.

Note that in terms of light extraction efficiency, the charge generation layer 792 preferably transmits visible light (specifically, the visible light transmittance of the charge generation layer 792 is preferably 40% or higher). The conductivity of the charge generation layer 792 may be lower than that of the conductor 772 or the conductor 788.

Figure 47E:
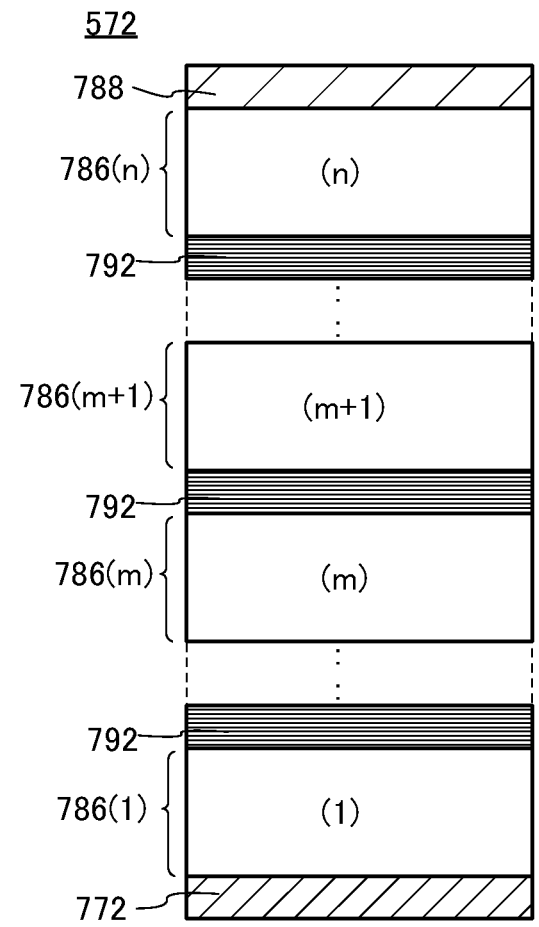
Figure 47D:
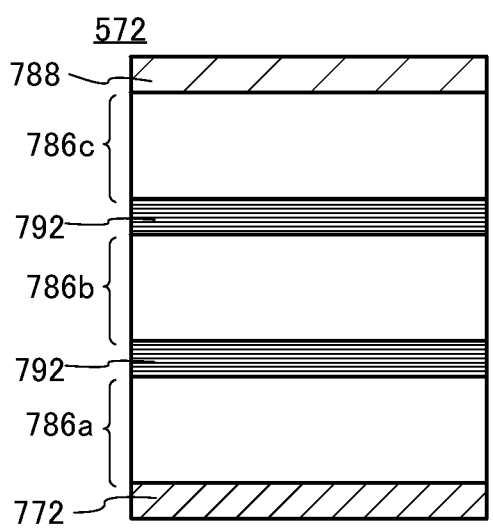

The light-emitting element 572 may have a structure illustrated in FIG. 47D. FIG. 47D illustrates the light-emitting element 572 having a tandem structure in which three EL layers (the EL layer 786a, the EL layer 786b, and an EL layer 786c) are provided between the conductor 772 and the conductor 788, and the charge generation layer 792 is provided between the EL layer 786a and the EL layer 786b and between the EL layer 786b and the EL layer 786c. Here, the EL layer 786a, the EL layer 786b, and the EL layer 786c can have a structure similar to that of the EL layer 786 illustrated in FIG. 47B. When the light-emitting element 572 has the structure illustrated in FIG. 47D, the current efficiency and external quantum efficiency of the light-emitting element 572 can be further increased. As a result, the display device 10 can display higher-luminance images. Moreover, the power consumption of the display device 10 can be further reduced.

The light-emitting element 572 may have a structure illustrated in FIG. 47E. FIG. 47E illustrates the light-emitting element 572 having a tandem structure in which n EL layers (an EL layer 786(1) to an EL layer 786(n)) are provided between the conductor 772 and the conductor 788, and the charge generation layer 792 is provided between the EL layers 786. Here, the EL layer 786(1) to the EL layer 786(n) can have a structure similar to that of the EL layer 786 illustrated in FIG. 47B. Note that FIG. 47E illustrates the EL layer 786(1), the EL layer 786(m), the EL layer 786(m+1), and the EL layer 786(n) among the EL layers 786. Here, m is an integer greater than or equal to 2 and less than n, and n is an integer greater than m. As n becomes larger, the current efficiency and external quantum efficiency of the light-emitting element 572 can be increased. Thus, the display device 10 can display high-luminance images. In addition, the power consumption of the display device 10 can be reduced.

At least part of the structure examples, the drawings corresponding thereto, and the like described in this embodiment can be implemented in combination with the other structure examples, the other drawings, or the like as appropriate.

At least part of this embodiment can be implemented in combination with the other embodiments described in this specification as appropriate.

Embodiment 2

In this embodiment, transistors that can be used in the display device of one embodiment of the present invention will be described.

Transistor Structure Example 1

Figure 48A:
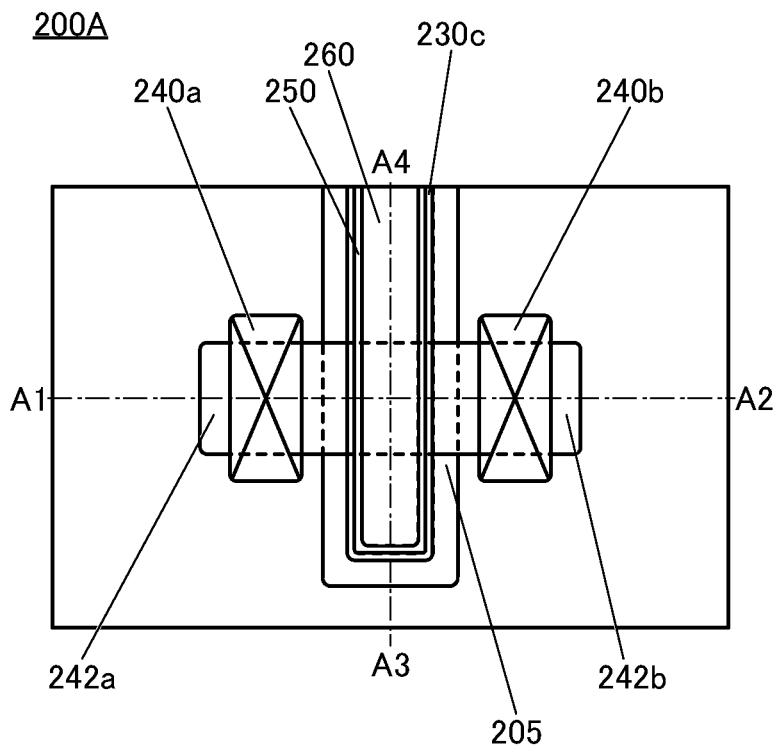
FIG. 48A is a top view illustrating a structure example of a transistor.
Figure 48C:
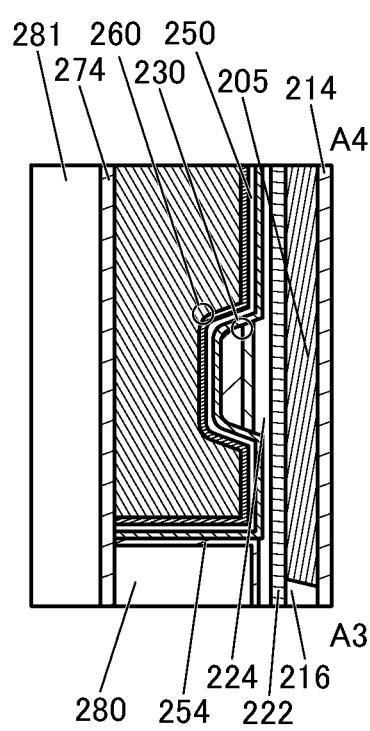
FIG. 48B and FIG. 48C are cross-sectional views illustrating the structure example of the transistor.
Figure 48B:
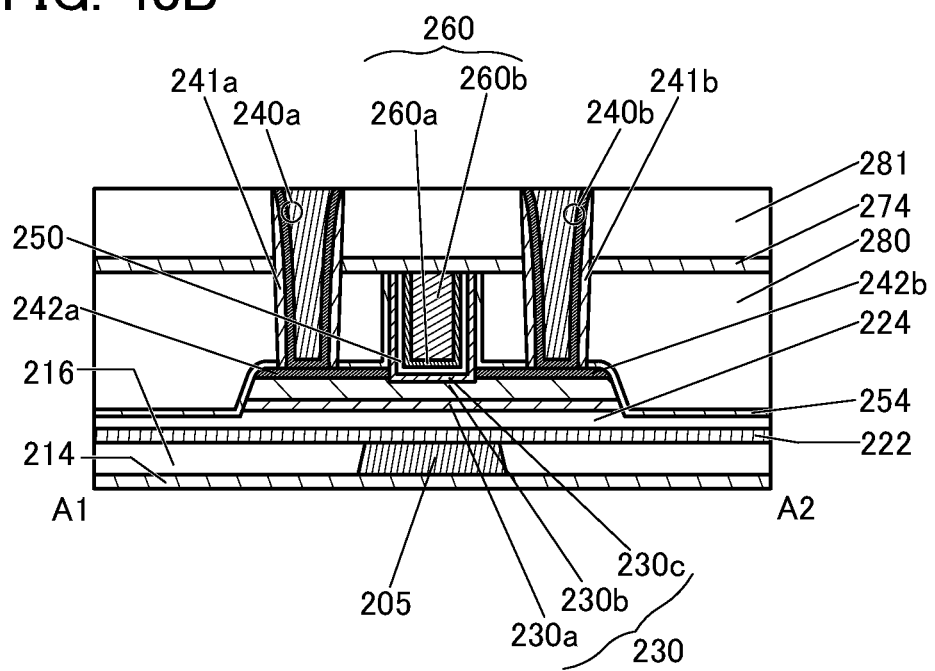

FIG. 48A to FIG. 48C are a top view and cross-sectional views of a transistor 200A that can be used in the display device of one embodiment of the present invention and the periphery of the transistor 200A. The transistor 200A can be used as the transistors included in the display portion 33, the gate driver circuit 21, the data driver circuit 22, and the functional circuit 40 described in Embodiment 1 and the like.

FIG. 48A is a top view of the transistor 200A. FIG. 48B and FIG. 48C are cross-sectional views of the transistor 200A. Here, FIG. 48B is a cross-sectional view of a portion indicated by the dashed-dotted line A1-A2 in FIG. 48A, and is a cross-sectional view in the channel length direction of the transistor 200A. FIG. 48C is a cross-sectional view of a portion indicated by the dashed-dotted line A3-A4 in FIG. 48A, and is a cross-sectional view in the channel width direction of the transistor 200A. Note that for clarity of the drawing, some components are not illustrated in the top view of FIG. 48A.

The transistor 200A includes a metal oxide 230a positioned over a substrate (not illustrated); a metal oxide 230b positioned over the metal oxide 230a; a conductor 242a and a conductor 242b that are apart from each other over the metal oxide 230b; the insulator 280 that is positioned over the conductor 242a and the conductor 242b and has an opening between the conductor 242a and the conductor 242b; a conductor 260 positioned in the opening; an insulator 250 positioned between the conductor 260 and the metal oxide 230b, the conductor 242a, the conductor 242b, and the insulator 280; and a metal oxide 230c between the insulator 250 and the metal oxide 230b, the conductor 242a, the conductor 242b, and the insulator 280. Here, as illustrated in FIG. 48B and FIG. 48C, the top surface of the conductor 260 is substantially aligned with the top surfaces of the insulator 250, the insulator 254, the metal oxide 230c, and the insulator 280. Hereinafter, the metal oxide 230a, the metal oxide 230b, and the metal oxide 230c may be collectively referred to as a metal oxide 230. The conductor 242a and the conductor 242b may be collectively referred to as a conductor 242.

As illustrated in FIG. 48B, in the transistor 200A, the side surfaces of the conductor 242a and the conductor 242b closer to the conductor 260 are substantially perpendicular. Note that the transistor 200A illustrated in FIG. 48B is not limited thereto, and the angle formed between the side surfaces and the bottom surfaces of the conductor 242a and the conductor 242b may be greater than or equal to 10° and less than or equal to 80°, preferably greater than or equal to 30° and less than or equal to 60°. The side surfaces of the conductor 242a and the conductor 242b that face each other may have a plurality of surfaces.

As illustrated in FIG. 48B and FIG. 48C, the insulator 254 is preferably provided between the insulator 280 and the insulator 224, the metal oxide 230a, the metal oxide 230b, the conductor 242a, the conductor 242b, and the metal oxide 230c. Here, as illustrated in FIG. 48B and FIG. 48C, the insulator 254 preferably includes a region in contact with the side surface of the metal oxide 230c, the top surface and side surface of the conductor 242a, the top surface and side surface of the conductor 242b, the side surface of the metal oxide 230a, the side surface of the metal oxide 230b, and the top surface of the insulator 224.

In the transistor 200A, three layers of the metal oxide 230a, the metal oxide 230b, and the metal oxide 230c are stacked in and around a region where the channel is formed (hereinafter also referred to as a channel formation region); however, one embodiment of the present invention is not limited thereto. For example, a two-layer structure of the metal oxide 230b and the metal oxide 230c or a stacked-layer structure of four or more layers may be employed. Although the conductor 260 has a stacked-layer structure of two layers in the transistor 200A, one embodiment of the present invention is not limited thereto. For example, the conductor 260 may have a single-layer structure or a stacked-layer structure of three or more layers. Alternatively, the metal oxide 230a, the metal oxide 230b, and the metal oxide 230c may each have a stacked-layer structure of two or more layers.

For example, when the metal oxide 230c has a stacked-layer structure including a first metal oxide and a second metal oxide over the first metal oxide, the first metal oxide preferably has a composition similar to that of the metal oxide 230b and the second metal oxide preferably has a composition similar to that of the metal oxide 230a.

Here, the conductor 260 functions as a gate electrode of the transistor, and the conductor 242a and the conductor 242b function as a source electrode and a drain electrode. As described above, the conductor 260 is formed to be embedded in the opening of the insulator 280 and the region between the conductor 242a and the conductor 242b. Here, the positions of the conductor 260, the conductor 242a, and the conductor 242b are selected in a self-aligned manner with respect to the opening of the insulator 280. In other words, in the transistor 200A, the gate electrode can be positioned between the source electrode and the drain electrode in a self-aligned manner. Thus, the conductor 260 can be formed without an alignment margin, resulting in a reduction in the area occupied by the transistor 200A. Accordingly, the display device can have higher definition. In addition, the display device can have a narrow bezel.

As illustrated in FIG. 48B, the conductor 260 preferably includes a conductor 260a provided on the inner side of the insulator 250 and a conductor 260b provided to be embedded on the inner side of the conductor 260a.

As illustrated in FIG. 48A to FIG. 48C, the transistor 200A preferably includes the insulator 214 positioned over the substrate (not illustrated); the insulator 216 positioned over the insulator 214; a conductor 205 positioned to be embedded in the insulator 216; the insulator 222 positioned over the insulator 216 and the conductor 205; and the insulator 224 positioned over the insulator 222. The metal oxide 230a is preferably positioned over the insulator 224.

The insulator 274 and the insulator 281 functioning as interlayer films are preferably provided over the transistor 200A. Here, the insulator 274 is preferably provided in contact with the top surfaces of the conductor 260, the insulator 250, the insulator 254, the metal oxide 230c, and the insulator 280.

The insulator 222, the insulator 254, and the insulator 274 preferably have a function of inhibiting diffusion of hydrogen (e.g., at least one of hydrogen atoms, hydrogen molecules, and the like). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of oxygen (e.g., at least one of oxygen atoms, oxygen molecules, and the like). For example, the insulator 222 and the insulator 254 preferably have a lower oxygen permeability than the insulator 224, the insulator 250, and the insulator 280.

Here, the insulator 224, the metal oxide 230, and the insulator 250 are separated from the insulator 280 and the insulator 281 by the insulator 254 and the insulator 274. This can inhibit entry of impurities such as hydrogen contained in the insulator 280 and the insulator 281 and excess oxygen into the insulator 224, the metal oxide 230, and the insulator 250.

A conductor 240 (a conductor 240a and a conductor 240b) that is electrically connected to the transistor 200A and functions as a plug is preferably provided. Note that an insulator 241 (an insulator 241a and an insulator 241b) is provided in contact with the side surface of the conductor 240 functioning as a plug. In other words, the insulator 241 is provided in contact with the inner wall of an opening in the insulator 254, the insulator 280, the insulator 274, and the insulator 281. Alternatively, a structure may be employed in which a first conductor of the conductor 240 is provided in contact with the side surface of the insulator 241 and a second conductor of the conductor 240 is provided on the inner side of the first conductor. Here, the top surface of the conductor 240 and the top surface of the insulator 281 can be substantially level with each other. Although the transistor 200A has a structure in which the first conductor of the conductor 240 and the second conductor of the conductor 240 are stacked, one embodiment of the present invention is not limited thereto. For example, the conductor 240 may have a single-layer structure or a stacked-layer structure of three or more layers. In the case where a component has a stacked-layer structure, layers may be distinguished by ordinal numbers corresponding to the formation order.

In the transistor 200A, a metal oxide functioning as an oxide semiconductor (hereinafter also referred to as an oxide semiconductor) is preferably used for the metal oxide 230 including the channel formation region (the metal oxide 230a, the metal oxide 230b, and the metal oxide 230c). For example, as the metal oxide to be the channel formation region of the metal oxide 230, it is preferable to use a metal oxide having a band gap of 2 eV or more, preferably 2.5 eV or more, as described above. With the use of a metal oxide having such a wide band gap, the off-state current of the transistor can be reduced. The use of such a transistor can provide a display device with low power consumption.

As illustrated in FIG. 48B, the metal oxide 230b in a region that is not overlapped by the conductor 242 sometimes have a smaller thickness than the metal oxide 230b in a region overlapped by the conductor 242. The thin region is formed when part of the top surface of the metal oxide 230b is removed at the time of forming the conductor 242a and the conductor 242b. When a conductive film to be the conductor 242 is formed, a low-resistance region is sometimes formed on the top surface of the metal oxide 230b in the vicinity of the interface with the conductive film. Removing the low-resistance region between the conductor 242a and the conductor 242b on the top surface of the metal oxide 230b in the above manner can inhibit formation of the channel in the region.

According to one embodiment of the present invention, a display device that includes small-size transistors and thus has high resolution can be provided. A display device that includes a transistor with a high on-state current and thus has high luminance can be provided. A display device that includes a transistor operating at high speed and thus operates at high speed can be provided. A display device that includes a transistor having stable electrical characteristics and thus is highly reliable can be provided. A display device that includes a transistor with a low off-state current and thus has low power consumption can be provided.

The structure of the transistor 200A that can be used in the display device of one embodiment of the present invention will be described in detail.

The conductor 205 is placed so as to include a region overlapped by the metal oxide 230 and the conductor 260. Furthermore, the conductor 205 is preferably provided to be embedded in the insulator 216. Here, the top surface of the conductor 205 preferably has favorable planarity. For example, the average surface roughness (Ra) of the top surface of the conductor 205 is less than or equal to 1 nm, preferably less than or equal to 0.5 nm, further preferably less than or equal to 0.3 nm. This achieves favorable planarity of the insulator 224 formed over the conductor 205 and increases the crystallinity of the metal oxide 230b and the metal oxide 230c.

The conductor 260 sometimes functions as a first gate (also referred to as top gate) electrode. The conductor 205 functions as a second gate (also referred to as back gate) electrode in some cases. In that case, by changing a potential applied to the conductor 205 independently of a potential applied to the conductor 260, $V_{th}$ of the transistor 200A can be controlled. In particular, by applying a negative potential to the conductor 205, $V_{th}$ of the transistor 200A can be higher than 0 V and the off-state current can be reduced. Thus, a drain current of the transistor 200A at the time when a potential applied to the conductor 260 is 0 V can be lower in the case where a negative potential is applied to the conductor 205 than in the case where the negative potential is not applied to the conductor 205.

The conductor 205 is preferably larger than the channel formation region of the metal oxide 230. It is particularly preferable that the conductor 205 extend beyond an end portion of the metal oxide 230 that intersects with the channel width direction, as illustrated in FIG. 48C. In other words, the conductor 205 and the conductor 260 preferably overlap each other with the insulator therebetween, beyond the side surface of the metal oxide 230 in the channel width direction.

With the above structure, the channel formation region of the metal oxide 230 can be electrically surrounded by electric fields of the conductor 260 having a function of the first gate electrode and electric fields of the conductor 205 having a function of the second gate electrode.

Furthermore, as illustrated in FIG. 48C, the conductor 205 extends to function as a wiring as well. However, without limitation to this structure, a structure in which a conductor functioning as a wiring is provided below the conductor 205 may be employed.

A conductive material containing tungsten, copper, or aluminum as its main component is preferably used for the conductor 205. Note that the conductor 205 is illustrated as a single layer but may have a stacked-layer structure, for example, a stack of any of the above conductive materials and titanium or titanium nitride.

In addition, a conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, a conductor through which the above impurities are less likely to pass may be provided under the conductor 205. Alternatively, it is preferable to provide a conductor having a function of inhibiting diffusion of oxygen (e.g., at least one of oxygen atoms, oxygen molecules, and the like), that is, a conductor through which oxygen is less likely to pass. Note that in this specification, a function of inhibiting diffusion of impurities or oxygen means a function of inhibiting diffusion of any one or all of the above impurities and oxygen.

When the conductor having a function of inhibiting oxygen diffusion is provided under the conductor 205, a reduction in conductivity of the conductor 205 due to oxidation of the conductor 205 can be inhibited. As the conductor having a function of inhibiting oxygen diffusion, tantalum, tantalum nitride, ruthenium, or ruthenium oxide is preferably used, for example. Thus, the conductor 205 is a single layer or a stack of the above conductive materials.

The insulator 214 preferably has a function of a barrier insulating film that inhibits entry of impurities such as water or hydrogen into the transistor 200A from the substrate side. Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the above impurities are less likely to pass). Alternatively, it is preferable to use an insulating material having a function of inhibiting diffusion of oxygen (e.g., at least one of an oxygen atom, an oxygen molecule, and the like) (through which the oxygen is less likely to pass).

For example, aluminum oxide or silicon nitride is preferably used for the insulator 214. Accordingly, it is possible to inhibit diffusion of impurities such as water or hydrogen into the transistor 200A side from the substrate side through the insulator 214. It is also possible to inhibit diffusion of oxygen contained in the insulator 224 and the like toward the substrate through the insulator 214.

The permittivity of each of the insulator 216, the insulator 280, and the insulator 281 functioning as an interlayer film is preferably lower than that of the insulator 214. When a material with a low permittivity is used for an interlayer film, parasitic capacitance generated between wirings can be reduced. For the insulator 216, the insulator 280, and the insulator 281, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 222 and the insulator 224 have a function of a gate insulator.

Here, the insulator 224 in contact with the metal oxide 230 preferably release oxygen by heating. In this specification and the like, oxygen that is released by heating is referred to as excess oxygen in some cases. For example, silicon oxide, silicon oxynitride, or the like can be used as appropriate for the insulator 224. When an insulator containing oxygen is provided in contact with the metal oxide 230, oxygen vacancies in the metal oxide 230 can be reduced, leading to improved reliability of the transistor 200A.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C. or 100° C. to 400° C.

As illustrated in FIG. 48C, the insulator 224 is sometimes thinner in a region overlapped by neither the insulator 254 nor the metal oxide 230b than in the other regions. In the insulator 224, the region overlapped by neither the insulator 254 nor the metal oxide 230b preferably has a thickness with which the above oxygen can be adequately diffused.

Like the insulator 214 and the like, the insulator 222 preferably has a function of a barrier insulating film that inhibits entry of impurities such as water or hydrogen into the transistor 200A from the substrate side. For example, the insulator 222 preferably has a lower hydrogen permeability than the insulator 224. When the insulator 224, the metal oxide 230, the insulator 250, and the like are surrounded by the insulator 222, the insulator 254, and the insulator 274, the entry of impurities such as water or hydrogen into the transistor 200A from the outside can be inhibited.

Furthermore, the insulator 222 preferably has a function of inhibiting diffusion of oxygen (e.g., at least one of an oxygen atom, an oxygen molecule, and the like) (through which the oxygen is less likely to pass). For example, the insulator 222 preferably has a lower oxygen permeability than the insulator 224. The insulator 222 preferably has a function of inhibiting diffusion of oxygen and impurities, in which case oxygen contained in the metal oxide 230 is less likely to diffuse to the substrate side. The insulator 222 can also inhibit reaction of the conductor 205 with oxygen contained in the insulator 224 and oxygen contained in the metal oxide 230.

As the insulator 222, an insulator containing an oxide of one or both of aluminum and hafnium, which is an insulating material, is preferably used. As the insulator containing an oxide of one or both of aluminum and hafnium, aluminum oxide or hafnium oxide is preferably used. Alternatively, an oxide containing aluminum and hafnium (hafnium aluminate) or the like is preferably used. The insulator 222 formed using such a material functions as a layer inhibiting oxygen release from the metal oxide 230 and entry of impurities such as hydrogen into the metal oxide 230 from the periphery of the transistor 200A.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

The insulator 222 may have a single-layer structure or a stacked-layer structure using an insulator containing a high-k material, such as aluminum oxide, hafnium oxide, tantalum oxide, zirconium oxide, lead zirconate titanate (PZT), strontium titanate ($SrTiO_3$), or (Ba,Sr)$TiO_3$ (BST). With further miniaturization and higher integration of transistors, a problem such as leakage current may arise because of a thinned gate insulator. When a high-k material is used for an insulator functioning as a gate insulator, a gate potential at the time when the transistor operates can be lowered while the physical thickness of the gate insulator is maintained.

Note that the insulator 222 and the insulator 224 may each have a stacked-layer structure of two or more layers. In such cases, without limitation to a stacked-layer structure formed of the same material, a stacked-layer structure formed of different materials may be employed. For example, an insulator similar to the insulator 224 may be provided below the insulator 222.

The metal oxide 230 includes the metal oxide 230a, the metal oxide 230b over the metal oxide 230a, and the metal oxide 230c over the metal oxide 230b. The metal oxide 230a under the metal oxide 230b can inhibit diffusion of impurities into the metal oxide 230b from the components formed below the metal oxide 230a. The metal oxide 230c over the metal oxide 230b can inhibit diffusion of impurities into the metal oxide 230b from the components formed above the metal oxide 230c.

Note that the metal oxide 230 preferably has a stacked-layer structure of a plurality of oxide layers that differ in the atomic ratio of metal atoms. Specifically, the atomic proportion of an element M in the constituent elements in the metal oxide used as the metal oxide 230a is preferably higher than that in the metal oxide used as the metal oxide 230b. The atomic ratio of the element M to In in the metal oxide used as the metal oxide 230a is preferably higher than that in the metal oxide used as the metal oxide 230b. The atomic ratio of In to the element M in the metal oxide used as the metal oxide 230b is preferably higher than that in the metal oxide used as the metal oxide 230a. A metal oxide that can be used as the metal oxide 230a or the metal oxide 230b can be used as the metal oxide 230c.

The metal oxide 230a, the metal oxide 230b, and the metal oxide 230c preferably have crystallinity, and are particularly preferably formed using a CAAC-OS (c-axis-aligned crystalline oxide semiconductor). An oxide having crystallinity, such as a CAAC-OS, has a dense structure with small amounts of impurities and defects (e.g., oxygen vacancies) and high crystallinity. This reduces oxygen extraction from the metal oxide 230b by the source electrode or the drain electrode. Accordingly, oxygen extraction from the metal oxide 230b can be inhibited even when heat treatment is performed. Thus, the transistor 200A is stable against high temperatures in the manufacturing process (i.e., thermal budget).

The energy of the conduction band minimum of each of the metal oxide 230a and the metal oxide 230c is preferably higher than that of the metal oxide 230b. In other words, the electron affinity of each of the metal oxide 230a and the metal oxide 230c is preferably smaller than that of the metal oxide 230b. In that case, a metal oxide that can be used as the metal oxide 230a is preferably used as the metal oxide 230c. Specifically, the atomic proportion of the element M in the constituent elements in the metal oxide used as the metal oxide 230c is preferably higher than that in the metal oxide used as the metal oxide 230b. The atomic ratio of the element M to In in the metal oxide used as the metal oxide 230c is preferably higher than that in the metal oxide used as the metal oxide 230b. The atomic ratio of In to the element M in the metal oxide used as the metal oxide 230b is preferably higher than that in the metal oxide used as the metal oxide 230c.

Here, the energy level of the conduction band minimum is gradually varied at junction portions between the metal oxide 230a, the metal oxide 230b, and the metal oxide 230c. In other words, the energy levels of the conduction band minimum at the junction portions between the metal oxide 230a, the metal oxide 230b, and the metal oxide 230c continuously vary or are continuously connected. This can be achieved by decreasing the density of defect states in a mixed layer formed at the interface between the metal oxide 230a and the metal oxide 230b and the interface between the metal oxide 230b and the metal oxide 230c.

Specifically, when the metal oxide 230a and the metal oxide 230b or the metal oxide 230b and the metal oxide 230c contain the same element (as a main component) in addition to oxygen, a mixed layer with a low density of defect states can be formed. For example, in the case where the metal oxide 230b is an In—Ga—Zn oxide, an In—Ga—Zn oxide, a Ga—Zn oxide, gallium oxide, or the like may be used as the metal oxide 230a and the metal oxide 230c. The metal oxide 230c may have a stacked-layer structure. For example, the metal oxide 230c can have a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, the metal oxide 230c may have a stacked-layer structure of an In—Ga—Zn oxide and an oxide that does not contain In.

Specifically, as the metal oxide 230a, a metal oxide with In:Ga:Zn=1:3:4 [atomic ratio] or 1:1:0.5 [atomic ratio] is used. As the metal oxide 230b, a metal oxide with In:Ga:Zn=4:2:3 [atomic ratio] or 3:1:2 [atomic ratio] is used. As the metal oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the metal oxide 230c having a stacked-layer structure include a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the metal oxide 230b serves as a main carrier path. When the metal oxide 230a and the metal oxide 230c have the above composition, the density of defect states at the interface between the metal oxide 230a and the metal oxide 230b and the interface between the metal oxide 230b and the metal oxide 230c can be made low. This reduces the influence of interface scattering on carrier conduction, and the transistor 200A can have a high on-state current and high frequency characteristics. Note that in the case where the metal oxide 230c has a stacked-layer structure, not only the effect of reducing the density of defect state at the interface between the metal oxide 230b and the metal oxide 230c, but also the effect of inhibiting diffusion of the constituent element of the metal oxide 230c toward the insulator 250 can be expected. Specifically, the metal oxide 230c has a stacked-layer structure in which the upper layer is an oxide that does not contain In, whereby the diffusion of In toward the insulator 250 can be inhibited. Since the insulator 250 functions as a gate insulator, the transistor would show poor characteristics when In diffuses into the insulator 250. Thus, the metal oxide 230c having a stacked-layer structure allows a highly reliable display device to be provided.

The conductor 242 (the conductor 242a and the conductor 242b) functioning as the source electrode and the drain electrode is provided over the metal oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

When the conductor 242 is provided in contact with the metal oxide 230, the oxygen concentration of the metal oxide 230 in the vicinity of the conductor 242 sometimes decreases. In addition, a metal compound layer that contains the metal contained in the conductor 242 and the component of the metal oxide 230 is sometimes formed in the metal oxide 230 in the vicinity of the conductor 242. In such cases, the carrier density of the region of the metal oxide 230 in the vicinity of the conductor 242 increases, and the region becomes a low-resistance region.

Here, the region between the conductor 242a and the conductor 242b is formed to be overlapped by the opening of the insulator 280. Accordingly, the conductor 260 can be formed in a self-aligned manner between the conductor 242a and the conductor 242b.

The insulator 250 functions as a gate insulator. The insulator 250 is preferably positioned in contact with the top surface of the metal oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably has a function of inhibiting oxygen diffusion from the insulator 250 into the conductor 260. Thus, oxidation of the conductor 260 due to oxygen in the insulator 250 can be inhibited.

The metal oxide has a function of part of the gate insulator in some cases. Therefore, when silicon oxide, silicon oxynitride, or the like is used for the insulator 250, a metal oxide that is a high-k material with a high relative permittivity is preferably used as the metal oxide. The gate insulator having a stacked-layer structure of the insulator 250 and the metal oxide enables the transistor 200A to be thermally stable and have a high relative permittivity. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, it is possible to use a metal oxide containing one kind or two or more kinds selected from hafnium, aluminum, gallium, yttrium, zirconium, tungsten, titanium, tantalum, nickel, germanium, magnesium, and the like. It is particularly preferable to use an insulator containing an oxide of one or both of aluminum and hafnium, such as aluminum oxide, hafnium oxide, or an oxide containing aluminum and hafnium (hafnium aluminate).

Although FIG. 48B illustrates the conductor 260 having a two-layer structure, the conductor 260 may have a single-layer structure or a stacked-layer structure of three or more layers.

The conductor 260a is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting diffusion of oxygen, it is possible to inhibit a reduction in conductivity of the conductor 260b due to oxidation of the conductor 260b caused by oxygen contained in the insulator 250. As a conductive material having a function of inhibiting oxygen diffusion, for example, tantalum, tantalum nitride, ruthenium, or ruthenium oxide is preferably used.

The conductor 260b also functions as a wiring. Thus, a conductor having high conductivity is preferably used. For example, a conductive material containing tungsten, copper, or aluminum as its main component can be used. The conductor 260b may have a stacked-layer structure, for example, a stacked-layer structure of titanium or titanium nitride and the above conductive material.

As illustrated in FIG. 48A and FIG. 48C, the side surface of the metal oxide 230 is covered with the conductor 260 in a region where the metal oxide 230b is not overlapped by the conductor 242, that is, the channel formation region of the metal oxide 230. Accordingly, electric fields of the conductor 260 having a function of the first gate electrode are likely to act on the side surface of the metal oxide 230. Hence, the transistor 200A can have a higher on-state current and improved frequency characteristics.

Like the insulator 214 and the like, the insulator 254 preferably has a function of a barrier insulating film that inhibits impurities such as water or hydrogen from entering the transistor 200A from the insulator 280 side. The insulator 254 preferably has a lower hydrogen permeability than the insulator 224, for example. Furthermore, as illustrated in FIG. 48B and FIG. 48C, the insulator 254 preferably includes a region in contact with the side surface of the metal oxide 230c, the top surface and side surface of the conductor 242a, the top surface and side surface of the conductor 242b, the side surface of the metal oxide 230a, the side surface of the metal oxide 230b, and the top surface of the insulator 224. Such a structure can inhibit entry of hydrogen of the insulator 280 into the metal oxide 230 through the top surfaces or side surfaces of the conductor 242a, the conductor 242b, the metal oxide 230a, the metal oxide 230b, and the insulator 224.

Furthermore, the insulator 254 preferably has a function of inhibiting diffusion of oxygen (e.g., at least one of an oxygen atom, an oxygen molecule, and the like) (through which the oxygen is less likely to pass). For example, the insulator 254 preferably has a lower oxygen permeability than the insulator 280 or the insulator 224.

The insulator 254 is preferably formed by a sputtering method. When the insulator 254 is formed by a sputtering method in an oxygen-containing atmosphere, oxygen can be added to the vicinity of a region of the insulator 224 that is in contact with the insulator 254. Thus, oxygen can be supplied from the region to the metal oxide 230 through the insulator 224. Here, with the insulator 254 having a function of inhibiting upward oxygen diffusion, diffusion of oxygen from the metal oxide 230 into the insulator 280 can be inhibited. Moreover, with the insulator 222 having a function of inhibiting downward oxygen diffusion, diffusion of oxygen from the metal oxide 230 toward the substrate can be inhibited. In the above manner, oxygen is supplied to the channel formation region of the metal oxide 230. Accordingly, oxygen vacancies in the metal oxide 230 can be reduced, so that the transistor can be prevented from having normally-on characteristics.

As the insulator 254, an insulator containing an oxide of one or both of aluminum and hafnium is formed, for example. Note that as the insulator containing an oxide of one or both of aluminum and hafnium, aluminum oxide, hafnium oxide, an oxide containing aluminum and hafnium (hafnium aluminate), or the like is preferably used.

The insulator 224, the insulator 250, and the metal oxide 230 are covered with the insulator 254 having a barrier property against hydrogen, whereby the insulator 280 is isolated from the insulator 224, the metal oxide 230, and the insulator 250 by the insulator 254. This inhibits entry of impurities such as hydrogen from the outside of the transistor 200A, resulting in favorable electrical characteristics and reliability of the transistor 200A.

The insulator 280 is provided over the insulator 224, the metal oxide 230, and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride are preferable because they are thermally stable. A material such as silicon oxide, silicon oxynitride, or porous silicon oxide is preferably used, in which case a region including oxygen that is released by heating can be easily formed.

The concentration of impurities such as water or hydrogen in the insulator 280 is preferably reduced. In addition, the top surface of the insulator 280 may be planarized.

The insulator 274, like the insulator 214 and the like, preferably has a function of a barrier insulating film that inhibits entry of impurities such as water and hydrogen into the insulator 280. The insulator 274 can be formed using an insulator that can be used as the insulator 214 or the insulator 254, for example.

The insulator 281 functioning as an interlayer film is preferably provided over the insulator 274. As in the insulator 224 or the like, the concentration of impurities such as water or hydrogen in the insulator 281 is preferably reduced.

The conductor 240a and the conductor 240b are positioned in openings formed in the insulator 281, the insulator 274, the insulator 280, and the insulator 254. The conductor 240a and the conductor 240b are positioned to face each other with the conductor 260 therebetween. Note that the top surfaces of the conductor 240a and the conductor 240b may be level with the top surface of the insulator 281.

The insulator 241a is provided in contact with the inner wall of the opening in the insulator 281, the insulator 274, the insulator 280, and the insulator 254, and the first conductor of the conductor 240a is formed in contact with the side surface of the insulator 241a. The conductor 242a is positioned on at least part of the bottom portion of the opening, and the conductor 240a is in contact with the conductor 242a. Similarly, the insulator 241b is provided in contact with the inner wall of the opening in the insulator 281, the insulator 274, the insulator 280, and the insulator 254, and the first conductor of the conductor 240b is formed in contact with the side surface of the insulator 241b. The conductor 242b is positioned on at least part of the bottom portion of the opening, and the conductor 240b is in contact with the conductor 242b.

The conductor 240a and the conductor 240b are preferably formed using a conductive material containing tungsten, copper, or aluminum as its main component. The conductor 240a and the conductor 240b may have a stacked-layer structure.

In the case where the conductor 240 has a stacked-layer structure, the aforementioned conductor having a function of inhibiting diffusion of impurities such as water or hydrogen is preferably used as the conductor in contact with the metal oxide 230a, the metal oxide 230b, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material can inhibit oxygen added to the insulator 280 from being absorbed by the conductor 240a and the conductor 240b. Moreover, impurities such as water or hydrogen can be inhibited from entering the metal oxide 230 through the conductor 240a and the conductor 240b from a layer above the insulator 281.

As the insulator 241a and the insulator 241b, for example, the insulator that can be used as the insulator 254 or the like can be used. Since the insulator 241a and the insulator 241b are provided in contact with the insulator 254, impurities such as water or hydrogen in the insulator 280 or the like can be inhibited from entering the metal oxide 230 through the conductor 240a and the conductor 240b. Furthermore, oxygen contained in the insulator 280 can be prevented from being absorbed by the conductor 240a and the conductor 240b.

Although not illustrated, a conductor functioning as a wiring may be provided in contact with the top surface of the conductor 240a and the top surface of the conductor 240b. For the conductor functioning as a wiring, a conductive material containing tungsten, copper, or aluminum as its main component is preferably used. Furthermore, the conductor may have a stacked-layer structure and may be a stack of titanium or a titanium nitride and any of the above conductive materials, for example. Note that the conductor may be formed to be embedded in an opening provided in an insulator.

Transistor Structure Example 2

FIG. 49A to FIG. 49C are a top view and cross-sectional views of a transistor 200B that can be used in the display device of one embodiment of the present invention and the periphery of the transistor 200B. The transistor 200B is a variation example of the transistor 200A.

FIG. 49A is a top view of the transistor 200B. FIG. 49B and FIG. 49C are cross-sectional views of the transistor 200B. Here, FIG. 49B is a cross-sectional view of a portion indicated by the dashed-dotted line B1-B2 in FIG. 49A, and is a cross-sectional view in the channel length direction of the transistor 200B. FIG. 49C is a cross-sectional view of a portion indicated by the dashed-dotted line B3-B4 in FIG. 49A, and is a cross-sectional view in the channel width direction of the transistor 200B. Note that for clarification of the drawing, some components are not illustrated in the top view of FIG. 49A.

In the transistor 200B, the conductor 242a and the conductor 242b each have a region overlapped by the metal oxide 230c, the insulator 250, and the conductor 260. Thus, the transistor 200B can have a high on-state current. In addition, the transistor 200B can be a transistor that is easy to control.

The conductor 260 functioning as a gate electrode includes the conductor 260a and the conductor 260b over the conductor 260a. For the conductor 260a, it is preferable to use a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting oxygen diffusion, the range of choices for the material of the conductor 260b can be expanded. That is, the conductor 260*a* inhibits oxidation of the conductor 260*b*, thereby inhibiting the decrease in conductivity of the conductor 260*b*.

The insulator 254 is preferably provided to cover the top surface and side surface of the conductor 260, the side surface of the insulator 250, and the side surface of the metal oxide 230*c*. Note that an insulating material having a function of inhibiting diffusion of oxygen and impurities such as water or hydrogen is preferably used for the insulator 254.

Providing the insulator 254 can inhibit oxidation of the conductor 260. Moreover, the insulator 254 can inhibit diffusion of impurities such as water or hydrogen contained in the insulator 280 into the transistor 200B.

Transistor Structure Example 3

Figure 50A:
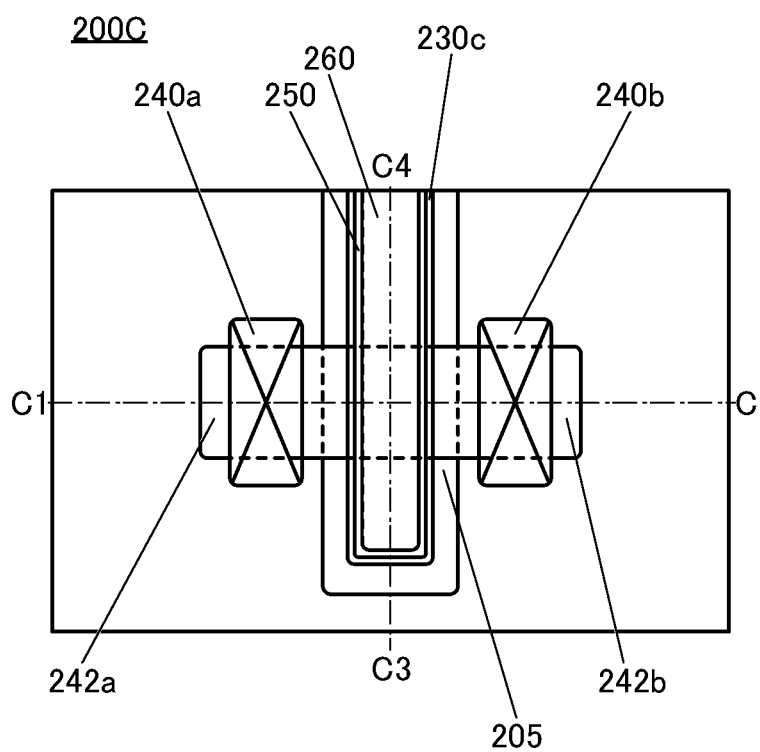
FIG. 50A is a top view illustrating a structure example of a transistor.
Figure 50C:
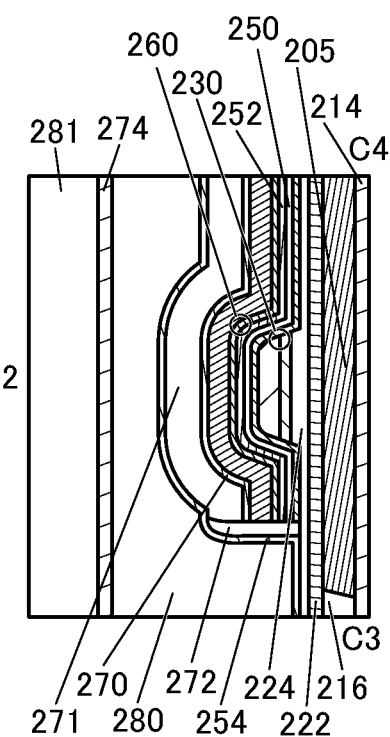
FIG. 50B and FIG. 50C are cross-sectional views illustrating the structure example of the transistor.
Figure 50B:
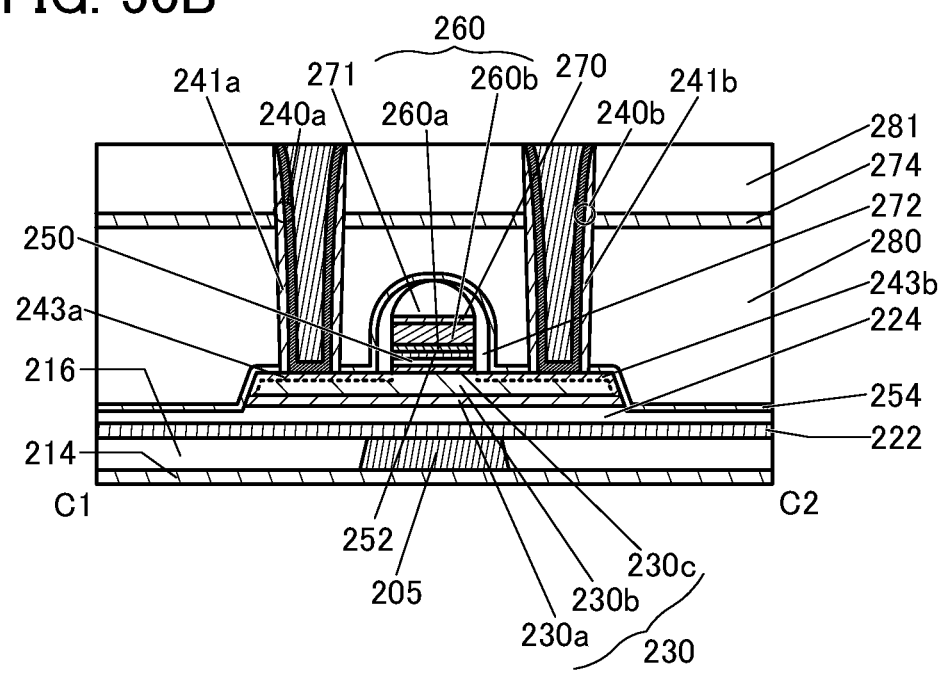

FIG. 50A to FIG. 50C are a top view and cross-sectional views of a transistor 200C that can be used in the display device of one embodiment of the present invention and the periphery of the transistor 200C. The transistor 200C is a variation example of the transistor 200A.

FIG. 50A is a top view of the transistor 200C. FIG. 50B and FIG. 50C are cross-sectional views of the transistor 200C. Here, FIG. 50B is a cross-sectional view of a portion indicated by the dashed-dotted line C1-C2 in FIG. 50A, and is a cross-sectional view in the channel length direction of the transistor 200C. FIG. 50C is a cross-sectional view of a portion indicated by the dashed-dotted line C3-C4 in FIG. 50A, and is a cross-sectional view in the channel width direction of the transistor 200C. Note that for clarity of the drawing, some components are not illustrated in the top view of FIG. 50A.

The transistor 200C includes the insulator 250 over the metal oxide 230*c* and a metal oxide 252 over the insulator 250. The conductor 260 is provided over the metal oxide 252, and an insulator 270 is provided over the conductor 260. An insulator 271 is provided over the insulator 270.

The metal oxide 252 preferably has a function of inhibiting oxygen diffusion. When the metal oxide 252 that inhibits oxygen diffusion is provided between the insulator 250 and the conductor 260, diffusion of oxygen into the conductor 260 is inhibited. In other words, a reduction in the amount of oxygen supplied to the metal oxide 230 can be inhibited. Furthermore, oxidation of the conductor 260 can be inhibited.

Note that the metal oxide 252 may have a function of part of a gate electrode. For example, an oxide semiconductor that can be used for the metal oxide 230 can be used for the metal oxide 252. In that case, when the conductor 260 is formed by a sputtering method, the metal oxide 252 can have a reduced electric resistance and become a conductor. Such a conductor can be referred to as an OC (Oxide Conductor) electrode.

Note that the metal oxide 252 may have a function of part of agate insulator. Therefore, when silicon oxide, silicon oxynitride, or the like, which has high thermal stability, is used for the insulator 250, a metal oxide that is a high-k material with a high relative permittivity is preferably used as the metal oxide 252. This stacked-layer structure enables the transistor 200C to be thermally stable and have a high relative permittivity. Consequently, a gate potential that is applied when the transistor operates can be lowered while the physical thickness is maintained. In addition, the equivalent oxide thickness (EOT) of the insulator functioning as the gate insulator can be reduced.

Although the metal oxide 252 in the transistor 200C is illustrated as a single layer, the metal oxide 252 may have a stacked-layer structure of two or more layers. For example, a metal oxide functioning as part of a gate electrode and a metal oxide functioning as part of a gate insulator may be stacked.

When the metal oxide 252 included in the transistor 200C functions as a gate electrode, the on-state current of the transistor 200C can be increased without weakening the influence of electric fields from the conductor 260. When the metal oxide 252 functions as a gate insulator, the distance between the conductor 260 and the metal oxide 230 can be maintained owing to the physical thickness of the insulator 250 and the metal oxide 252. Thus, leakage current between the conductor 260 and the metal oxide 230 can be reduced. Consequently, in the transistor 200C having the stacked-layer structure of the insulator 250 and the metal oxide 252, it is easy to adjust the physical distance between the conductor 260 and the metal oxide 230 and the intensity of electric fields applied from the conductor 260 to the metal oxide 230.

Specifically, for the metal oxide 252, a material obtained by reducing the resistance of an oxide semiconductor that can be used for the metal oxide 230 can be used. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulator containing an oxide of one or both of aluminum and hafnium, such as aluminum oxide, hafnium oxide, or an oxide containing aluminum and hafnium (hafnium aluminate). In particular, hafnium aluminate has higher heat resistance than hafnium oxide. Therefore, hafnium aluminate is preferable because it is less likely to be crystallized by heat treatment in a later step. Note that the metal oxide 252 is not an essential component. Design is appropriately set in consideration of required transistor characteristics.

For the insulator 270, an insulating material having a function of inhibiting the passage of oxygen and impurities such as water or hydrogen is preferably used. For example, aluminum oxide or hafnium oxide is preferably used. In that case, oxidation of the conductor 260 due to oxygen from above the insulator 270 can be inhibited. Moreover, entry of impurities such as water or hydrogen from above the insulator 270 into the metal oxide 230 through the conductor 260 and the insulator 250 can be inhibited.

The insulator 271 functions as a hard mask. By providing the insulator 271, the conductor 260 can be processed such that the side surface of the conductor 260 is substantially perpendicular; specifically, an angle formed by the side surface of the conductor 260 and a surface of the substrate can be greater than or equal to 75° and less than or equal to 100°, preferably greater than or equal to 80° and less than or equal to 95°.

Note that the insulator 271 may be formed using an insulating material having a function of inhibiting the passage of oxygen and impurities such as water or hydrogen so that the insulator 271 also functions as a barrier layer. In that case, the insulator 270 is not necessarily provided.

Parts of the insulator 270, the conductor 260, the metal oxide 252, the insulator 250, and the metal oxide 230*c* are selectively removed using the insulator 271 as a hard mask, whereby their side surfaces can be substantially aligned with each other and the surface of the metal oxide 230*b* can be partly exposed.

The transistor 200C includes a region 243*a* and a region 243*b* on part of the exposed surface of the metal oxide 230*b*. One of the region 243*a* and the region 243*b* functions as a source region, and the other of the region 243a and the region 243b functions as a drain region.

The region 243a and the region 243b can be formed by adding an impurity element such as phosphorus or boron to the exposed surface of the metal oxide 230b by an ion implantation method, an ion doping method, a plasma immersion ion implantation method, or plasma treatment, for example. In this embodiment and the like, an "impurity element" refers to an element other than main constituent elements.

Alternatively, the region 243a and the region 243b can be formed in such manner that, after part of the surface of the metal oxide 230b is exposed, a metal film is formed and then heat treatment is performed so that the element contained in the metal film is diffused into the metal oxide 230b.

The electrical resistivity of the regions of the metal oxide 230b to which the impurity element is added decreases. For that reason, the region 243a and the region 243b are sometimes referred to as "impurity regions" or "low-resistance regions".

The region 243a and the region 243b can be formed in a self-aligned manner by using the insulator 271 and/or the conductor 260 as a mask. Accordingly, the conductor 260 does not overlap the region 243a and/or the region 243b, so that the parasitic capacitance can be reduced. Moreover, an offset region is not formed between the channel formation region and the source/drain region (the region 243a or the region 243b). The formation of the region 243a and the region 243b in a self-aligned manner achieves a higher on-state current, a lower threshold voltage, and a higher operating frequency, for example.

The transistor 200C includes an insulator 272 on the side surfaces of the insulator 271, the insulator 270, the conductor 260, the metal oxide 252, the insulator 250, and the metal oxide 230c. The insulator 272 is preferably an insulator having a low relative permittivity. The insulator 272 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin, for example. In particular, silicon oxide, silicon oxynitride, silicon nitride oxide, or porous silicon oxide is preferably used for the insulator 272, in which case an excess oxygen region can be easily formed in the insulator 272 in a later step. Silicon oxide and silicon oxynitride are preferable because they are thermally stable. The insulator 272 preferably has a function of diffusing oxygen.

Note that an offset region may be provided between the channel formation region and the source/drain region in order to further reduce the off-state current. The offset region is a region where the electrical resistivity is high and the impurity element is not added. The offset region can be formed by addition of the impurity element after the formation of the insulator 272. In that case, the insulator 272 also serves as a mask, like the insulator 271 or the like. Thus, the impurity element is not added to the region of the metal oxide 230b overlapped by the insulator 272, so that the electrical resistivity of the region can be kept high.

The transistor 200C also includes the insulator 254 over the insulator 272 and the metal oxide 230. The insulator 254 is preferably formed by a sputtering method. The insulator formed by a sputtering method can be an insulator containing few impurities such as water or hydrogen.

Note that an oxide film formed by a sputtering method may extract hydrogen from the component over which the oxide film is formed. For that reason, the insulator 254 formed by a sputtering method absorbs hydrogen and water from the metal oxide 230 and the insulator 272. This reduces the hydrogen concentration in the metal oxide 230 and the insulator 272.

<Materials for Transistor>

Materials that can be used for the transistor will be described.

<<Substrate>>

As the substrate where the transistor 200A, the transistor 200B, or the transistor 200C is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example includes a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

With further miniaturization and higher integration of transistors, for example, a problem such as leakage current may arise because of a thinned gate insulator. When a high-k material is used for an insulator functioning as a gate insulator, the driving voltage of the transistor can be lowered while the physical thickness of the gate insulator is maintained. By contrast, when a material with a low relative permittivity is used for an insulator functioning as an interlayer film, parasitic capacitance generated between wirings can be reduced. Accordingly, a material is preferably selected depending on the function of the insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting the passage of oxygen and impurities such as hydrogen (e.g., the insulator 214, the insulator 222, the insulator 254, and the insulator 274), the electrical characteristics of the transistor can be stable. As the insulator having a function of inhibiting the passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator preferably includes a region containing oxygen released by heating. For example, when silicon oxide or silicon oxynitride that includes a region containing oxygen released by heating is provided in contact with the metal oxide 230, oxygen vacancies included in the metal oxide 230 can be filled.

<<Conductor>>

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A plurality of conductors formed using any of the above materials may be stacked. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably employs a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

For the conductor functioning as the gate electrode, it is particularly preferable to use a conductive material containing oxygen and a metal element contained in a metal oxide where the channel is formed. A conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

<<Metal Oxide>>

A metal oxide preferably contains at least indium or zinc. In particular, indium and zinc are preferably contained. Furthermore, aluminum, gallium, yttrium, tin, or the like is preferably contained in addition to them. Moreover, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide that contains indium, an element M, and zinc is considered. Note that the element M is aluminum, gallium, yttrium, tin, or the like. Other examples of elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) are classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

[Impurities]

Here, the influence of impurities in the metal oxide is described. When a metal oxide contains an alkali metal or an alkaline earth metal, defect states are formed and carriers are generated in some cases. Thus, a transistor using a metal oxide containing an alkali metal or an alkaline earth metal in a channel formation region tends to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by secondary ion mass spectrometry (SIMS) is lower than or equal to $1 \times 10^{18}$ atoms/cm$^3$, preferably lower than or equal to $2 \times 10^{16}$ atoms/cm$^3$.

Hydrogen contained in a metal oxide reacts with oxygen bonded to a metal atom and forms water. Hence, hydrogen contained in a metal oxide may cause oxygen vacancies in the metal oxide. When hydrogen enters the oxygen vacancy, an electron which is a carrier is generated in some cases. Furthermore, bonding of part of hydrogen to oxygen bonded to a metal atom causes generation of an electron serving as a carrier in some cases. Thus, a transistor using a metal oxide that contains hydrogen is likely to have normally-on characteristics.

Accordingly, hydrogen in the metal oxide is preferably reduced as much as possible. Specifically, the hydrogen concentration of the metal oxide obtained by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently reduced impurity concentration is used for a channel formation region of a transistor, the transistor can have stable electrical characteristics.

Note that as a metal oxide used as a semiconductor of a transistor, a thin film having high crystallinity is preferably used. With the thin film, the stability or reliability of the transistor can be improved. As the thin film, a thin film of a single crystal metal oxide or a thin film of a polycrystalline metal oxide can be used, for example. However, a high-temperature process or a laser heating process is required to form the thin film of a single crystal metal oxide or the thin film of a polycrystalline metal oxide over a substrate. Thus, manufacturing cost is increased, and throughput is decreased.

At least part of the structure examples, the drawings corresponding thereto, and the like described in this embodiment can be implemented in combination with the other structure examples, the other drawings, or the like as appropriate.

At least part of this embodiment can be implemented in combination with the other embodiments described in this specification as appropriate.

Embodiment 3

In this embodiment, a metal oxide (hereinafter also referred to as an oxide semiconductor) that can be used in an OS transistor described in the above embodiment will be described.

<Classification of Crystal Structures>

First, the classification of crystal structures of an oxide semiconductor will be described with reference to FIG. 51A. FIG. 51A is a diagram showing the classification of crystal structures of an oxide semiconductor, typically IGZO (a metal oxide containing In, Ga, and Zn).

As shown in FIG. 51A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 51A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 51B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 51B and obtained by GIXD measurement is hereinafter simply referred to as an XRD spectrum. The composition of the CAAC-IGZO film in FIG. 51B is In:Ga:Zn=4:2:3 [atomic ratio] or the neighborhood thereof. The CAAC-IGZO film in FIG. 51B has a thickness of 500 nm.

As shown in FIG. 51B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 51B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 51C shows a diffraction pattern of a CAAC-IGZO film. FIG. 51C shows a diffraction pattern obtained with the NBED method in which an electron beam is incident in the direction parallel to the substrate. The composition of the CAAC-IGZO film in FIG. 51C is In:Ga:Zn=4:2:3 [atomic ratio] or the neighborhood thereof. In the nanobeam electron diffraction method, electron diffraction is performed with a probe diameter of 1 nm.

As shown in FIG. 51C, a plurality of spots indicating c-axis alignment are observed in the diffraction pattern of the CAAC-IGZO film.

<<Structure of Oxide Semiconductor>>

Oxide semiconductors may be classified in a manner different from that in FIG. 51A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is sometimes a non-regular hexagon. A pentagonal lattice arrangement, a heptagonal lattice arrangement, and the like are sometimes included in the distortion. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and traps carriers and thus decreases the on-state current and field-effect mobility of a transistor, for example. Hence, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for an OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. As another example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide can be found to have a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<<Transistor Including Oxide Semiconductor>>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<<Impurities>>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentrations obtained by secondary ion mass spectrometry (SIMS)) are lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Consequently, the concentration of an alkali metal or an alkaline earth metal in the oxide semiconductor, which is obtained using SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 4

In this embodiment, electronic devices each including the display device of one embodiment of the present invention will be described.

FIG. 52A to FIG. 52G are diagrams illustrating examples of electronic devices each including the display device of one embodiment of the present invention. The electronic devices illustrated in FIG. 52A to FIG. 52G each include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 9008, and the like.

The electronic devices illustrated in FIG. 52A to FIG. 52G have a variety of functions. Examples include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices illustrated in FIG. 52A to FIG. 52G are not limited thereto, and the electronic devices can have a variety of functions. Although not illustrated in FIG. 52A to FIG. 52G, the electronic devices may each include a plurality of display portions. The electronic devices may each include a camera and the like and have a function of taking a still image, a function of taking a moving image, a function of storing the taken image in a memory medium (external or incorporated in the camera), a function of displaying the taken image on the display portion, or the like.

The details of the electronic devices illustrated in FIG. 52A to FIG. 52G are described below.

Figure 52A:
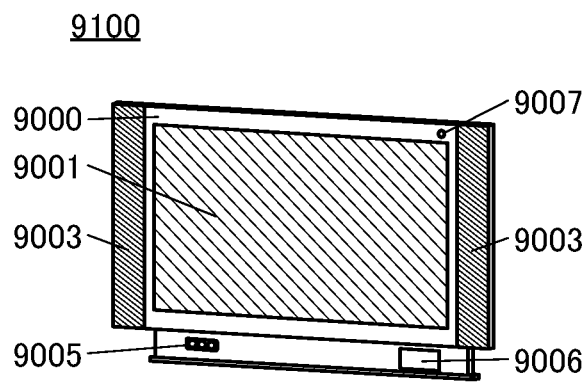
FIG. 52A to FIG. 52G are perspective views illustrating structure examples of electronic devices.

FIG. 52A is a perspective view illustrating a television 9100. The television 9100 can include the display portion 9001 having a large screen size of, for example, 50 inches or more, or 100 inches or more.

The display device of one embodiment of the present invention can be used in the display portion 9001 included in the television 9100. Accordingly, the television 9100 can have a narrower bezel, a high-quality image can be displayed on the display portion 9001, and a more realistic image can be displayed.

Figure 52D:
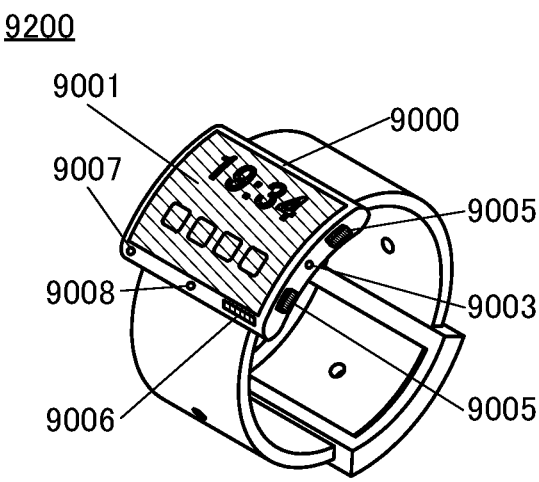
Figure 52B:
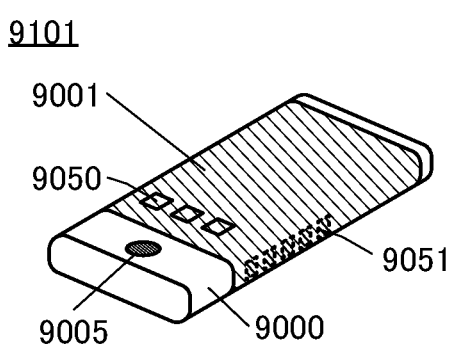

FIG. 52B is a perspective view illustrating a portable information terminal 9101. The portable information terminal 9101 has a function of one or more selected from a telephone set, a notebook, an information browsing device, and the like, for example. Specifically, the portable information terminal can be used as a smartphone. Note that the portable information terminal 9101 may be provided with the speaker 9003, the connection terminal 9006, the sensor 9007, or the like. The portable information terminal 9101 can display letters and images on its plurality of surfaces. For example, three operation buttons 9050 (also referred to as operation icons, or simply icons) can be displayed on one surface of the display portion 9001. Information 9051 indicated by dashed rectangles can be displayed on another surface of the display portion 9001. Note that examples of the information 9051 include display indicating reception of an e-mail, an SNS (social networking service), a telephone call, and the like, the title of an e-mail, an SNS, or the like, the sender of an e-mail, an SNS, or the like, date, time, remaining battery, and reception strength of an antenna. Alternatively, the operation buttons 9050 or the like may be displayed on the position where the information 9051 is displayed, in place of the information 9051.

The display device of one embodiment of the present invention can be used in the display portion 9001 included in the portable information terminal 9101. Accordingly, the size of the portable information terminal 9101 can be reduced, a high-quality image can be displayed on the display portion 9001, and a more realistic image can be displayed.

Figure 52E:
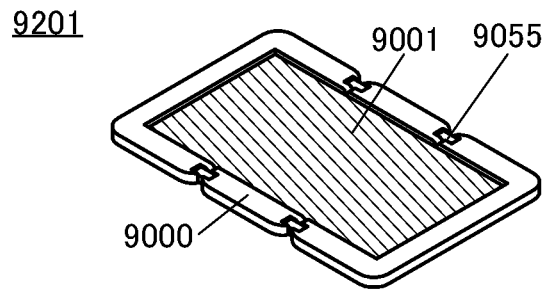
Figure 52C:
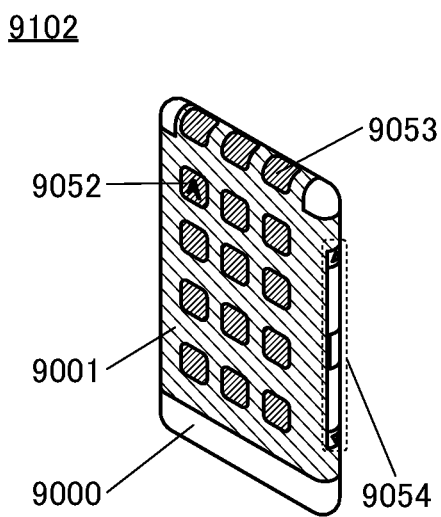

FIG. 52C is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, the user of the portable information terminal 9102 can see the display (here, the information 9053) with the portable information terminal 9102 put in a breast pocket of the clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

The display device of one embodiment of the present invention can be used in the display portion 9001 of the portable information terminal 9102. Accordingly, the size of the portable information terminal 9102 can be reduced, a high-quality image can be displayed on the display portion 9001, and a more realistic image can be displayed.

FIG. 52D is a perspective view illustrating a watch-type portable information terminal 9200. The portable information terminal 9200 is capable of executing a variety of applications such as mobile phone calls, e-mailing, reading and editing texts, music reproduction, Internet communication, and computer games. The display surface of the display portion 9001 is arranged to be curved, and display can be performed along the curved display surface. The portable information terminal 9200 can perform near field communication conformable to a communication standard. For example, mutual communication with a headset capable of wireless communication enables hands-free calling. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

The display device of one embodiment of the present invention can be used in the display portion 9001 of the portable information terminal 9200. Accordingly, the portable information terminal 9200 can have a narrower bezel, a high-quality image can be displayed on the display portion 9001, and a more realistic image can be displayed.

Figure 52F:
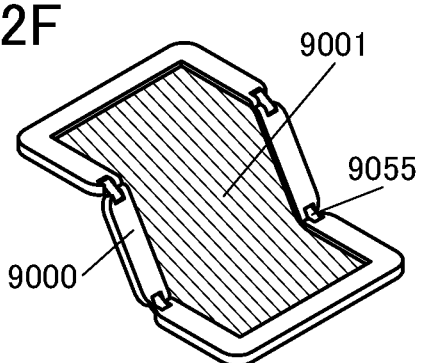
Figure 52G:
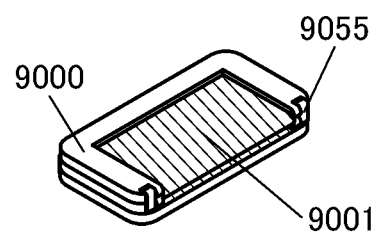

FIG. 52E to FIG. 52G are perspective views illustrating a foldable portable information terminal 9201. FIG. 52E is a perspective view of the portable information terminal 9201 in the opened state, FIG. 52F is a perspective view of the portable information terminal 9201 that is shifted from one of the opened state and the folded state to the other, and FIG. 52G is a perspective view of the portable information terminal 9201 in the folded state. The portable information terminal 9201 is highly portable in the folded state and is highly browsable in the opened state because of a seamless large display region. The display portion 9001 of the portable information terminal 9201 is supported by three housings 9000 joined by hinges 9055. By being folded at the hinges 9055 between two housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

The display device of one embodiment of the present invention can be used in the display portion 9001 of the portable information terminal 9201. Accordingly, the portable information terminal 9201 can have a narrower bezel, a high-quality image can be displayed on the display portion 9001, and a more realistic image can be displayed.

At least part of the structure examples, the drawings corresponding thereto, and the like described in this embodiment can be implemented in combination with the other structure examples, the other drawings, or the like as appropriate.

At least part of this embodiment can be implemented in combination with the other embodiments described in this specification as appropriate.

Example 1

In this example, the measured results of the electrical characteristics of an OS transistor will be described.

In this example, the gate current-gate voltage characteristics (Ig-Vg characteristics) and the drain current-drain voltage characteristics (Id-Vd characteristics) of an OS transistor having the structure illustrated in FIG. 48A to FIG. 48C were measured. In the OS transistor, the channel length was 200 nm and the channel width was 60 nm. Note that the lower measurement limit of a measurement device that measured the current in this example is $1 \times 10^{-13}$ A.

Figure 53A:
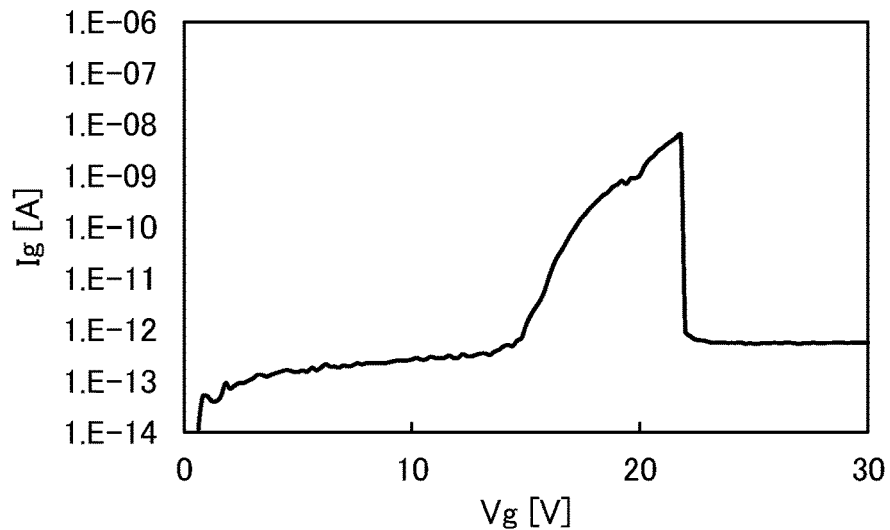
FIG. 53A is a graph showing measured results of Ig-Vg characteristics of Example.
Figure 53B:
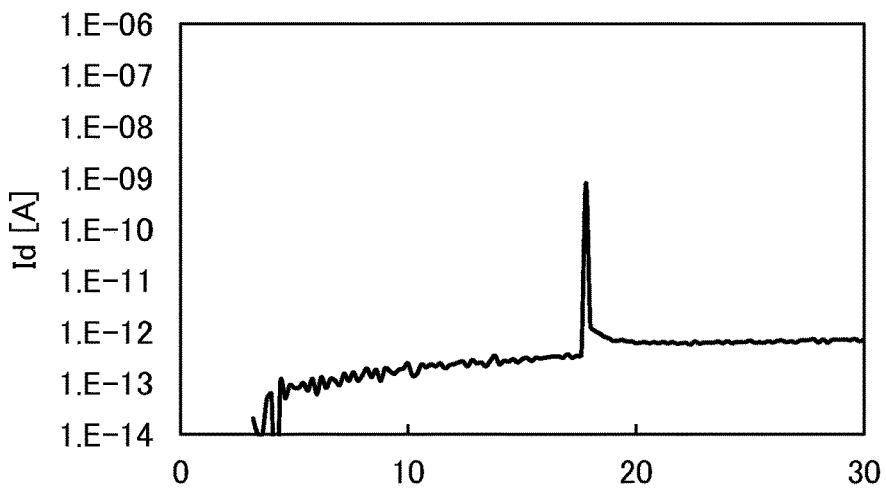
FIG. 53B and FIG. 53C are graphs showing measured results of Id-Vd characteristics of Example.
Figure 53C:
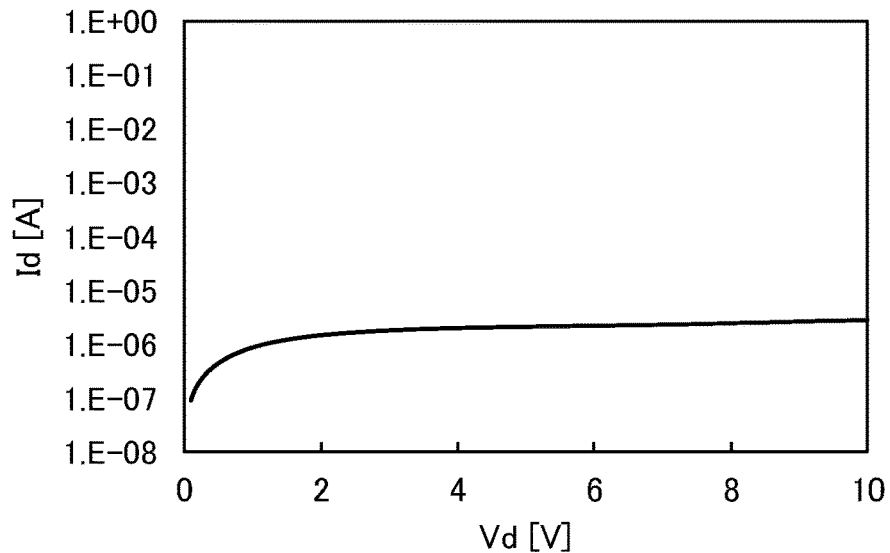

FIG. 53A is a graph showing the measured results of the Ig-Vg characteristics when the potential of the drain and the potential of the source were 0 V. FIG. 53B is a graph showing the measured results of the Id-Vd characteristics when the potential of the source and the potential of the gate were 0 V. FIG. 53C is a graph showing the measured results of the Id-Vd characteristics when the potential of the gate was 3 V.

FIG. 53A demonstrates that when the potential of the gate is 10 V or lower in the OS transistor having the structure illustrated in FIG. 48A to FIG. 48C, the leakage current from the gate becomes sufficiently low. FIG. 53B demonstrates that in the case where the potential of the gate was 0 V in the OS transistor having the structure illustrated in FIG. 48A to FIG. 48C, the drain current is not significantly increased even when the potential of the drain is increased to 10 V. Furthermore, FIG. 53C demonstrates that in the case where the potential of the gate was 3 V in the OS transistor having the structure illustrated in FIG. 48A to FIG. 48C, favorable saturation characteristics can be ensured even when the potential of the drain is increased to 10 V.

Example 2

In this example, the measured results of the electrical characteristics of an OS transistor and a Si transistor will be described.

In this example, the drain current-drain voltage characteristics (Id-Vd characteristics) of an OS transistor having the structure illustrated in FIG. 48A to FIG. 48C were measured. In the OS transistor, the channel length was 1.0 m and the channel width was 0.36 m. The thickness of the gate insulator was 30 nm.

Furthermore, in this example, the drain current-drain voltage characteristics (Id-Vd characteristics) of a Si transistor were measured. In the Si transistor, the channel length was 1.0 μm and the channel width was 0.5 m. The thickness of a gate insulator was 31 nm.

Here, the Id-Vd characteristics of the transistors were measured with the potential of the gate and the potential of the source of the transistors set to 0 V. The amount of drain current was measured using a measurement device with a lower measurement limit of $1.0 \times 10^{-13}$ A.

Figure 54A:
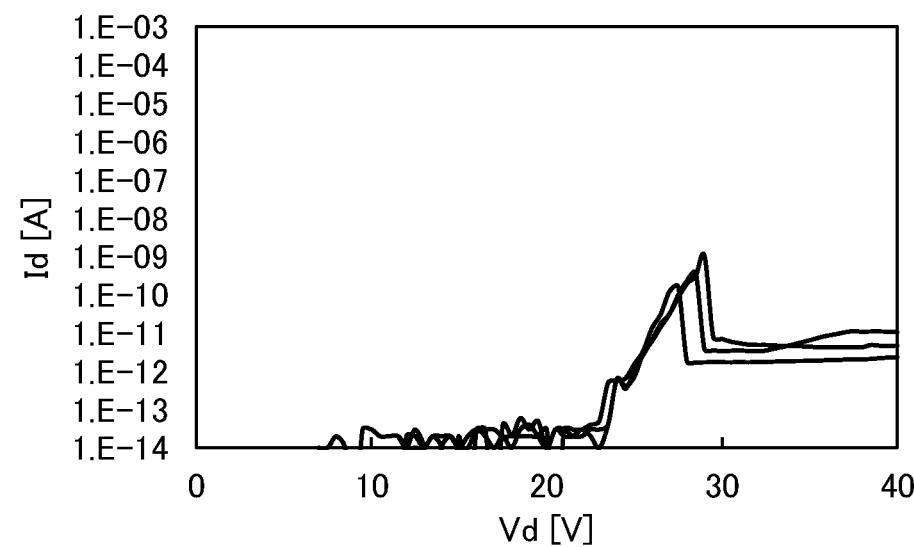
FIG. 54A and FIG. 54B are graphs showing measured results of Id-Vd characteristics of Example.
Figure 54B:
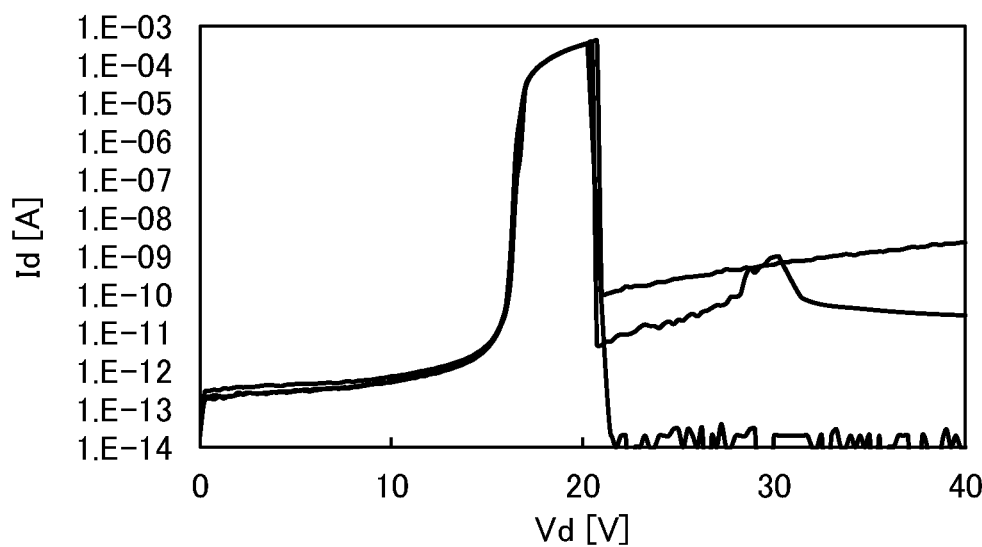

FIG. 54A is a graph showing the measured results of the Id-Vd characteristics of the OS transistor having the structure illustrated in FIG. 48A to FIG. 48C. FIG. 54B is a graph showing the measured results of the Id-Vd characteristics of the Si transistor.

FIG. 54A demonstrates that when the potential of the drain is 20 V or lower in the OS transistor having the structure illustrated in FIG. 48A to FIG. 48C, the drain current is lower than or equal to the lower measurement limit. On the other hand, FIG. 54B demonstrates that when the potential of the drain of the Si transistor is 20 V, the drain current is increased as compared to the case where the potential of the drain is 10 V.

REFERENCE NUMERALS

10: display device, 20: layer, 21: gate driver circuit, 21*a*: gate driver circuit, 21*b*: gate driver circuit, 22: data driver circuit, 22*a*: data driver circuit, 22*b*: data driver circuit, 23: region, 23*a*: region, 23*b*: region, 24: demultiplexer circuit, 30: layer, 31: wiring, 31_1: wiring 31_2: wiring, 313: wiring, 31*a*: wiring, 31*b*: wiring, 32: wiring, 32_1: wiring, 32_2: wiring, 33: display portion, 34: pixel, 35: sensor portion, 35B: sensor portion, 35L: sensor portion, 35R: sensor portion, 35T: sensor portion, 36: pixel, 37: memory portion, 38: cell, 39: wiring, 39*a*: wiring, 39*b*: wiring, 40: functional circuit, 51: transistor, 52: transistor, 53: transistor, 54: transistor, 55: transistor, 56: transistor, 57: transistor, 58: transistor, 59: transistor, 60: transistor, 61: transistor, 62: transistor, 63: transistor, 64: capacitor, 65: capacitor, 66: capacitor, 67: source follower circuit, 70: region, 71: transistor, 72: transistor, 73: dummy transistor, 81: display element, 82: light, 83: photoelectric conversion element, 84: light, 85: light-emitting element, 86: light, 100: electronic device, 101: housing, 110: channel formation region, 111: source region, 112: drain region, 113: gate electrode, 114:

opening portion, 115: wiring, 116: opening portion, 117: wiring, 118: opening portion, 119: opening portion, 120: opening portion, 121: wiring, 122: wiring, 123: wiring, 130: channel formation region, 131: source region, 132: drain region, 133: gate electrode, 134: opening portion, 135: wiring, 136: opening portion, 137: wiring, 138: opening portion, 139: opening portion, 140: opening portion, 141: wiring, 142: wiring, 143: wiring, 151: semiconductor, 152: conductor, 160: generator, 161: learning data, 162: learning-purpose image data, 163: learning-purpose defective pixel coordinate data, 164: test data, 165: test-purpose image data, 166: test-purpose defective pixel coordinate data, 167: learning result, 168: image data, 169: defective pixel coordinate data, 170: image data, 171: eyeball, 171L: eyeball, 171R: eyeball, 200A: transistor, 200B: transistor, 200C: transistor, 205: conductor, 214: insulator, 216: insulator, 222: insulator, 224: insulator, 230: metal oxide, 230a: metal oxide, 230b: metal oxide, 230c: metal oxide, 240: conductor, 240a: conductor, 240b: conductor, 241: insulator, 241a: insulator, 241b: insulator, 242: conductor, 242a: conductor, 242b: conductor, 243a: region, 243b: region, 244: insulator, 250: insulator, 252: metal oxide, 254: insulator, 260: conductor, 260a: conductor, 260b: conductor, 270: insulator, 271: insulator, 272: insulator, 274: insulator, 280: insulator, 281: insulator, 301a: conductor, 301b: conductor, 305: conductor, 311: conductor, 313: conductor, 317: conductor, 321: lower electrode, 323: insulator, 325: upper electrode, 331: conductor, 333: conductor, 335: conductor, 337: conductor, 341: conductor, 343: conductor, 347: conductor, 351: conductor, 353: conductor, 355: conductor, 357: conductor, 361: insulator, 363: insulator, 401: circuit, 403: element isolation layer, 405: insulator, 407: insulator, 409: insulator, 411: insulator, 413: insulator, 415: insulator, 417: insulator, 419: insulator, 421: insulator, 441: transistor, 443: conductor, 445: insulator, 447: semiconductor region, 449a: low-resistance region, 449b: low-resistance region, 451: conductor, 453: conductor, 455: conductor, 457: conductor, 459: conductor, 461: conductor, 463: conductor, 465: conductor, 467: conductor, 469: conductor, 471: conductor, 501: insulator, 503: insulator, 505: insulator, 507: insulator, 509: insulator, 511: transistor, 513: transistor, 515: capacitor, 517: capacitor, 520: circuit, 521: transistor, 525: transistor, 527: transistor, 529: transistor, 531: wiring, 533: wiring, 535: wiring, 537: wiring, 539: wiring, 541: wiring, 543: wiring, 545: wiring, 550: transistor, 552: transistor, 554: transistor, 560: capacitor, 562: capacitor, 570: liquid crystal element, 572: light-emitting element, 582: transistor, 584: transistor, 586: transistor, 588: transistor, 590: capacitor, 592: wiring, 601: transistor, 602: transistor, 603: transistor, 613: insulator, 614: insulator, 616: insulator, 622: insulator, 624: insulator, 644: insulator, 654: insulator, 674: insulator, 680: insulator, 681: insulator, 701: substrate, 705: substrate, 712: sealant, 716: FPC, 721: hole-injection layer, 722: hole-transport layer, 723: light-emitting layer, 724: electron-transport layer, 725: electron-injection layer, 730: insulator, 732: sealing layer, 734: insulator, 736: coloring layer, 738: light-blocking layer, 750: transistor, 760: connection electrode, 772: conductor, 774: conductor, 776: liquid crystal layer, 778: component, 780: anisotropic conductor, 786: EL layer, 786a: EL layer, 786b: EL layer, 786c: EL layer, 788: conductor, 790: capacitor, 792: charge generation layer, 901: subpixel, 901B: subpixel, 901G: subpixel, 901R: subpixel, 902: pixel, 911: conductor, 912: conductor, 913: semiconductor, 914: semiconductor, 915a: conductor, 915b: conductor, 916a: conductor, 916b: conductor, 917: conductor, 918: conductor, 919: conductor, 920: conductor, 921: conductor, 922: conductor, 923: conductor, 924: conductor, 925: conductor, 926: conductor, 927: conductor, 928: conductor, 929: conductor, 930: conductor, 931: conductor, 940: subpixel, 940_1: subpixel, 940_2: subpixel, 940B: subpixel, 940G: subpixel, 940R: subpixel, 941: pixel, 951: conductor, 952: semiconductor, 953: semiconductor, 954a: conductor, 954b: conductor, 955a: conductor, 955b: conductor, 956: conductor, 957: conductor, 958: conductor, 959: conductor, 960: conductor, 961: conductor, 962: conductor, 963: conductor, 964: conductor, 965: conductor, 966: conductor, 967: conductor, 968: conductor, 969: conductor, 970: conductor, 971: semiconductor, 972: semiconductor, 973a: conductor, 973b: conductor, 974a: conductor, 974b: conductor, 975: conductor, 976: conductor, 977: conductor, 978: conductor, 979: conductor, 980: conductor, 981: conductor, 982: conductor, 983: conductor, 984: conductor, 985: conductor, 986: conductor, 987: conductor, 990: conductor, 991: bonding layer, 992: insulator, 993: coloring layer, 993a: coloring layer, 993b: coloring layer, 994: bonding layer, 995: substrate, 1021: insulator, 1022: insulator, 1023: insulator, 1024: insulator, 1025: insulator, 1026: insulator, 1027: insulator, 1031: insulator, 1032: insulator, 1033: insulator, 1034: insulator, 1035: insulator, 1036: insulator, 1042: insulator, 1043: insulator, 1044: insulator, 1045: insulator, 1046: insulator, 1047: insulator, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television, 9101: portable information terminal, 9102: portable information terminal, 9200: portable information terminal, 9201: portable information terminal

The invention claimed is:

1. A method for operating a display device comprising a display portion and a sensor portion, wherein the display portion comprises a matrix of pixels in m rows by n columns, where m and n are each an integer greater than or equal to 2, and the sensor portion comprises a photoelectric conversion element, the method comprising:
dividing the display portion into a first region including first pixels and a second region including second pixels;
emitting first light from the first pixels, and detecting a luminance of the first light by the photoelectric conversion element;
emitting second light from the second pixels, and detecting a luminance of the second light by the photoelectric conversion element;
comparing the luminance of the first light and the luminance of the second light;
dividing one of the first region and the second region into a third region including third pixels and a fourth region including fourth pixels on the basis of a result of the comparison;
emitting third light from the third pixels, and detecting a luminance of the third light by the photoelectric conversion element;
emitting fourth light from the fourth pixels, and detecting a luminance of the fourth light by the photoelectric conversion element;
comparing the luminance of the third light and the luminance of the fourth light; and
detecting, in the third pixels and the fourth pixels, a defective pixel having a defect.

2. The method for operating the display device, according to claim 1, the method further comprising:
generating image data; and
emitting, from the matrix of pixels, fifth light having a luminance obtained by correcting a luminance represented by the image data on the basis of a detection result of the defective pixel.

3. The method for operating the display device, according to claim 2,
wherein the correction is performed using a neural network.

4. The method for operating the display device, according to claim 3,
wherein learning of the neural network is performed using learning-purpose image data and learning-purpose defective pixel coordinate data corresponding to the learning-purpose image data, as learning data.

5. The method for operating the display device, according to claim 1,
wherein a first layer and a second layer are provided to be stacked in the display device,
wherein the first layer comprises a gate driver circuit and a data driver circuit,
wherein the second layer comprises the display portion and the sensor portion,
wherein the gate driver circuit and the data driver circuit comprise a region overlapped by the display portion, and
wherein part of the gate driver circuit and part of the data driver circuit share an area.

6. The method for operating the display device, according to claim 1,
wherein each of the pixels in the matrix of pixels comprises a transistor comprising a metal oxide in a channel formation region, and
wherein the metal oxide comprises at least one of In and Zn.

7. A method for operating a display device comprising a display portion and a sensor portion, wherein the display portion comprises a matrix of pixels in m rows by n columns, where m and n are each an integer greater than or equal to 2, and the sensor portion comprises a photoelectric conversion element, the method comprising:
dividing the display portion into first to p-th regions, where p is an integer greater than or equal to 2 and less than or equal to m×n/2;
emitting first to p-th light from pixels each included in the first to p-th regions, and detecting luminances of the first to p-th light by the photoelectric conversion element;
comparing the luminances of the first to p-th light;
dividing a (p+1)th region comprising at least one of the first to p-th regions into (p+2)th to q-th regions, where q is an integer greater than or equal to p+3 and less than or equal to m×n+p+1 on the basis of results of the comparison;
emitting (p+1)th to (q−1)th light from pixels each included in the (p+2)th to q-th regions, and detecting luminances of the (p+1)th to (q−1)th light by the photoelectric conversion element;
comparing the luminances of the (p+1)th to (q−1)th light; and
detecting, in the pixels in the (p+2)th to q-th regions, a defective pixel having a defect.

8. The method for operating the display device, according to claim 3, the method further comprising:
generating image data; and
emitting, from the matrix of pixels, q-th light having a luminance obtained by correcting a luminance represented by the image data on the basis of a detection result of the defective pixel.

9. The method for operating the display device, according to claim 8,
wherein the correction is performed using a neural network.

10. The method for operating the display device, according to claim 9,
wherein learning of the neural network is performed using learning-purpose image data and learning-purpose defective pixel coordinate data corresponding to the learning-purpose image data, as learning data.

11. The method for operating the display device, according to claim 8,
wherein a first layer and a second layer are provided to be stacked in the display device,
wherein the first layer comprises a gate driver circuit and a data driver circuit,
wherein the second layer comprises the display portion and the sensor portion,
wherein the gate driver circuit and the data driver circuit comprise a region overlapped by the display portion, and
wherein part of the gate driver circuit and part of the data driver circuit share an area.

12. The method for operating the display device, according to claim 8,
wherein each of the pixels in the matrix of pixels comprises a transistor comprising a metal oxide in a channel formation region, and
wherein the metal oxide comprises at least one of In and Zn.

* * * * *